(12) United States Patent
Hikichi et al.

(10) Patent No.: US 10,712,543 B2
(45) Date of Patent: Jul. 14, 2020

(54) STACKED LENS STRUCTURE, METHOD OF MANUFACTURING THE SAME, ELECTRONIC APPARATUS, MOLD, METHOD OF MANUFACTURING THE SAME, AND SUBSTRATE

(71) Applicant: SONY SEMICONDUCTOR SOLUTIONS CORPORATION, Kanagawa (JP)

(72) Inventors: Kunihiko Hikichi, Kanagawa (JP); Koichi Takeuchi, Kanagawa (JP); Toshihiro Kurobe, Kanagawa (JP); Hiroyasu Matsugai, Kanagawa (JP); Hiroyuki Itou, Kanagawa (JP); Suguru Saito, Kanagawa (JP); Keiji Ohshima, Tokyo (JP); Nobutoshi Fujii, Kanagawa (JP); Hiroshi Tazawa, Kanagawa (JP); Toshiaki Shiraiwa, Kanagawa (JP); Minoru Ishida, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 45 days.

(21) Appl. No.: 15/741,354

(22) PCT Filed: Jul. 15, 2016

(86) PCT No.: PCT/JP2016/003351
§ 371 (c)(1),
(2) Date: Jan. 2, 2018

(87) PCT Pub. No.: WO2017/022189
PCT Pub. Date: Feb. 9, 2017

(65) Prior Publication Data
US 2019/0004293 A1 Jan. 3, 2019

(30) Foreign Application Priority Data
Jul. 31, 2015 (JP) .................... 2015-152917

(51) Int. Cl.
*G02B 3/00* (2006.01)
*H01L 27/146* (2006.01)
(Continued)

(52) U.S. Cl.
CPC .... *G02B 13/0085* (2013.01); *B29D 11/00307* (2013.01); *B29D 11/00375* (2013.01);
(Continued)

(58) Field of Classification Search
CPC .............. G02B 13/0085; G02B 3/0062; H01L 27/14687; H01L 27/14685;
(Continued)

(56) References Cited

U.S. PATENT DOCUMENTS

| 5,648,854 | A | 7/1997 | McCoy et al. |
| 8,514,491 | B2 * | 8/2013 | Duparre ............ H01L 27/14621 359/618 |

(Continued)

FOREIGN PATENT DOCUMENTS

| CN | 103713371 | 4/2014 |
| EP | 2190025 | 5/2010 |

(Continued)

OTHER PUBLICATIONS

International Search Report and Written Opinion prepared by the European Patent Office dated Dec. 12, 2016, for International Application No. PCT/JP2016/003351.

(Continued)

*Primary Examiner* — Lin Ye
*Assistant Examiner* — John H Morehead, III
(74) *Attorney, Agent, or Firm* — Sheridan Ross P.C.

(57) ABSTRACT

A positional shift of a lens of a stacked lens structure is reduced. A plurality of through-holes is formed at a position shifted from a first target position on a substrate according to a first shift. A lens is formed on an inner side of each of the through-holes using a first mold in which a plurality of first transfer surfaces is disposed at a position shifted from a predetermined second target position according to a sec- (Continued)

ond shift and a second mold in which a plurality of second transfer surfaces is disposed at a position shifted from a predetermined third target position according to a third shift. The plurality of substrates having the lenses formed therein is formed according to direct bonding, and the plurality of stacked substrates is divided. The present technique can be applied to a stacked lens structure or the like, for example.

12 Claims, 93 Drawing Sheets

(51) Int. Cl.
    *G02B 13/00* (2006.01)
    *B29D 11/00* (2006.01)

(52) U.S. Cl.
    CPC ...... *G02B 3/0062* (2013.01); *H01L 27/14627* (2013.01); *H01L 27/14685* (2013.01); *H01L 27/14687* (2013.01)

(58) Field of Classification Search
    CPC ........ H01L 27/14627; B29D 11/00375; B29D 11/00307
    See application file for complete search history.

(56) References Cited

U.S. PATENT DOCUMENTS

| | | | | |
|---|---|---|---|---|
| 9,185,276 | B2* | 11/2015 | Rodda | H04N 5/2254 |
| 9,210,392 | B2* | 12/2015 | Nisenzon | H04N 9/735 |
| 2008/0007623 | A1* | 1/2008 | Lee | G02B 13/006 |
| | | | | 348/207.99 |
| 2010/0214456 | A1* | 8/2010 | Tokuda | G02B 5/1885 |
| | | | | 348/294 |
| 2010/0283113 | A1 | 11/2010 | Kang et al. | |
| 2010/0321802 | A1* | 12/2010 | Kim | B29D 11/00365 |
| | | | | 359/811 |
| 2011/0149143 | A1* | 6/2011 | Tsujino | G02B 3/0031 |
| | | | | 348/374 |
| 2011/0176020 | A1* | 7/2011 | Chang | H04N 5/3415 |
| | | | | 348/222.1 |
| 2012/0194669 | A1 | 8/2012 | Hutto et al. | |
| 2012/0248638 | A1 | 10/2012 | Matsuda | |
| 2013/0003199 | A1* | 1/2013 | Jeong | B29D 11/00375 |
| | | | | 359/819 |
| 2013/0242182 | A1* | 9/2013 | Rudmann | G02B 7/021 |
| | | | | 348/374 |
| 2014/0002674 | A1* | 1/2014 | Duparre | G02B 7/003 |
| | | | | 348/187 |
| 2014/0125849 | A1* | 5/2014 | Heimgartner | H01L 27/14625 |
| | | | | 348/276 |
| 2014/0264709 | A1 | 9/2014 | Tsai et al. | |
| 2015/0146030 | A1* | 5/2015 | Venkataraman | H04N 13/243 |
| | | | | 13/243 |
| 2015/0288861 | A1* | 10/2015 | Duparre | H04N 5/3696 |
| | | | | 348/218.1 |

FOREIGN PATENT DOCUMENTS

| | | |
|---|---|---|
| JP | H08-298240 | 11/1996 |
| JP | 2009-279790 | 12/2009 |
| JP | 2012-252113 | 12/2012 |
| JP | 2014-006329 | 1/2014 |
| WO | WO 2010/087082 | 8/2010 |
| WO | WO 2010/137368 | 12/2010 |
| WO | WO 2014/073323 | 5/2014 |

OTHER PUBLICATIONS

Official Action (with English translation) for Japanese Patent Application No. 2015-152917, dated Aug. 1, 2019, 15 pages.
Official Action (with English translation) for Chinese Patent Application No. 201680036724.9, dated Jan. 10, 2020, 14 pages.

* cited by examiner

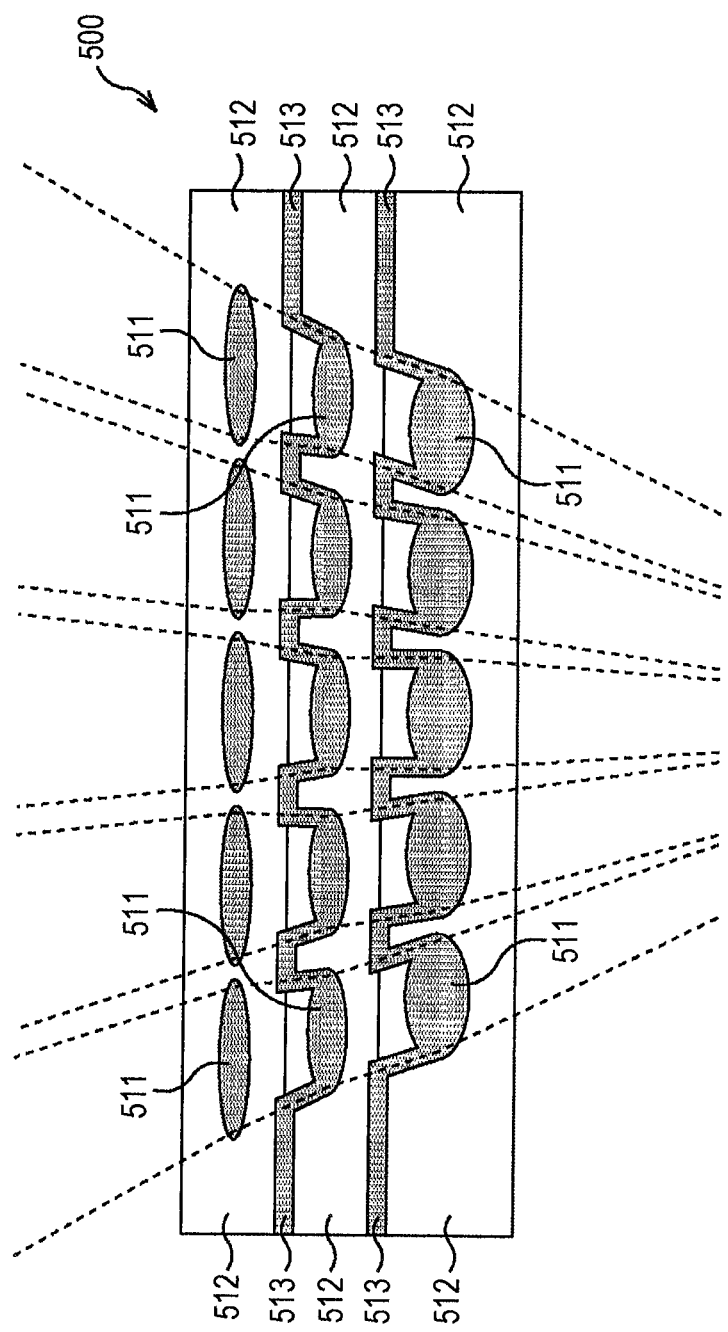

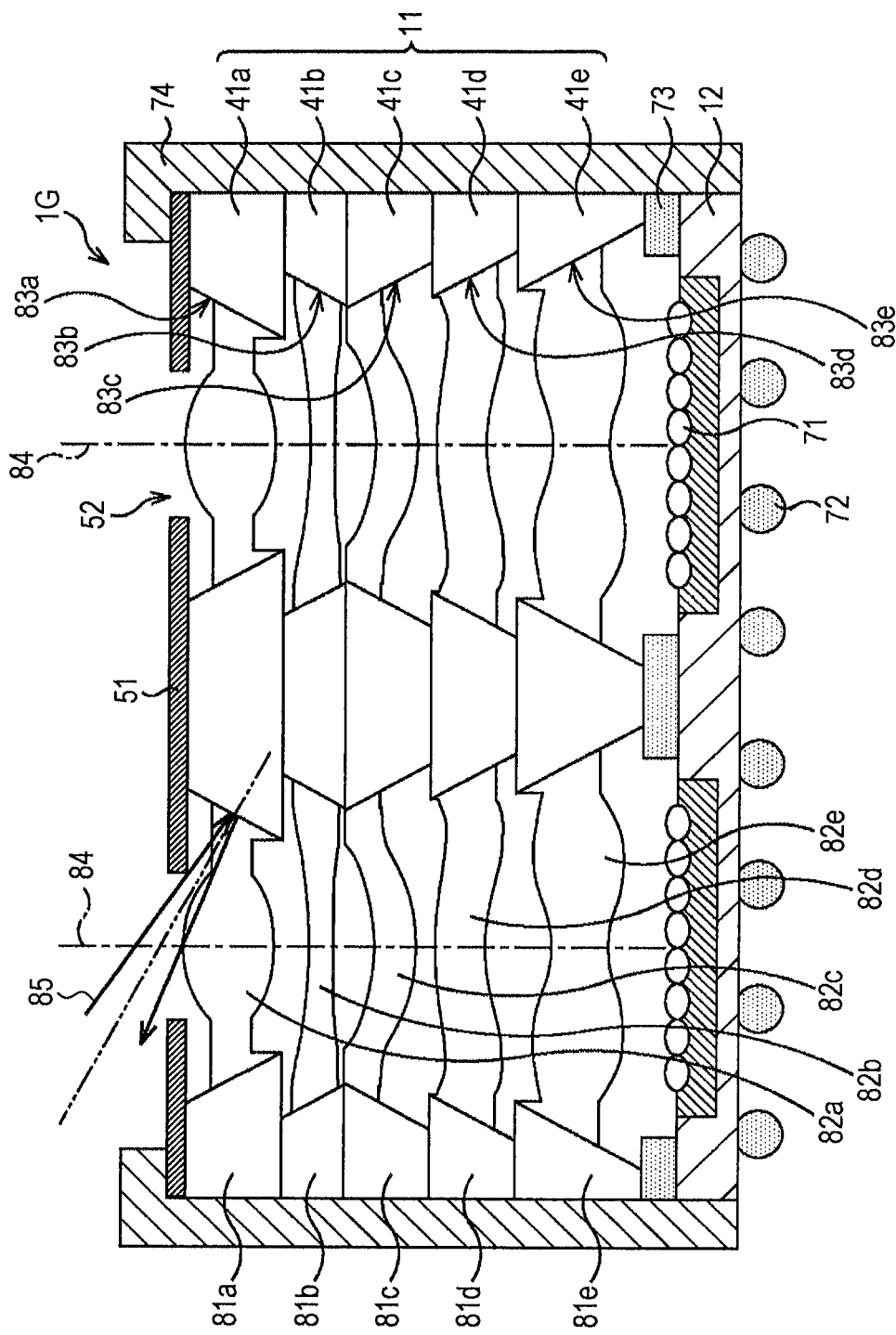

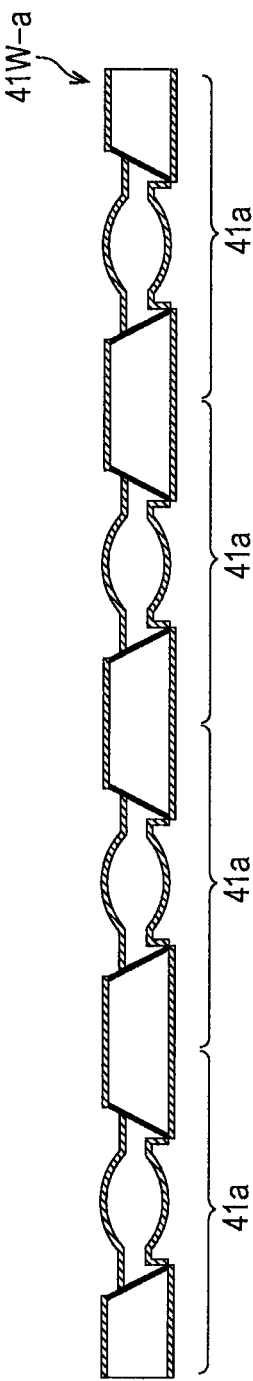
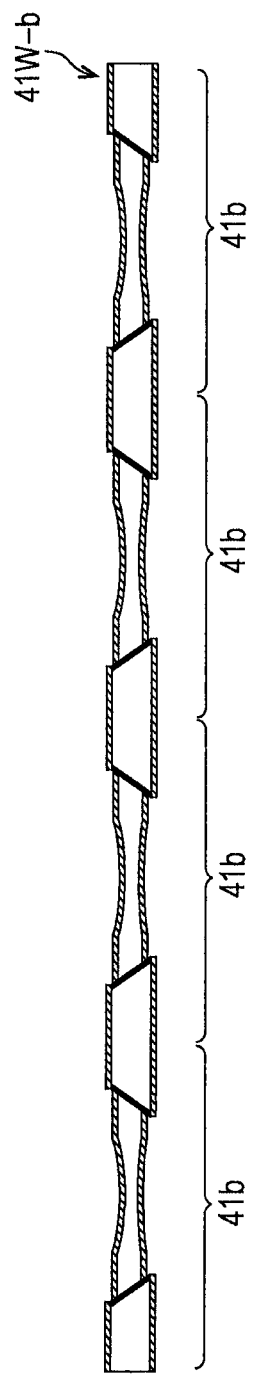
FIG. 30A
FIG. 30B

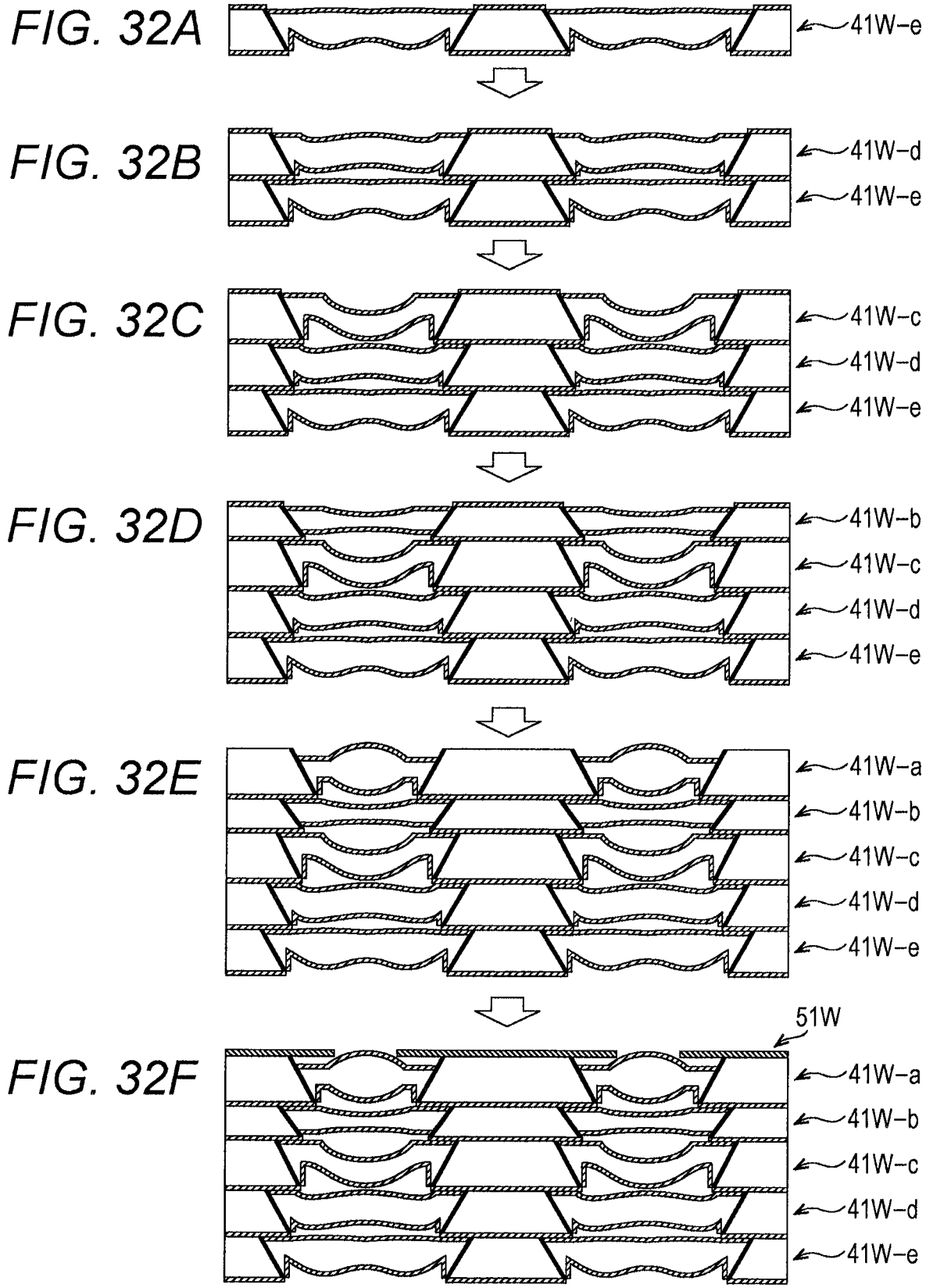

STACKED LENS STRUCTURE, METHOD OF MANUFACTURING THE SAME, ELECTRONIC APPARATUS, MOLD, METHOD OF MANUFACTURING THE SAME, AND SUBSTRATE

CROSS-REFERENCE TO RELATED APPLICATIONS

This application is a national stage application under 35 U.S.C. 371 and claims the benefit of PCT Application No. PCT/JP2016/003351 having an international filing data of 15 Jul. 2016, which designated the United States, which PCT application claimed the benefit of Japanese Priority Patent Application JP 2015-152917 filed on Jul. 31, 2015, the entire contents of which are incorporated herein by reference.

TECHNICAL FIELD

The present technique relates to a stacked lens structure, a method of manufacturing the stacked lens structure, an electronic apparatus, a mold, and a method of manufacturing the mold, and a substrate, and more particular, to a stacked lens structure, a method of manufacturing the stacked lens structure, an electronic apparatus, a mold, a method of manufacturing the mold, and a substrate, the stacked lens structure being ideally used when lenses are formed on a substrate which can be used for manufacturing an electronic device such as a semiconductor device or a flat-panel display device to form the stacked lens structure by stacking the lenses in a substrate state.

BACKGROUND ART

In a wafer-level lens process in which a plurality of lenses is arranged in a plan direction of a wafer substrate, it is difficult to obtain the shape accuracy or the position accuracy when the lenses are formed. In particular, a high level may be demanded in a process in which wafer substrates are stacked to manufacture a stacked lens structure. It is difficult to stack three layers or more in mass production level.

Various techniques related to the wafer-level lens process have been devised and proposed. For example, Patent Literature 1 proposes a method in which when a lens material is filled into through-holes formed in a substrate to form a lens, the lens material itself is used as an adhesive to stack wafer substrates.

CITATION LIST

Patent Literature

PTL 1: JP 2009-279790 A

SUMMARY OF INVENTION

Technical Problem

However, as disclosed in Patent Literature 1, when the wafer substrates are attached using an adhesive resin, a deformation such as a distortion or a positional shift of a stacked lens is likely to occur due to shrinkage and expansion of the resin.

It is desirable to suppress a positional shift of a lens of a stacked lens structure.

Solution to Problem

A method of manufacturing stacked lens structures according to a first aspect of the present technique includes: forming a plurality of through-holes at a position shifted from a predetermined first target position according to a first shift amount corresponding to a shift in the position of each of the respective through-holes that occurs during a manufacturing process; forming a lens at an inner side of each of the through-holes of the plurality of through-holes using a first mold in which a plurality of first transfer surfaces used for forming a first surface of each of the lenses is disposed at a position shifted from a predetermined second target position according to a second shift amount corresponding to a shift in the position of the first surface of each of the respective lenses that occurs during the manufacturing processes and a second mold in which a plurality of second transfer surfaces used for forming a second surface of each of the lenses is disposed at a position shifted from a predetermined third target position according to a third shift amount corresponding to a shift in the position of the second surface of each of the respective lenses that occurs during the manufacturing processes; stacking and directly bonding the plurality of substrates having the lenses formed therein; and dividing the plurality of stacked substrates.

A stacked lens structure according to a first aspect of the present technique is manufactured by the steps including: forming a plurality of through-holes at a position shifted from a predetermined first target position according to a first shift amount corresponding to a shift in the position of each of the respective through-holes that occurs during a manufacturing processes; forming a lens at an inner side of each of the through-holes of the plurality of through-holes using a first mold in which a plurality of first transfer surfaces used for forming a first surface of each of the lenses is disposed at a position shifted from a predetermined second target position according to a second shift amount corresponding to a shift in the position of the first surface of each of the respective lenses that occurs during the manufacturing processes and a second mold in which a plurality of second transfer surfaces used for forming a second surface of each of the lenses is disposed at a position shifted from a predetermined third target position according to a third shift amount corresponding to a shift in the position of the second surface of each of the respective lenses that occurs during the manufacturing process; stacking and directly bonding the plurality of substrates having the lenses formed therein; and dividing the plurality of stacked substrates.

An electronic apparatus according to a first aspect of the present technique includes a stacked lens structure manufactured by: forming a plurality of through-holes at a position shifted from a predetermined first target position according to a first shift amount corresponding to a shift in the position of each of the respective through-holes that occurs during a manufacturing process; forming a lens at an inner side of each of the through-holes of the plurality of through-holes using a first mold in which a plurality of first transfer surfaces used for forming a first surface of each of the lenses is disposed at a position shifted from a predetermined second target position according to a second shift amount corresponding to a shift in the position of the first surface of each of the respective lenses that occurs during the manufacturing processes and a second mold in which a plurality of second transfer surfaces used for forming a second surface of each of the lenses is disposed at a position shifted from a predetermined third target position according to a third shift amount corresponding to a shift in the position of the second surface of each of the respective lenses that occurs during the manufacturing processes; stacking and directly bonding the plurality of substrates having the lenses formed therein; and dividing the plurality of stacked substrates.

A mold according to a second aspect of the present technique is used for forming one surface of a lens of a substrate including a plurality of through-holes, wherein the lens of the substrate is disposed at an inner side of the through-hole, wherein a plurality of transfer surfaces used for forming the surface of the lens is disposed at a position shifted from a predetermined target position according to an amount of shift in the position of the surface of the lens that occurs during a manufacturing process.

A method of manufacturing a lens structure according to a third aspect of the present technique includes: directly bonding a first plurality of substrates to a second plurality of substrates thereby forming a stacked substrate, each substrate of the first plurality and second plurality of substrates including multiple through-holes having a lens disposed at an inner side thereof, wherein each substrate of the first plurality and second plurality of substrates is directly bonded to at least one other substrate of the respective first and second plurality of substrates that includes multiple through-holes having a lens disposed at an inner side therein; and dividing the stacked substrate into one or more lens structures.

A stacked lens structure according to a third aspect of the present technique is manufactured by directly bonding a first plurality of substrates to a second plurality of substrates thereby forming a stacked substrate, each substrate of the first plurality and second plurality of substrates including multiple through-holes having a lens disposed at an inner side thereof, wherein each substrate of the first plurality and second plurality of substrates is directly bonded to at least one other substrate of the respective first and second plurality of substrates that includes multiple through-holes having a lens disposed at an inner side therein; and dividing the stacked substrate into one or more lens structures.

An electronic apparatus according to a third aspect of the present technique includes a lens structure manufactured by: directly bonding a first plurality of substrates to a second plurality of substrates thereby forming a stacked substrate, each substrate of the first plurality and second plurality of substrates including multiple through-holes having a lens disposed at an inner side thereof, wherein each substrate of the first plurality and second plurality of substrates is directly bonded to at least one other substrate of the respective first and second plurality of substrates that includes multiple through-holes having a lens disposed at an inner side therein; and dividing the stacked substrate into one or more lens structures.

A method of manufacturing a mold according to a fourth aspect of the present technique includes: forming a first fitting portion at a plurality of predetermined positions of a first substrate, wherein the first fitting portion fits to a second fitting portion at a distal end of a mold; and aligning the second fitting portion of a second mold to the respective first fitting portion, and forming a transfer surface at the plurality of positions of the first substrate using the second mold.

A substrate according to a fifth aspect of the present technique is a substrate in which a second fitting portion that fits to a first fitting portion at a distal end of a mold used for forming a transfer surface is formed at a position at which a plurality of the transfer surfaces is formed.

In the fifth aspect of the present technique, the first fitting portion and the second fitting portion are fitted together whereby the mold is aligned.

A mold according to a sixth aspect of the present technique is a mold which is used for forming a transfer surface at a plurality of predetermined positions of a substrate and in which a second fitting portion that fits to a first fitting portion formed at the plurality of positions of the substrate is formed at a distal end.

In the sixth aspect of the present technique, the first fitting portion and the second fitting portion are fitted together whereby the mold is aligned.

The stacked lens structure and the electronic apparatus may be independent components or apparatuses and may be modules incorporated into another apparatuses.

Advantageous Effects of Invention

According to the first to sixth aspects of the present technique, it is possible to reduce the positional shift of lenses of stacked lens structures.

The advantageous effects described herein are not necessarily presented in a limiting sense, but any one of the advantageous effects disclosed in the present technique may be exhibited.

BRIEF DESCRIPTION OF DRAWINGS

FIG. 2 is a diagram illustrating a cross-sectional structure of the stacked lens structure disclosed in Patent Literature 1.

FIG. 17 is a diagram illustrating a seventh embodiment of a camera module which uses a stacked lens structure to which the present technique is applied.

FIGS. 30A to 30B are diagrams illustrating bonding of substrates with lenses in a substrate state.

FIGS. 32A to 32F are diagrams illustrating a first stacking method of stacking five substrates with lenses in a substrate state.

DESCRIPTION OF EMBODIMENTS

Hereinafter, modes (hereinafter referred to as embodiments) for carrying out the present technique will be described. The description will be given in the following order:

1. First Embodiment of Camera Module
2. Second Embodiment of Camera Module
3. Third Embodiment of Camera Module
4. Fourth Embodiment of Camera Module
5. Fifth Embodiment of Camera Module
6. Detailed Configuration of Camera Module of Fourth Embodiment
7. Sixth Embodiment of Camera Module
8. Seventh Embodiment of Camera Module
9. Detailed Configuration of Substrate with Lenses
10. Method of Manufacturing Substrate with Lenses
11. Bonding of Substrates with Lenses
12. Eighth and Ninth Embodiments of Camera Module
13. Tenth Embodiment of Camera Module
14. Eleventh Embodiment of Camera Module
15. Advantages of Present Structure compared to Other Structures
16. Various Modified Examples
17. Example of Application to Electronic Apparatus
18. Use Example of Image Sensor 1. First Embodiment of Camera Module FIGS. 1A and 1B are diagrams illustrating a first embodiment of a camera module which uses a stacked lens structure to which the present technique is applied.

Figure 1A:
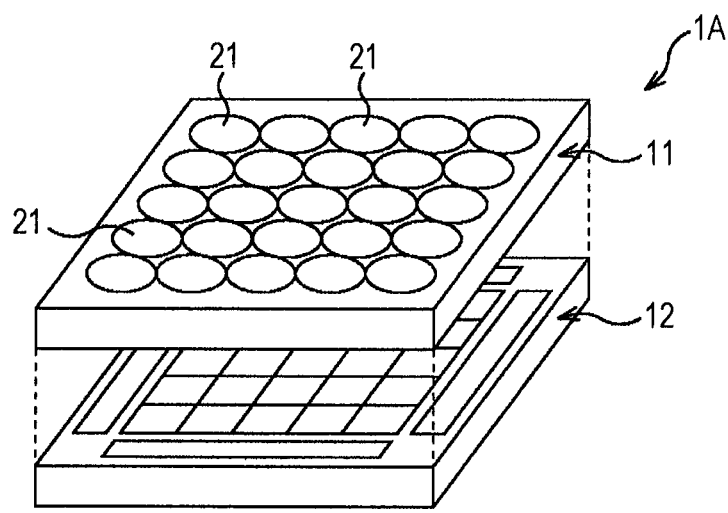
FIG. 1A to 1B are diagrams illustrating a first embodiment of a camera module which uses a stacked lens structure to which the present technique is applied.

FIG. 1A is a schematic diagram illustrating a configuration of a camera module 1A as a first embodiment of a camera module 1. FIG. 1B is a schematic cross-sectional view of the camera module 1A.

The camera module 1A includes a stacked lens structure 11 and light receiving elements 12. The stacked lens structure 11 includes twenty five optical units 13 in total, five optical units in vertical and horizontal directions each. The optical unit 13 is configured to include a plurality of lenses 21 in one optical axis direction. The camera module 1A is a multi-ocular camera module having a plurality of optical units 13.

Figure 1B:
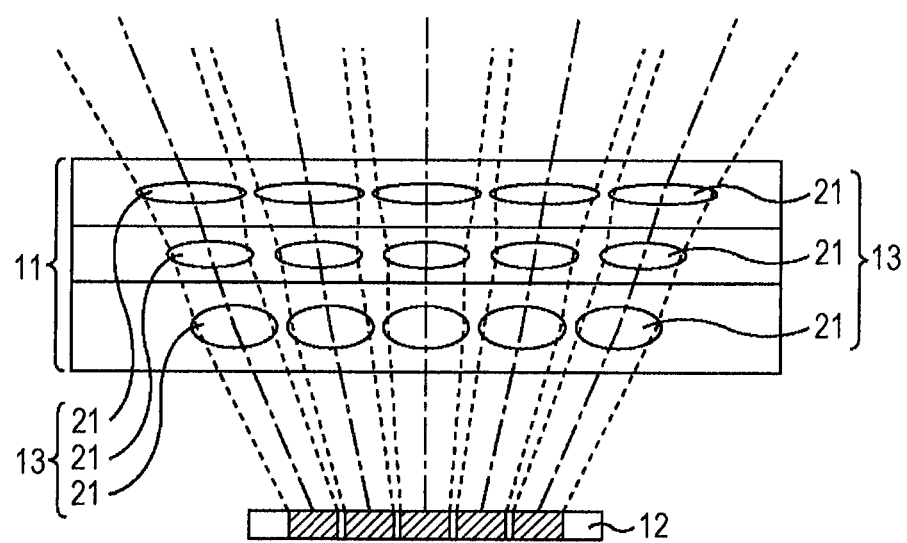

The optical axes of the plurality of optical units 13 included in the camera module 1A are disposed so as to spread toward the outer side of the module as illustrated in FIG. 1B. Due to this, it is possible to photograph a wide-angle image.

Although the stacked lens structure 11 illustrated in FIG. 1B has a structure in which the lenses 21 are stacked in three layers only for the sake of simplicity, a larger number of lenses 21 may naturally be stacked.

The camera module 1A illustrated in FIGS. 1A and 1B can stitch a plurality of images photographed by the plurality of optical units 13 together to create one wide-angle image. In order to stitch the plurality of images together, high accuracy is demanded in the formation and the arrangement of the optical units 13 photographing the images. Moreover, since the optical units 13 particularly on the wide-angle side have a small incidence angle of light incident on the lenses 21, high accuracy is demanded in the positional relation and the arrangement of the lenses 21 in the optical unit 13.

FIG. 2 is a diagram illustrating a cross-sectional structure of a stacked lens structure which uses a resin-based fixing technique, disclosed in Patent Literature 1.

In a stacked lens structure 500 illustrated in FIG. 2, a resin 513 is used as a unit for fixing substrates 512 each having lenses 511. The resin 513 is an energy-curable resin such as an UV-curable resin.

Before the substrates 512 are attached together, a layer of the resin 513 is formed on an entire surface of the substrate 512. After that, the substrates 512 are attached together, and the resin 513 is cured. In this way, the attached substrates 512 are fixed together.

However, when the resin 513 is cured, the resin 513 experiences curing shrinkage. In the case of the structure illustrated in FIG. 2, since the resin 513 is cured after the layer of the resin 513 is formed on the entire substrate 512, the amount of displacement of the resin 513 increases.

Moreover, even after the stacked lens structure 500 formed by attaching the substrates 512 together is divided into individual imaging elements and the imaging elements are combined to form a camera module, the stacked lens structure 500 provided in the camera module has the resin 513 entirely between the substrates 512 having lenses 511 as illustrated in FIG. 2. Due to this, when the camera module is mounted into the housing of a camera and is used actually, the resin between the substrates of the stacked lens structure 500 may experience thermal expansion due to an increase in the temperature caused by the heat generated by the apparatus.

Figure 3:
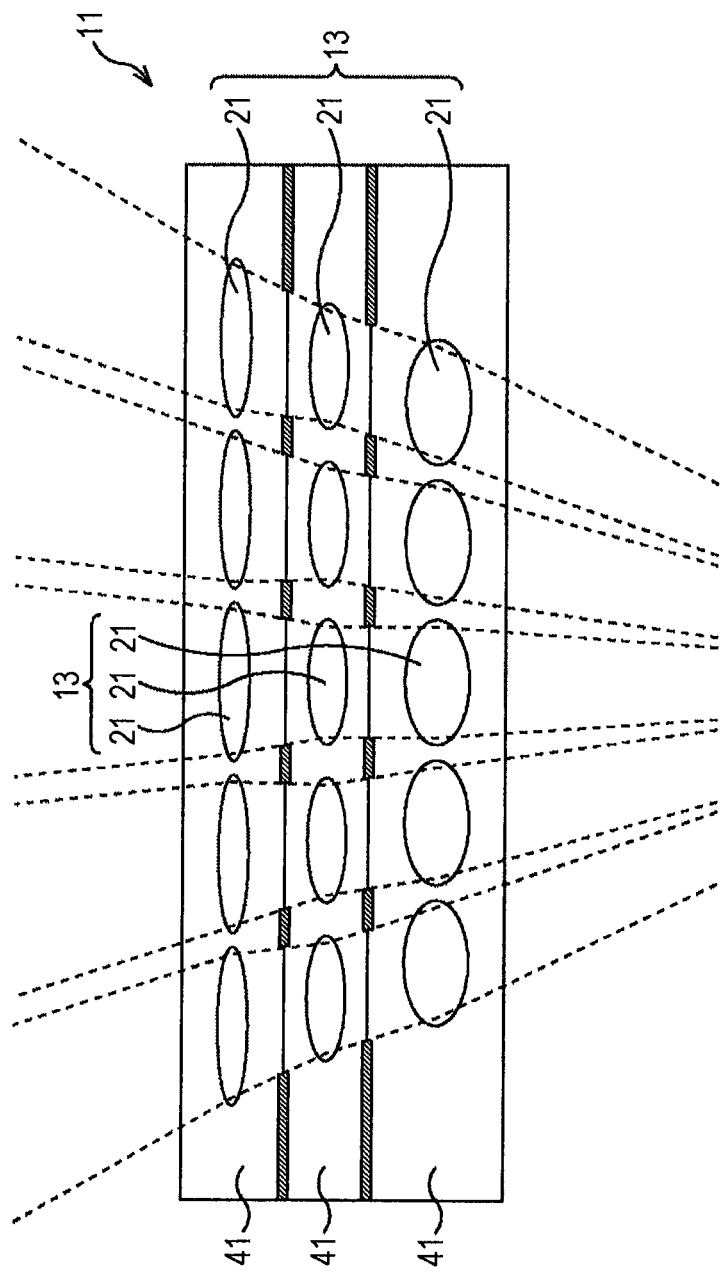
FIG. 3 is a diagram illustrating a cross-sectional structure of the stacked lens structure of the camera module illustrated in FIG. 1.

FIG. 3 is a diagram illustrating a cross-sectional structure of the stacked lens structure 11 only of the camera module 1A illustrated in FIGS. 1A and 1B.

The stacked lens structure 11 of the camera module 1A is also formed by stacking a plurality of substrates with lenses 41 having the lenses 21.

In the stacked lens structure 11 of the camera module 1A, a fixing unit which is completely different from that used in the stacked lens structure 500 illustrated in FIG. 2 or that disclosed in the related art is used as a unit for fixing the substrates with lenses 41 having the lenses 21 together.

Figure 4:
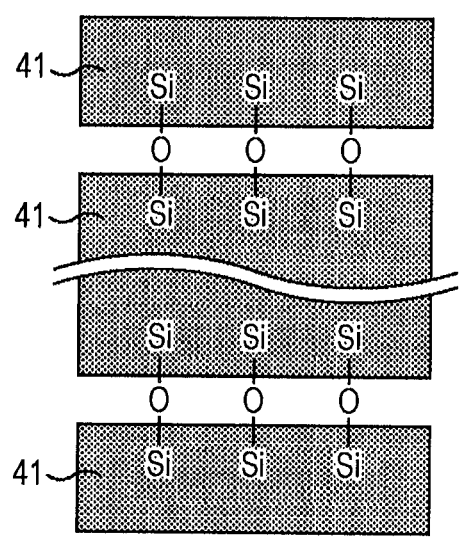
FIG. 4 is a diagram illustrating direct bonding of a substrate with lenses.

That is, two substrates with lenses 41 to be stacked are directly bonded by a covalent bond between an oxide or nitride-based surface layer formed on the surface of one substrate and an oxide or nitride-based surface layer formed on the surface of the other substrate. As a specific example, as illustrated in FIG. 4, a silicon oxide film or a silicon nitride film is formed on the surfaces of the two substrates with lenses 41 to be stacked as a surface layer, and a hydroxyl radical is combined with the film. After that, the two substrates with lenses 41 are attached together and are heated and subjected to dehydration condensation. As a result, a silicon-oxygen covalent bond is formed between the surface layers of the two substrates with lenses 41. In this way, the two substrates with lenses 41 are directly bonded. As the result of condensation, atoms included in the two surface layers may directly form a covalent bond.

In the present specification, direct bonding means fixing the two substrates with lenses 41 by the layer of an inorganic material disposed between the two substrates with lenses 41. Alternatively, direct bonding means fixing the two substrates with lenses 41 by chemically combining the layers of an inorganic material disposed on the surfaces of the two substrates with lenses 41. Alternatively, direct bonding means fixing the two substrates with lenses 41 by forming a dehydration condensation-based bond between the layers of an inorganic material disposed on the surfaces of the two substrates with lenses 41. Alternatively, direct bonding means fixing the two substrates with lenses 41 by forming an oxygen-based covalent bond between the layers of an inorganic material disposed on the surfaces of the two substrates with lenses 41 or a covalent bond between atoms included in the layers of the inorganic material. Alternatively, direct bonding means fixing the two substrates with lenses 41 by forming a silicon-oxygen covalent bond or a silicon-silicon covalent bond between silicon oxide layers or silicon nitride layers disposed on the surfaces of the two substrates with lenses 41.

In order to realize dehydration condensation based on attachment and heating, in the present embodiment, lenses are formed in a substrate state using a substrate used in the field of manufacturing semiconductor devices and flat-panel display devices, dehydration condensation based on attachment and heating is realized in a substrate state, and bonding based on a covalent bond is realized in a substrate state. The structure in which the layers of an inorganic material formed between the surfaces of the two substrates with lenses 41 are bonded by a covalent bond has an effect or an advantage that the structure suppresses a deformation caused by curing shrinkage of the resin 513 in the entire substrate and a deformation caused by thermal expansion of the resin 513 during actual use, which may occur when the technique described in FIG. 2, disclosed in Patent Literature 1 is used.

Figure 5:
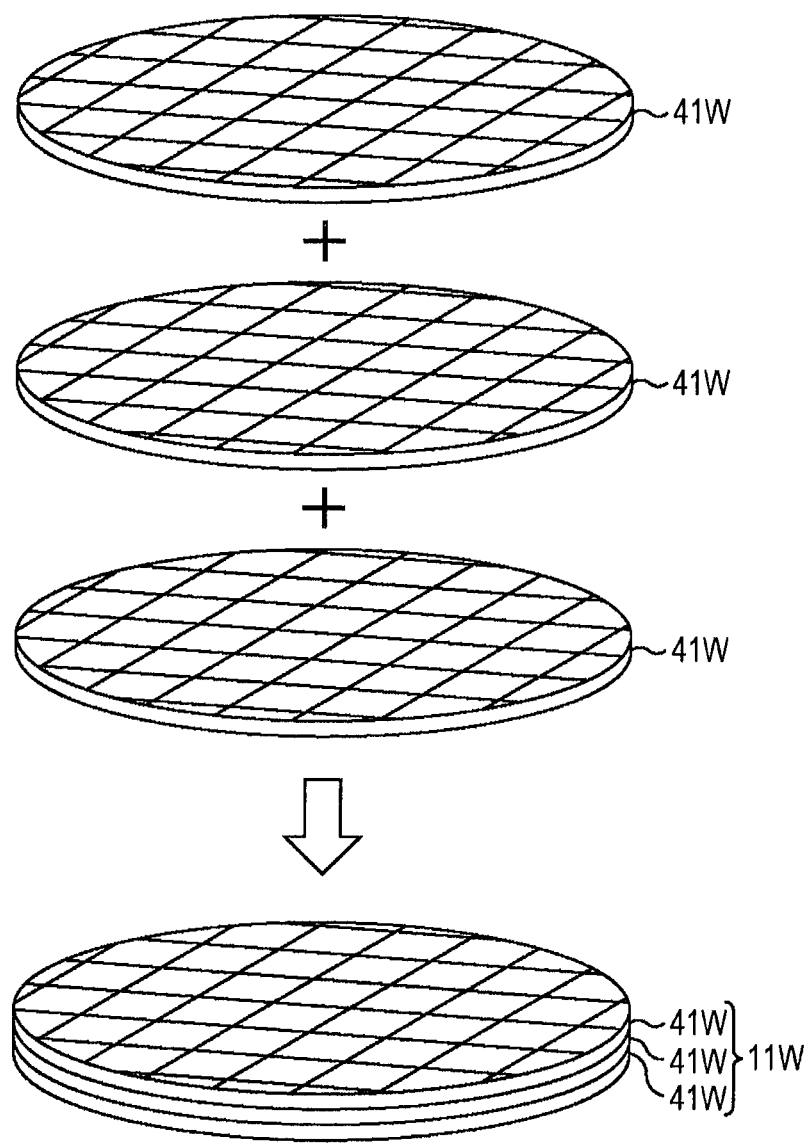
FIG. 5 is a diagram illustrating a step of forming the camera module illustrated in FIG. 1.
Figure 6:
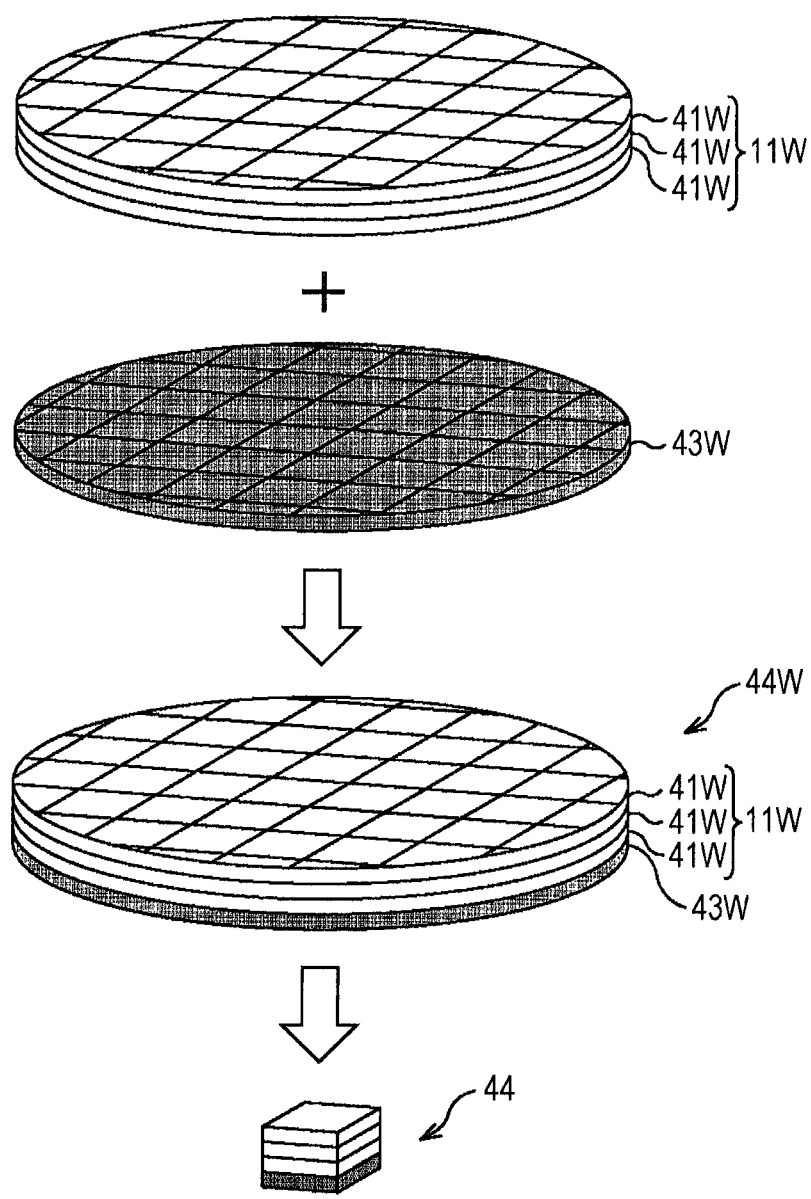
FIG. 6 is a diagram illustrating a step of forming the camera module illustrated in FIG. 1.

FIGS. 5 and 6 are diagrams illustrating a step of combining the stacked lens structure 11 and the light receiving elements 12 to form the camera module 1A illustrated in FIGS. 1A and 1B.

First, as illustrated in FIG. 5, a plurality of substrates with lenses 41W on which a plurality of lenses 21 (not illustrated) is formed in a plane direction are prepared and are stacked together. In this way, a stacked lens structure 11W in a substrate state in which a plurality of substrates with lenses 41W in a substrate state is stacked is obtained.

Subsequently, as illustrated in FIG. 6, a sensor substrate 43W in a substrate state in which a plurality of light receiving elements 12 is formed in a plane direction is manufactured and prepared separately from the stacked lens structure 11W in the substrate state illustrated in FIG. 5.

Moreover, the sensor substrate 43W in the substrate state and the stacked lens structure 11W in the substrate state are stacked and attached together, and external terminals are attached to respective modules of the attached substrates to obtain a camera module 44W in a substrate state.

Finally, the camera module 44W in the substrate state is divided into respective modules or chips. The divided camera module 44 is enclosed in a housing (not illustrated) prepared separately whereby a final camera module 44 is obtained.

In the present specification and the drawings, for example, components denoted by reference numerals with "W" added thereto like the substrate with lenses 41W, for example, indicate that the components are in a substrate state (wafer state), and components denoted by reference numerals without "W" like the substrate with lenses 41, for example, indicate that the components are divided into respective modules or chips. The same is applied for the sensor substrate 43W, the camera module 44W, and the like.

Figure 7:
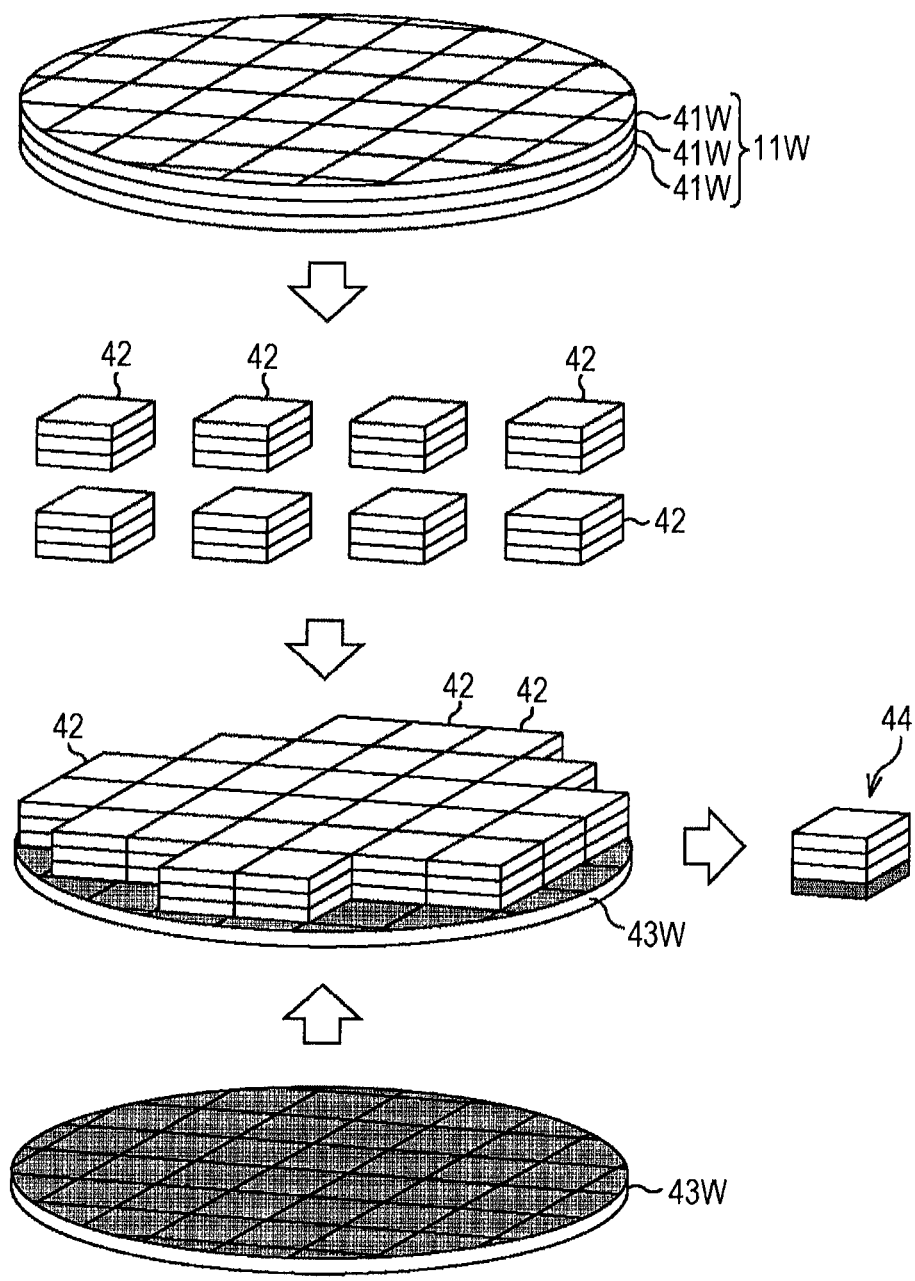
FIG. 7 is a diagram illustrating another step of forming the camera module illustrated in FIG. 1.

FIG. 7 is a diagram illustrating another step of combining the stacked lens structure 11 and the light receiving elements 12 to form the camera module 1A illustrated in FIGS. 1A and 1B.

First, similarly to the above-described step, a stacked lens structure 11W in a substrate state on which a plurality of substrates with lenses 41W in a substrate state are stacked is manufactured.

Subsequently, the stacked lens structure 11W in the substrate state is divided into individual pieces.

Moreover, a sensor substrate 43W in a substrate state is manufactured and prepared separately from the stacked lens structure 11W in the substrate state.

Moreover, the divided stacked lens structures 11 are mounted one by one on the respective light receiving elements 12 of the sensor substrate 43W in the substrate state.

Finally, the sensor substrate 43W in the substrate state on which the divided stacked lens structures 11 are mounted is divided into respective modules or chips. The divided sensor substrate 43 on which the stacked lens structure 11 is mounted is enclosed in a housing (not illustrated) prepared separately and external terminals are attached thereto to obtain a final camera module 44.

Further, as another example of the step of combining the stacked lens structure 11 and the light receiving elements 12 to form the camera module 1A illustrated in FIGS. 1A and 1B, a sensor substrate 43W in a substrate state illustrated in FIG. 7 may be divided into individual light receiving elements 12, and the divided stacked lens structures 11 may be mounted on the individual light receiving elements 12 to obtain a divided camera module 44.

FIGS. 8A to 8H are diagrams illustrating a configuration of the substrate with lenses 41 of the camera module 1A.

Figure 8A:
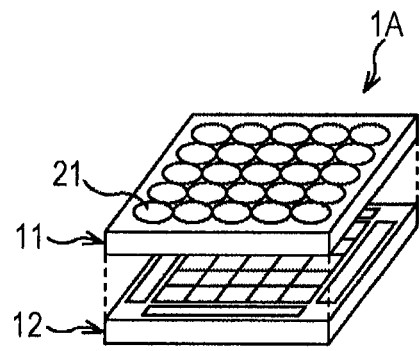
FIGS. 8A to 8H are diagrams illustrating a configuration of a substrate with lenses.

FIG. 8A is the same schematic diagram as FIG. 1A, illustrating a configuration of the camera module 1A.

Figure 8B:
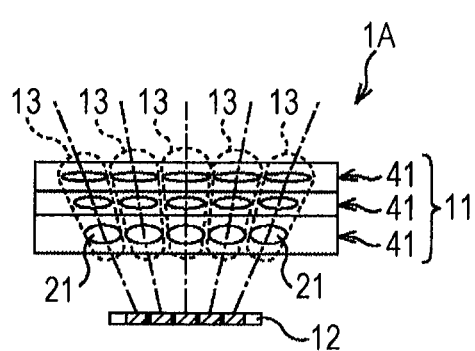

FIG. 8B is the same schematic cross-sectional view as FIG. 1B, of the camera module 1A.

As illustrated in FIG. 8B, the camera module 1A is a multi-ocular camera module including a plurality of optical units 13 having one optical axis, formed by combining a plurality of lenses 21. The stacked lens structure 11 includes twenty five optical units 13 in total, five optical units in vertical and horizontal directions each.

In the camera module 1A, the optical axes of the plurality of optical units 13 are disposed so as to spread toward the outer side of the module. Due to this, it is possible to photograph a wide-angle image. Although the stacked lens structure 11 illustrated in FIG. 8B has a structure in which only three substrates with lenses 41 are stacked for the sake of simplicity, a larger number of substrates with lenses 41 may naturally be stacked.

Figure 8C:
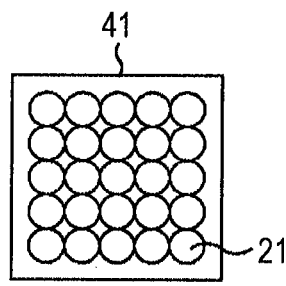
Figure 8D:
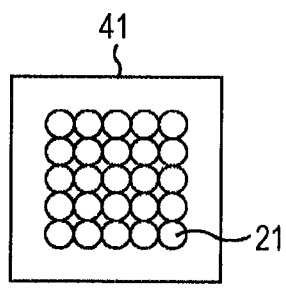
Figure 8E:
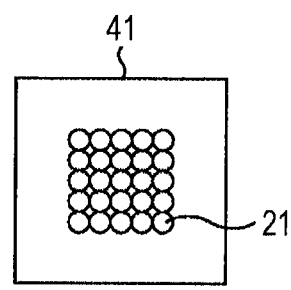

FIGS. 8C to 8E are diagrams illustrating planar shapes of the three substrates with lenses 41 that form the stacked lens structure 11.

FIG. 8C is a plan view of the substrate with lenses 41 on the top layer among the three layers, FIG. 8D is a plan view of the substrate with lenses 41 on the middle layer, and FIG. 8E is a plan view of the substrate with lenses 41 on the bottom layer. Since the camera module 1 is a multi-ocular wide-angle camera module, the diameter of the lens 21 and the lens-to-lens pitch increase as it ascends from the bottom layer to the top layer.

Figure 8F:
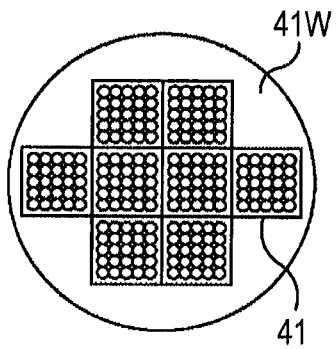
Figure 8G:
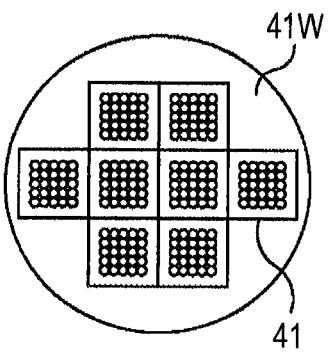
Figure 8H:
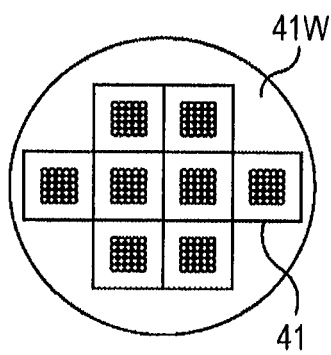

FIGS. 8F to 8H are plan views of the substrates with lenses 41W in the substrate state, for obtaining the substrates with lenses 41 illustrated in FIGS. 8C to 8E, respectively.

The substrate with lenses 41W illustrated in FIG. 8F illustrates the substrate state corresponding to the substrate with lenses 41 illustrated in FIG. 8C, the substrate with lenses 41W illustrated in FIG. 8G illustrates the substrate state corresponding to the substrate with lenses 41 illustrated in FIG. 8D, and the substrate with lenses 41W illustrated in FIG. 8H illustrates the substrate state corresponding to the substrate with lenses 41 illustrated in FIG. 8E.

The substrates with lenses 41W in the substrate state, illustrated in FIGS. 8F to 8H are configured to obtain eight camera modules 1A illustrated in FIG. 8A for one substrate.

It can be understood that between the substrates with lenses 41W of FIG. 8F to 8H, the lens-to-lens pitch of the substrate with lenses 41W on the top layer, in the substrates with lenses 41 of respective modules is different from that of the substrate with lenses 41W on the bottom layer, and that in each substrate with lenses 41W, the arrangement pitch of the substrates with lenses 41 of the respective modules is constant from the substrate with lenses 41W on the top layer to the substrate with lenses 41W on the bottom layer.

2. Second Embodiment of Camera Module

FIGS. 9A to 9H are diagrams illustrating a second embodiment of a camera module which uses a stacked lens structure to which the present technique is applied.

Figure 9A:
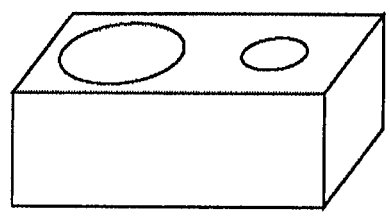
FIGS. 9A to 9H are diagrams illustrating a second embodiment of a camera module which uses a stacked lens structure to which the present technique is applied.
Figure 9B:
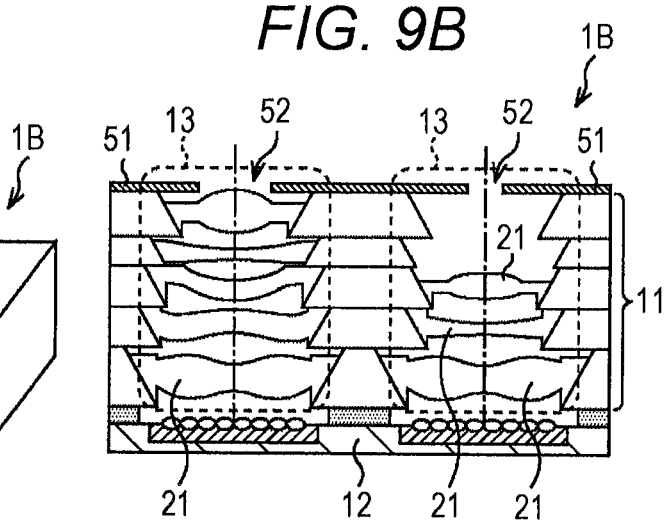

FIG. 9A is a schematic diagram illustrating an appearance of a camera module 1B as the second embodiment of the camera module 1. FIG. 9B is a schematic cross-sectional view of the camera module 1B.

The camera module 1B includes two optical units 13. The two optical units 13 include a diaphragm plate 51 on the top layer of the stacked lens structure 11. An opening 52 is formed in the diaphragm plate 51.

Although the camera module 1B includes two optical units 13, the two optical units 13 have different optical parameters. That is, the camera module 1B includes two optical units 13 having different optical performances. The two types of optical units 13 may include an optical unit 13 having a short focal distance for photographing a close-range view and an optical unit 13 having a long focal distance for photographing a distant view.

In the camera module 1B, since the optical parameters of the two optical units 13 are different, the numbers of lenses 21 of the two optical units 13 are different as illustrated in FIG. 9B. Moreover, in the lenses 21 on the same layer of the stacked lens structure 11 included in the two optical units 13, at least one of the diameter, the thickness, the surface shape, the volume, and the distance between adjacent lenses may be different. Due to this, for example, the lenses 21 of the camera module 1B may have such a planar shape that the two optical units 13 may have lenses 21 having the same diameter as illustrated in FIG. 9C and may have lenses 21 having different shapes as illustrated in FIG. 9D, and one of the two optical units 13 may have a void 21X without having the lens 21 as illustrated in FIG. 9E.

Figure 9C:
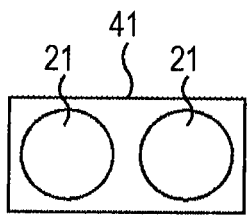
Figure 9D:
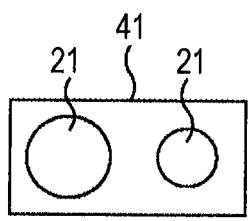
Figure 9E:
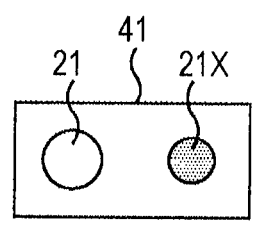
Figure 9F:
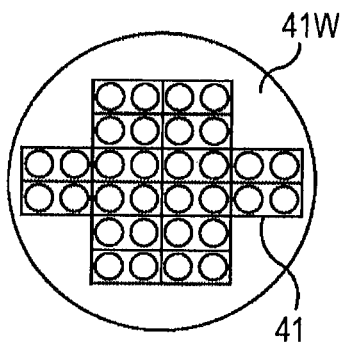
Figure 9G:
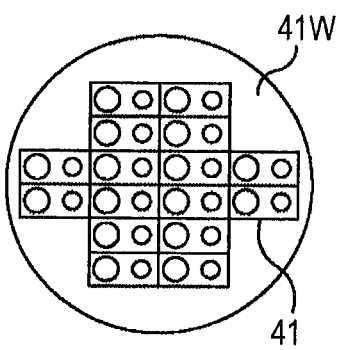
Figure 9H:
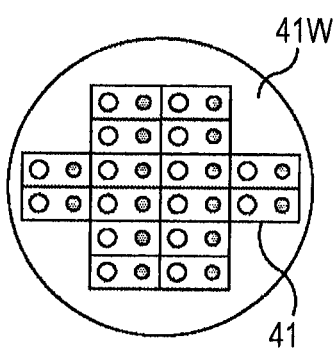

FIGS. 9F to 9H are plan views of the substrates with lenses 41W in a substrate state, for obtaining the substrates with lenses 41 illustrated in FIGS. 9C to 9E, respectively.

The substrate with lenses 41W illustrated in FIG. 9F illustrates the substrate state corresponding to the substrate with lenses 41 illustrated in FIG. 9C, the substrate with lenses 41W illustrated in FIG. 9G illustrates the substrate state corresponding to the substrate with lenses 41 illustrated in FIG. 9D, and the substrate with lenses 41W illustrated in FIG. 9H illustrates the substrate state corresponding to the substrate with lenses 41 illustrated in FIG. 9E.

The substrates with lenses 41W in the substrate state illustrated in FIGS. 9F to 9H are configured to obtain sixteen camera modules 1B illustrated in FIG. 9A for one substrate.

As illustrated in FIGS. 9F to 9H, in order to form the camera module 1B, lenses having the same shape or lenses having different shapes may be formed on the entire surface of the substrate with lenses 41W in the substrate state and lenses may be formed or not.

3. Third Embodiment of Camera Module

FIGS. 10A to 10F are diagrams illustrating a third embodiment of a camera module which uses a stacked lens structure to which the present technique is applied.

Figure 10A:
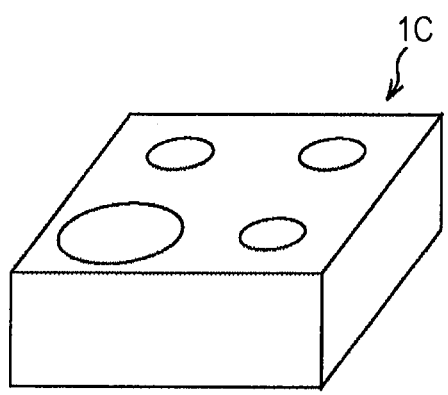
FIGS. 10A to 10F are diagrams illustrating a third embodiment of a camera module which uses a stacked lens structure to which the present technique is applied.
Figure 10B:
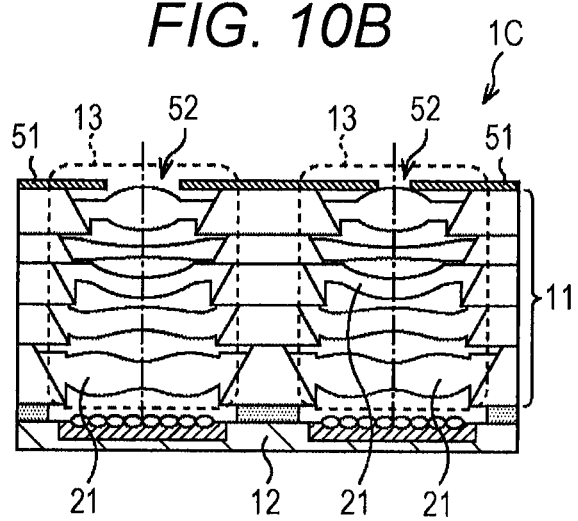

FIG. 10A is a schematic diagram illustrating an appearance of a camera module 1C as the third embodiment of the camera module 1. FIG. 10B is a schematic cross-sectional view of the camera module 1C.

The camera module 1C includes four optical units 13 in total, two in vertical and horizontal directions each, on a light incidence surface. The lenses 21 have the same shape in the four optical units 13.

Although the four optical units 13 include a diaphragm plate 51 on the top layer of the stacked lens structure 11, the sizes of the openings 52 of the diaphragm plates 51 are different among the four optical units 13. Due to this, the camera module 1C can realize the following camera module 1C, for example. That is, in an anti-crime surveillance camera, for example, in the camera module 1C which uses light receiving elements 12 including a light receiving pixel that includes three types of RGB color filters and receives three types of RGB light beams for the purpose of monitoring color images in the day time and a light receiving pixel that does not include RGB color filters for the purpose of monitoring monochrome images in the night time, it is possible to increase the size of the openings of the diaphragms of pixels for photographing monochrome images in the night time where the illuminance is low. Due to this, for example, the lenses 21 of one camera module 1C have such a planar shape that the lenses 21 included in the four optical units 13 have the same diameter as illustrated in FIG. 10C, and the size of the opening 52 of the diaphragm plate 51 is different depending on the optical unit 13 as illustrated in FIG. 10D.

Figure 10C:
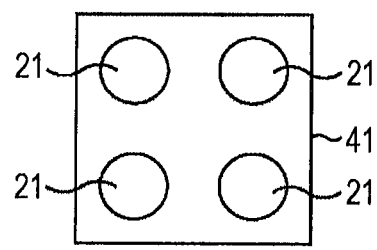
Figure 10D:
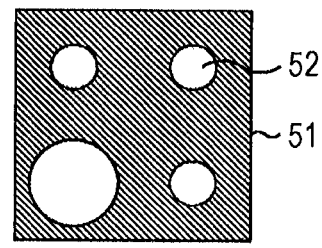
Figure 10E:
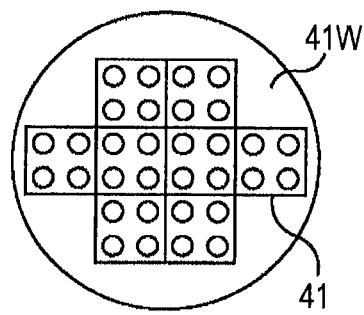
Figure 10F:
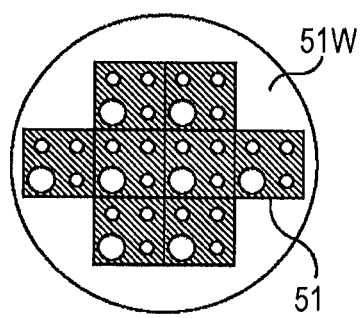

FIG. 10E is a plan view of the substrate with lenses 41W in the substrate state, for obtaining the substrate with lenses 41 illustrated in FIG. 10C. FIG. 10F is a plan view of the diaphragm plate 51W in the substrate state, for obtaining the diaphragm plate 51 illustrated in FIG. 10D.

The substrate with lenses 41W in the substrate state illustrated in FIG. 10E and the diaphragm plate 51W in the substrate state illustrated in FIG. 10F are configured to obtain eight camera modules 1C illustrated in FIG. 10A for one substrate.

As illustrated in FIG. 10F, in the diaphragm plate 51W in the substrate state, in order to form the camera module 1C, the sizes of the openings 52 can be set to be different for the respective optical units 13 included in the camera module 1C.

4. Fourth Embodiment of Camera Module

FIGS. 11A to 11D are diagrams illustrating a fourth embodiment of a camera module which uses a stacked lens structure to which the present technique is applied.

Figure 11A:
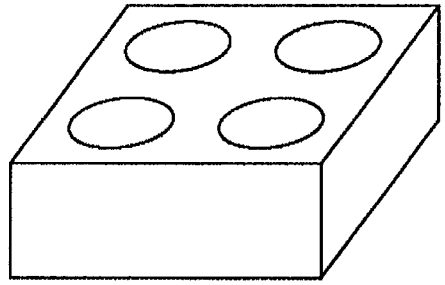
FIGS. 11A to 11D are diagrams illustrating a fourth embodiment of a camera module which uses a stacked lens structure to which the present technique is applied.
Figure 11B:
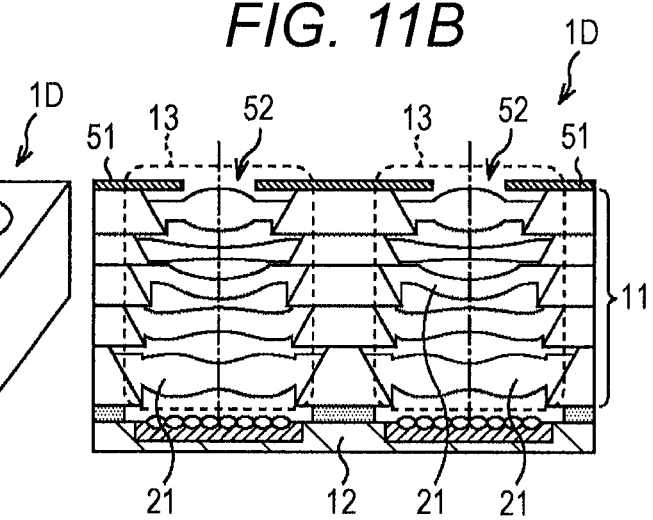

FIG. 11A is a schematic diagram illustrating an appearance of a camera module 1D as the fourth embodiment of the camera module 1. FIG. 11B is a schematic cross-sectional view of the camera module 1D.

The camera module 1D includes four optical units 13 in total, two in vertical and horizontal directions each, on a light incidence surface similarly to the camera module 1C. The lenses 21 have the same shape and the openings 52 of the diaphragm plates 51 have the same size in the four optical units 13.

In the camera module 1D, the optical axes of the two sets of optical units 13 disposed in the vertical and horizontal directions of the light incidence surface extend in the same direction. One-dot chain line illustrated in FIG. 11B indicates the optical axis of each of the optical units 13. The camera module 1D having such a structure is ideal for photographing a higher resolution image using a super-resolution technique than photographing using one optical unit 13.

In the camera module 1D, it is possible to obtain a plurality of images which are not necessarily identical while the optical axes being directed in the same direction by photographing images using a plurality of light receiving elements 12 disposed at different positions while the optical axes in each of the vertical and horizontal directions being directed in the same direction or by photographing images using light receiving pixels in different regions of one light receiving element 12. By combining image data of respective places, of the plurality of non-identical images, it is possible to obtain a high-resolution image. Due to this, the lenses 21 of one camera module 1D preferably have the same planar shape in the four optical units 13 as illustrated in FIG. 11C.

Figure 11C:
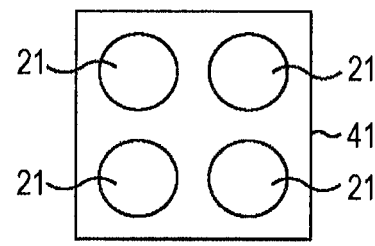
Figure 11D:
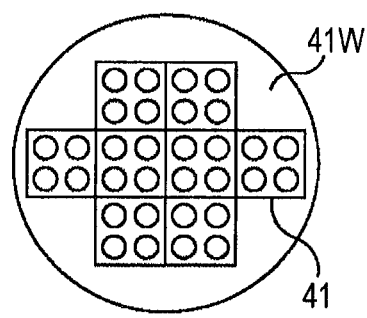

FIG. 11D is a plan view of the substrate with lenses 41W in the substrate state, for obtaining the substrate with lenses 41 illustrated in FIG. 11C. The substrate with lenses 41W in the substrate state is configured to obtain eight camera modules 1D illustrated in FIG. 11A for one substrate.

As illustrated in FIG. 11D, in the substrate with lenses 41W in the substrate state, in order to form the camera module 1D, the camera module 1D includes a plurality of lenses 21 and a plurality of module lens groups is disposed on the substrate at a fixed pitch.

5. Fifth Embodiment of Camera Module

FIGS. 12A to 12D are diagrams illustrating a fifth embodiment of a camera module which uses a stacked lens structure to which the present technique is applied.

Figure 12A:
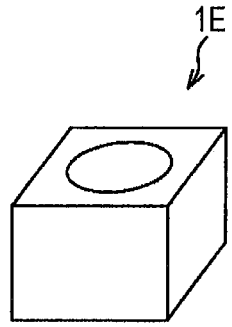
FIGS. 12A to 12D are diagrams illustrating a fifth embodiment of a camera module which uses a stacked lens structure to which the present technique is applied.
Figure 12B:
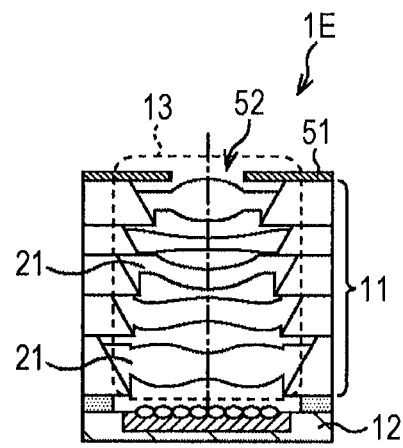

FIG. 12A is a schematic diagram illustrating an appearance of a camera module 1E as a fifth embodiment of the camera module 1. FIG. 12B is a schematic cross-sectional view of the camera module 1E.

The camera module 1E is a monocular camera module in which one optical unit 13 having one optical axis is provided in the camera module 1E.

Figure 12C:
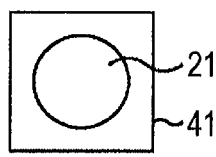

FIG. 12C is a plan view of the substrate with lenses 41, illustrating a planar shape of the lenses 21 of the camera module 1E. The camera module 1E includes one optical unit 13.

Figure 12D:
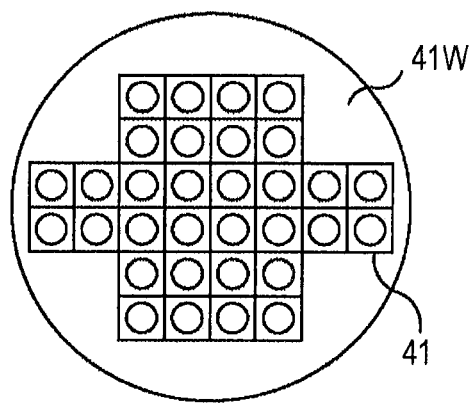

FIG. 12D is a plan view of the substrate with lenses 41W in the substrate state, for obtaining the substrate with lenses 41 illustrated in FIG. 12C. The substrate with lenses 41W in the substrate state is configured to obtain thirty two camera modules 1E illustrated in FIG. 12A for one substrate.

As illustrated in FIG. 12D, in the substrate with lenses 41W in the substrate state, a plurality of lenses 21 for the camera module 1E is disposed on the substrate at a fixed pitch.

6. Detailed Configuration of Camera Module of Fourth Embodiment

Next, a detailed configuration of the camera module 1D according to the fourth embodiment illustrated in FIGS. 11A to 11D will be described with reference to FIG. 13.

Figure 13:
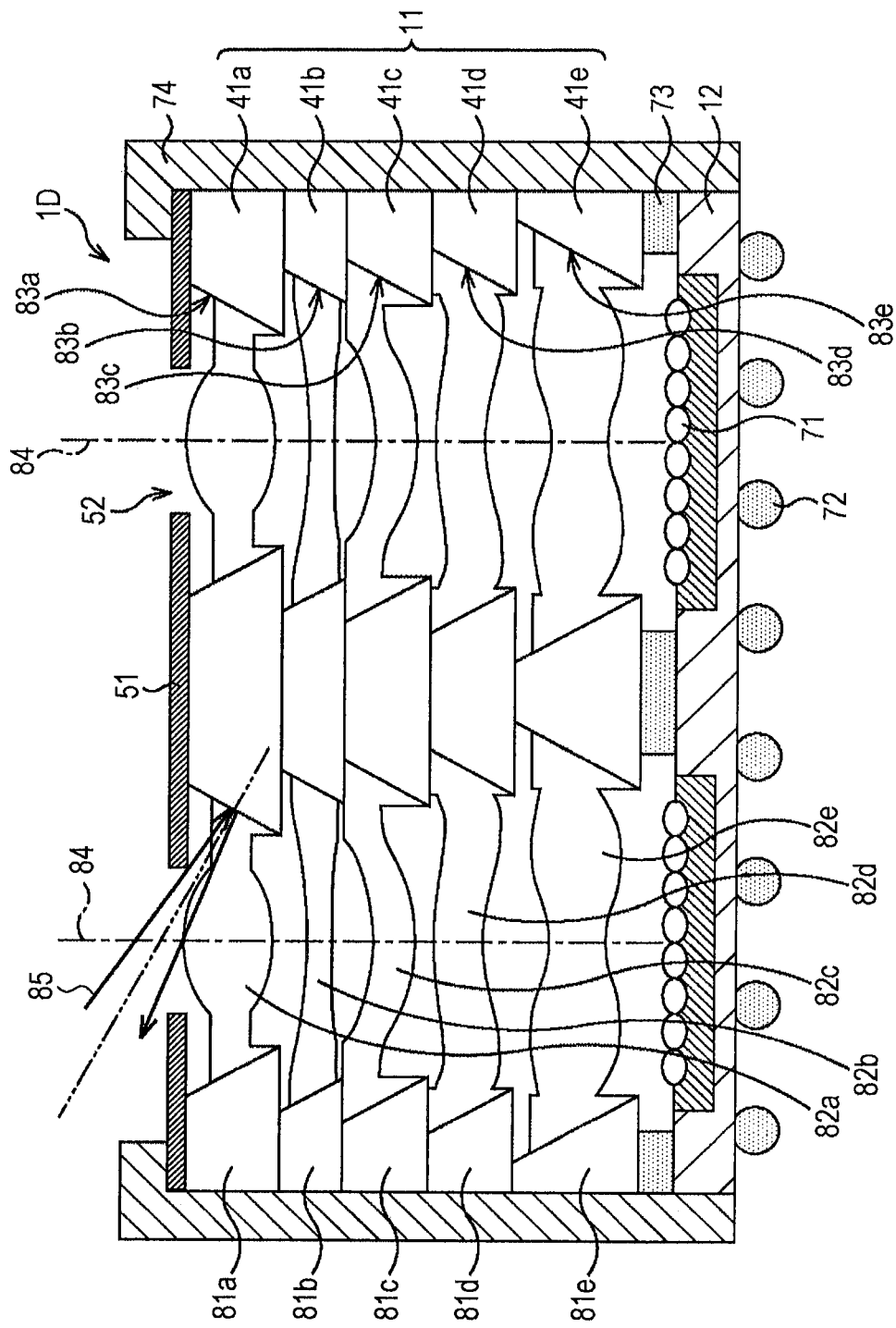
FIG. 13 is a diagram illustrating a detailed configuration of the camera module according to the fourth embodiment.

FIG. 13 is a cross-sectional view of the camera module 1D illustrated in FIG. 11B.

The camera module 1D is configured to include a stacked lens structure 11 in which a plurality of substrates with lenses 41a to 41e are stacked and a light receiving element 12. The stacked lens structure 11 includes a plurality of optical units 13. One-dot chain line 84 indicates an optical axis of each of the optical units 13. The light receiving element 12 is disposed on the lower side of the stacked lens structure 11. In the camera module 1D, light entering the camera module 1D from above passes through the stacked lens structure 11 and the light is received by the light receiving element 12 disposed on the lower side of the stacked lens structure 11.

The stacked lens structure 11 includes five stacked substrates with lenses 41a to 41e. When the five substrates with lenses 41a to 41e are not distinguished particularly, the substrates with lenses will be referred to simply as substrates with lenses 41.

A cross-sectional shape of a through-hole 83 of the substrates with lenses 41 that form the stacked lens structure 11 has a so-called downward tapered shape such that an opening width decreases as it advances toward the lower side (the side on which the light receiving element 12 is disposed).

A diaphragm plate 51 is disposed on the stacked lens structure 11. The diaphragm plate 51 has a layer formed of a material having a light absorbing property or a light blocking property, for example. An opening 52 is formed in the diaphragm plate 51.

The light receiving element 12 is formed of a front or back-illuminated complementary metal oxide semiconductor (CMOS) image sensor, for example. On-chip lenses 71 are formed on a surface on an upper side of the light receiving element 12 close to the stacked lens structure 11, and external terminals 72 for inputting and outputting signals are formed on a surface on a lower side of the light receiving element 12.

The stacked lens structure 11, the light receiving element 12, the diaphragm plate 51, and the like are accommodated in a lens barrel 74.

A structure material 73 is disposed on the upper side of the light receiving element 12. The stacked lens structure 11 and the light receiving element 12 are fixed by the structure material 73. The structure material 73 is an epoxy-based resin, for example.

In the present embodiment, although the stacked lens structure 11 includes five stacked substrates with lenses 41a to 41e, the number of stacked substrates with lenses 41 is not particularly limited as long as two substrates with lenses or more are stacked.

Each of the substrates with lenses 41 that form the stacked lens structure 11 is configured by adding a lens resin portion 82 to a support substrate 81. The support substrate 81 has the through-hole 83, and the lens resin portion 82 is formed on the inner side of the through-hole 83. The lens resin portion 82 is a portion which includes the above-described lenses 21 and extends up to the support substrate 81 and which is integrated with a portion that supports the lens 21 by a material that forms the lens 21.

When the support substrates 81, the lens resin portions 82, or the through-holes 83 of the respective substrates with lenses 41a to 41e are distinguished, the respective components will be referred to as support substrates 81a to 81e, lens resin portions 82a to 82e, or through-holes 83a to 83e so as to correspond to the substrates with lenses 41a to 41e as illustrated in FIG. 13.

<Detailed Description of Lens Resin Portion>

Next, the shape of the lens resin portion 82 will be described by way of an example of the lens resin portion 82a of the substrate with lenses 41a.

Figure 14:
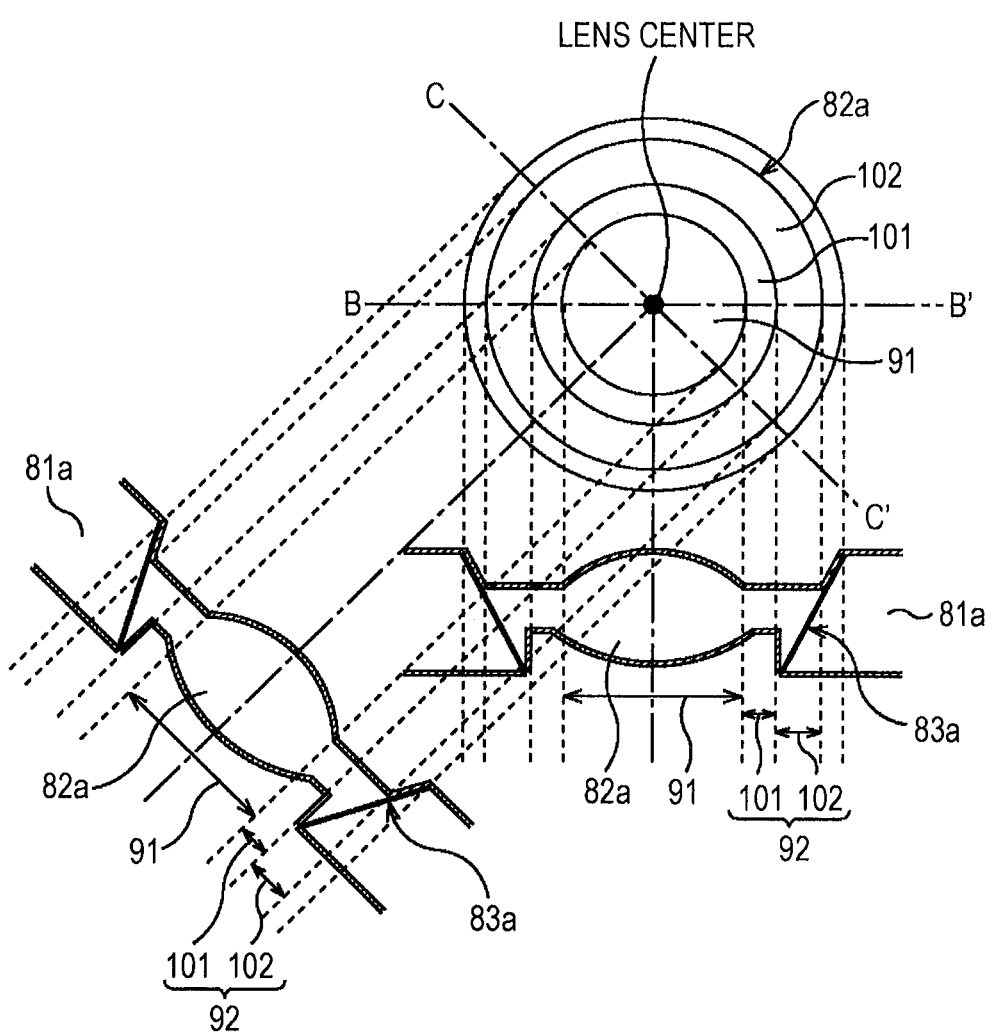
FIG. 14 illustrates a plan view and cross-sectional views of a support substrate and a lens resin portion.

FIG. 14 illustrates a plan view and cross-sectional views of the support substrate 81a and the lens resin portion 82a that form the substrate with lenses 41a.

The cross-sectional views of the support substrate 81a and the lens resin portion 82a illustrated in FIG. 14 are cross-sectional views taken along lines B-B' and C-C' in the plan view.

The lens resin portion 82a is a portion formed integrally by the material that forms the lens 21 and includes a lens portion 91 and a support portion 92. In the above description, the lens 21 corresponds to the entire lens portion 91 or the entire lens resin portion 82a.

The lens portion 91 is a portion having the performance of a lens, and in other words, is "a portion that refracts light so that light converges or diverges" or "a portion having a curved surface such as a convex surface, a concave surface, or an aspherical surface, or a portion in which a plurality of polygons used in a lens which uses a Fresnel screen or a diffraction grating are continuously disposed".

The support portion 92 is a portion that extends from the lens portion 91 up to the support substrate 81a to support the lens portion 91. The support portion 92 includes an arm portion 101 and a leg portion 102 and is positioned at the outer circumference of the lens portion 91.

The arm portion 101 is a portion that is disposed on the outer side of the lens portion 91 in contact with the lens portion 91 and extends outward from the lens portion 91 in a constant thickness. The leg portion 102 is a portion of the support portion 92 other than the arm portion 101 and includes a portion that is in contact with the side wall of the through-hole 83a. The thickness of the resin in the leg portion 102 is preferably larger than that of the arm portion 101.

The planar shape of the through-hole 83a formed in the support substrate 81a is circular, and the cross-sectional shape is naturally the same regardless of the diametrical direction. The cross-sectional shape of the lens resin portion 82a which is the shape determined by the upper and lower molds during forming of a lens is the same regardless of the diametrical direction.

Figure 15:
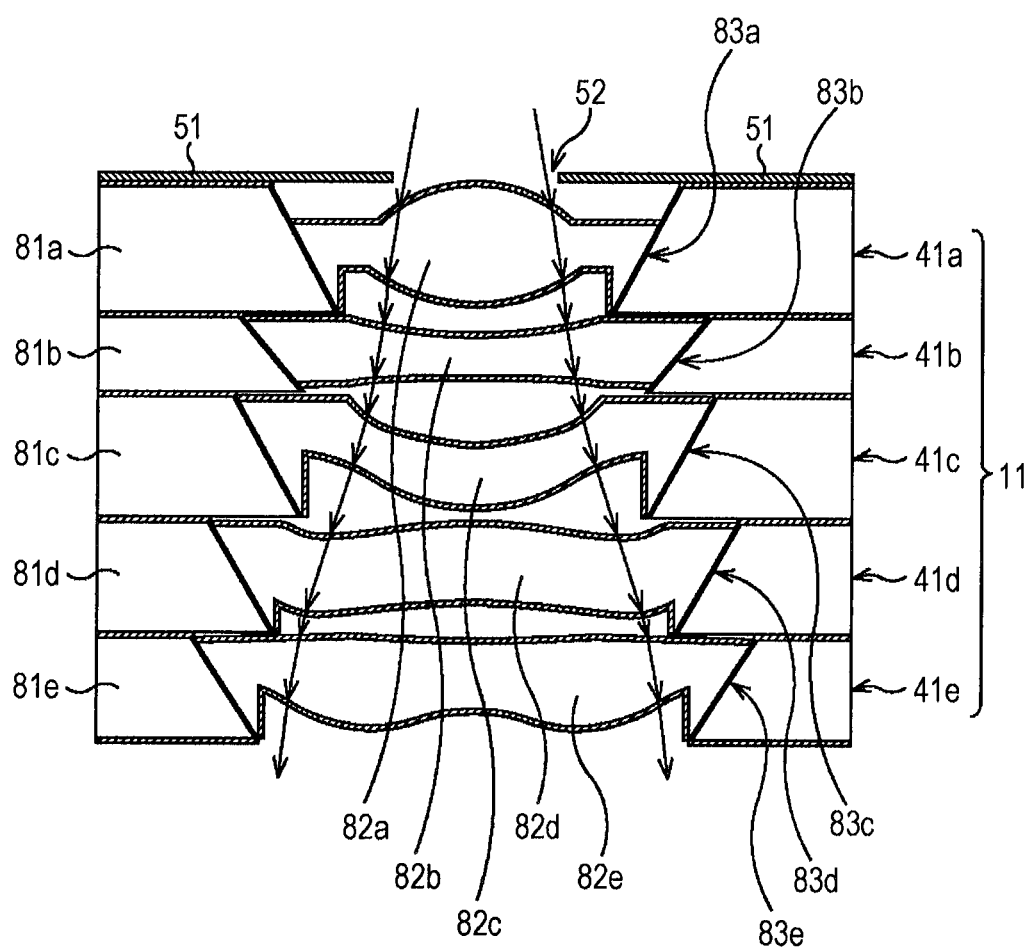
FIG. 15 is a cross-sectional view illustrating a stacked lens structure and a diaphragm plate.

FIG. 15 is a cross-sectional view illustrating the stacked lens structure 11 and the diaphragm plate 51 which are part of the camera module 1D illustrated in FIG. 13.

In the camera module 1D, after light entering the module is narrowed by the diaphragm plate 51, the light is widened inside the stacked lens structure 11 and is incident on the light receiving element 12 (not illustrated in FIG. 15) disposed on the lower side of the stacked lens structure 11. That is, in a general view of the entire stacked lens structure 11, the light entering the module moves while widening substantially in a fan shape toward the lower side from the opening 52 of the diaphragm plate 51. Due to this, as an example of the size of the lens resin portion 82 provided in the stacked lens structure 11, in the stacked lens structure 11 illustrated in FIG. 15, the lens resin portion 82a provided in the substrate with lenses 41a disposed immediately below the diaphragm plate 51 is the smallest, and the lens resin portion 82e provided in the substrate with lenses 41e disposed on the bottom layer of the stacked lens structure 11 is the largest.

If the lens resin portion 82 of the substrate with lenses 41 has a constant thickness, it is more difficult to manufacture a larger lens than a smaller lens. This is because a large lens is likely to be deformed due to a load applied to the lens when manufacturing the lens and it is difficult to maintain the strength. Due to this, it is preferable to increase the thickness of a large lens to be larger than the thickness of a small lens. Thus, in the stacked lens structure 11 illustrated in FIG. 15, the thickness of the lens resin portion 82e provided in the substrate with lenses 41e disposed on the bottom layer is the largest among the lens resin portions 82.

The stacked lens structure 11 illustrated in FIG. 15 has at least one of the following features in order to increase the degree of freedom in a lens design.

(1) The thickness of the support substrate 81 is different at least among the plurality of substrates with lenses 41 that forms the stacked lens structure 11. For example, the thickness of the support substrate 81 in the substrate with lenses 41 on the bottom layer is the largest.

(2) An opening width of the through-hole 83 provided in the substrate with lenses 41 is different at least among the plurality of substrates with lenses 41 that forms the stacked lens structure 11. For example, the opening width of the through-hole 83 in the substrate with lenses 41 on the bottom layer is the largest.

(3) The diameter of the lens portion 91 provided in the substrate with lenses 41 is different at least among the plurality of substrates with lenses 41 that forms the stacked lens structure 11. For example, the diameter of the lens portion 91 in the substrate with lenses 41 on the bottom layer is the largest.

(4) The thickness of the lens portion 91 provided in the substrate with lenses 41 is different at least among the plurality of substrates with lenses 41 that forms the stacked lens structure 11. For example, the thickness of the lens portion 91 in the substrate with lenses 41 on the bottom layer is the largest.

(5) The distance between the lenses provided in the substrate with lenses 41 is different at least among the plurality of substrates with lenses 41 that forms the stacked lens structure 11.

(6) The volume of the lens resin portion 82 provided in the substrate with lenses 41 is different at least among the plurality of substrates with lenses 41 that forms the stacked lens structure 11. For example, the volume of the lens resin portion 82 in the substrate with lenses 41 on the bottom layer is the largest.

(7) The material of the lens resin portion 82 provided in the substrate with lenses 41 is different at least among the plurality of substrates with lenses 41 that forms the stacked lens structure 11.

In general, light incident on a camera module includes vertical incident light and oblique incident light. A large part of the oblique incident light strikes the diaphragm plate 51 and is absorbed therein or is reflected outside the camera module 1D. The oblique incident light which is not narrowed by the diaphragm plate 51 may strike the side wall of the through-hole 83 depending on an incidence angle thereof and may be reflected therefrom.

The moving direction of the reflected light of the oblique incident light is determined by the incidence angle of oblique incident light 85 and the angle of the side wall of the through-hole 83 as illustrated in FIG. 13. When the opening of the through-hole 83 has a so-called fan shape such that the opening width increases as it advances from the incidence side toward the light receiving element 12, if the oblique incident light 85 of a specific incidence angle which is not narrowed by the diaphragm plate 51 strikes the side wall of the through-hole 83, the oblique incident light may be reflected in the direction of the light receiving element 12, and the reflected light may become stray light or noise light.

However, in the stacked lens structure 11 illustrated in FIG. 13, as illustrated in FIG. 15, the through-hole 83 has a so-called downward tapered shape such that the opening width decreases as it advances toward the lower side (the side on which the light receiving element 12 is disposed). In the case of this shape, the oblique incident light 85 striking the side wall of the through-hole 83 is reflected in the upper direction (so-called the incidence side direction) rather than the lower direction (so-called the direction of the light receiving element 12). Due to this, an effect or an advantage of suppressing the occurrence of stray light or noise light is obtained.

A light absorbing material may be disposed in the side wall of the through-hole 83 of the substrate with lenses 41 in order to suppress light which strikes the side wall and is reflected therefrom.

As an example, when light (for example, visible light) of a wavelength that is to be received when the camera module 1D is used as a camera is first light and light (for example, UV light) of a wavelength different from the first light is second light, a material obtained by dispersing carbon particles as a material absorbing the first light (visible light) into a resin that is cured by the second light (UV light) may be applied or sprayed to the surface of the support substrate 81, the resin of the side wall portion only of the through-hole 83 may be cured by irradiation with the second light (UV light), and the resin in the other region may be removed. In this way, a layer of a material having a property of absorbing the first light (visible light) may be formed on the side wall of the through-hole 83.

The stacked lens structure 11 illustrated in FIG. 15 is an example of a structure in which the diaphragm plate 51 is disposed on top of the plurality of stacked substrates with lenses 41. The diaphragm plate 51 may be disposed by being inserted in any of the intermediate substrates with lenses 41 rather than on top of the plurality of stacked substrates with lenses 41.

As still another example, instead of providing the planar diaphragm plate 51 separately from the substrate with lenses 41, a layer of a material having a light absorbing property may be formed on the surface of the substrate with lenses 41 so as to function as a diaphragm. For example, a material obtained by dispersing carbon particles as a material absorbing the first light (visible light) in a resin that is cured by the second light (UV light) may be applied or sprayed to the surface of the substrate with lenses 41, the resin in a region other than a region through which light is to pass when the layer functions as a diaphragm may be irradiated with the second light (UV light) to cure the resin so as to remain, and the resin in the region that is not cured (that is, the region through which light is to pass when the layer functions as a diaphragm) may be removed. In this way, the diaphragm may be formed on the surface of the substrate with lenses 41.

The substrate with lenses 41 in which the diaphragm is formed on the surface may be the substrate with lenses 41 disposed on the top layer of the stacked lens structure 11 or may be the substrate with lenses 41 which is an inner layer of the stacked lens structure 11.

The stacked lens structure 11 illustrated in FIG. 15 has a structure in which the substrates with lenses 41 are stacked.

As another embodiment, the stacked lens structure 11 may have a structure which includes a plurality of substrates with lenses 41 and at least one support substrate 81 which does not have the lens resin portion 82. In this structure, the support substrate 81 which does not have the lens resin portion 82 may be disposed on the top layer or the bottom layer of the stacked lens structure 11 and may be disposed as an inner layer of the stacked lens structure 11. This structure provides an effect or an advantage, for example, that the distance between the plurality of lenses included in the stacked lens structure 11 and the distance between the lens resin portion 82 on the bottom layer of the stacked lens structure 11 and the light receiving element 12 disposed on the lower side of the stacked lens structure 11 can be set arbitrarily.

Alternatively, this structure provides an effect or an advantage that, when the opening width of the support substrate 81 which does not have the lens resin portion 82 is set appropriately and a material having a light absorbing property is disposed in a region excluding the opening, the material can function as a diaphragm plate.

7. Sixth Embodiment of Camera Module

Figure 16:
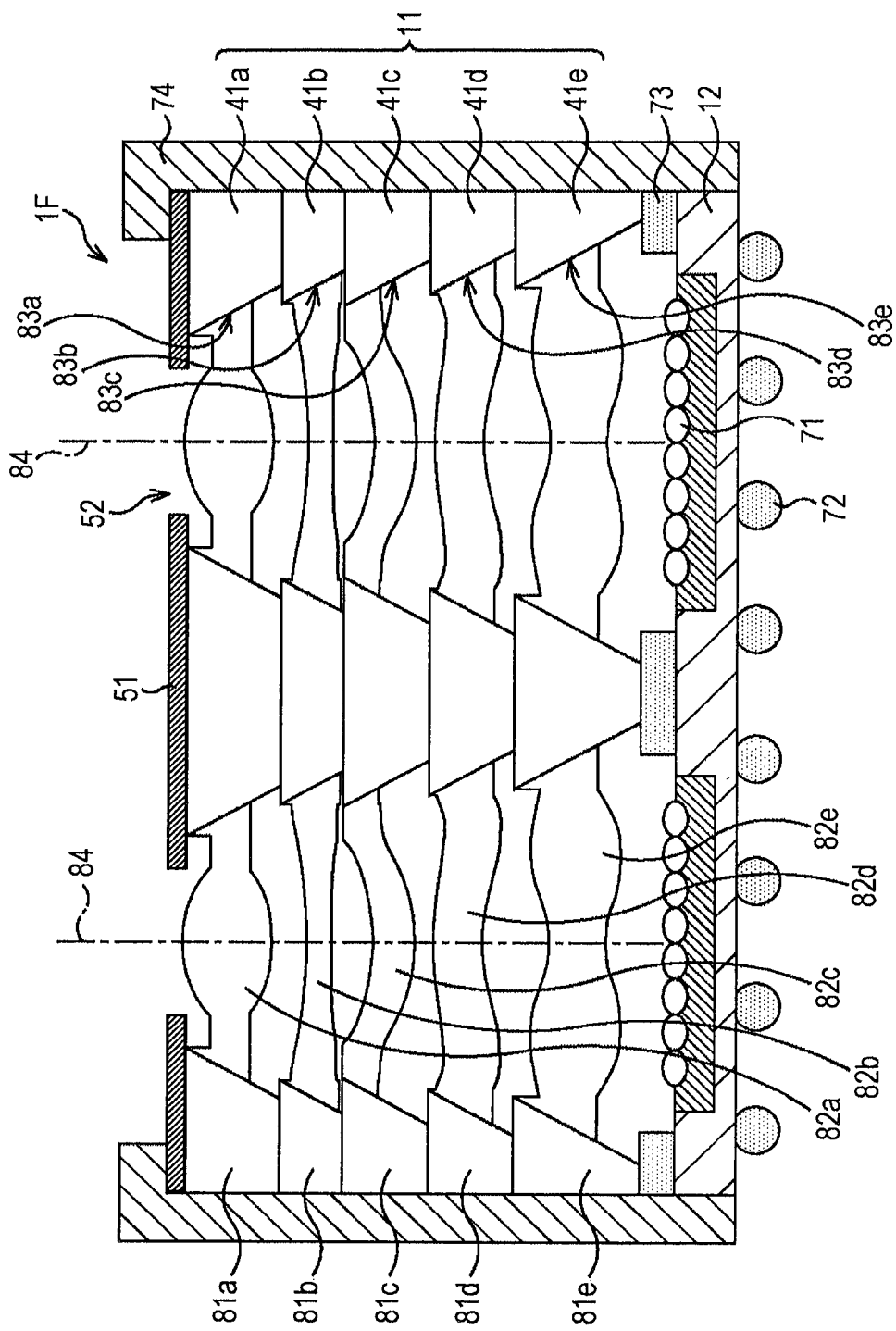
FIG. 16 is a diagram illustrating a sixth embodiment of a camera module which uses a stacked lens structure to which the present technique is applied.

FIG. 16 is a diagram illustrating a sixth embodiment of a camera module which uses a stacked lens structure to which the present technique is applied.

In FIG. 16, the portions corresponding to those of the fourth embodiment illustrated in FIG. 13 will be denoted by the same reference numerals, and different portions from those of the camera module 1D illustrated in FIG. 13 will be described mainly.

In a camera module 1F illustrated in FIG. 16, similarly to the camera module 1D illustrated in FIG. 13, after incident light is narrowed by the diaphragm plate 51, the light is widened inside the stacked lens structure 11 and is incident on the light receiving element 12 disposed on the lower side of the stacked lens structure 11. That is, in a general view of the entire stacked lens structure 11, the light moves while widening substantially in a fan shape toward the lower side from the opening 52 of the diaphragm plate 51.

The camera module 1F illustrated in FIG. 16 is different from the camera module 1D illustrated in FIG. 13 in that the cross-sectional shape of the through-holes 83 of the substrates with lenses 41 that form the stacked lens structure 11 has a so-called fan shape such that the opening width increases as it advances toward the lower side (the side on which the light receiving element 12 is disposed).

The stacked lens structure 11 of the camera module 1F has a structure in which incident light moves while widening in a fan shape from the opening 52 of the diaphragm plate 51 toward the lower side. Thus, such a fan shape that the opening width of the through-hole 83 increases toward the lower side makes the support substrate 81 less likely to obstruct an optical path than such a downward tapered shape that the opening width of the through-hole 83 decreases toward the lower side. Due to this, an effect of increasing the degree of freedom in a lens design is obtained.

Moreover, in the case of the downward tapered shape that the opening width of the through-hole 83 decreases toward the lower side, the cross-sectional area in the substrate plane direction of the lens resin portion 82 including the support portion 92 has a specific size in the lower surface of the lens resin portion 82 in order to transmit light entering the lens 21. On the other hand, the cross-sectional area increases as it advances from the lower surface of the lens resin portion 82 toward the upper surface.

In contrast, in the case of the fan shape that the opening width of the through-hole 83 increases toward the lower side, the cross-sectional area in the lower surface of the lens resin portion 82 is substantially the same as the case of the downward tapered shape. However, the cross-sectional area decreases as it advances from the lower surface of the lens resin portion 82 toward the upper surface.

Due to this, the structure in which the opening width of the through-hole 83 increases toward the lower side provides an effect or an advantage that the size of the lens resin portion 82 including the support portion 92 can be reduced. As a result, it is possible to provide an effect or an advantage that the above-described difficulty in forming lenses, occurring when the lens is large can be reduced.

8. Seventh Embodiment of Camera Module

FIG. 17 is a diagram illustrating a seventh embodiment of a camera module which uses a stacked lens structure to which the present technique is applied.

In FIG. 17, the portions corresponding to those of the fourth embodiment illustrated in FIG. 13 will be denoted by the same reference numerals, and different portions from those of the camera module 1D illustrated in FIG. 13 will be described mainly.

In a camera module 1G illustrated in FIG. 17, the shapes of the lens resin portions 82 and the through-holes 83 of the substrates with lenses 41 that form the stacked lens structure 11 are different from those of the camera module 1D illustrated in FIG. 13.

The stacked lens structure 11 of the camera module 1G includes both a substrate with lenses 41 in which the through-hole 83 has a so-called downward tapered shape such that the opening width decreases toward the lower side (the side on which the light receiving element 12 is disposed) and a substrate with lenses 41 in which the through-hole 83 has a so-called fan shape such that the opening width increases toward the lower side.

In the substrate with lenses 41 in which the through-hole 83 has a so-called downward tapered shape that the opening width decreases toward the lower side, the oblique incident light 85 striking the side wall of the through-hole 83 is reflected in the upper direction (so-called the incidence side direction) as described above. Due to this, an effect or an advantage of suppressing the occurrence of stray light or noise light is obtained.

In the stacked lens structure 11 illustrated in FIG. 17, a plurality of substrates with lenses 41 in which the through-hole 83 has the so-called downward tapered shape that the opening width decreases toward the lower side is used particularly on the upper side (the incidence side) among the plurality of substrates with lenses 41 that forms the stacked lens structure 11.

In the substrate with lenses 41 in which the through-hole 83 has the so-called fan shape that the opening width increases toward the lower side, the support substrate 81 provided in the substrate with lenses 41 is rarely likely to obstruct the optical path as described above. Due to this, an effect or an advantage of increasing the degree of freedom in a lens design or reducing the size of the lens resin portion 82 including the support portion 92 provided in the substrate with lenses 41 is obtained.

In the stacked lens structure 11 illustrated in FIG. 17, light moves while being widened in a fan shape from the diaphragm toward the lower side. Thus, the lens resin portion 82 provided in several substrates with lenses 41 disposed on the lower side among the plurality of substrates with lenses 41 that forms the stacked lens structure 11 has a large size. When the through-hole 83 having the fan shape is used in such a large lens resin portion 82, a remarkable effect of reducing the size of the lens resin portion 82 is obtained.

Thus, in the stacked lens structure 11 illustrated in FIG. 17, a plurality of substrates with lenses 41 in which the through-hole 83 has the so-called fan shape that the opening width increases toward the lower side is used particularly on the lower side among the plurality of substrates with lenses 41 that forms the stacked lens structure 11.

9. Detailed Configuration of Substrate with Lenses

Next, a detailed configuration of the substrate with lenses 41 will be described.

Figure 18A:
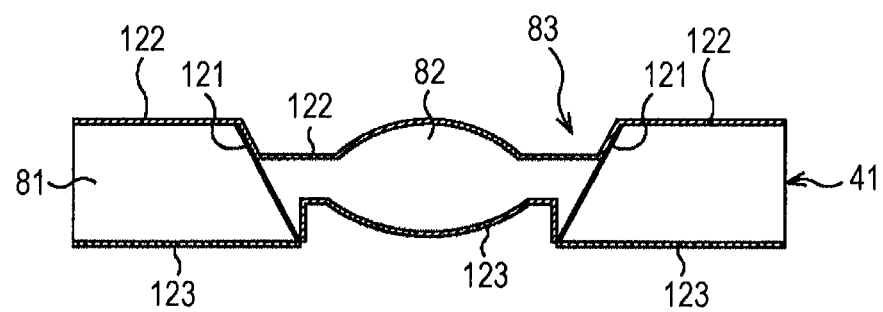
FIGS. 18A to 18C are cross-sectional views illustrating a detailed configuration of a substrate with lenses.
Figure 18B:
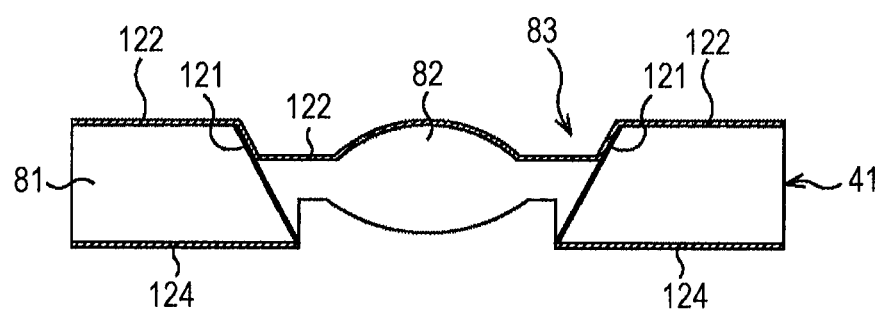
Figure 18C:
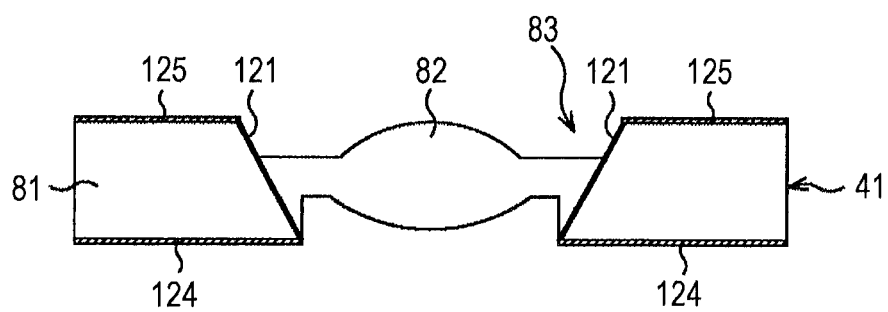

FIGS. 18A to 18C are cross-sectional views illustrating a detailed configuration of the substrate with lenses 41.

Although FIGS. 18A to 18C illustrate the substrate with lenses 41a on the top layer among the five substrates with lenses 41a to 41e, the other substrates with lenses 41 are configured similarly.

The substrate with lenses 41 may have any one of the configurations illustrated in FIGS. 18A to 18C.

In the substrate with lenses 41 illustrated in FIG. 18A, the lens resin portion 82 is formed so as to block the through-hole 83 when seen from the upper surface in relation to the through-hole 83 formed in the support substrate 81. As described with reference to FIG. 14, the lens resin portion 82 includes the lens portion 91 (not illustrated) at the center and the support portion 92 (not illustrated) in the periphery.

A film 121 having a light absorbing property or a light blocking property is formed on the side wall of the through-hole 83 of the substrate with lenses 41 in order to prevent ghost or flare resulting from reflection of light. Such a film 121 will be referred to as a light blocking film 121 for the sake of convenience.

An upper surface layer 122 containing oxides, nitrides, or other insulating materials is formed on an upper surface of the support substrate 81 and the lens resin portion 82, and a lower surface layer 123 containing oxides, nitrides, or other insulating materials is formed on a lower surface of the support substrate 81 and the lens resin portion 82.

As an example, the upper surface layer 122 forms an anti-reflection film in which a low refractive index film and a high refractive index film are stacked alternately in a plurality of layers. The anti-reflection film can be formed by alternately stacking a low refractive index film and a high refractive index film in four layers in total. For example, the low refractive index film is formed of an oxide film such as $SiO_x$ ($1 \leq x \leq 2$), SiOC, or SiOF, and the high refractive index film is formed of a metal oxide film such as TiO, TaO, or $Nb_2O_5$.

The configuration of the upper surface layer 122 may be designed so as to obtain a desired anti-reflection performance using an optical simulation, for example, and the material, the thickness, the number of stacked layers, and the like of the low refractive index film and the high refractive index film are not particularly limited. In the present embodiment, the top surface of the upper surface layer 122 is a low refractive index film which has a thickness of 20 to 1000 nm, for example, a density of 2.2 to 2.5 $g/cm^3$, for example, and a flatness of approximately 1 nm or smaller in root mean roughness Rq (RMS), for example. Moreover, the upper surface layer 122 also serve as a bonding film when it is bonded to other substrates with lenses 41, which will be described in detail later.

As an example, the upper surface layer 122 may be an anti-reflection film in which a low refractive index film and a high refractive index film are stacked alternately in a plurality of layers, and among such anti-reflection films, the upper surface layer 122 may be an anti-reflection film of an inorganic material. As another example, the upper surface layer 122 may be a single-layer film containing oxides, nitrides, or other insulating materials, and among such single-layer films, the upper surface layer 122 may be a film of an inorganic material.

As an example, the lower surface layer 123 may be an anti-reflection film in which a low refractive index film and a high refractive index film are stacked alternately in a plurality of layers, and among such anti-reflection films, the lower surface layer 123 may be an anti-reflection film of an inorganic material. As another example, the lower surface layer 123 may be a single-layer film containing oxides, nitrides, or other insulating materials, and among such single-layer films, the lower surface layer 123 may be a film of an inorganic material.

As for the substrates with lenses 41 illustrated in FIGS. 18B and 18C, only different portions from those of the substrate with lenses 41 illustrated in FIG. 18A will be described.

In the substrate with lenses 41 illustrated in FIG. 18B, a film formed on the lower surface of the support substrate 81 and the lens resin portion 82 is different from that of the substrate with lenses 41 illustrated in FIG. 18A.

In the substrate with lenses 41 illustrated in FIG. 18B, a lower surface layer 124 containing oxides, nitrides, or other insulating materials is formed on the lower surface of the support substrate 81, and the lower surface layer 124 is not formed on the lower surface of the lens resin portion 82. The lower surface layer 124 may be formed of the same material as or a different material from the upper surface layer 122.

Such a structure can be formed by a manufacturing method of forming the lower surface layer 124 on the lower surface of the support substrate 81 before forming the lens resin portion 82 and then forming the lens resin portion 82. Alternatively, such a structure can be formed by forming a mask on the lens resin portion 82 after forming the lens resin portion 82 and then depositing a film that forms the lower surface layer 124 to the lower surface of the support substrate 81 according to PVD, for example, in a state in which a mask is not formed on the support substrate 81.

In the substrate with lenses 41 illustrated in FIG. 18C, the upper surface layer 125 containing oxides, nitrides, or other insulating materials is formed on the upper surface of the support substrate 81, and the upper surface layer 125 is not formed on the upper surface of the lens resin portion 82.

Similarly, in the lower surface of the substrate with lenses 41, the lower surface layer 124 containing oxides, nitrides, or other insulating materials is formed on the lower surface of the support substrate 81, and the lower surface layer 124 is not formed on the lower surface of the lens resin portion 82.

Such a structure can be formed by a manufacturing method of forming the upper surface layer 125 and the lower surface layer 124 on the support substrate 81 before the lens resin portion 82 is formed and then forming the lens resin portion 82. Alternatively, such a structure can be formed by forming a mask on the lens resin portion 82 after forming the lens resin portion 82 and then depositing a film that forms the upper surface layer 125 and the lower surface layer 124 to the surface of the support substrate 81 according to PVD, for example, in a state in which a mask is not formed on the support substrate 81. The lower surface layer 124 and the upper surface layer 125 may be formed of the same material or different materials.

The substrate with lenses 41 can be formed in the above-described manner.

10. Method of Manufacturing Substrate with Lenses

Next, a method of manufacturing the substrate with lenses 41 will be described with reference to FIGS. 19A and 19B to FIG. 29.

Figure 19A:
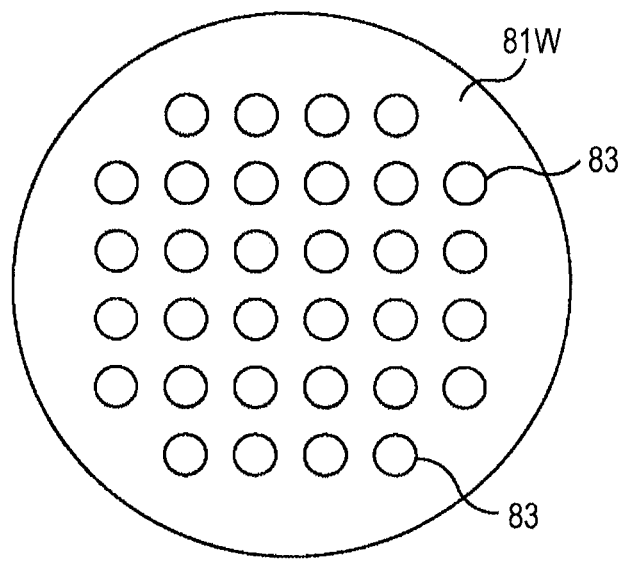
FIGS. 19A to 19B are diagrams illustrating a method of manufacturing the substrate with lenses.

First, a support substrate 81W in a substrate state in which a plurality of through-holes 83 is formed is prepared. A silicon substrate used in general semiconductor devices, for example, can be used as the support substrate 81W. The support substrate 81W has such as circular shape as illustrated in FIG. 19A, for example, and the diameter thereof is 200 mm or 300 mm, for example. The support substrate 81W may be a glass substrate, a resin substrate, or a metal substrate, for example, other than the silicon substrate.

Figure 19B:
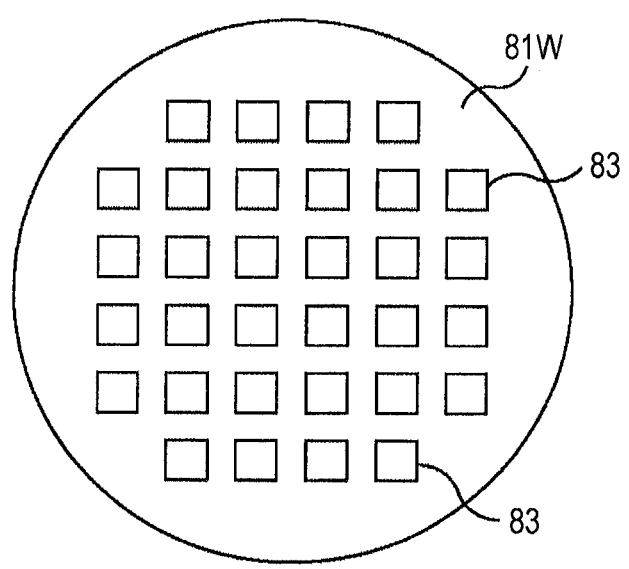

Moreover, in the present embodiment, although the planar shape of the through-hole 83 is circular as illustrated in FIG. 19A, the planar shape of the through-hole 83 may be polygonal such as rectangular as illustrated in FIG. 19B.

The opening width of the through-hole 83 may be between approximately 100 μm and approximately 20 mm, for example. In this case, for example, approximately 100 to 5,000,000 through-holes 83 can be disposed in the support substrate 81W.

In the present specification, the size of the through-hole 83 in the plane direction of the substrate with lenses 41 is referred to as an opening width. The opening width means the length of one side when the planar shape of the through-hole 83 is rectangular and means the diameter when the planar shape of the through-hole 83 is circular unless particularly stated otherwise.

Figure 20A:
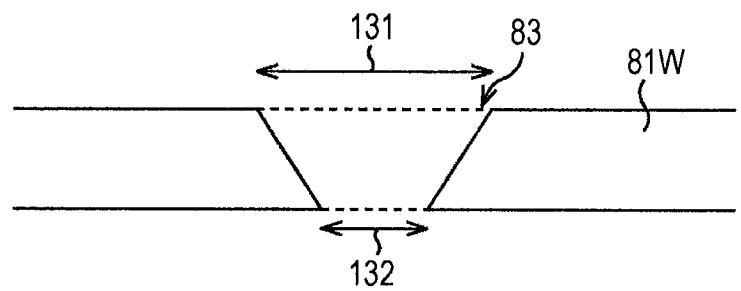
FIGS. 20A to 20C are diagrams illustrating a method of manufacturing the substrate with lenses.
Figure 20B:
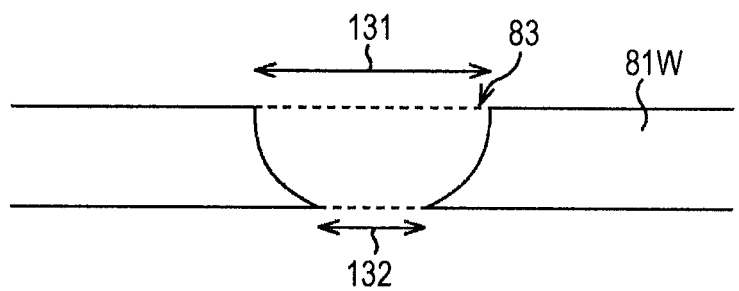
Figure 20C:
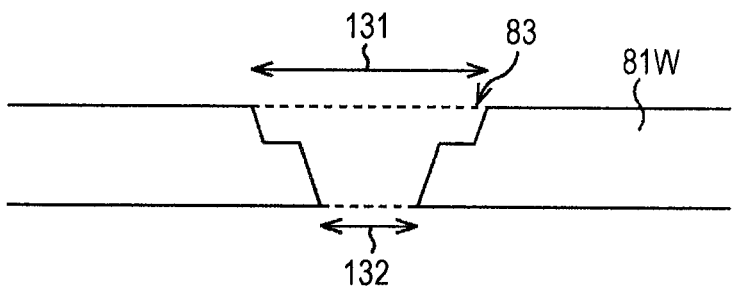

As illustrated in FIGS. 20A to 20C, the through-hole 83 is configured such that a second opening width 132 in a second surface facing a first surface of the support substrate 81W is smaller than a first opening width 131 in the first surface.

As an example of a three-dimensional shape of the through-hole 83 of which the second opening width 132 is smaller than the first opening width 131, the through-hole 83 may have a truncated conical shape as illustrated in FIG. 20A and may have a truncated polygonal pyramidal shape. The cross-sectional shape of the side wall of the through-hole 83 may be linear as illustrated in FIG. 20A and may be curved as illustrated in FIG. 20B. Alternatively, the cross-sectional shape may have a step as illustrated in FIG. 20C.

When a resin is supplied into the through-hole 83 having such a shape that the second opening width 132 is smaller than the first opening width 131, and the resin is pressed by mold members in opposite directions from the first and second surfaces to form the lens resin portion 82, the resin that forms the lens resin portion 82 receives force from the two facing mold members and is pressed against the side wall of the through-hole 83. Due to this, it is possible to obtain an effect of increasing the adhesion strength between the support substrate and the resin that forms the lens resin portion 82.

As another embodiment of the through-hole 83, the through-hole 83 may have such a shape that the first opening width 131 is the same as the second opening width 132 (that is, a shape that the cross-sectional shape of the side wall of the through-hole 83 is vertical).

<Through-Hole Forming Method Using Wet-Etching>

The through-holes 83 of the support substrate 81W can be formed by etching the support substrate 81W according to wet-etching. Specifically, before the support substrate 81W is etched, an etching mask for preventing a non-opening region of the support substrate 81W from being etched is formed on the surface of the support substrate 81W. An insulating film such as a silicon oxide film or a silicon nitride film, for example, is used as the material of the etching mask. The etching mask is formed by forming the layer of an etching mask material on the surface of the support substrate 81W and opening a pattern that forms the planar shape of the through-hole 83 in the layer. After the etching mask is formed, the support substrate 81W is etched whereby the through-holes 83 are formed in the support substrate 81W.

When single-crystal silicon of which the substrate plane orientation is (100) is used as the support substrate 81W, for example, crystal anisotropic wet-etching which uses an alkaline solution such as KOH may be used to form the through-hole 83.

When crystal anisotropic wet-etching which uses an alkaline solution such as KOH is performed on the support substrate 81W which is single-crystal silicon of which the substrate plane orientation is (100), etching progresses so that the (111) plane appears on the opening side wall. As a result, even when the planar shape of the opening of the etching mask is circular or rectangular, the through-holes 83 in which the planar shape is rectangular, the second opening width 132 of the through-hole 83 is smaller than the first opening width 131, and the three-dimensional shape of the through-hole 83 has a truncated pyramidal shape or a similar shape are obtained. The angle of the side wall of the through-hole 83 having the truncated pyramidal shape is approximately 55° with respect to the substrate plane.

As another example of etching for forming the through-hole, wet-etching which uses a chemical liquid capable of etching silicon in an arbitrary shape without any limitation of crystal orientations, disclosed in International Patent Publication No. 2011/010739 or the like may be used. Examples of this chemical liquid include a chemical liquid obtained by adding at least one of polyoxyethylene alkylphenyl ethers, polyoxyalkylene alkyl ethers, and polyethylene glycols which are surfactants to an aqueous solution of TMAH (tetramethylammonium hydroxide) or a chemical liquid obtained by adding isopropyl alcohols to an aqueous solution of KOH.

When etching for forming the through-holes 83 is performed on the support substrate 81W which is single-crystal silicon of which the substrate plane orientation is (100) using any one the above-described chemical liquids, the through-holes 83 in which the planar shape is circular when the planar shape of the opening of the etching mask is circular, the second opening width 132 is smaller than the first opening width 131, and the three-dimensional shape is a truncated conical shape or a similar shape are obtained.

When the planar shape of the opening of the etching mask is rectangular, the through-holes 83 in which the planar shape is rectangular, the second opening width 132 is smaller than the first opening width 131, and the three-dimensional shape is a truncated pyramidal shape or a similar shape are obtained. The angle of the side wall of the through-hole 83 having the truncated conical shape or the truncated pyramidal shape is approximately 45° with respect to the substrate plane.

<Through-Hole Forming Method Using Dry-Etching>

In etching for forming the through-holes 83, dry-etching can be also used rather than the wet-etching.

A method of forming the through-holes 83 using dry-etching will be described with reference to FIGS. 21A to 21F.

Figure 21A:
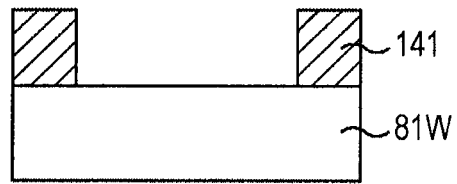
FIGS. 21A to 21F are diagrams illustrating a method of manufacturing the substrate with lenses.

As illustrated in FIG. 21A, an etching mask 141 is formed on one surface of the support substrate 81W. The etching mask 141 has a mask pattern in which portions that form the through-holes 83 are open.

Figure 21B:
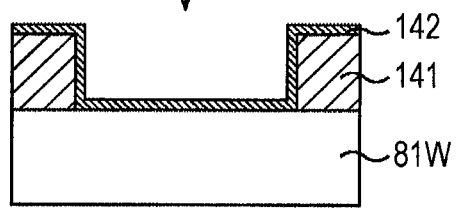
Figure 21C:
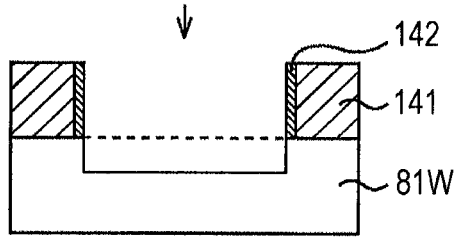

Subsequently, after a protective film 142 for protecting the side wall of the etching mask 141 is formed as illustrated in FIG. 21B, the support substrate 81W is etched to a predetermined depth according to dry-etching as illustrated in FIG. 21C. With the dry-etching step, although the protective film 142 on the surface of the support substrate 81W and the surface of the etching mask 141 is removed, the protective film 142 on the side surface of the etching mask 141 remains and the side wall of the etching mask 141 is protected. After etching is performed, as illustrated in FIG. 21D, the protective film 142 on the side wall is removed and the etching mask 141 is removed in a direction of increasing the size of the opening pattern.

Figure 21D:
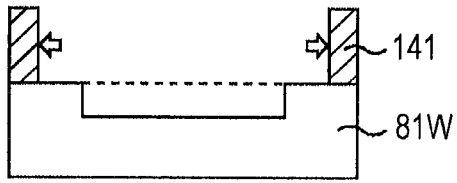
Figure 21E:
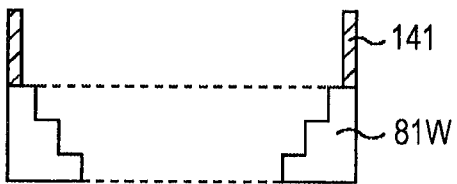

Moreover, a protective film forming step, a dry-etching step, and an etching mask removal step illustrated in FIGS. 21B to 21D are repeatedly performed a plurality of number of times. In this way, as illustrated in FIG. 21E, the support substrate 81W is etched in a stair shape (concave-convex shape) having periodic steps.

Figure 21F:
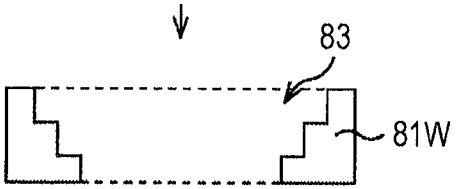

Finally, when the etching mask 141 is removed, the through-holes 83 having a stair-shaped side wall are formed in the support substrate 81W as illustrated in FIG. 21F. The width (the width of one step) in the plane direction of the stair shape of the through-hole 83 is between approximately 400 nm and 1 μm, for example.

When the through-holes 83 are formed using the above-described dry-etching, a protective film forming step, a dry-etching step, and an etching mask removal step are executed repeatedly.

Since the side wall of the through-hole 83 has a periodic stair shape (concave-convex shape), it is possible to suppress reflection of incident light. If the side wall of the through-hole 83 has a concave-convex shape of a random size, a void (cavity) is formed in an adhesion layer between the side wall and the lens formed in the through-hole 83, and the adhesion to the lens may decrease due to the void. However, according to the above-described forming method, since the side wall of the through-hole 83 has a periodic concave-convex shape, the adhesion property is improved, and a change in optical characteristics due to a positional shift of lenses can be suppressed.

As examples of the materials used in the respective steps, for example, the support substrate 81W may be single-crystal silicon, the etching mask 141 may be a photoresist, and the protective film 142 may be fluorocarbon polymer formed using gas plasma such as $C_4F_8$ or $CHF_3$. The etching process may use plasma etching which uses gas that contains F such as $SF_6/O_2$ or $C_4F_8/SF_6$. The mask removing step may use plasma etching which uses $O_2$ gas or gas that contains $O_2$ such as $CF_4/O_2$.

Alternatively, the support substrate 81W may be single-crystal silicon, the etching mask 141 may be $SiO_2$, etching may use plasma that contains $Cl_2$, the protective film 142 may use an oxide film obtained by oxidating an etching target material using $O_2$ plasma, the etching process may use plasma using gas that contains $Cl_2$, and the etching mask removal step may use plasma etching which uses gas that contains F such as $CF_4/O_2$.

Figure 22A:
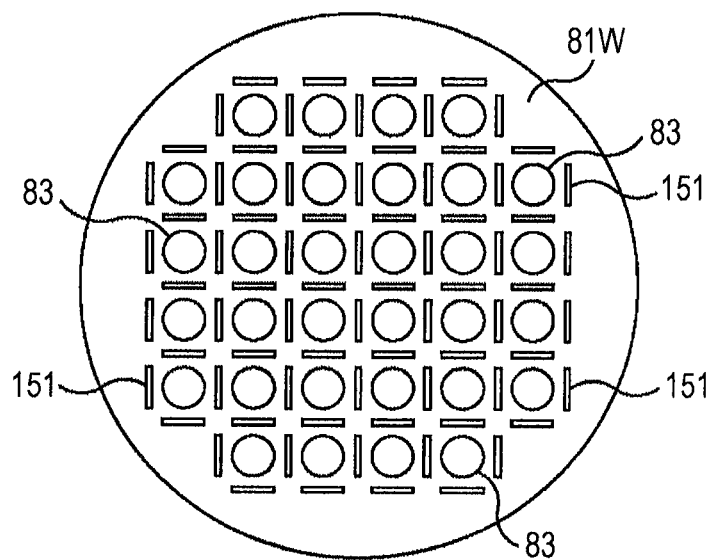
FIGS. 22A to 22B are diagrams illustrating a method of manufacturing the substrate with lenses.

As described above, although a plurality of through-holes 83 can be simultaneously formed in the support substrate 81W by wet-etching or dry-etching, through-grooves 151 may be formed in a region in which the through-holes 83 are not formed, of the support substrate 81W as illustrated in FIG. 22A.

FIG. 22A is a plan view of the support substrate 81W in which the through-groove 151 as well as the through-hole 83 are formed.

For example, as illustrated in FIG. 22A, the through-groove 151 is disposed only in a portion between the through-holes 83 in each of the row and column directions outside the plurality of through-holes 83 disposed in a matrix form.

Moreover, the through-grooves 151 of the support substrate 81W can be formed at the same position in the respective substrates with lenses 41 that form the stacked lens structure 11. In this case, in a state in which a plurality of support substrates 81W is stacked as the stacked lens structure 11, the through-grooves 151 of the plurality of support substrates 81W pass between the plurality of support substrates 81W as in the cross-sectional view of FIG. 22B.

The through-groove 151 of the support substrate 81W as a portion of the substrate with lenses 41 can provide an effect or an advantage of alleviating a deformation of the substrate with lenses 41 resulting from stress when the stress that deforms the substrate with lenses 41 is applied from the outside of the substrate with lenses 41.

Alternatively, the through-groove 151 can provide an effect or an advantage of alleviating a deformation of the substrate with lenses 41 resulting from stress when the stress that deforms the substrate with lenses 41 is generated from the inside of the substrate with lenses 41.

<Method of Manufacturing Substrate with Lenses>

Next, a method of manufacturing the substrate with lenses 41W in a substrate state will be described with reference to FIGS. 23A to 23G.

Figure 23A:
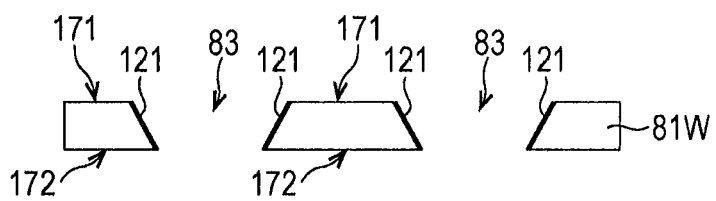
FIGS. 23A to 23G are diagrams illustrating a method of manufacturing the substrate with lenses.

First, a support substrate 81W in which a plurality of through-holes 83 is formed is prepared as illustrated in FIG. 23A. A light blocking film 121 is formed on the side wall of the through-hole 83. Although only two through-holes 83 are illustrated in FIGS. 23A to 23G due to limitation of the drawing surface, a number of through-holes 83 are actually formed in the plane direction of the support substrate 81W as illustrated in FIGS. 19A and 19B. Moreover, an alignment mark (not illustrated) for positioning is formed in a region close to the outer circumference of the support substrate 81W.

A front planar portion 171 on an upper side of the support substrate 81W and a rear planar portion 172 on a lower side thereof are planar surfaces formed so flat as to allow plasma bonding performed in a later step. The thickness of the support substrate 81W also plays the role of a spacer that determines a lens-to-lens distance when the support substrate 81W is finally divided as the substrate with lenses 41 and is superimposed on another substrate with lenses 41.

A base material having a low thermal expansion coefficient of 10 ppm/° C. or less is preferably used as the support substrate 81W.

Figure 23B:
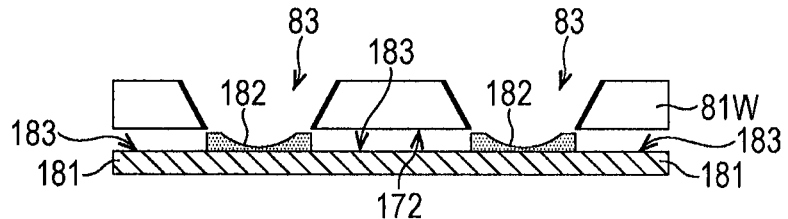

Subsequently, as illustrated in FIG. 23B, the support substrate 81W is disposed on a lower mold 181 in which a plurality of concave optical transfer surfaces 182 is disposed at a fixed interval. More specifically, the rear planar portion 172 of the support substrate 81W and the planar surface 183 of the lower mold 181 are superimposed together so that the concave optical transfer surface 182 is positioned inside the through-hole 83 of the support substrate 81W. The optical transfer surfaces 182 of the lower mold 181 are formed so as to correspond to the through-holes 83 of the support substrate 81W in one-to-one correspondence, and the positions in the plane direction of the support substrate 81W and the lower mold 181 are adjusted so that the centers of the corresponding optical transfer surface 182 and the through-hole 83 are identical in the optical axis direction. The lower mold 181 is formed of a hard mold member and is configured using metal, silicon, quartz, or glass, for example.

Figure 23C:
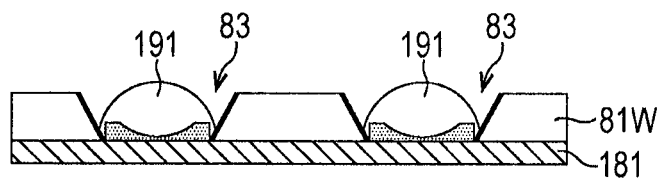

Subsequently, as illustrated in FIG. 23C, an energy-curable resin 191 is filled (dropped) into the through-holes 83 of the lower mold 181 and the support substrate 81W superimposed together. The lens resin portion 82 is formed using the energy-curable resin 191. Thus, the energy-curable resin 191 is preferably subjected to a defoaming process in advance so that bubbles are not included. A vacuum defoaming process or a defoaming process which uses centrifugal force is preferably performed as the defoaming process. Moreover, the vacuum defoaming process is preferably performed after the filling. When the defoaming process is performed, it is possible to form the lens resin portion 82 without any bubble included therein.

Figure 23D:
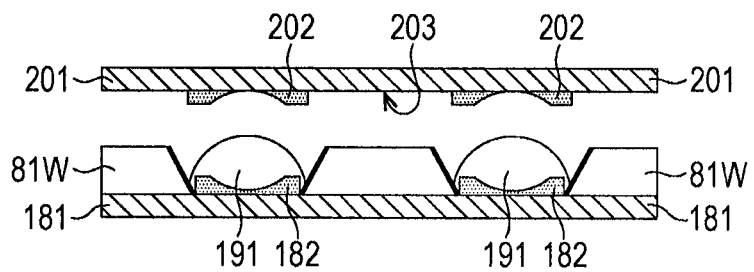

Subsequently, as illustrated in FIG. 23D, the upper mold 201 is disposed on the lower mold 181 and the support substrate 81W superimposed together. A plurality of concave optical transfer surfaces 202 is disposed at a fixed interval in the upper mold 201, and similarly to the case of disposing the lower mold 181, the upper mold 201 is disposed after the through-holes 83 and the optical transfer surfaces 202 are aligned with high accuracy so that the centers thereof are identical in the optical axis direction.

In a height direction which is the vertical direction on the drawing surface, the position of the upper mold 201 is fixed so that the interval between the upper mold 201 and the lower mold 181 reaches a predetermined distance with the aid of a controller that controls the interval between the upper mold 201 and the lower mold 181. In this case, the space interposed between the optical transfer surface 202 of the upper mold 201 and the optical transfer surface 182 of the lower mold 181 is equal to the thickness of the lens resin portion 82 (the lens 21) calculated by optical design.

Figure 23E:
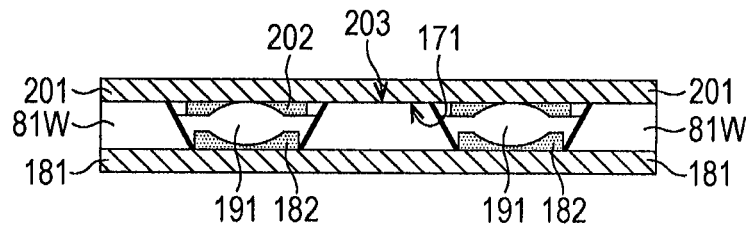

Alternatively, as illustrated in FIG. 23E, similarly to the case of disposing the lower mold 181, the planar surface 203 of the upper mold 201 and the front planar portion 171 of the support substrate 81W may be superimposed together. In this case, the distance between the upper mold 201 and the lower mold 181 is the same as the thickness of the support substrate 81W, and high-accuracy alignment can be realized in the plane direction and the height direction.

When the interval between the upper mold 201 and the lower mold 181 is controlled to reach a predetermined distance, in the above-described step of FIG. 23C, the amount of the energy-curable resin 191 dropped into the through-holes 83 of the support substrate 81W is controlled to such an amount that the resin does not overflow the through-holes 83 of the support substrate 81W and the space surrounded by the upper mold 201 and the lower mold 181 disposed on the upper and lower sides of the support substrate 81W. Due to this, it is possible to reduce the manufacturing cost without wasting the material of the energy-curable resin 191.

Subsequently, in the state illustrated in FIG. 23E, a process of curing the energy-curable resin 191 is performed. The energy-curable resin 191 is cured by being irradiated with heat or UV light as energy and being left for a predetermined period, for example. During curing, the upper mold 201 is pushed downward and is subjected to alignment, whereby a deformation resulting from shrinkage of the energy-curable resin 191 can be suppressed as much as possible.

A thermoplastic resin may be used instead of the energy-curable resin 191. In this case, in the state illustrated in FIG. 23E, the upper mold 201 and the lower mold 181 are heated whereby the energy-curable resin 191 is molded in a lens shape and is cured by being cooled.

Figure 23F:
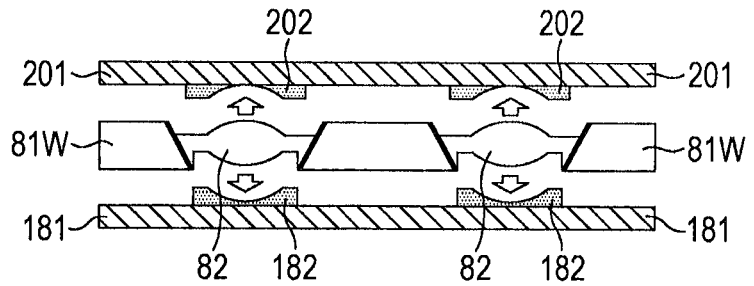

Subsequently, as illustrated in FIG. 23F, the controller that controls the positions of the upper mold 201 and the lower mold 181 moves the upper mold 201 upward and the lower mold 181 downward so that the upper mold 201 and the lower mold 181 are separated from the support substrate 81W. When the upper mold 201 and the lower mold 181 are separated from the support substrate 81W, the lens resin portion 82 including the lenses 21 is formed inside the through-holes 83 of the support substrate 81W.

The surfaces of the upper mold 201 and the lower mold 181 that make contact with the support substrate 81W may be coated with a fluorine-based or silicon-based mold releasing agent. By doing so, the support substrate 81W can be easily separated from the upper mold 201 and the lower mold 181. Moreover, various coatings such as fluorine-containing diamond-like carbon (DLC) may be performed as a method of separating the support substrate 81W from the contact surface easily.

Figure 23G:
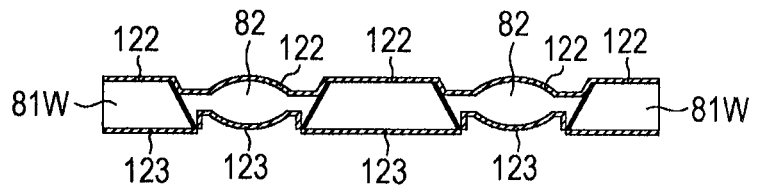

Subsequently, as illustrated in FIG. 23G, the upper surface layer 122 is formed on the surface of the support substrate 81W and the lens resin portion 82, and the lower surface layer 123 is formed on the rear surface of the support substrate 81W and the lens resin portion 82. Before or after the upper surface layer 122 and the lower surface layer 123 are formed, chemical mechanical polishing (CMP) or the like may be performed as necessary to planarize the front planar portion 171 and the rear planar portion 172 of the support substrate 81W.

As described above, when the energy-curable resin 191 is pressure-molded (imprinted) into the through-holes 83 formed in the support substrate 81W using the upper mold 201 and the lower mold 181, it is possible to form the lens resin portion 82 and to manufacture the substrate with lenses 41.

The shape of the optical transfer surface 182 and the optical transfer surface 202 is not limited to the concave shape described above but may be determined appropriately according to the shape of the lens resin portion 82. As illustrated in FIG. 15, the lens shape of the substrates with lenses 41a to 41e may take various shapes derived by optical design. For example, the lens shape may have a biconvex shape, a biconcave shape, a plano-convex shape, a plano-concave shape, a convex meniscus shape, a concave meniscus shape, or a high-order aspherical shape.

Moreover, the optical transfer surface 182 and the optical transfer surface 202 may have such a shape that the lens shape after forming has a moth-eye structure.

According to the above-described manufacturing method, since a variation in the distance in the plane direction between the lens resin portions 82 due to a curing shrinkage of the energy-curable resin 191 can be prevented by the interposed support substrate 81W, it is possible to control the lens-to-lens distance with high accuracy. Moreover, the manufacturing method provides an effect of reinforcing the weak energy-curable resin 191 with the strong support substrate 81W. Due to this, the manufacturing method provides an advantage that it is possible to provide the lens array substrate in which a plurality of lenses having good handling properties is disposed and to suppress a warp of the lens array substrate.

Example in which Through-Hole has Polygonal Shape

As illustrated in FIG. 19B, the planar shape of the through-hole 83 may be polygonal such as rectangular.

Figure 24:
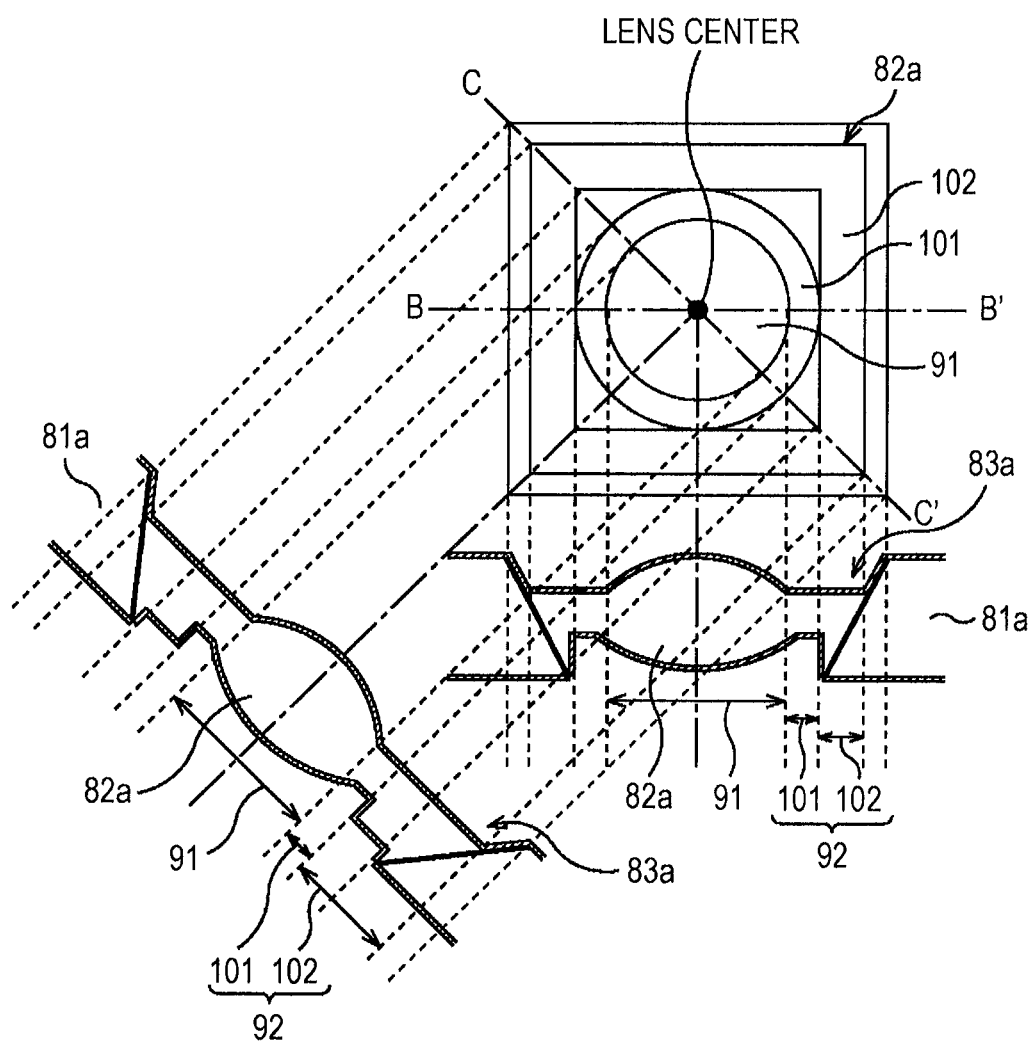
FIG. 24 is a diagram illustrating a method of manufacturing the substrate with lenses.

FIG. 24 illustrates a plan view and cross-sectional views of the support substrate 81a and the lens resin portion 82a of the substrate with lenses 41a when the planar shape of the through-hole 83 is rectangular.

The cross-sectional views of the substrate with lenses 41a illustrated in FIG. 24 are cross-sectional views taken along lines B-B' and C-C' in the plan view.

As can be understood from comparison between the cross-sectional views taken along lines B-B' and C-C', when the through-hole 83a is rectangular, the distance from the center of the through-hole 83a to an upper outer edge of the through-hole 83a and the distance from the center of the through-hole 83a to a lower outer edge of the through-hole 83a are different in the side direction and the diagonal direction of the through-hole 83a which is a rectangle, and the distance in the diagonal direction is larger than that in the side direction. Due to this, when the planar shape of the through-hole 83a is rectangular, if the lens portion 91 is circular, the distance from the outer circumference of the lens portion 91 to the side wall of the through-hole 83a (that is, the length of the support portion 92) needs to be different in the side direction and the diagonal direction of the rectangle.

Thus, the lens resin portion 82a illustrated in FIG. 24 has the following structures.

(1) The length of the arm portion 101 disposed on the outer circumference of the lens portion 91 is the same in the side direction and the diagonal direction of the rectangle.

(2) The length of the leg portion 102 disposed on the outer side of the arm portion 101 to extend up to the side wall of the through-hole 83a is set such that the length of the leg portion 102 in the diagonal direction of the rectangle is larger than the length of the leg portion 102 in the side direction of the rectangle.

As illustrated in FIG. 24, the leg portion 102 is not in direct-contact with the lens portion 91, and the arm portion 101 is in direct-contact with the lens portion 91.

In the lens resin portion 82a illustrated in FIG. 24, the length and the thickness of the arm portion 101 being in direct-contact with the lens portion 91 are constant over the entire outer circumference of the lens portion 91. Thus, it is possible to provide an effect or an advantage that the entire lens portion 91 is supported with constant force without deviation.

Further, when the entire lens portion 91 is supported with constant force without deviation, it is possible to obtain an effect or an advantage that, when stress is applied from the support substrate 81a surrounding the through-holes 83a to the entire outer circumference of the through-hole 83a, for example, the stress is transmitted to the entire lens portion 91 without deviation whereby transmission of stress to a specific portion of the lens portion 91 in a deviated manner is prevented.

Figure 25:
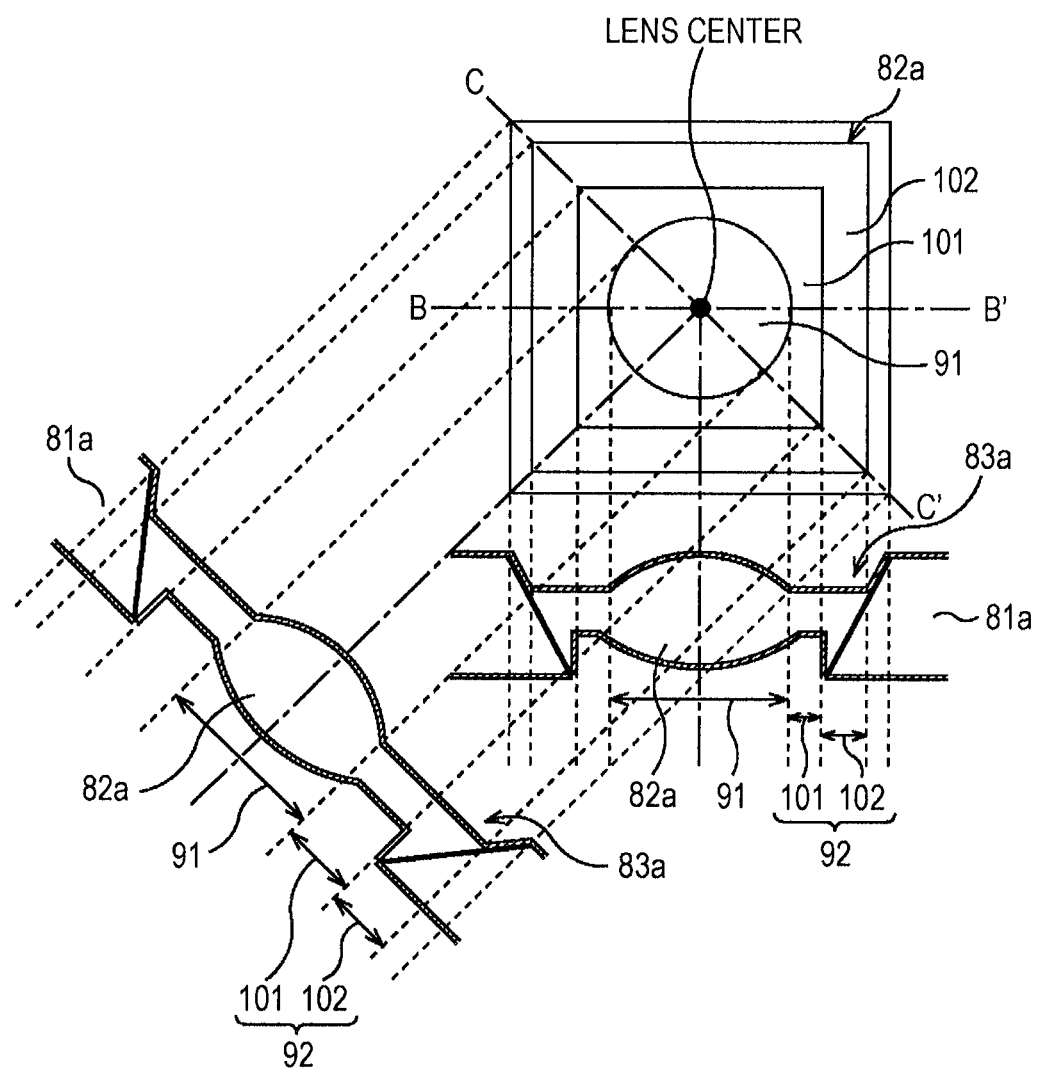
FIG. 25 is a diagram illustrating a method of manufacturing the substrate with lenses.

FIG. 25 illustrates a plan view and a cross-sectional view of the support substrate 81a and the lens resin portion 82a of the substrate with lenses 41a, illustrating another example of the through-hole 83 of which the planar shape is rectangular.

The cross-sectional views of the substrate with lenses 41a illustrated in FIG. 25 are cross-sectional views taken along lines B-B' and C-C' in the plan view.

Figure 22B:
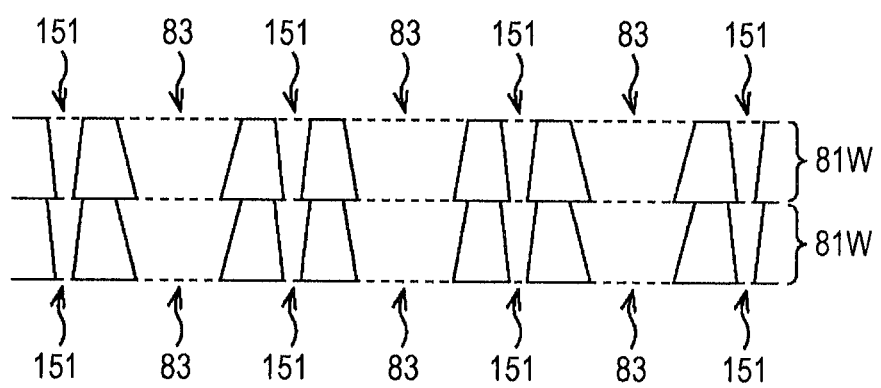

In FIG. 25, similarly to FIGS. 22A and 22B, the distance from the center of the through-hole 83a to an upper outer edge of the through-hole 83a and the distance from the center of the through-hole 83a to a lower outer edge of the through-hole 83a are different in the side direction and the diagonal direction of the through-hole 83a which is a rectangle, and the distance in the diagonal direction is larger than that in the side direction. Due to this, when the planar shape of the through-hole 83a is rectangular, if the lens portion 91 is circular, the distance from the outer circumference of the lens portion 91 to the side wall of the through-hole 83a (that is, the length of the support portion 92) needs to be different in the side direction and the diagonal direction of the rectangle.

Thus, the lens resin portion 82a illustrated in FIG. 25 has the following structures.

(1) The length of the leg portion 102 disposed on the outer circumference of the lens portion 91 is constant along the four sides of the rectangle of the through-hole 83a.

(2) In order to realize the structure (1), the length of the arm portion 101 is set such that the length of the arm portion in the diagonal direction of the rectangle is larger than the length of the arm portion in the side direction of the rectangle.

As illustrated in FIG. 25, the thickness of the resin in the leg portion 102 is larger than the thickness of the resin in the arm portion 101. Due to this, the volume of the leg portion 102 per unit area in the plane direction of the substrate with lenses 41a is larger than the volume of the arm portion 101.

In the embodiment of FIG. 25, when the volume of the leg portion 102 is decreased as much as possible and is made constant along the four sides of the rectangle of the through-hole 83a, it is possible to provide an effect or an advantage that, when a deformation such as swelling of a resin, for example, occurs, a change in the volume resulting from the deformation is suppressed as much as possible and the change in the volume does not deviate on the entire outer circumference of the lens portion 91 as much as possible.

Figure 26:
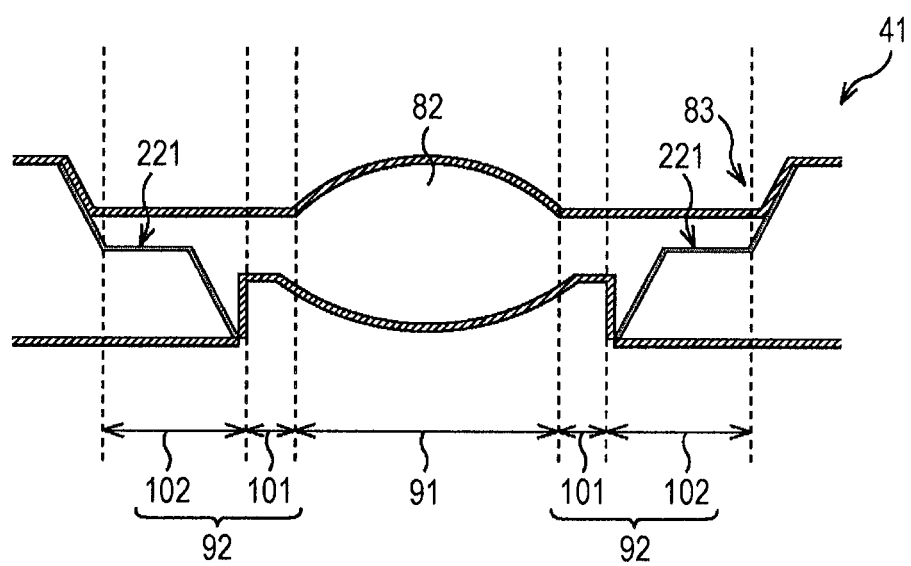
FIG. 26 is a diagram illustrating a method of manufacturing the substrate with lenses.

FIG. 26 is a cross-sectional view illustrating another embodiment of the lens resin portion 82 and the through-hole 83 of the substrate with lenses 41.

The lens resin portion 82 and the through-hole 83 illustrated in FIG. 26 have the following structures.

(1) The side wall of the through-hole 83 has a stair shape having a stair portion 221.

(2) The leg portion 102 of the support portion 92 of the lens resin portion 82 is disposed on the upper side of the side wall of the through-hole 83 and is also disposed on the stair portion 221 provided in the through-hole 83 so as to extend in the plane direction of the substrate with lenses 41.

A method of forming the stair-shaped through-hole 83 illustrated in FIG. 26 will be described with reference to FIGS. 27A to 27F.

Figure 27A:
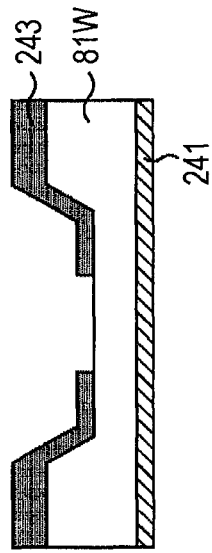
FIGS. 27A to 27F are diagrams illustrating a method of manufacturing the substrate with lenses.

First, as illustrated in FIG. 27A, an etching stop film 241 having resistance to the wet-etching when forming through-holes is formed on one surface of the support substrate 81W. The etching stop film 241 may be a silicon nitride film, for example.

Subsequently, a hard mask 242 having resistance to the wet-etching when forming through-holes is formed on the other surface of the support substrate 81W. The hard mask 242 may also be a silicon nitride film, for example.

Figure 27B:
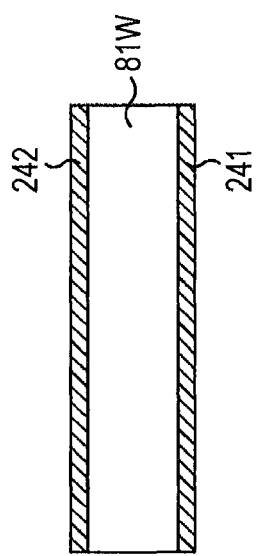

Subsequently, as illustrated in FIG. 27B, a predetermined region of the hard mask 242 is opened to perform a first round of etching. In the first round of etching, a portion of the through-hole 83, which forms the upper end of the stair portion 221 is etched. Due to this, the opening of the hard mask 242 for the first round of etching is a region corresponding to the opening, of the surface of the upper surface of the substrate with lenses 41 illustrated in FIG. 26.

Figure 27C:
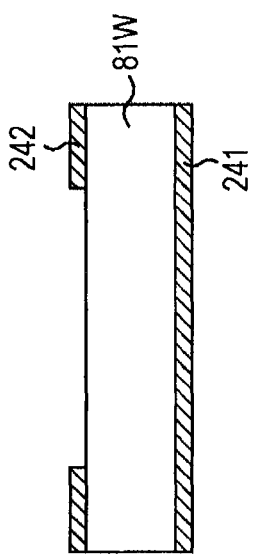

Subsequently, as illustrated in FIG. 27C, wet-etching is performed so that the support substrate 81W is etched to a predetermined depth according to the opening of the hard mask 242.

Figure 27D:
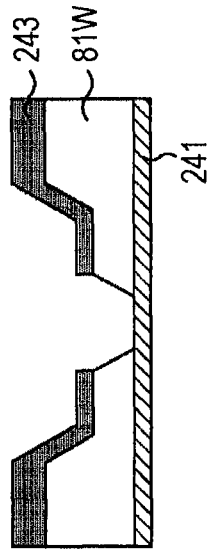

Subsequently, as illustrated in FIG. 27D, a hard mask 243 is formed again on the surface of the etched support substrate 81W, and the hard mask 243 is opened in a region corresponding to the lower portion of the stair portion 221 of the through-hole 83. The second hard mask 243 may also be a silicon nitride film, for example.

Figure 27E:
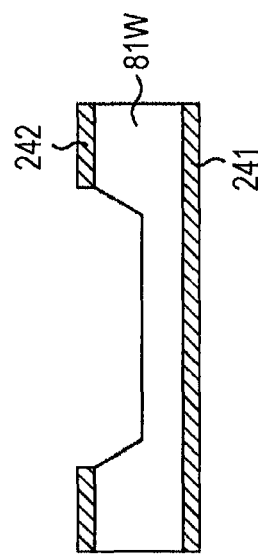

Subsequently, as illustrated in FIG. 27E, wet-etching is performed so that the support substrate 81W is etched to reach the etching stop film 241 according to the opening of the hard mask 243.

Figure 27F:
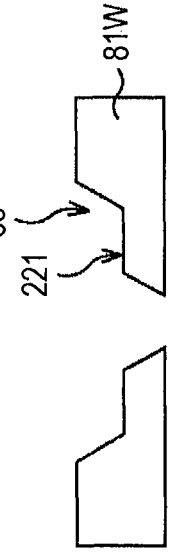

Finally, as illustrated in FIG. 27F, the hard mask 243 on the upper surface of the support substrate 81W and the etching stop film 241 on the lower surface thereof are removed.

When wet-etching of the support substrate 81W for forming through-holes is performed in two rounds in the above-described manner, the through-hole 83 having the stair shape illustrated in FIG. 26 is obtained.

Figure 28:
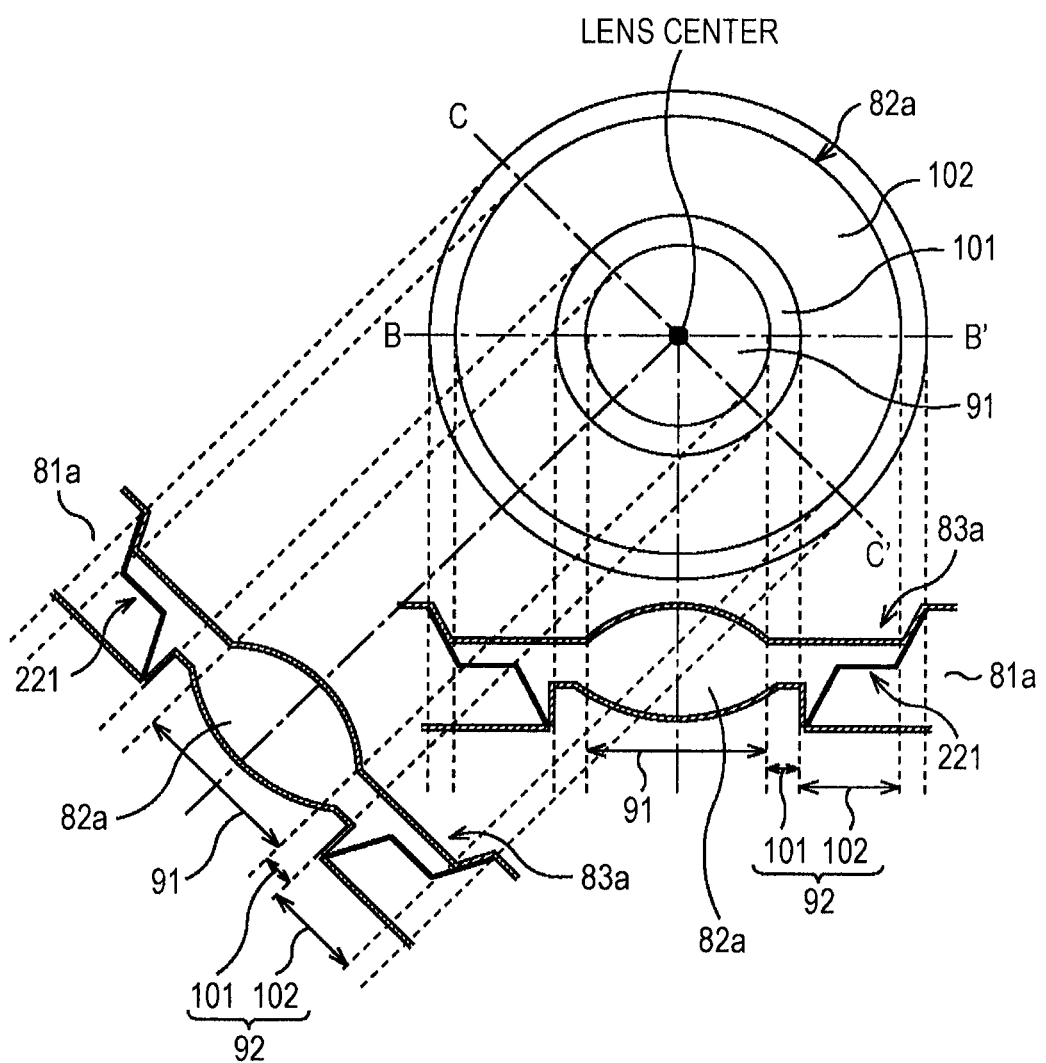
FIG. 28 is a diagram illustrating a method of manufacturing the substrate with lenses.

FIG. 28 illustrates a plan view and cross-sectional views of the support substrate 81a and the lens resin portion 82a of the substrate with lenses 41a when the through-hole 83a has the stair portion 221 and the planar shape of the through-hole 83a is circular.

The cross-sectional views of the substrate with lenses 41a in FIG. 28 are cross-sectional views taken along lines B-B' and C-C' in the plan view.

When the planar shape of the through-hole 83a is circular, the cross-sectional shape of the through-hole 83a is naturally the same regardless of the diametrical direction. In addition to this, the cross-sectional shapes of the outer edge, the arm portion 101, and the leg portion 102 of the lens resin portion 82a are the same regardless of the diametrical direction.

The through-hole 83a having the stair shape illustrated in FIG. 28 provides an effect or an advantage that the area in which the leg portion 102 of the support portion 92 of the lens resin portion 82 makes contact with the side wall of the through-hole 83a can be increased as compared to the through-hole 83a illustrated in FIG. 14 in which the stair portion 221 is not provided in the through-hole 83a. Due to this, it is possible to provide an effect or an advantage of increasing the adhesion strength between the lens resin portion 82 and the side wall of the through-hole 83a (that is, the adhesion strength between the lens resin portion 82a and the support substrate 81W).

Figure 29:
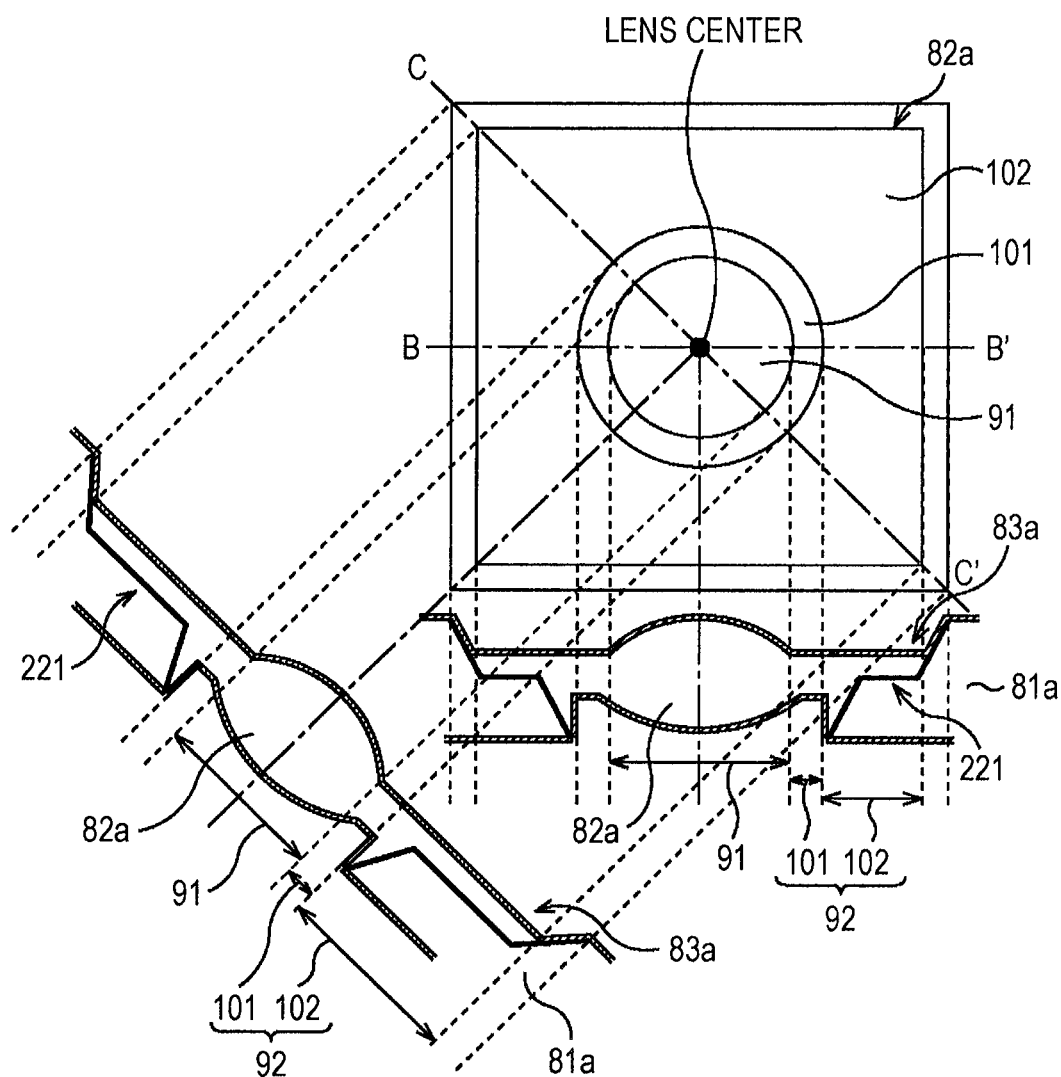
FIG. 29 is a diagram illustrating a method of manufacturing the substrate with lenses.

FIG. 29 illustrates a plan view and cross-sectional views of the support substrate 81a and the lens resin portion 82a of the substrate with lenses 41a when the through-hole 83a has the stair portion 221 and the planar shape of the through-hole 83a is rectangular.

The cross-sectional views of the substrate with lenses 41a in FIG. 29 are cross-sectional views taken along lines B-B' and C-C' in the plan view.

The lens resin portion 82 and the through-hole 83 illustrated in FIG. 29 have the following structures.

(1) The length of the arm portion 101 disposed on the outer circumference of the lens portion 91 is the same in the side direction and the diagonal direction of the rectangle.

(2) The length of the leg portion 102 disposed on the outer side of the arm portion 101 to extend up to the side wall of the through-hole 83a is set such that the length of the leg portion 102 in the diagonal direction of the rectangle is larger than the length of the leg portion 102 in the side direction of the rectangle.

As illustrated in FIG. 29, the leg portion 102 is not in direct-contact with the lens portion 91 whereas the arm portion 101 is in direct-contact with the lens portion 91.

In the lens resin portion 82a illustrated in FIG. 29, similarly to the lens resin portion 82a illustrated in FIG. 24, the length and the thickness of the arm portion 101 being in direct-contact with the lens portion 91 are constant over the entire outer circumference of the lens portion 91. Due to this, it is possible to provide an effect or an advantage that the entire lens portion 91 is supported with constant force without deviation.

Further, when the entire lens portion 91 is supported with constant force without deviation, it is possible to obtain an effect or an advantage that, when stress is applied from the support substrate 81a surrounding the through-holes 83a to the entire outer circumference of the through-hole 83a, for example, the stress is transmitted to the entire lens portion 91 without deviation whereby transmission of stress to a specific portion of the lens portion 91 in a deviated manner is prevented.

Further, the structure of the through-hole 83a illustrated in FIG. 29 provides an effect or an advantage that the area in which the leg portion 102 of the support portion 92 of the lens resin portion 82a makes contact with the side wall of the through-hole 83a can be increased as compared to the through-hole 83a illustrated in FIG. 24 and the like in which the stair portion 221 is not provided in the through-hole 83a. Due to this, it is possible to provide an effect or an advantage of increasing the adhesion strength between the lens resin portion 82a and the side wall of the through-hole 83a (that is, the adhesion strength between the lens resin portion 82a and the support substrate 81a).

11. Direct Bonding of Substrates with Lenses

Next, direct bonding of the substrates with lenses 41W in the substrate state in which the plurality of substrates with lenses 41 is formed will be described.

In the following description, as illustrated in FIGS. 30A and 30B, the substrate with lenses 41W in the substrate state in which the plurality of substrates with lenses 41a is formed will be referred to as a substrate with lenses 41W-a, and the substrate with lenses 41W in the substrate state in which the plurality of substrates with lenses 41b is formed will be referred to as a substrate with lenses 41W-b. The other substrates with lenses 41c to 41e are similarly referred to.

Direct bonding between the substrate with lenses 41W-a in the substrate state and the substrate with lenses 41W-b in the substrate state will be described with reference to FIGS. 31A and 31B.

Figure 31A:
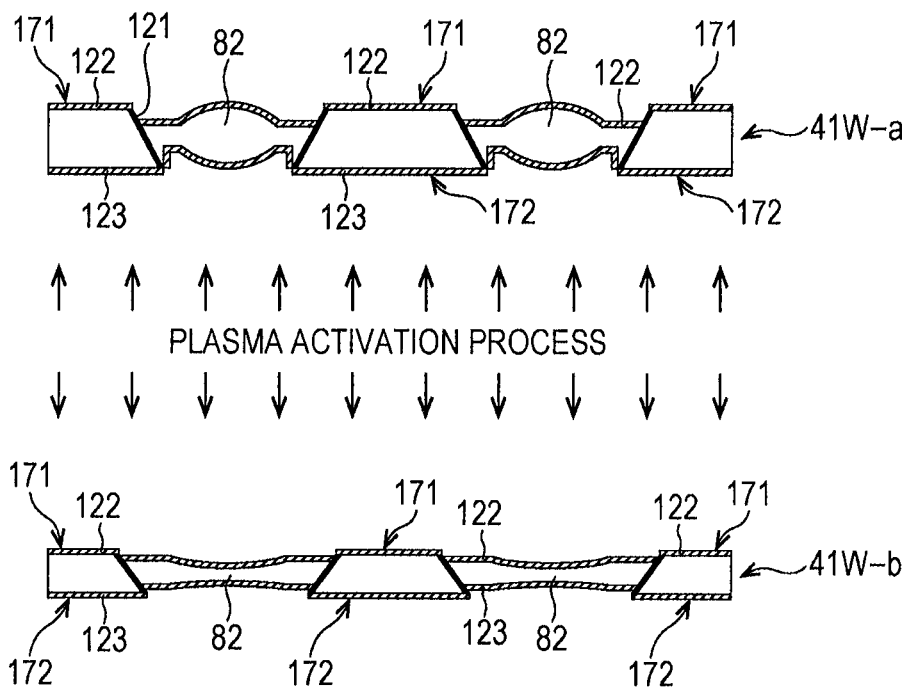
FIGS. 31A to 31B are diagrams illustrating bonding of substrates with lenses in a substrate state.
Figure 31B:
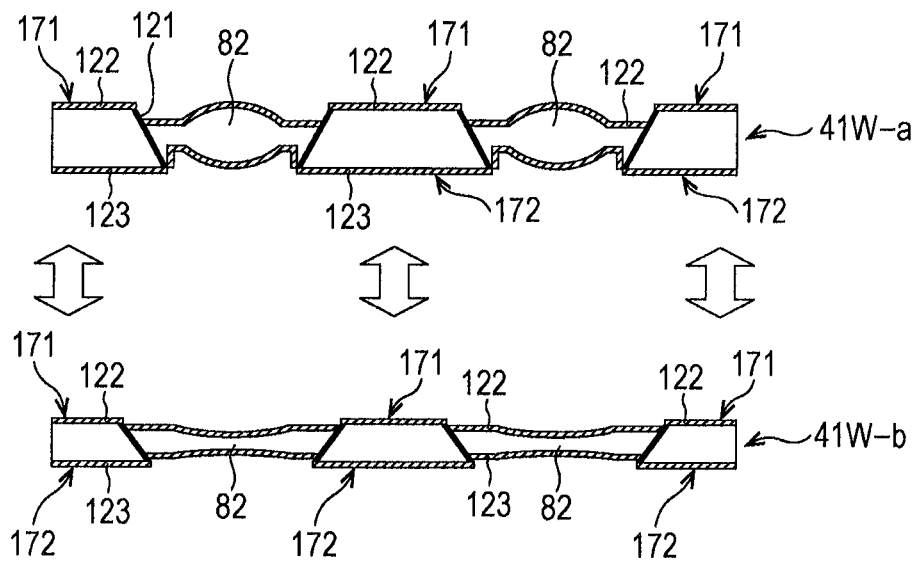

In FIGS. 31A and 31B, the portions of the substrate with lenses 41W-b corresponding to the respective portions of the substrate with lenses 41W-a will be denoted by the same reference numerals as those of the substrate with lenses 41W-a.

The upper surface layer 122 or 125 are formed on the upper surface of the substrates with lenses 41W-a and 41W-b. The lower surface layer 123 or 124 is formed on the lower surface of the substrates with lenses 41W-a and 41W-b. Moreover, as illustrated in FIG. 31A, a plasma activation process is performed on the entire lower surface including the rear planar portion 172 of the substrate with lenses 41W-a and the entire upper surface including the front planar portion 171 of the substrate with lenses 41W-b, serving as the bonding surfaces of the substrates with lenses 41W-a and 41W-b. The gas used in the plasma activation process may be arbitrary gas which can be plasma-processed such as $O_2$, $N_2$, He, Ar, or $H_2$. However, it is desirable that the same gas as the constituent elements of the upper surface layer 122 and the lower surface layer 123 is used as the gas used in the plasma activation process. By doing so, degeneration of the film itself of the upper surface layer 122 and the lower surface layer 123 can be suppressed.

As illustrated in FIG. 31B, the rear planar portion 172 of the substrate with lenses 41W-a in the activated surface state and the front planar portion 171 of the substrate with lenses 41W-b are attached together.

With the attachment process of the substrates with lenses, a hydrogen bond is formed between the hydrogen of the OH radical on the surface of the lower surface layer 123 or 124 of the substrate with lenses 41W-a and the hydrogen of the OH radical on the surface of the upper surface layer 122 or 125 of the substrate with lenses 41W-b. Due to this, the substrates with lenses 41W-a and 41W-b are fixed together. The attachment process of the substrates with lenses can be performed under the condition of the atmospheric pressure.

An annealing process is performed on the attached substrates with lenses 41W-a and 41W-b. In this way, dehydration condensation occurs from the state in which the OH radicals form a hydrogen bond, and an oxygen-based covalent bond is formed between the lower surface layer 123 or 124 of the substrate with lenses 41W-a and the upper surface layer 122 or 125 of the substrate with lenses 41W-b. Alternatively, the element contained in the lower surface layer 123 or 124 of the substrate with lenses 41W-a and the element contained in the upper surface layer 122 or 125 of the substrate with lenses 41W-b form a covalent bond. By these bonds, the two substrates with lenses are strongly fixed together. A state in which a covalent bond is formed between the lower surface layer 123 or 124 of the substrate with lenses 41W disposed on the upper side and the upper surface layer 122 or 125 of the substrate with lenses 41W disposed on the lower side whereby the two substrates with lenses 41W are fixed together is referred to as direct bonding in the present specification. The method of fixing a plurality of substrates with lenses by the resin formed on the entire surface, disclosed in Patent Literature 1 has a problem that the resin may experience curing shrinkage and thermal expansion and the lens may be deformed. In contrast, the direct bonding of the present technique provides an effect or an advantage that, since the resin is not used when fixing the plurality of substrates with lenses 41W, the plurality of substrates with lenses 41W can be fixed without causing a curing shrinkage and a thermal expansion.

The annealing process can be performed under the condition of the atmospheric pressure. This annealing process can be performed at a temperature of 100° C. or higher, 150° C. or higher, or 200° C. or higher in order to realize dehydration condensation. On the other hand, this annealing process can be performed at a temperature of 400° C. or lower, 350° C. or lower, or 300° C. or lower from the perspective of protecting the energy-curable resin 191 for forming the lens resin portion 82 from heat and the perspective of suppressing degassing from the energy-curable resin 191.

If the attachment process of the substrates with lenses 41W or the direct bonding process of the substrates with lenses 41W is performed under the condition of the atmospheric pressure, when the bonded substrates with lenses 41W-a and 41W-b are returned to the environment of the atmospheric pressure, a pressure difference occurs between the outside of the lens resin portion 82 and the space between the bonded lens resin portions 82. Due to this pressure difference, pressure is applied to the lens resin portion 82 and the lens resin portion 82 may be deformed.

When both the attachment process of the substrates with lenses 41W and the direct bonding process of the substrates with lenses are performed under the condition of the atmospheric pressure, it is possible to provide an effect or an advantage that the deformation of the lens resin portion 82 which may occur when the bonding was performed under the condition other than the atmospheric pressure can be avoided.

When the substrate subjected to the plasma activation process is direct-bonded (that is, plasma-bonded), since such fluidity and thermal expansion as when a resin is used as an adhesive can be suppressed, it is possible to improve the positional accuracy when the substrates with lenses 41W-a and 41W-b are bonded.

As described above, the upper surface layer 122 or the lower surface layer 123 is formed on the rear planar portion 172 of the substrate with lenses 41W-a and the front planar portion 171 of the substrate with lenses 41W-b. In the upper surface layer 122 and the lower surface layer 123, a dangling bond is likely to be formed due to the plasma activation process performed previously. That is, the lower surface layer 123 formed on the rear planar portion 172 of the substrate with lenses 41W-a and the upper surface layer 122 formed on the front planar portion 171 of the substrate with lenses 41W-a also have the function of increasing the bonding strength.

Moreover, when the upper surface layer 122 or the lower surface layer 123 is formed of an oxide film, since the layer is not affected by a change in the film property due to plasma ($O_2$), it is possible to provide an effect of suppressing plasma-based corrosion of the lens resin portion 82.

As described above, the substrate with lenses 41W-a in the substrate state in which the plurality of substrates with lenses 41a is formed and the substrate with lenses 41W-b in the substrate state in which the plurality of substrates with lenses 41b is formed are direct-bonded after being subjected to a plasma-based surface activation process (that is, the substrates are bonded using plasma bonding).

FIGS. 32A to 32F illustrate a first stacking method of stacking five substrates with lenses 41a to 41e corresponding to the stacked lens structure 11 illustrated in FIG. 13 in the substrate state using the method of bonding the substrates with lenses 41W in the substrate state described with reference to FIGS. 31A and 31B.

First, as illustrated in FIG. 32A, a substrate with lenses 41W-e in the substrate state positioned on the bottom layer of the stacked lens structure 11 is prepared.

Subsequently, as illustrated in FIG. 32B, a substrate with lenses 41W-d in the substrate state positioned on the second layer from the bottom of the stacked lens structure 11 is bonded to the substrate with lenses 41W-e in the substrate state.

Subsequently, as illustrated in FIG. 32C, a substrate with lenses 41W-c in the substrate state positioned on the third layer from the bottom of the stacked lens structure 11 is bonded to the substrate with lenses 41W-d in the substrate state.

Subsequently, as illustrated in FIG. 32D, a substrate with lenses 41W-b in the substrate state positioned on the fourth layer from the bottom of the stacked lens structure 11 is bonded to the substrate with lenses 41W-c in the substrate state.

Subsequently, as illustrated in FIG. 32E, a substrate with lenses 41W-a in the substrate state positioned on the fifth layer from the bottom of the stacked lens structure 11 is bonded to the substrate with lenses 41W-b in the substrate state.

Finally, as illustrated in FIG. 32F, a diaphragm plate 51W positioned on the upper layer of the substrate with lenses 41a of the stacked lens structure 11 is bonded to the substrate with lenses 41W-a in the substrate state.

In this way, when the five substrates with lenses 41W-a to 41W-e in the substrate state are sequentially stacked one by one in the order from the substrate with lenses 41W on the lower layer of the stacked lens structure 11 to the substrate with lenses 41W on the upper layer, the stacked lens structure 11W in the substrate state is obtained.

FIGS. 33A to 33F illustrate a second stacking method of stacking five substrates with lenses 41a to 41e corresponding to the stacked lens structure 11 illustrated in FIG. 13 in the substrate state using the method of bonding the substrates with lenses 41W in the substrate state described with reference to FIGS. 31A and 31B.

Figure 33A:
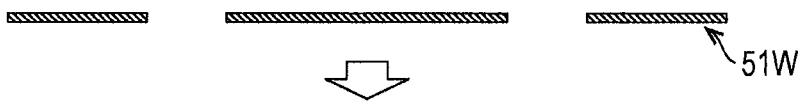
FIGS. 33A to 33F are diagrams illustrating a second stacking method of stacking five substrates with lenses in a substrate state.

First, as illustrated in FIG. 33A, a diaphragm plate 51W positioned on the upper layer of the substrate with lenses 41a of the stacked lens structure 11 is prepared.

Figure 33B:
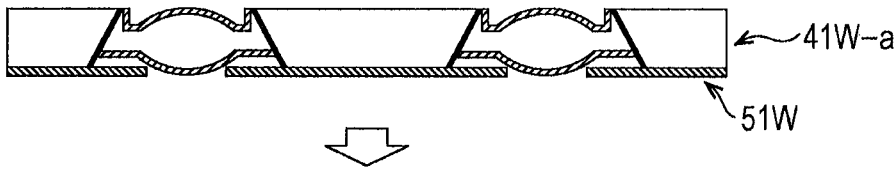

Subsequently, as illustrated in FIG. 33B, a substrate with lenses 41W-a in the substrate state positioned on the top layer of the stacked lens structure 11 is inverted upside down and is then bonded to the diaphragm plate 51W.

Figure 33C:
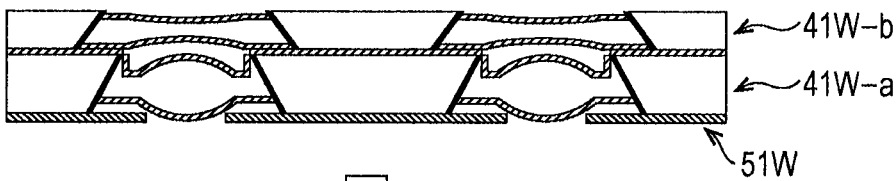

Subsequently, as illustrated in FIG. 33C, a substrate with lenses 41W-b in the substrate state positioned on the second layer from the top of the stacked lens structure 11 is inverted upside down and is then bonded to the substrate with lenses 41W-a in the substrate state.

Figure 33D:
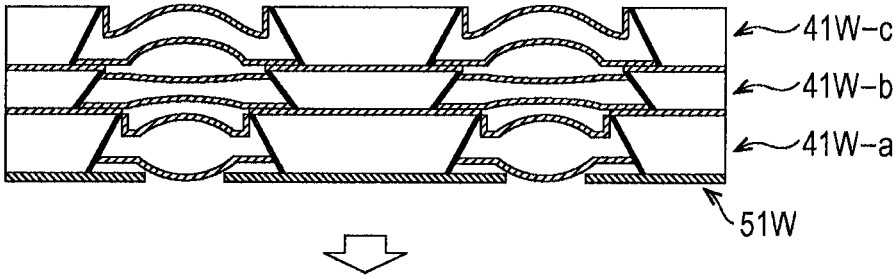

Subsequently, as illustrated in FIG. 33D, a substrate with lenses 41W-c in the substrate state positioned on the third layer from the top of the stacked lens structure 11 is inverted upside down and is then bonded to the substrate with lenses 41W-b in the substrate state.

Figure 33E:
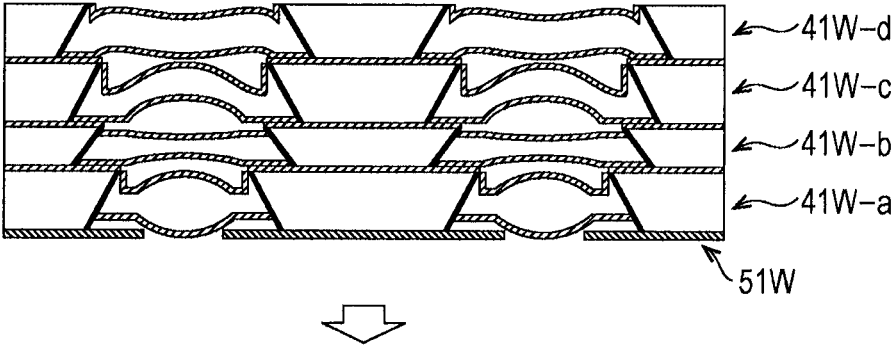

Subsequently, as illustrated in FIG. 33E, a substrate with lenses 41W-d in the substrate state positioned on the fourth layer from the top of the stacked lens structure 11 is inverted upside down and is then bonded to the substrate with lenses 41W-c in the substrate state.

Figure 33F:
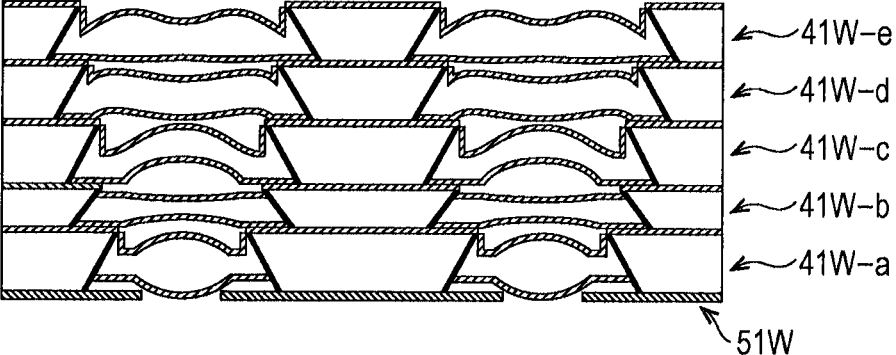

Finally, as illustrated in FIG. 33F, a substrate with lenses 41W-e in the substrate state positioned on the fifth layer from the top of the stacked lens structure 11 is inverted upside down and is then bonded to the substrate with lenses 41W-d in the substrate state.

In this way, when the five substrates with lenses 41W-a to 41W-e in the substrate state are sequentially stacked one by one in the order from the substrate with lenses 41W on the upper layer of the stacked lens structure 11 to the substrate with lenses 41W on the lower layer, the stacked lens structure 11W in the substrate state is obtained.

The five substrates with lenses 41W-a to 41W-e in the substrate state stacked by the stacking method described in FIGS. 32A to 32F or FIGS. 33A to 33F are divided in respective modules or chips using a blade, a laser, or the like whereby the stacked lens structure 11 in which the five substrates with lenses 41a to 41e are stacked is obtained.

12. Eighth and Ninth Embodiments of Camera Module

Figure 34:
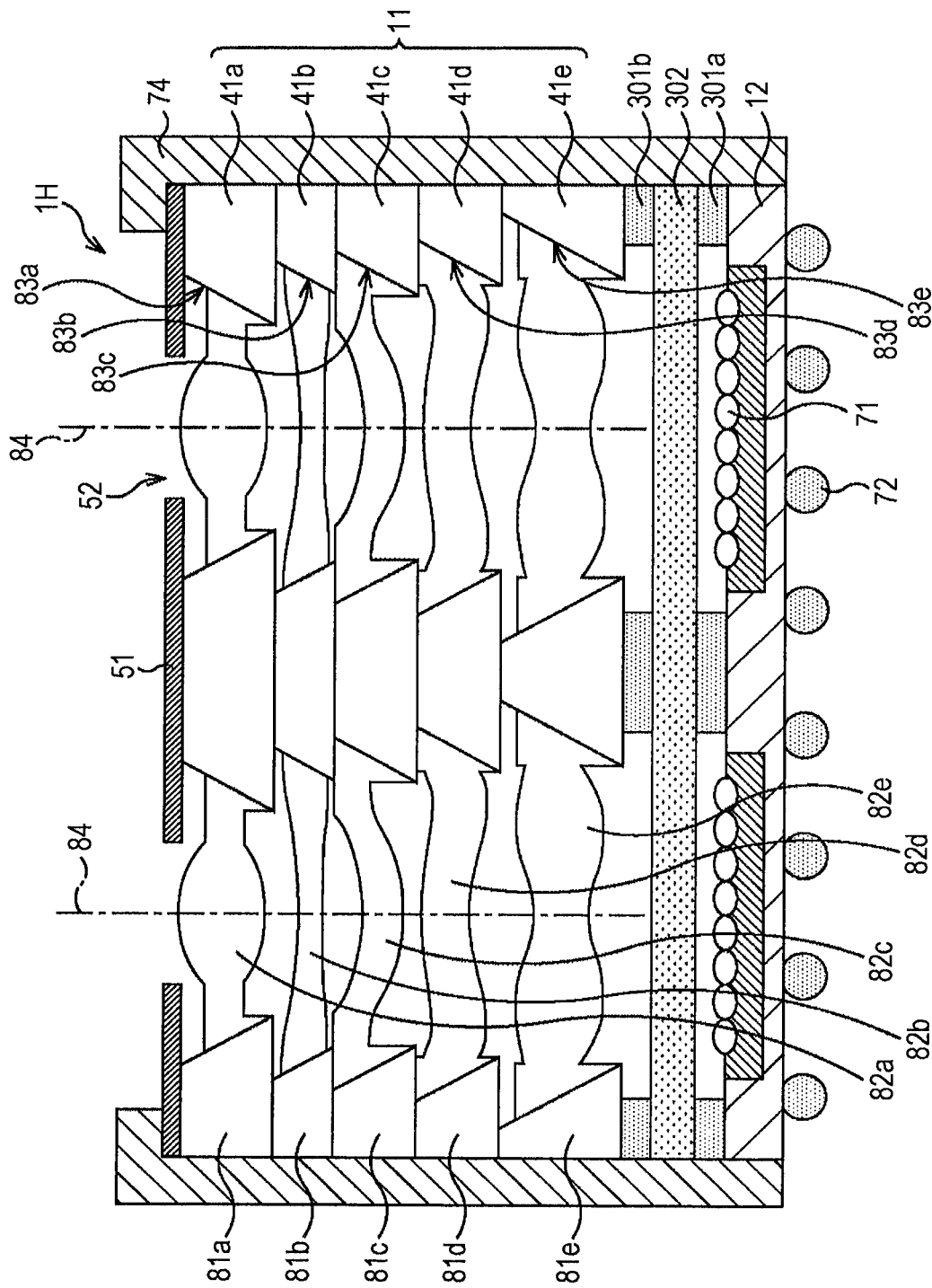
FIG. 34 is a diagram illustrating an eighth embodiment of a camera module which uses a stacked lens structure to which the present technique is applied.

FIG. 34 is a diagram illustrating an eighth embodiment of a camera module which uses a stacked lens structure to which the present technique is applied.

Figure 35:
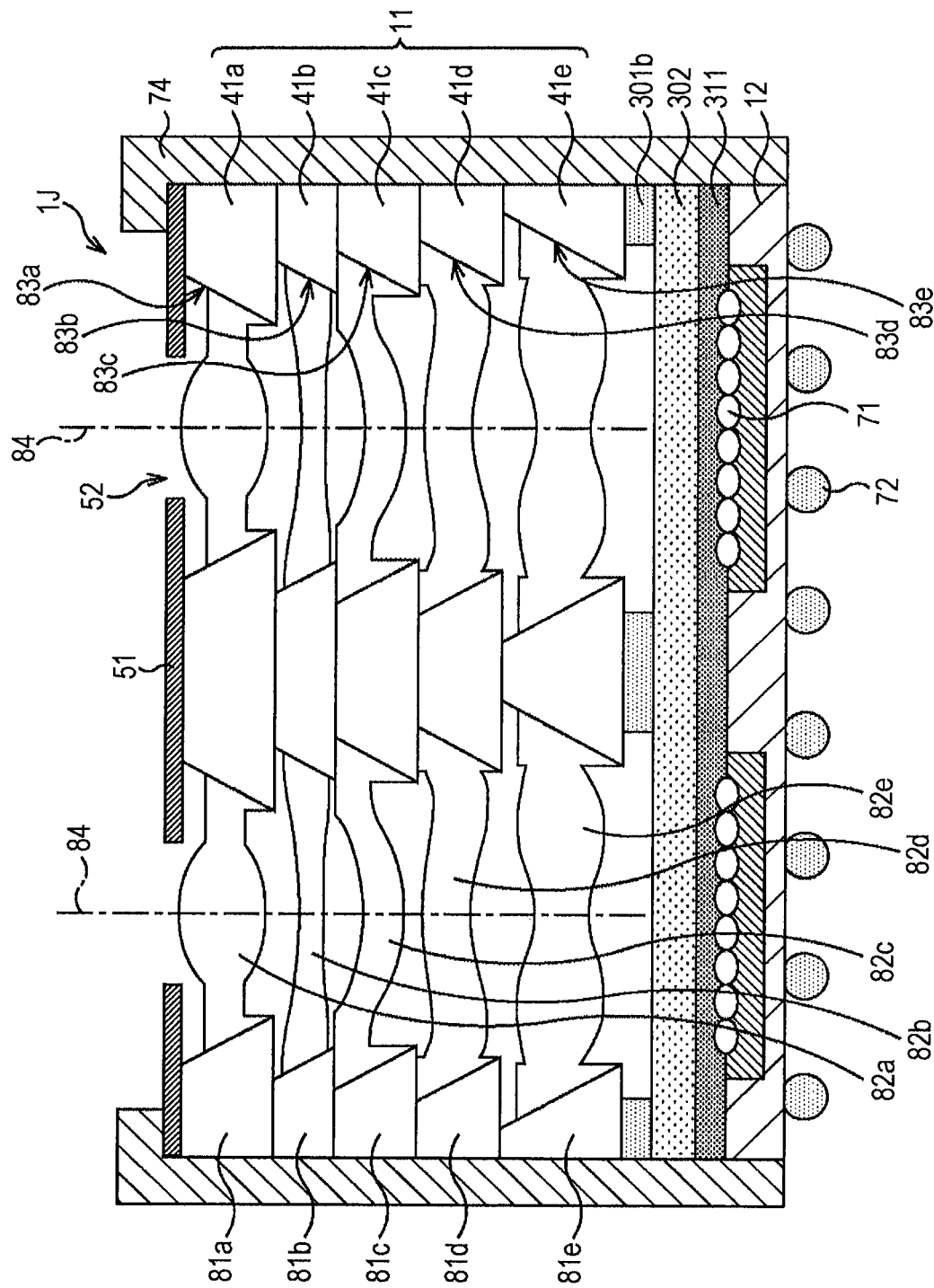
FIG. 35 is a diagram illustrating a ninth embodiment of a camera module which uses a stacked lens structure to which the present technique is applied.

FIG. 35 is a diagram illustrating a ninth embodiment of a camera module which uses a stacked lens structure to which the present technique is applied.

In description of FIGS. 34 and 35, only the portions different from those of the camera module E illustrated in FIG. 13 will be described.

In a camera module 1H illustrated in FIG. 34 and a camera module 1J illustrated in FIG. 35, the portion of the structure material 73 of the camera module E illustrated in FIG. 13 is replaced with another structure.

In the camera module 1H illustrated in FIG. 34, the portion of the structure material 73 of the camera module 1J is replaced with structure materials 301a and 301b and a light transmitting substrate 302.

Specifically, the structure material 301a is disposed in a portion of the upper side of the light receiving element 12. The light receiving element 12 and the light transmitting substrate 302 are fixed by the structure material 301a. The structure material 301a is an epoxy-based resin, for example.

The structure material 301b is disposed on the upper side of the light transmitting substrate 302. The light transmitting substrate 302 and the stacked lens structure 11 are fixed by the structure material 301b. The structure material 301b is an epoxy-based resin, for example.

In contrast, in the camera module 1J illustrated in FIG. 35, the portion of the structure material 301a of the camera module 1H illustrated in FIG. 34 is replaced with a resin layer 311 having a light transmitting property.

The resin layer 311 is disposed on the entire upper surface of the light receiving element 12. The light receiving element 12 and the light transmitting substrate 302 are fixed by the resin layer 311. The resin layer 311 disposed on the entire upper surface of the light receiving element 12 provides an effect or an advantage that, when stress is applied to the light transmitting substrate 302 from the upper side of the light transmitting substrate 302, the resin layer 311 prevents the stress from concentrating on a partial region of the light receiving element 12 so that the stress is received while being distributed to the entire surface of the light receiving element 12.

The structure material 301b is disposed on the upper side of the light transmitting substrate 302. The light transmitting substrate 302 and the stacked lens structure 11 are fixed by the structure material 301b.

The camera module 1H illustrated in FIG. 34 and the camera module 1J illustrated in FIG. 35 include the light transmitting substrate 302 on the upper side of the light receiving element 12. The light transmitting substrate 302 provides an effect or an advantage of suppressing the light receiving element 12 from being damaged in the course of manufacturing the camera module 1H or 1J, for example.

13. Tenth Embodiment of Camera Module

Figure 36:
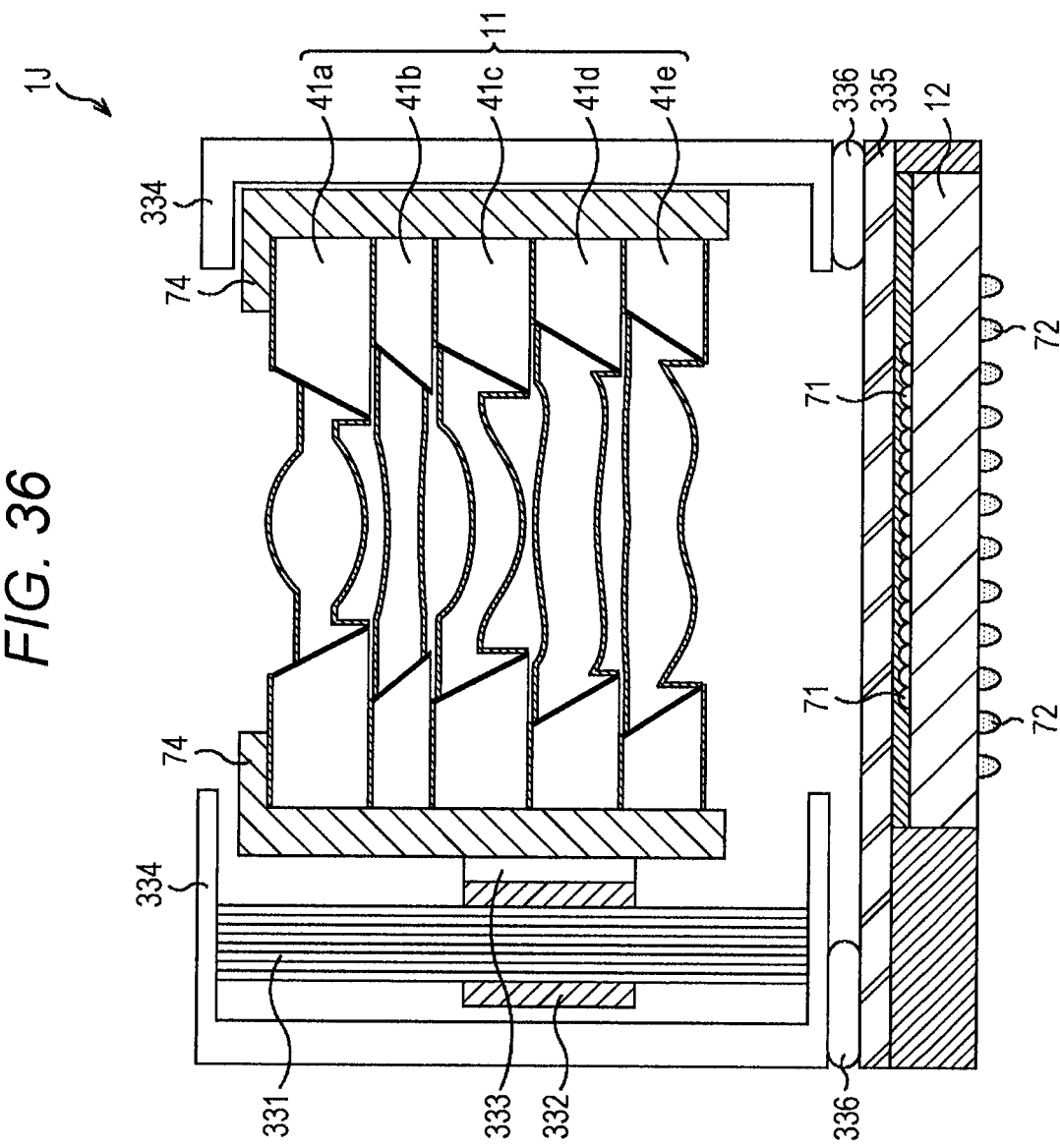
FIG. 36 is a diagram illustrating a tenth embodiment of a camera module which uses a stacked lens structure to which the present technique is applied.

FIG. 36 is a diagram illustrating a tenth embodiment of a camera module which uses a stacked lens structure to which the present technique is applied.

In the camera module 1J illustrated in FIG. 36, the stacked lens structure 11 is accommodated in a lens barrel 74. The lens barrel 74 is fixed to a moving member 332 moving along a shaft 331 by a fixing member 333. When the lens barrel 74 is moved in an axial direction of the shaft 331 by a drive motor (not illustrated), the distance from the stacked lens structure 11 to the imaging surface of the light receiving element 12 is adjusted.

The lens barrel 74, the shaft 331, the moving member 332, and the fixing member 333 are accommodated in the housing 334. A protective substrate 335 is disposed on an upper portion of the light receiving element 12, and the protective substrate 335 and the housing 334 are connected by an adhesive 336.

The mechanism that moves the stacked lens structure 11 provides an effect or an advantage of allowing a camera which uses the camera module 1J to perform an autofocus operation when photographing an image.

14. Eleventh Embodiment of Camera Module

Figure 37:
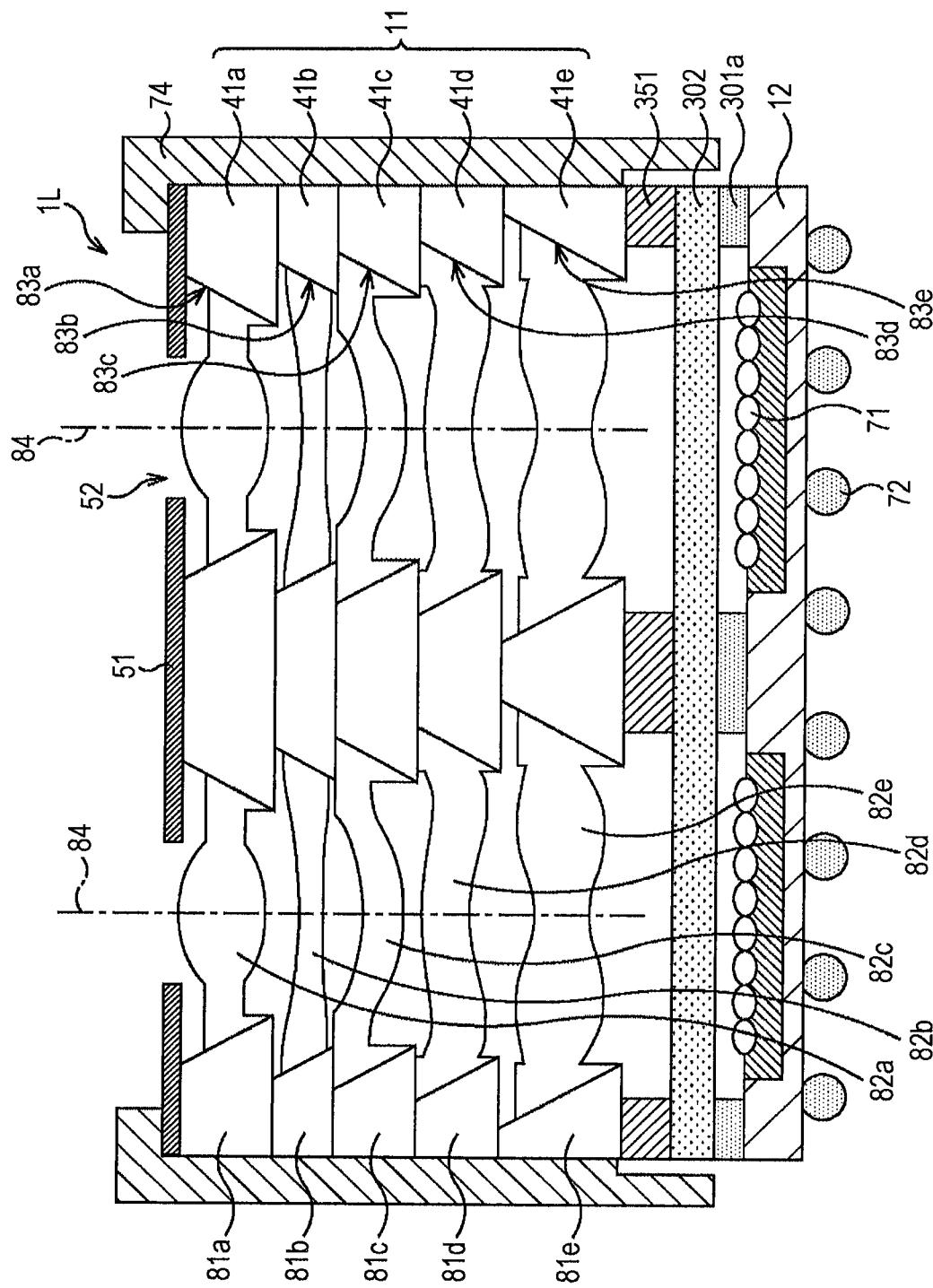
FIG. 37 is a diagram illustrating an eleventh embodiment of a camera module which uses a stacked lens structure to which the present technique is applied.

FIG. 37 is a diagram illustrating an eleventh embodiment of a camera module which uses a stacked lens structure to which the present technique is applied.

A camera module 1L illustrated in FIG. 37 is a camera module in which a focus adjustment mechanism based on a piezoelectric element is added.

That is, in the camera module 1L, a structure material 301a is disposed in a portion of the upper side of the light receiving element 12 similarly to the camera module 1H illustrated in FIG. 34. The light receiving element 12 and the light transmitting substrate 302 are fixed by the structure material 301a. The structure material 301a is an epoxy-based resin, for example.

A piezoelectric element 351 is disposed on an upper side of the light transmitting substrate 302. The light transmitting substrate 302 and the stacked lens structure 11 are fixed by the piezoelectric element 351.

In the camera module 1L, when a voltage is applied to the piezoelectric element 351 disposed on the lower side of the stacked lens structure 11 and the voltage is blocked, the stacked lens structure 11 can be moved up and down. The means for moving the stacked lens structure 11 is not limited to the piezoelectric element 351, but another device of which the shape changes when a voltage is applied or blocked can be used. For example, a MEMS device can be used.

The mechanism that moves the stacked lens structure 11 provides an effect or an advantage of allowing a camera which uses the camera module 1L to perform an autofocus operation when photographing an image.

15. Advantage of Present Structure Compared to Other Structures

The stacked lens structure 11 has a structure (hereinafter referred to as a present structure) in which the substrates with lenses 41 are fixed by direct bonding. The effect and the advantage of the present structure will be described in comparison with other structures of a substrate with lenses in which lenses are formed.

Comparative Structure Example 1

Figure 38:
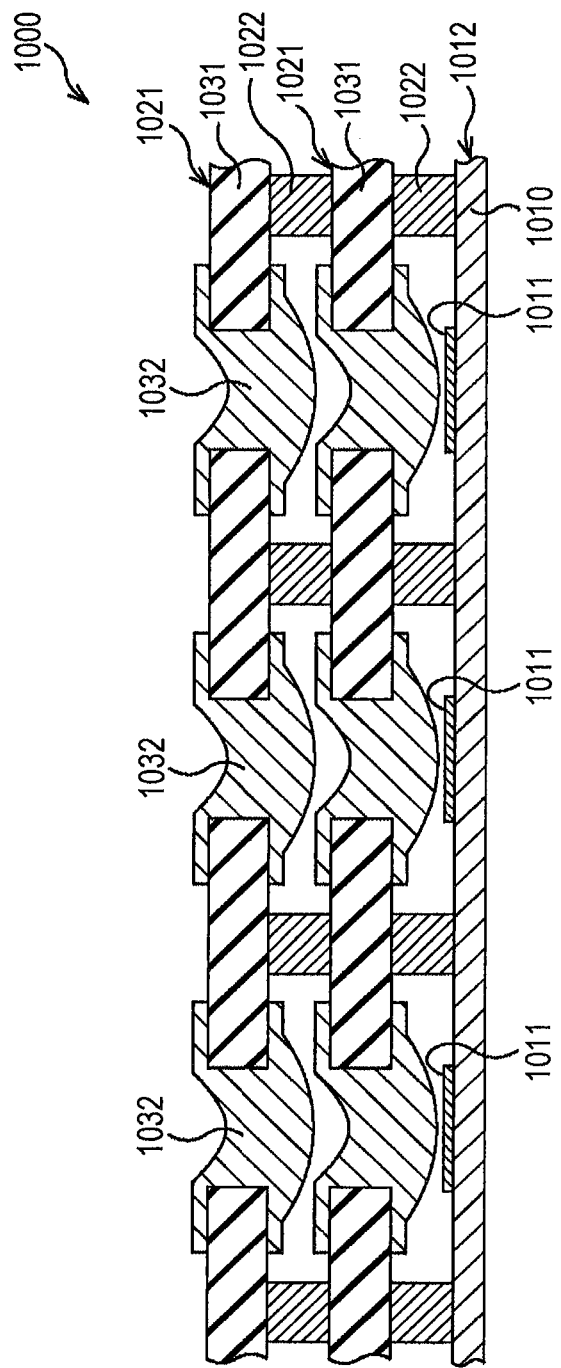
FIG. 38 is a cross-sectional view of a wafer-level stacked structure as Comparative Structure Example 1.

FIG. 38 is a cross-sectional view of a first substrate structure (hereinafter referred to as Comparative Structure Example 1) for comparing with the present structure and is a cross-sectional view of a wafer-level stacked structure disclosed in FIG. 14B of JP 2011-138089 A (hereinafter referred to as Comparative Literature 1).

A wafer-level stacked structure 1000 illustrated in FIG. 38 has a structure in which two lens array substrates 1021 are stacked on a sensor array substrate 1012 in which a plurality of image sensors 1011 is arranged on a wafer substrate 1010 with a columnar spacer 1022 interposed. Each lens array substrate 1021 includes a substrate with lenses 1031 and lenses 1032 formed in a plurality of through-hole portions formed in the substrate with lenses 1031.

Comparative Structure Example 2

Figure 39:
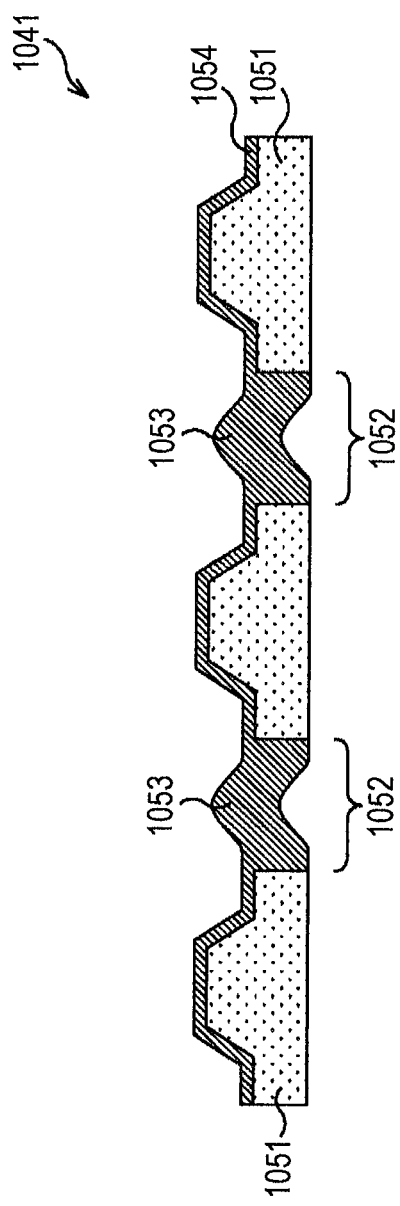
FIG. 39 is a cross-sectional view of a lens array substrate as Comparative Structure Example 2.

FIG. 39 is a cross-sectional view of a second substrate structure (hereinafter referred to as Comparative Structure Example 2) for comparing with the present structure and is a cross-sectional view of a lens array substrate disclosed in FIG. 5A of JP 2009-279790 A (hereinafter referred to as Comparative Literature 2).

In a lens array substrate 1041 illustrated in FIG. 39, lenses 1053 are provided in a plurality of through-holes 1052 formed in a planar substrate 1051. Each lens 1053 is formed of a resin (energy-curable resin) 1054, and the resin 1054 is also formed on the upper surface of the substrate 1051.

A method of manufacturing the lens array substrate 1041 illustrated in FIG. 39 will be described briefly with reference to FIGS. 40A to 40C.

Figure 40A:
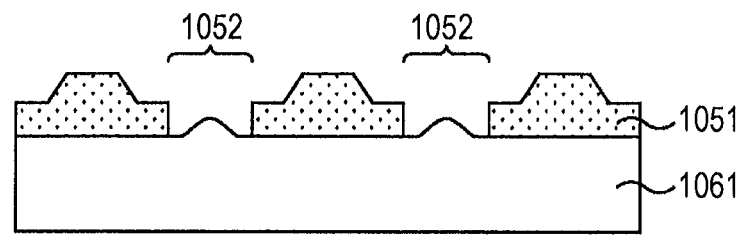
FIGS. 40A to 40C are diagrams illustrating a method of manufacturing the lens array substrate illustrated in FIG. 39.

FIG. 40A illustrates a state in which the substrate 1051 in which the plurality of through-holes 1052 is formed is placed on a lower mold 1061. The lower mold 1061 is a metal mold that presses the resin 1054 toward the upper side from the lower side in a subsequent step.

Figure 40B:
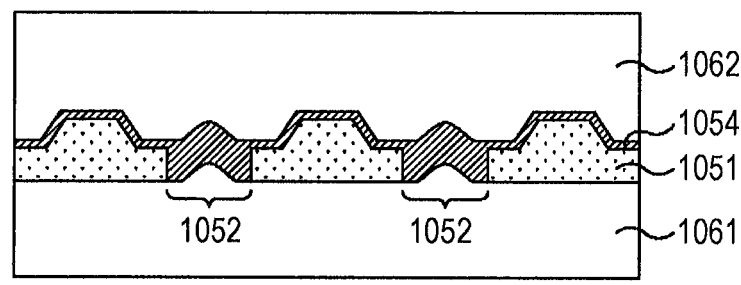

FIG. 40B illustrates a state in which, after the resin 1054 is applied to the inside of the plurality of through-holes 1052 and the upper surface of the substrate 1051, the upper mold 1062 is disposed on the substrate 1051 and pressure-molding is performed using the upper mold 1062 the lower mold 1061. The upper mold 1062 is a metal mold that presses the resin 1054 toward the lower side from the upper side. In a state illustrated in FIG. 40B, the resin 1054 is cured.

Figure 40C:
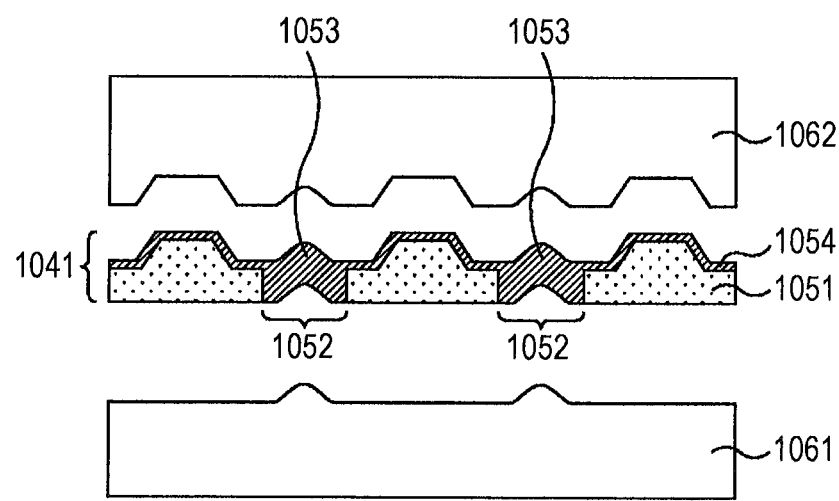

FIG. 40C illustrates a state in which, after the resin 1054 is cured, the upper mold 1062 and the lower mold 1061 are removed and the lens array substrate 1041 is obtained.

The lens array substrate 1041 is characterized in that (1) the resin 1054 formed at the positions of the through-holes 1052 of the substrate 1051 forms the lenses 1053 whereby a plurality of lenses 1053 is formed in the substrate 1051 and (2) a thin layer of the resin 1054 is formed on the entire upper surface of the substrate 1051 positioned between the plurality of lenses 1053.

When a plurality of lens array substrates 1041 is stacked to form a structure, it is possible to obtain an effect or an advantage that the thin layer of the resin 1054 formed on the entire upper surface of the substrate 1051 functions as an adhesive that attaches the substrates.

Moreover, when the plurality of lens array substrates 1041 is stacked to form a structure, since the area of attaching the substrates can be increased as compared to the wafer-level stacked structure 1000 illustrated in FIG. 38 as Comparative Structure Example 1, the substrates can be attached with stronger force.

Effect of Resin in Comparative Structure Example 2

In Comparative Literature 2 which discloses the lens array substrate 1041 illustrated in FIG. 39 as Comparative Structure Example 2, it is described that the resin 1054 serving as the lenses 1053 provides the following effects.

In Comparative Structure Example 2, an energy-curable resin is used as the resin 1054. Moreover, a photo-curable resin is used as an example of the energy-curable resin. When a photo-curable resin is used as the energy-curable resin and the resin 1054 is irradiated with UV light, the resin 1054 is cured. With this curing, a curing shrinkage occurs in the resin 1054.

However, according to the structure of the lens array substrate 1041 illustrated in FIG. 39, even when a curing shrinkage of the resin 1054 occurs, since the substrate 1051 is interposed between the plurality of lenses 1053, it is possible to prevent a variation in the distance between the lenses 1053 resulting from a curing shrinkage of the resin 1054. As a result, it is possible to suppress a warp of the lens array substrate 1041 in which the plurality of lenses 1053 is disposed.

Comparative Structure Example 3

Figure 41:
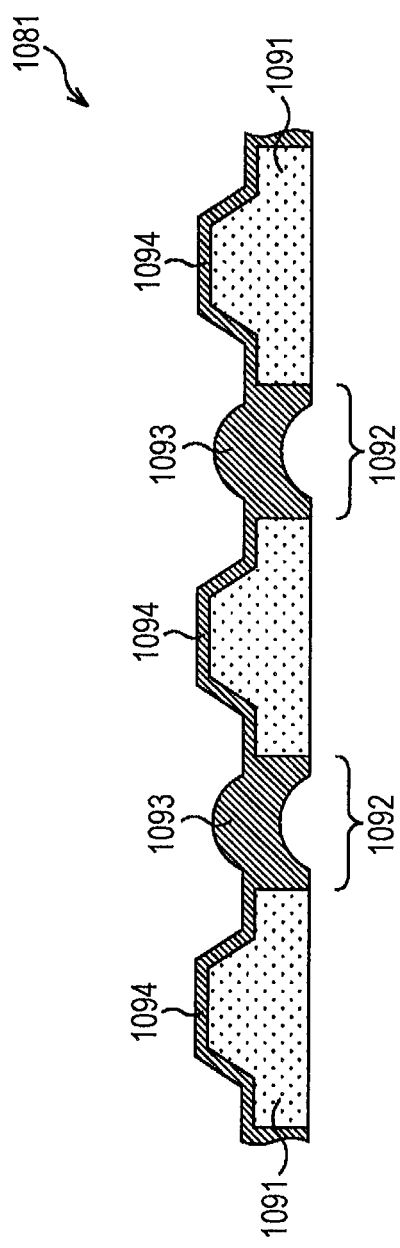
FIG. 41 is a cross-sectional view of a lens array substrate as Comparative Structure Example 3.

FIG. 41 is a cross-sectional view of a third substrate structure (hereinafter referred to as Comparative Structure Example 3) for comparing with the present structure and is a cross-sectional view of a lens array substrate disclosed in FIG. 1 of JP 2010-256563 A (hereinafter referred to as Comparative Document 3).

In a lens array substrate 1081 illustrated in FIG. 41, lenses 1093 are provided in a plurality of through-holes 1092 formed in a planar substrate 1091. Each lens 1093 is formed of a resin (energy-curable resin) 1094, and the resin 1094 is also formed on the upper surface of the substrate 1091 in which the through-hole 1092 is not formed.

A method of manufacturing the lens array substrate 1081 illustrated in FIG. 41 will be described briefly with reference to FIGS. 42A to 42C.

Figure 42A:
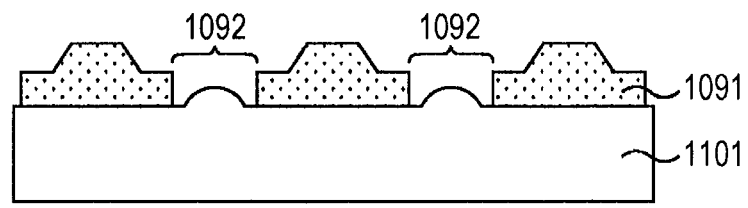
FIGS. 42 are diagrams illustrating a method of manufacturing the lens array substrate illustrated in FIG. 41.

FIG. 42A illustrates a state in which the substrate 1091 in which the plurality of through-holes 1092 is formed is placed on a lower mold 1101. The lower mold 1101 is a metal mold that presses the resin 1094 toward the upper side from the lower side in a subsequent step.

Figure 42B:
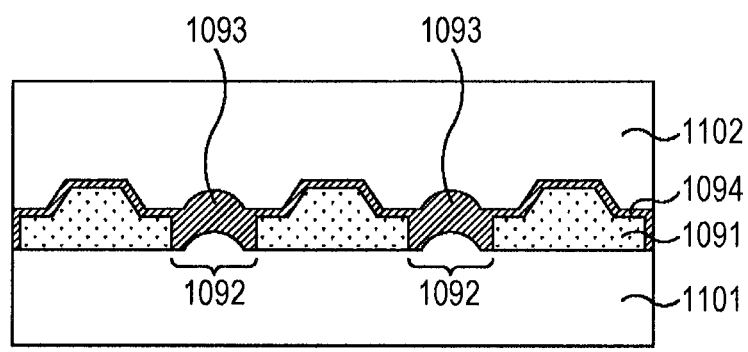

FIG. 42B illustrates a state in which, after the resin 1094 is applied to the inside of the plurality of through-holes 1092 and the upper surface of the substrate 1091, an upper mold 1102 is disposed on the substrate 1091 and pressure-molding is performed using the upper mold 1102 and the lower mold 1101. The upper mold 1102 is a metal mold that presses the resin 1094 toward the lower side from the upper side. In the state illustrated in FIG. 42B, the resin 1094 is cured.

Figure 42C:
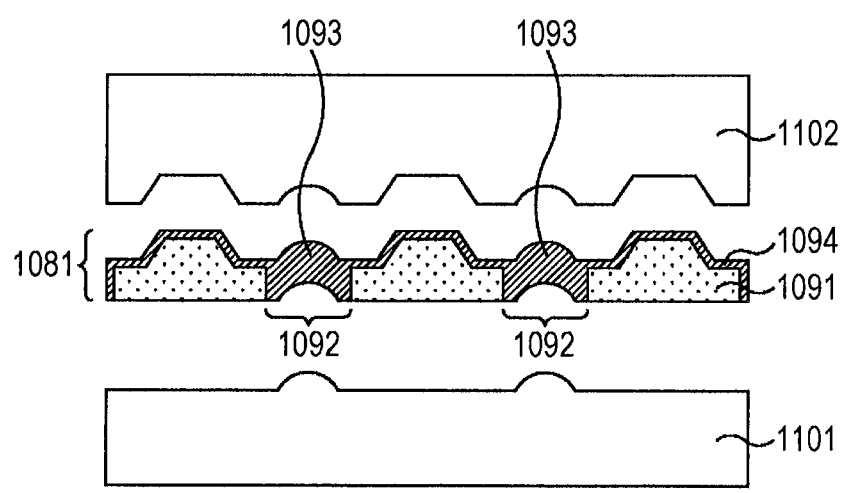

FIG. 42C illustrates a state in which, after the resin 1094 is cured, the upper mold 1102 and the lower mold 1101 are removed to obtain the lens array substrate 1081.

The lens array substrate 1081 is characterized in that (1) the resin 1094 formed at the positions of the through-holes 1092 of the substrate 1091 forms the lenses 1093 whereby a plurality of lenses 1093 is formed in the substrate 1091 and (2) a thin layer of the resin 1094 is formed on the entire upper surface of the substrate 1091 positioned between the plurality of lenses 1093.

Effect of Resin in Comparative Structure Example 3

In Comparative Literature 3 which discloses the lens array substrate 1081 illustrated in FIG. 41 as Comparative Structure Example 3, it is described that the resin 1094 serving as the lenses 1093 provides the following effects.

In Comparative Structure Example 3, an energy-curable resin is used as the resin 1094. Moreover, a photo-curable resin is used as an example of the energy-curable resin. When a photo-curable resin is used as the energy-curable resin and the resin 1094 is irradiated with UV light, the resin 1094 is cured. With this curing, a curing shrinkage occurs in the resin 1094.

However, according to the structure of the lens array substrate 1081 illustrated in FIG. 41, even when a curing shrinkage of the resin 1094 occurs, since the substrate 1091 is interposed between the plurality of lenses 1093, it is possible to prevent a variation in the distance between the lenses 1093 resulting from a curing shrinkage of the resin 1094. As a result, it is possible to suppress a warp of the lens array substrate 1081 in which the plurality of lenses 1093 is disposed.

As described above, in Comparative Literatures 2 and 3, it is described that a curing shrinkage occurs when a photo-curable resin is cured. The curing shrinkage occurring when a photo-curable resin is cured is also disclosed in JP 2013-1091 A or the like as well as Comparative Literature 2 and 3.

Moreover, the problem of a curing shrinkage occurring in a resin when the resin is molded into the shape of lenses and the molded resin is cured is not limited to the photo-curable resin. For example, a curing shrinkage occurring during curing is also a problem in a heat-curable resin which is one type of an energy-curable resin similarly to the photo-curable resin. This is also disclosed in JP 2010-204631 A or the like as well as Comparative Literature 1 and 3, for example.

Comparative Structure Example 4

Figure 43:
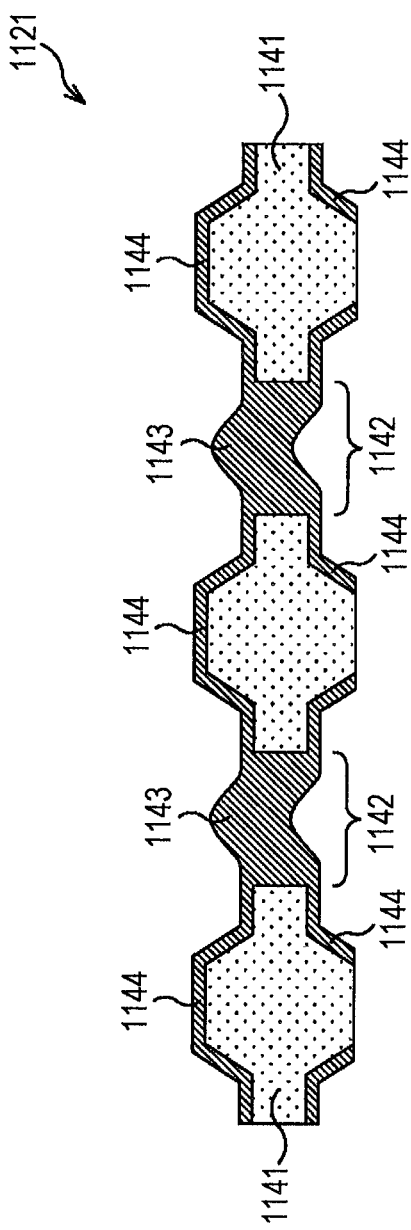
FIG. 43 is a cross-sectional view of a lens array substrate as Comparative Structure Example 4.

FIG. 43 is a cross-sectional view of a fourth substrate structure (hereinafter referred to as Comparative Structure Example 4) for comparing with the present structure and is a cross-sectional view of a lens array substrate disclosed in FIG. 6 of Comparative Literature 2 described above.

A lens array substrate 1121 illustrated in FIG. 43 is different from the lens array substrate 1041 illustrated in FIG. 39 in that the shape of a substrate 1141 other than the through-holes 1042 protrudes toward the lower side as well as the upper side and a resin 1144 is also formed in a portion of the lower surface of the substrate 1141. The other configurations of the lens array substrate 1121 are the same as those of the lens array substrate 1041 illustrated in FIG. 39.

Figure 44:
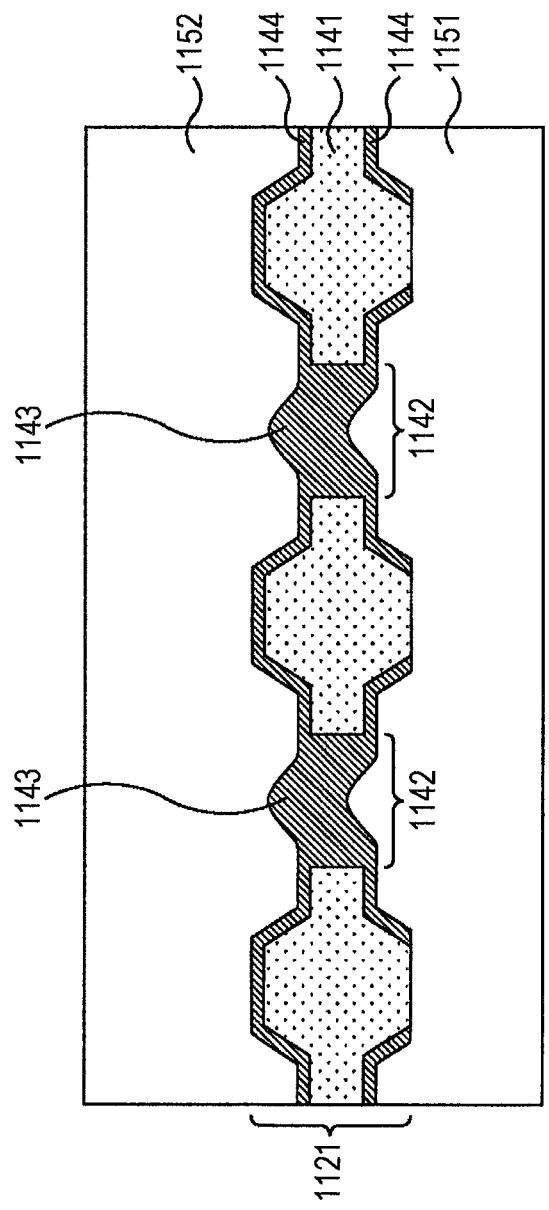
FIG. 44 is a diagram illustrating a method of manufacturing the lens array substrate illustrated in FIG. 43.

FIG. 44 is a diagram illustrating a method of manufacturing the lens array substrate 1121 illustrated in FIG. 43 and is a diagram corresponding to FIG. 40B.

FIG. 44 illustrates a state in which, after the resin 1144 is applied to the inside of the plurality of through-holes 1142 and the upper surface of the substrate 1141, pressure-molding is performed using an upper mold 1152 and a lower mold 1151. The resin 1144 is also injected between the lower surface of the substrate 1141 and the lower mold 1151. In the state illustrated in FIG. 44, the resin 1144 is cured.

The lens array substrate 1121 is characterized in that (1) the resin 1144 formed at the positions of the through-holes 1142 of the substrate 1141 forms the lenses 1143 whereby a plurality of lenses 1143 is formed in the substrate 1141 and (2) a thin layer of the resin 1144 is formed on the entire upper surface of the substrate 1141 positioned between the plurality of lenses 1143 and a thin layer of the resin 1144 is also formed in a portion of the lower surface of the substrate 1141.

Effect of Resin in Comparative Structure Example 4

In Comparative Literature 2 which discloses the lens array substrate 1121 illustrated in FIG. 43 as Comparative Structure Example 4, it is described that the resin 1144 serving as the lenses 1143 provides the following effects.

In the lens array substrate 1121 illustrated in FIG. 43, which is Comparative Structure Example 4, a photo-curable resin which is an example of an energy-curable resin is used as the resin 1144. When the resin 1144 is irradiated with UV light, the resin 1144 is cured. With this curing, a curing shrinkage occurs in the resin 1144 similarly to Comparative Structure Examples 2 and 3.

However, in the lens array substrate 1121 of Comparative Structure Example 4, a thin layer of the resin 1144 is formed in a certain region of the lower surface of the substrate 1141 as well as the entire upper surface of the substrate 1141 positioned between the plurality of lenses 1143.

In this way, when a structure in which the resin 1144 is formed on both the upper surface and the lower surface of the substrate 1141 is used, it is possible to cancel the direction of a warp of the entire lens array substrate 1121.

In contrast, in the lens array substrate 1041 illustrated in FIG. 39 as Comparative Structure Example 2, although a thin layer of the resin 1054 is formed on the entire upper surface of the substrate 1051 positioned between the plurality of lenses 1053, a thin layer of the resin 1054 is not formed on the lower surface of the substrate 1051.

Thus, in the lens array substrate 1121 illustrated in FIG. 43, it is possible to provide a lens array substrate in which the amount of a warp is reduced as compared to the lens array substrate 1041 illustrated in FIG. 39.

Comparative Structure Example 5

Figure 45:
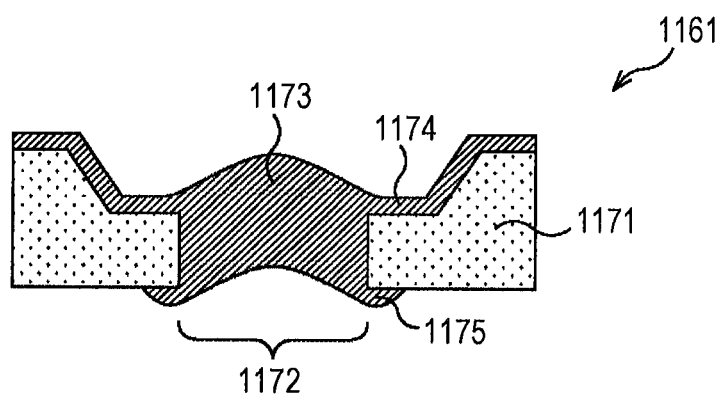
FIG. 45 is a cross-sectional view of a lens array substrate as Comparative Structure Example 5.

FIG. 45 is a cross-sectional view of a fifth substrate structure (hereinafter referred to as Comparative Structure Example 5) for comparing with the present structure and is a cross-sectional view of a lens array substrate disclosed in FIG. 9 of Comparative Literature 2 described above.

A lens array substrate 1161 illustrated in FIG. 45 is different from the lens array substrate 1041 illustrated in FIG. 39 in that a resin protrusion region 1175 is formed on a rear surface of a substrate 1171 near through-holes 1172 formed in the substrate 1171. The other configurations of the lens array substrate 1161 are the same as those of the lens array substrate 1041 illustrated in FIG. 39.

FIG. 45 illustrates the divided lens array substrate 1161.

The lens array substrate 1161 is characterized in that (1) a resin 1174 formed at the positions of the through-holes 1172 of the substrate 1171 forms lenses 1173 whereby a plurality of lenses 1173 is formed in the substrate 1171 and (2) a thin layer of the resin 1174 is formed on the entire upper surface of the substrate 1171 positioned between the plurality of lenses 1173 and a thin layer of the resin 1174 is also formed in a portion of the lower surface of the substrate 1171.

Effect of Resin in Comparative Structure Example 5

In Comparative Literature 2 which discloses the lens array substrate 1161 illustrated in FIG. 45 as Comparative Structure Example 5, it is described that the resin 1174 serving as the lenses 1173 provides the following effects.

In the lens array substrate 1161 illustrated in FIG. 45, which is Comparative Structure Example 5, a photo-curable resin which is an example of an energy-curable resin is used as the resin 1174. When the resin 1174 is irradiated with UV light, the resin 1174 is cured. With this curing, a curing shrinkage occurs in the resin 1174 similarly to Comparative Structure Examples 2 and 3.

However, in the lens array substrate 1171 of Comparative Structure Example 5, a thin layer (the resin protrusion region 1175) of the resin 1174 is formed in a certain region of the lower surface of the substrate 1171 as well as the entire upper surface of the substrate 1171 positioned between the plurality of lenses 1173. Due to this, it is possible to provide a lens array substrate in which the direction of a warp of the entire lens array substrate 1171 is canceled and the amount of a warp is reduced.

Comparison of Effects of Resin in Comparative Structure Examples 2 to 5

The effects of the resin in Comparative Structure Examples 2 to 5 can be summarized as below.

(1) As in Comparative Structure Examples 2 and 3, in the case of the structure in which a resin layer is disposed on the entire upper surface of a lens array substrate, a warp occurs in the substrate in which the plurality of lenses is disposed.

Figure 46A:
FIGS. 46A to 46C are diagrams illustrating the effects of a resin which forms a lens.
Figure 46B:
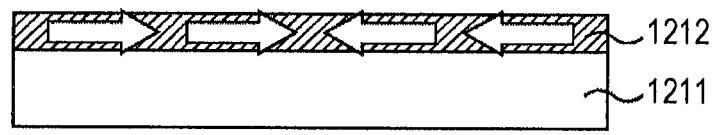
Figure 46C:
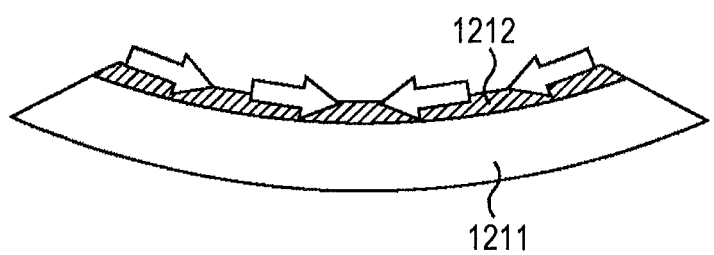

FIGS. 46A to 46C are diagrams schematically illustrating a structure in which a resin layer is disposed on the entire upper surface of a lens array substrate and are diagrams illustrating the effect of the resin serving as lenses.

As illustrated in FIGS. 46A and 46B, a curing shrinkage occurs in the layer of a photo-curable resin 1212 disposed on the upper surface of a lens array substrate 1211 (lenses and through-holes are not illustrated) when irradiated with UV light for curing. As a result, force in the shrinking direction resulting from the photo-curable resin 1212 occurs in the layer of the photo-curable resin 1212.

On the other hand, the lens array substrate 1211 itself does not shrink or expand even when irradiated with UV light. That is, force resulting from the substrate does not occur in the lens array substrate 1211 itself. As a result, the lens array substrate 1211 warps in a downward convex shape as illustrated in FIG. 46C.

(2) However, as in Comparative Structure Examples 4 and 5, in the case of a structure in which a resin layer is disposed on both the upper surface and the lower surface of a lens array substrate, since the direction of a warp of the lens array substrate is canceled, it is possible to reduce the amount of a warp of the lens array substrate as compared to Comparative Structure Examples 2 and 3.

Figure 47A:
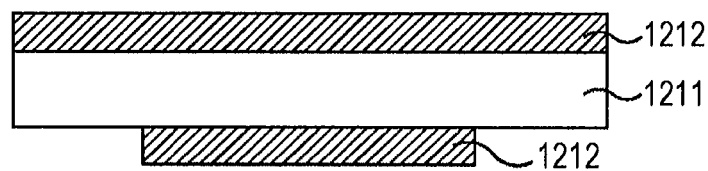
FIGS. 47A to 47C are diagrams illustrating the effects of a resin which forms a lens.
Figure 47B:
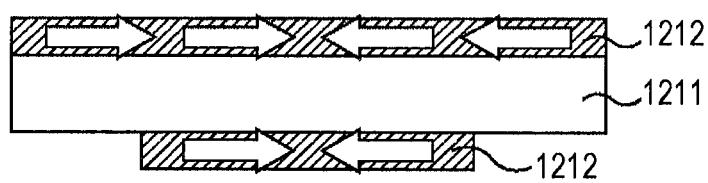
Figure 47C:
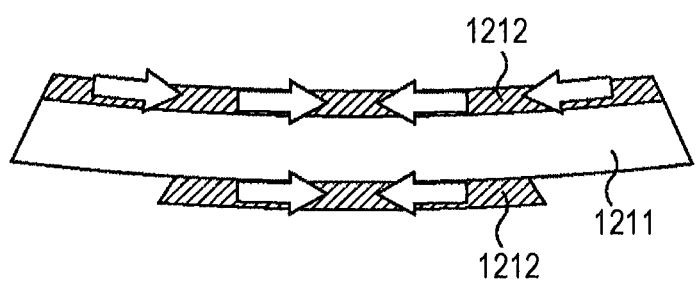

FIGS. 47A to 47C are diagrams schematically illustrating a structure in which a resin layer is disposed on both the upper surface and the lower surface of a lens array substrate and is a diagram illustrating the effect of the resin serving as lenses.

As illustrated in FIGS. 47A and 47B, a curing shrinkage occurs in the layer of a photo-curable resin 1212 disposed on the upper surface of a lens array substrate 1211 when irradiated with UV light for curing. As a result, force in the shrinking direction resulting from the photo-curable resin 1212 occurs in the layer of the photo-curable resin 1212 disposed on the upper surface of the lens array substrate 1211. Due to this, force that warps the lens array substrate 1211 in a downward convex shape acts on the upper surface side of the lens array substrate 1211.

In contrast, the lens array substrate 1211 itself does not shrink or expand even when irradiated with UV light. That is, force resulting from the substrate does not occur in the lens array substrate 1211 itself.

On the other hand, a curing shrinkage occurs in the layer of the photo-curable resin 1212 disposed on the lower surface of the lens array substrate 1211 when irradiated with UV light for curing. As a result, force in the shrinking direction resulting from the photo-curable resin 1212 occurs in the layer of the photo-curable resin 1212 disposed on the lower surface of the lens array substrate 1211. Due to this, force that warps the lens array substrate 1211 in an upward convex shape acts on the lower surface side of the lens array substrate 1211.

The force that warps the lens array substrate 1211 in a downward convex shape, acting on the upper surface side of the lens array substrate 1211 and the force that warps the lens array substrate 1211 in an upward convex shape, acting on the lower surface side of the lens array substrate 1211 cancel each other.

As a result, as illustrated in FIG. 47C, the amount of a warp of the lens array substrate 1211 in Comparative Structure Examples 4 and 5 is smaller than the amount of a warp in Comparative Structure Examples 2 and 3 illustrated in FIG. 46C.

As described above, the force that warps the lens array substrate and the amount of a warp of the lens array substrate are affected by a relative relation between (1) the direction and the magnitude of the force acting on the lens array substrate on the upper surface of the lens array substrate and (2) the direction and the magnitude of the force acting on the lens array substrate on the lower surface of the lens array substrate.

Comparative Structure Example 6

Figure 48A:
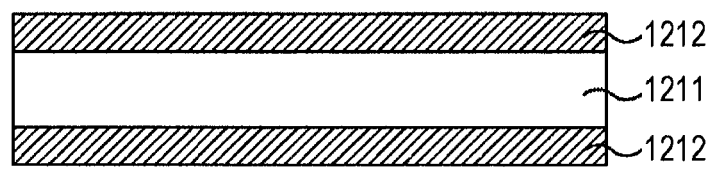
FIGS. 48A to 48C are diagrams schematically illustrating a lens array substrate as Comparative Structure Example 6.

Thus, for example, as illustrated in FIG. 48A, a lens array substrate structure in which the layer and the area of the photo-curable resin 1212 disposed on the upper surface of the lens array substrate 1211 are the same as the layer and the area of the photo-curable resin 1212 disposed on the lower surface of the lens array substrate 1211 can be considered. This lens array substrate structure will be referred to as a sixth substrate structure (hereinafter referred to as Comparative Structure Example 6) for comparison with the present structure.

In Comparative Structure Example 6, force in a shrinking direction resulting from the photo-curable resin 1212 occurs in the layer of the photo-curable resin 1212 disposed on the upper surface of the lens array substrate 1211. Force resulting from the substrate does not occur in the lens array substrate 1211 itself. Due to this, force that warps the lens array substrate 1211 in a downward convex shape acts on the upper surface side of the lens array substrate 1211.

On the other hand, force in a shrinking direction resulting from the photo-curable resin 1212 occurs in the layer of the photo-curable resin 1212 disposed on the lower surface of the lens array substrate 1211. Force resulting from the substrate does not occur in the lens array substrate 1211 itself. Due to this, force that warps the lens array substrate 1211 in an upward convex shape acts on the lower surface side of the lens array substrate 1211.

The two types of force that warps the lens array substrate 1211 act in the direction of canceling each other more effectively than the structure illustrated in FIG. 47A. As a result, the force that warps the lens array substrate 1211 and the amount of a warp of the lens array substrate 1211 are further reduced as compared to Comparative Structure Examples 4 and 5.

Comparative Structure Example 7

However, practically, the shapes of the substrates with lenses that form the stacked lens structure assembled into a camera module are not the same. More specifically, among the plurality of substrates with lenses that forms a stacked lens structure, for example, the thicknesses of the substrates with lenses and the sizes of the through-holes may be different and the thicknesses, shapes, volumes, and the like of lenses formed in the through-holes may be different. Further specifically, the thickness of a photo-curable resin formed on the upper surface and the lower surface of a substrate with lenses may be different from one substrate with lenses to another.

Figure 48B:
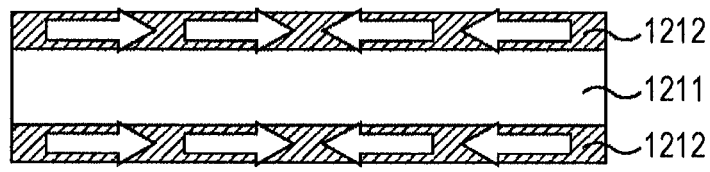
Figure 48C:
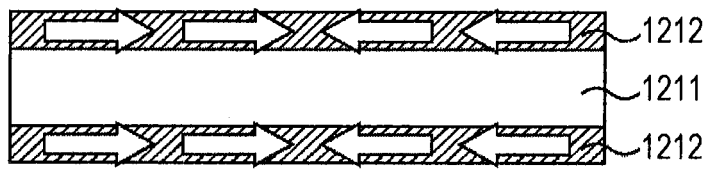
Figure 49:
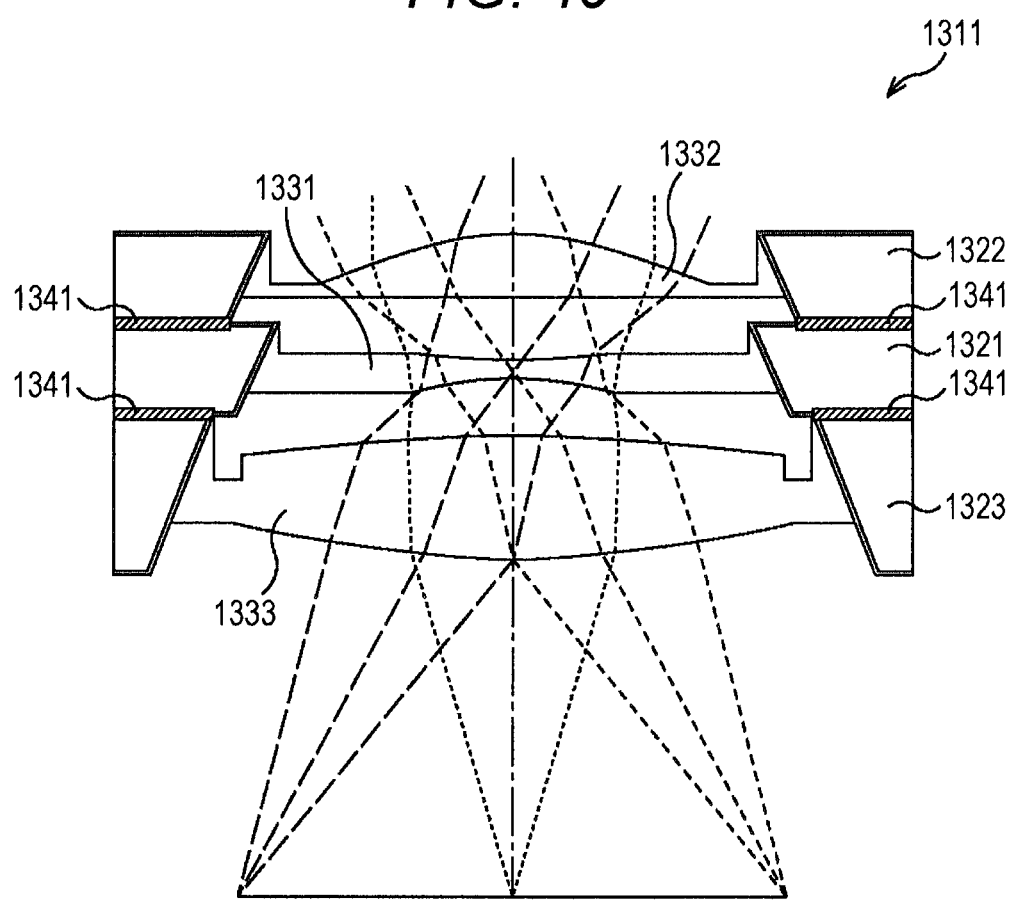
FIG. 49 is a cross-sectional view of a stacked lens structure as Comparative Structure Example 7.

FIG. 49 is a cross-sectional view of a stacked lens structure formed by stacking three substrates with lenses as a seventh substrate structure (hereinafter referred to as Comparative Structure Example 7). In this stacked lens structure, similarly to Comparative Structure Example 6 illustrated in FIGS. 48A to 48C, it is assumed that the layer and the area of the photo-curable resin disposed on the upper surface and the lower surface of each of the substrates with lenses are the same.

A stacked lens structure 1311 illustrated in FIG. 49 includes three substrates with lenses 1321 to 1323.

In the following description, among the three substrates with lenses 1321 to 1323, the substrate with lenses 1321 on the middle layer will be referred to as a first substrate with lenses 1321, the substrate with lenses 1322 on the top layer will be referred to as a second substrate with lenses 1322, and the substrate with lenses 1323 on the bottom layer will be referred to as a third substrate with lenses 1323.

The substrate thickness and the lens thickness in the second substrate with lenses 1322 disposed on the top layer are different from those of the third substrate with lenses 1323 disposed on the bottom layer.

More specifically, the lens thickness in the third substrate with lenses 1323 is larger than the lens thickness in the second substrate with lenses 1322. Thus, the substrate thickness in the third substrate with lenses 1323 is larger than the substrate thickness in the second substrate with lenses 1322.

A resin 1341 is formed on an entire contact surface between the first and second substrates with lenses 1321 and 1322 and an entire contact surface between the first and third substrates with lenses 1321 and 1323.

The cross-sectional shape of the through-holes of the three substrates with lenses 1321 to 1323 has such a so-called fan shape that the upper surface of the substrate is wider than the lower surface of the substrate.

The effect of the three substrates with lenses 1321 to 1323 having different shapes will be described with reference to FIGS. 50A to 50D.

Figure 50A:
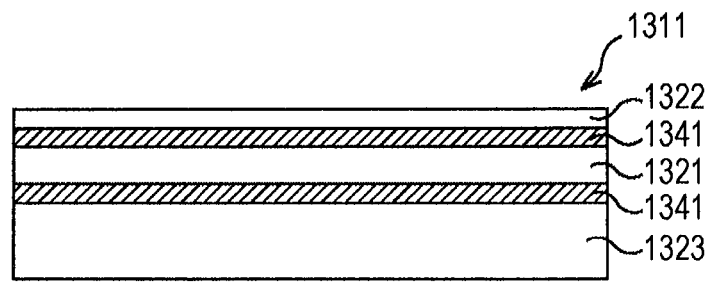
FIGS. 50A to 50D are diagrams illustrating the effects of the stacked lens structure illustrated in FIG. 49.
Figure 50B:
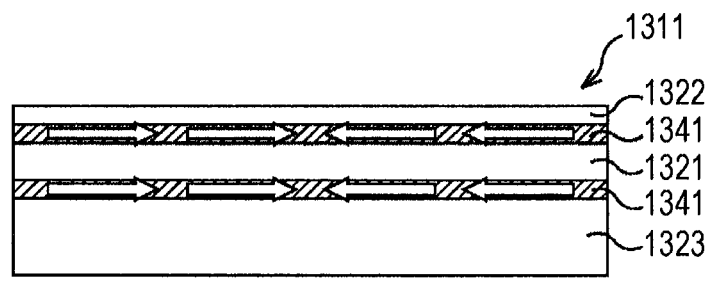
Figure 50C:
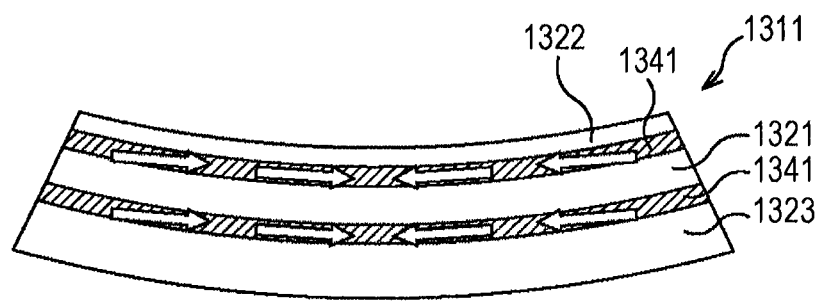

FIGS. 50A to 50C are diagrams schematically illustrating the stacked lens structure 1311 illustrated in FIG. 49.

As in this stacked lens structure 1311, when the second and third substrates with lenses 1322 and 1323 having different substrate thicknesses are disposed on the upper surface and the lower surface of the first substrate with lenses 1321, respectively, the force of warping the stacked lens structure 1311 and the amount of a warp of the stacked lens structure 1311 change depending on the position in the thickness direction of the stacked lens structure 1311 at which the layer of the resin 1341 present in the entire contact surface of the three substrates with lenses 1321 to 1323 is present.

Unless the layer of the resin 1341 present in the entire contact surface of the three substrates with lenses 1321 to 1323 is disposed symmetrical about a line that passes through the central line (that is, the central point in the thickness direction of the stacked lens structure 1311) of the stacked lens structure 1311 and runs in the plane direction of the substrate, the effect of the force occurring due to a curing shrinkage of the resin 1341 disposed on the upper surface and the lower surface of the first substrate with lenses 1321 is not canceled completely as illustrated in FIG. 48C. As a result, the stacked lens structure 1311 warps in a certain direction.

For example, when the two layers of the resin 1341 on the upper surface and the lower surface of the first substrate with lenses 1321 are disposed to be shifted in an upper direction than the central line in the thickness direction of the stacked lens structure 1311, if a curing shrinkage occurs in the two layers of the resin 1341, the stacked lens structure 1311 warps in a downward convex shape as illustrated in FIG. 50C.

Further, when the cross-sectional shape of the through-hole in a thinner substrate among the second and third substrates with lenses 1322 and 1323 has such a shape that widens toward the first substrate with lenses 1321, the possibility of the loss or breakage of lenses may increase.

Figure 50D:
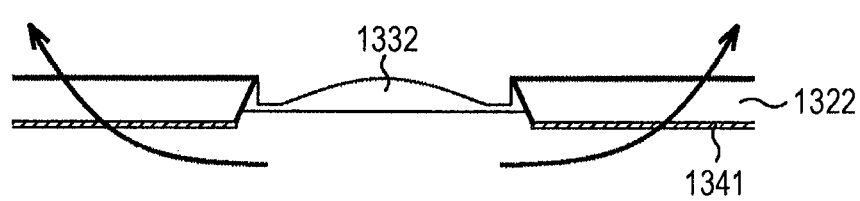

In the example illustrated in FIG. 49, the cross-sectional shape of the through-hole in the second substrate with lenses 1322 having the smaller thickness among the second and third substrates with lenses 1322 and 1323 has such a fan shape that widens toward the first substrate with lenses 1321. In such a shape, when a curing shrinkage occurs in the two layers of the resin 1341 on the upper surface and the lower surface of the first substrate with lenses 1321, force that warps the stacked lens structure 1311 in a downward convex shape as illustrated in FIG. 50C acts on the stacked lens structure 1311. This force acts as force acting in the direction of separating the lenses and the substrate in the second substrate with lenses 1322 as illustrated in FIG. 50D. With this action, the possibility that the lenses 1332 of the second substrate with lenses 1322 are lost or broken increases.

Next, a case in which a resin is expanded thermally will be considered.

Comparative Structure Example 8

Figure 51:
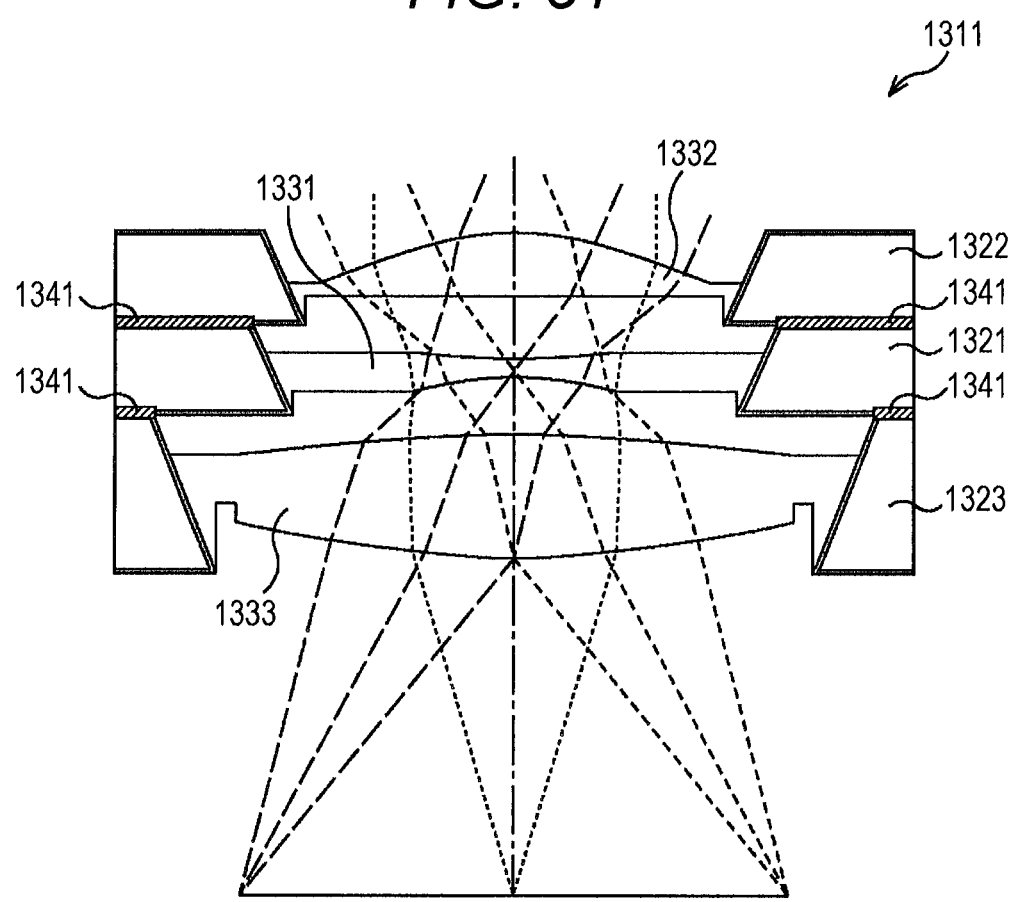
FIG. 51 is a cross-sectional view of a stacked lens structure as Comparative Structure Example 8.

FIG. 51 is a cross-sectional view of a stacked lens structure formed by stacking three substrates with lenses as an eighth substrate structure (hereinafter referred to as Comparative Structure Example 8). In this stacked lens structure, similarly to Comparative Structure Example 6 illustrated in FIGS. 48A to 48C, it is assumed that the layer and the area of the photo-curable resin disposed on the upper surface and the lower surface of each of the substrates with lenses are the same.

Comparative Structure Example 8 illustrated in FIG. 51 is different from Comparative Structure Example 7 illustrated in FIG. 49 in that the cross-sectional shape of the through-holes of the three substrates with lenses 1321 to 1323 has such a so-called downward tapered shape that the lower surface of the substrate is narrower than the upper surface of the substrate.

Figure 52A:
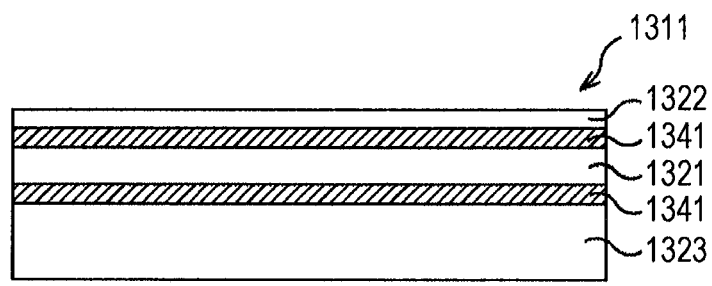
FIGS. 52A to 52D are diagrams illustrating the effects of a stacked lens structure illustrated in FIG. 51.
Figure 52B:
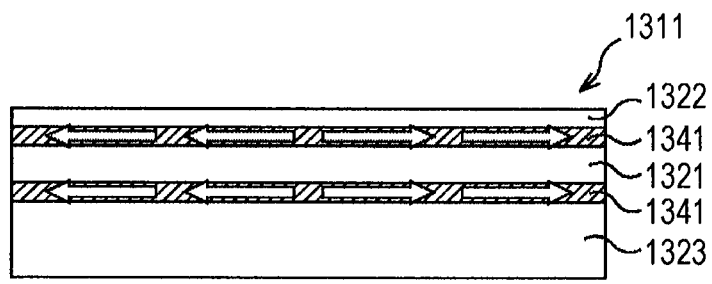
Figure 52C:
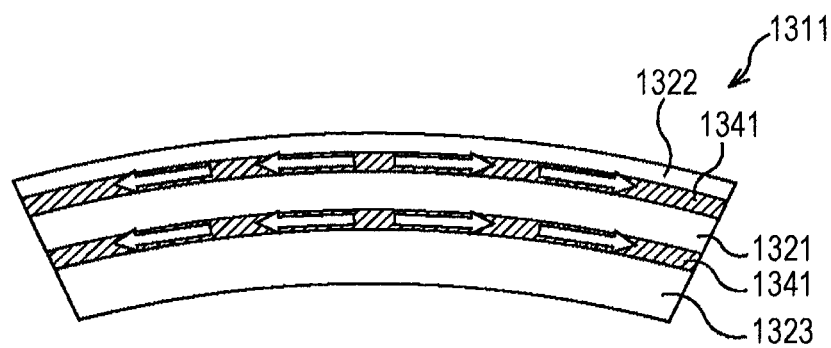

FIGS. 52A to 52C are diagrams schematically illustrating the stacked lens structure 1311 illustrated in FIG. 51.

When a user actually uses a camera module, the temperature in the housing of a camera increases with an increase in power consumption accompanied by the operation of the camera and the temperature of the camera module also increases. With this temperature rise, the resin 1341 disposed on the upper surface and the lower surface of the first substrate with lenses 1321 of the stacked lens structure 1311 illustrated in FIG. 51 is expanded thermally.

Even when the area and the thickness of the resin 1341 disposed on the upper surface and the lower surface of the first substrate with lenses 1321 are the same as illustrated in FIG. 48A, unless the layer of the resin 1341 present in the entire contact surface of the three substrates with lenses 1321 to 1323 is disposed symmetrical about a line that passes through the central line (that is, the central point in the thickness direction of the stacked lens structure 1311) of the stacked lens structure 1311 and runs in the plane direction of the substrate, the effect of the force occurring due to thermal expansion of the resin 1341 disposed on the upper surface and the lower surface of the first substrate with lenses 1321 is not canceled completely as illustrated in FIG. 48C. As a result, the stacked lens structure 1311 warps in a certain direction.

For example, when the two layers of the resin 1341 on the upper surface and the lower surface of the first substrate with lenses 1321 are disposed to be shifted in an upper direction than the central line in the thickness direction of the stacked lens structure 1311, if thermal expansion occurs in the two layers of the resin 1341, the stacked lens structure 1311 warps in an upward convex shape as illustrated in FIG. 52C.

Figure 52D:
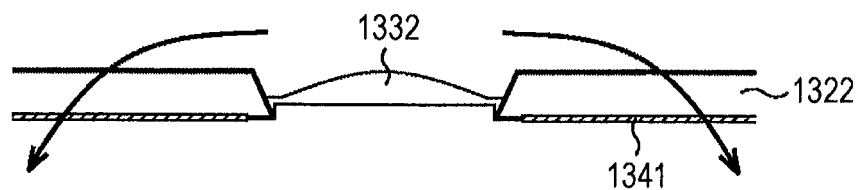

Further, in the example illustrated in FIG. 51, the cross-sectional shape of the through-hole of the second substrate with lenses 1322 having a smaller thickness among the second and third substrates with lenses 1322 and 1323 has a downward tapered shape that narrows toward the first substrate with lenses 1321. In such a shape, when the two layers of the resin 1341 on the upper surface and the lower surface of the first substrate with lenses 1321 is thermally expanded, force that warps the stacked lens structure 1311 in an upward convex shape acts on the stacked lens structure 1311. This force acts as force acting in the direction of separating the lenses and the substrate in the second substrate with lenses 1322 as illustrated in FIG. 52D. With this action, the possibility that the lenses 1332 of the second substrate with lenses 1322 are lost or broken increases.

<Present Structure>

Figure 53B:
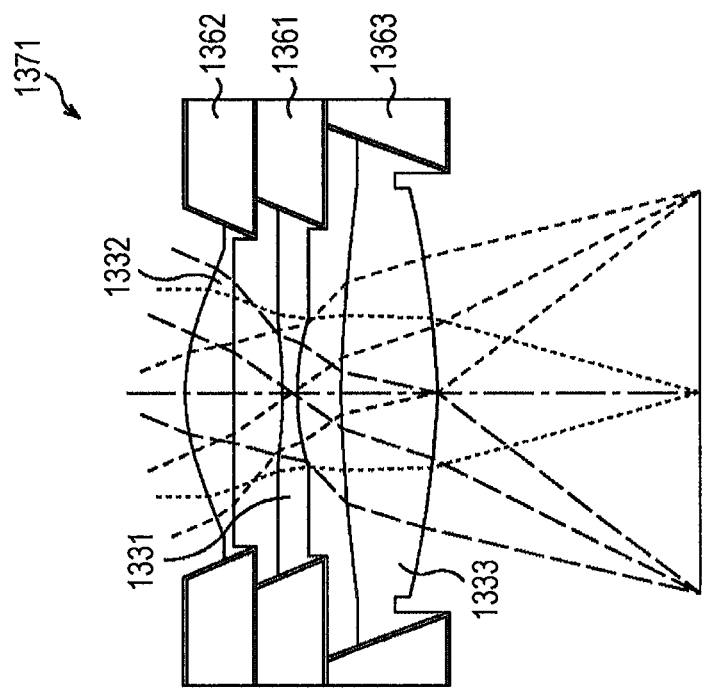
FIGS. 53A to 53B are a cross-sectional views of a stacked lens structure which employs the present structure.
Figure 53A:
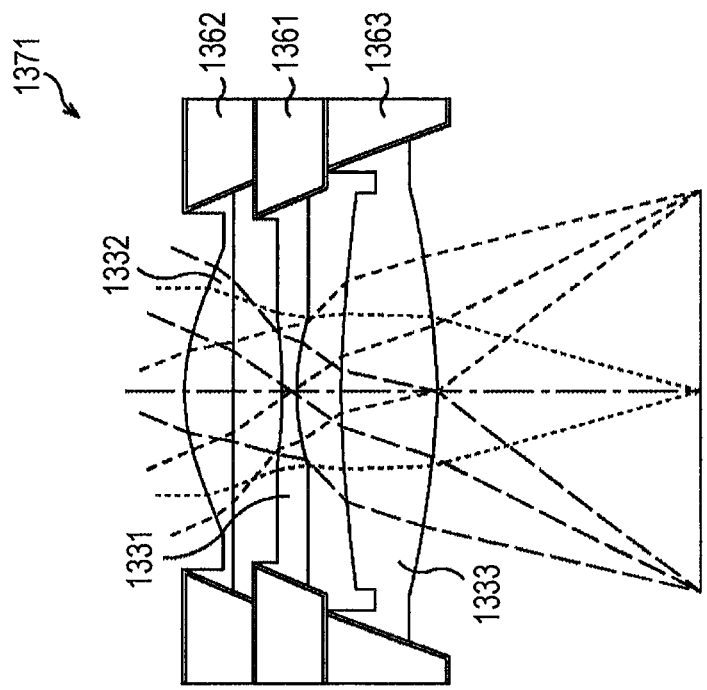

FIGS. 53A and 53B are diagrams illustrating a stacked lens structure 1371 including three substrates with lenses 1361 to 1363, which employs the present structure.

FIG. 53A illustrates a structure corresponding to the stacked lens structure 1311 illustrated in FIG. 49, in which the cross-sectional shape of the through-hole has a so-called fan shape. On the other hand, FIG. 53B illustrates a structure corresponding to the stacked lens structure 1311 illustrated in FIG. 51, in which the cross-sectional shape of the through-hole has a so-called downward tapered shape.

Figure 54A:
FIGS. 54A to 54C are diagrams schematically illustrating the stacked lens structure illustrated in FIG. 53.
Figure 54B:
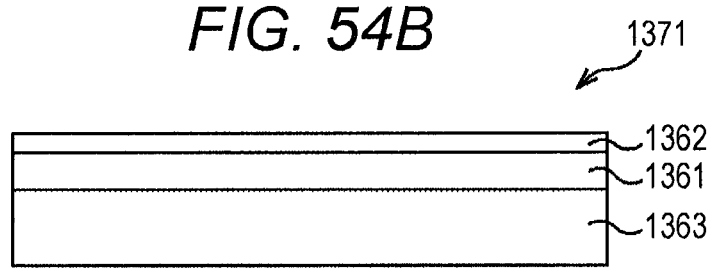
Figure 54C:
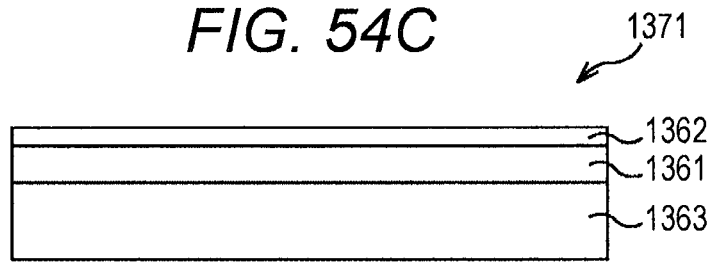

FIGS. 54A to 54C are diagrams schematically illustrating the stacked lens structure 1371 illustrated in FIGS. 53A and 53B in order to describe the effect of the present structure.

The stacked lens structure 1371 has a structure in which a second substrate with lenses 1362 is disposed on a first substrate with lenses 1361 at the center, and a third substrate with lenses 1363 is disposed under the first substrate with lenses 1361.

The substrate thickness and the lens thickness in the second substrate with lenses 1362 disposed on the top layer are different from those of the third substrate with lenses 1363 disposed on the bottom layer. More specifically, the lens thickness in the third substrate with lenses 1363 is larger than the lens thickness in the second substrate with lenses 1362. Thus, the substrate thickness in the third substrate with lenses 1363 is larger than the substrate thickness in the second substrate with lenses 1362.

In the stacked lens structure 1371 of the present structure, direct bonding of substrates is used as the means for fixing substrates with lenses. In other words, substrates with lenses to be fixed are subjected to a plasma activation process, and two substrates with lenses to be fixed are plasma-bonded. In still other words, a silicon oxide film is formed on the surfaces of the two substrates with lenses to be stacked, and a hydroxyl radical is combined with the film. After that, the two substrates with lenses are attached together and are heated and subjected to dehydration condensation. In this way, the two substrates with lenses are direct-bonded by a silicon-oxygen covalent bond.

Thus, in the stacked lens structure 1371 of the present structure, resin-based attachment is not used as the means for fixing substrates with lenses. Due to this, a resin for forming lenses or a resin for attaching substrates is not disposed between the substrates with lenses. Moreover, since a resin is not disposed on the upper surface or the lower surface of the substrate with lenses, thermal expansion or a curing shrinkage of the resin does not occur in the upper surface or the lower surface of the substrate with lenses.

Thus, in the stacked lens structure 1371 even when the second and third substrates with lenses 1362 and 1363 having different lens thicknesses and different substrate thicknesses are disposed on the upper and lower surfaces of the first substrates with lenses 1351, respectively, a warp of the substrate resulting from a curing shrinkage and a warp of the substrate resulting from thermal expansion do not occur unlike Comparative Structure Examples 1 to 8 described above.

That is, the present structure in which substrates with lenses are fixed by direct bonding provides an effect and an advantage that, even when substrates with lenses having different lens thicknesses and different substrate thicknesses are stacked on and under the present structure, it is possible to suppress a warp of the substrate more effectively than Comparative Structure Examples 1 to 8 described above.

16. Various Modifications

Other modifications of the respective embodiments described above will be described below.

<16.1 Countermeasures against Positional Shift of Lens Resin Portion>

First, countermeasures against the positional shift of the lens resin portion (lens portion) of the substrate with lenses of the stacked lens structure will be described.

<First Countermeasure against Positional Shift of Lens Resin Portion>

First, a first countermeasure against the positional shift of the lens resin portion will be described with reference to FIGS. 55 to 70.

Figure 55:
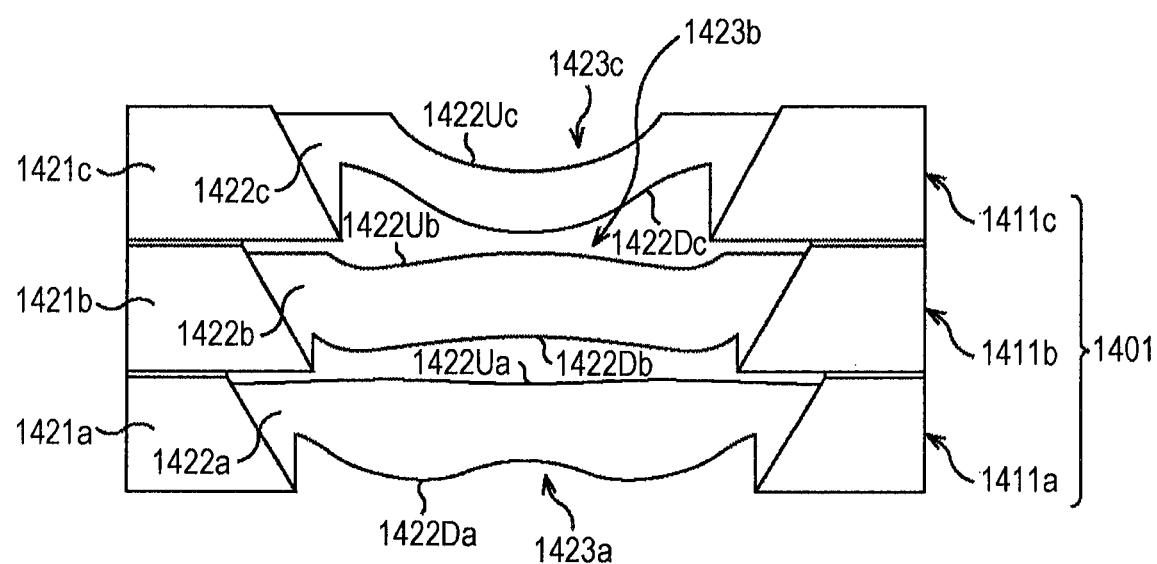
FIG. 55 is a schematic diagram of a cross-section of a stacked lens structure to which the present technique is applied.

FIG. 55 is a schematic diagram of a cross-section of a stacked lens structure 1401. FIG. 55 illustrates only portions necessary for description mainly, and those portions which are not necessary for description are not illustrated.

In the stacked lens structure 1401, substrates with lenses 1411a to 1411c are stacked in three layers.

A lens resin portion 1422a is formed on the inner side of a through-hole 1423a of a support substrate 1421a of the substrate with lenses 1411a. The substrates with lenses 1411b and 1411c have the same configuration as the substrate with lenses 1411a, and the description thereof will not be provided.

When it is not necessary to distinguish the individual substrates with lenses 1411a to 1411c, the substrates with lenses will be referred to simply as substrates with lenses 1411. Hereinafter, when it is not necessary to distinguish the individual support substrates 1421a to 1421c, the support substrates will be referred to simply as support substrates 1421. Hereinafter, when it is not necessary to distinguish the individual lens resin portions 1422a to 1422c and the individual upper surfaces 1422Ua to 1422Uc and the lower surfaces 1422Da to 1422Dc of the lens resin portions 1422a to 1422c, the lens resin portions, the upper surfaces, and the lower surfaces will be referred to simply as lens resin portions 1422, upper surfaces 1422U, and lower surfaces 1422D.

Figure 56:
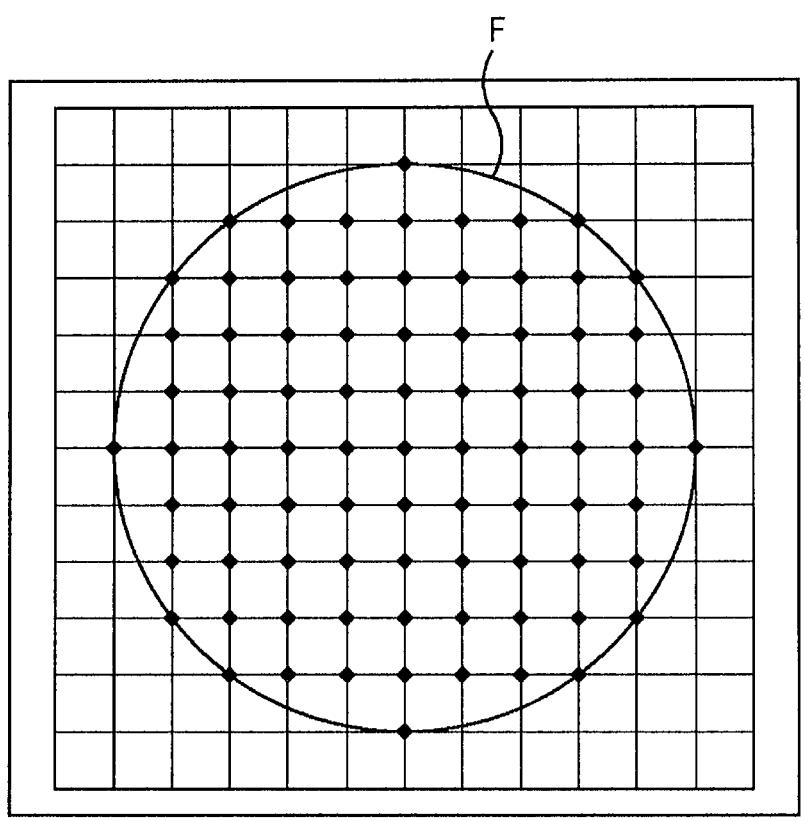
FIG. 56 is a diagram illustrating an example of a design value at the center of a lens resin portion of each substrate with lenses in a substrate state.

FIG. 56 illustrates an example of the design values of the centers (the optical axes of the lens portion) of the lens resin portion 1422 of each substrate with lenses 1411W in the substrate state. A circular frame F indicates an outer frame of the substrate with lenses 1411W in the substrate state. Moreover, the points plotted on the intersections of the grating illustrated as auxiliary lines indicate the design values of the centers of the lens resin portions 1422 of each substrate with lenses 1411W. That is, it is ideal that the centers of the lens resin portions 1422 of each substrate with lenses 1411W are identical to the respective points (hereinafter referred to as target positions) in the frame F.

However, the centers of the upper surfaces 1422U and the lower surfaces 1422D of the lens resin portions 1422 of each substrate with lenses 1411 and the centers of the through-holes 1423 are gradually shifted from the target positions in the manufacturing process. As a result, the center of the lens resin portion 1422 of each substrate with lenses 1411W is not identical to the target position. The causes of this shift will be described with reference to FIGS. 57 to 64.

Figure 57:
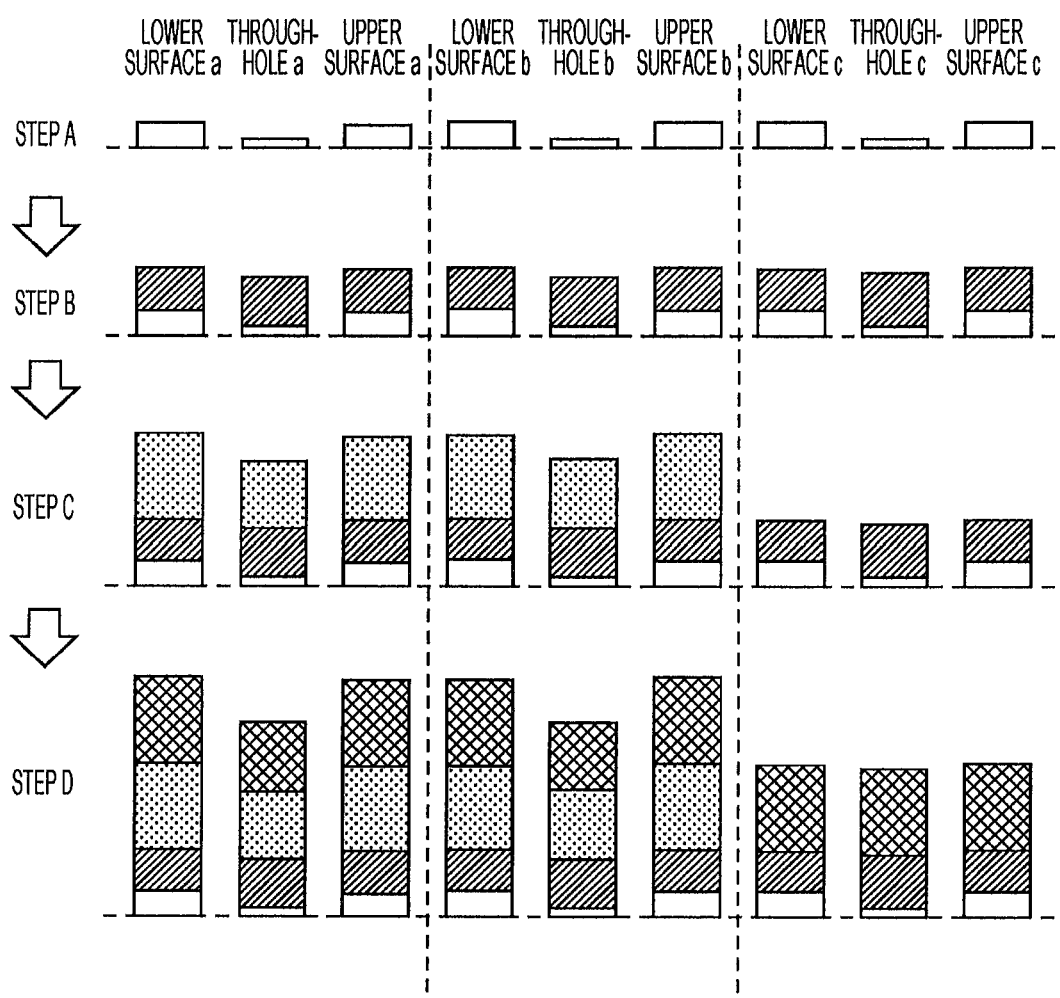
FIG. 57 is a diagram illustrating the cause of a positional shift of a lens.

FIG. 57 illustrates the amounts of shift from the target positions, of the centers of the upper surface 1422U and the lower surface 1422D of the respective lens resin portions 1422 at the same positions of the respective substrates with lenses 1411W and the centers of the through-holes 1423 in steps A to D described later by bar graphs.

Although the amounts of shift are practically represented by two-dimensional vectors in x and y-directions on the plane of each substrate with lenses 1411W, the amounts of shift are represented by one-dimensional values in this drawing in order to simplify the description. Moreover, in this drawing, the upper surfaces 1422Ua to 1422Uc are referred to as upper surfaces a to c, the lower surfaces 1422Da to 1422Dc are referred to as lower surfaces a to c, and the through-holes 1423a to 1423c are referred to as through-holes a to c.

First, in step A, an upper mold and a lower mold (not illustrated) are manufactured and the through-holes 1423a to 1423c are manufactured.

Specifically, as described above, an upper mold and a lower mold are used for forming the lens resin portions 1422 of each substrate with lenses 1411W. A plurality of optical transfer surfaces used for forming the upper surface 1422U of each lens resin portion 1422 is formed in the upper mold by imprinting. A plurality of optical transfer surfaces used for forming the lower surface 1422D of each lens resin portion 1422 is formed in the lower mold by imprinting. In this case, due to the apparatus and process used, the positions of the optical transfer surfaces in each upper mold and each lower mold are shifted from the design values.

Figure 58:
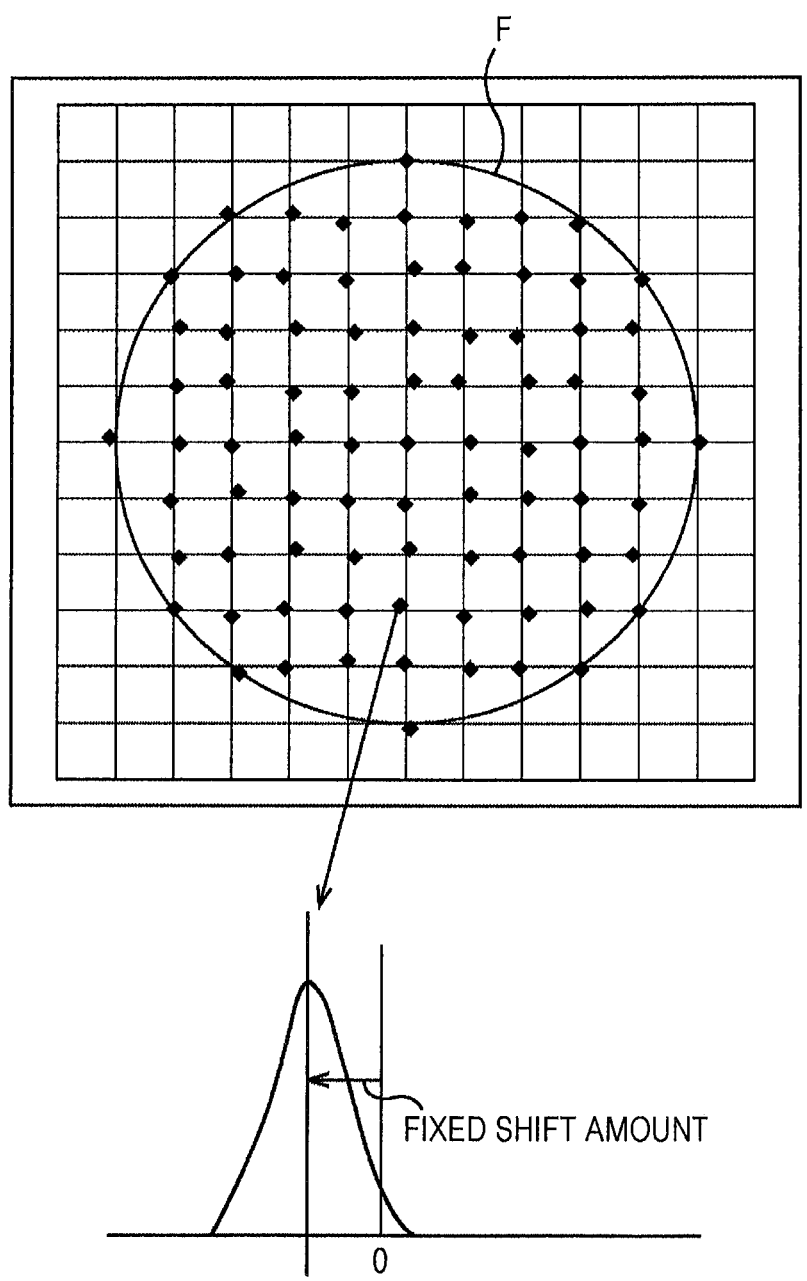
FIG. 58 is a diagram illustrating the cause of a positional shift of a lens.

FIG. 58 schematically illustrates the positions of the centers of the respective optical transfer surfaces in the upper mold for the substrate with lenses 1411W-a manufactured in step A. The points in the drawing indicate the positions of the centers of the respective optical transfer surfaces.

As described above, the positions of the centers of the optical transfer surfaces are shifted from the target positions which are the intersections of the grating. Moreover, the direction and the magnitude of shift of the respective optical transfer surfaces are diverse. However, when the plurality of substrates with lenses 1411W-a is manufactured, the distribution of the amount of shift of the optical transfer surfaces at the same position follows approximately the Gaussian distribution around a fixed amount of shift unique to the apparatus and process used as illustrated in the graph in the lower part of FIG. 58. Moreover, the position of the upper surface 1422Ua of each lens resin portion 1422a of the substrate with lenses 1411W-a is shifted in the same direction and by the same magnitude as the positional shift of each optical transfer surface of the upper mold.

A positional shift resulting from the positional shift of the optical transfer surface of the lower mold also occurs in the lower surface 1422Da of each lens resin portion 1422a of the substrate with lenses 1411W-a. Moreover, a positional shift due to the same reason occurs in the upper surface 1422U and the lower surface 1422D of each lens resin portion 1422 of the substrates with lenses 1411W-b and 1411W-c.

Moreover, the through-holes 1423 in each substrate with lenses 1411W are manufactured through a lithography step and an etching step, for example. In this case, a shift in the pattern of an etching mask and a shift in the etching processing position occur depending on the apparatus and process used. As a result, a positional shift of each through-hole 1423 occurs.

As described above, as illustrated in the graphs on the top stage of FIG. 57, a positional shift occurs in each through-hole 1423 and the upper surface 1422U and the lower surface 1422D of each lens resin portion 1422 of each substrate with lenses 1411W in step A.

Subsequently, the lens resin portion 1422 of each substrate with lenses 1411W is formed in step B.

Specifically, as described above, the lens resin portion 1422 of each substrate with lenses 1411W is formed by imprinting which uses an upper mold and a lower mold. In this case, a new positional shift occurs in the upper surface 1422U and the lower surface 1422D of each lens resin portion 1422 due to imprinting errors.

Figure 59:
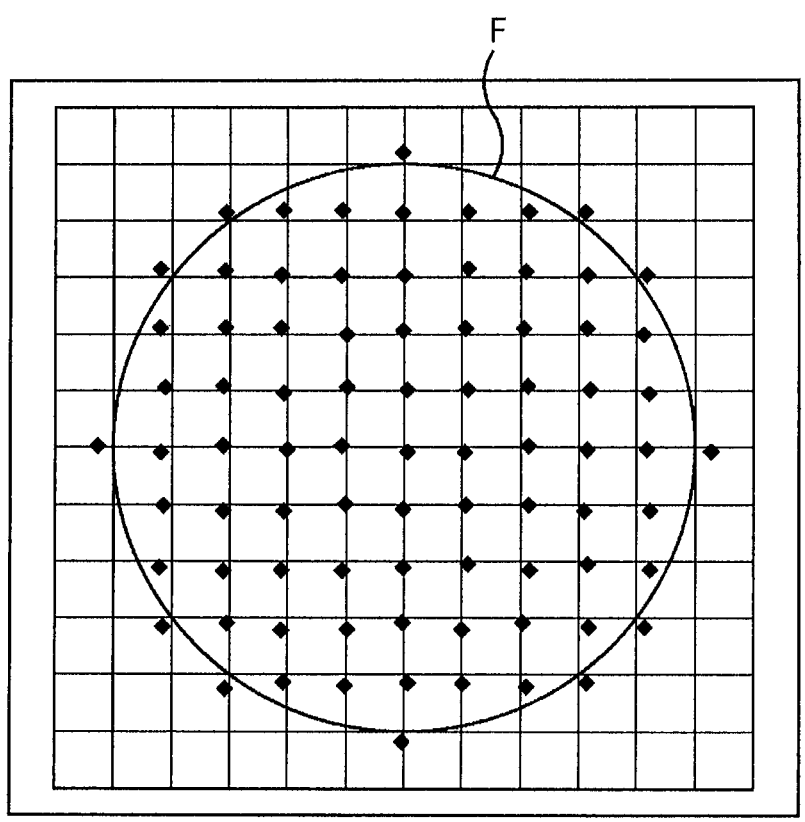
FIG. 59 is a diagram illustrating the cause of a positional shift of a lens.

FIG. 59 schematically illustrates the state of a positional shift of the upper surface 1422Ua of each lens resin portion 1422a of the substrate with lenses 1411W-a resulting from step B. The points in the drawing indicate the centers of the upper surfaces 1422Ua of the respective lens resin portions 1422a. In this way, the centers of the upper surfaces 1422Ua of the respective lens resin portions 1422a are shifted from the target positions which are the intersections of the grating. Moreover, the direction and the magnitude of the shift of the upper surfaces 1422Ua of the respective lens resin portions 1422a are diverse in respective lens resin portions 1422a.

Figure 60:
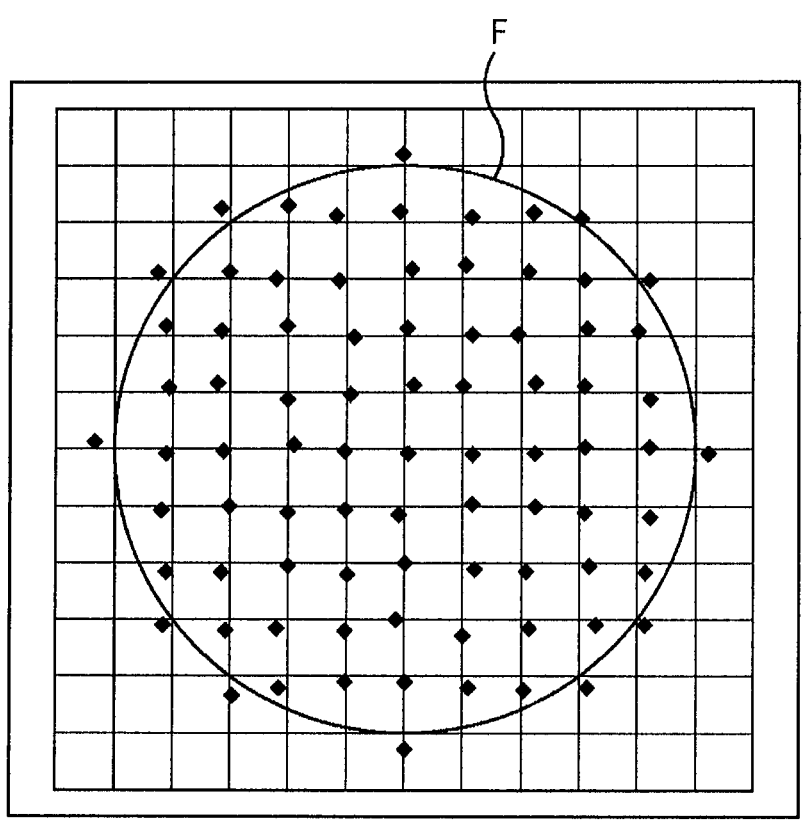
FIG. 60 is a diagram illustrating the cause of a positional shift of a lens.

FIG. 60 schematically illustrates the state of a positional shift of the upper surface 1422Ua of each lens resin portion 1422a of the substrate with lenses 1411W-a in a stage when step B ends. The points in the drawings indicate the centers of the upper surfaces 1422Ua of the respective lens resin portions 1422a. The positional shift illustrated in FIG. 60 is the sum of the positional shifts illustrated in FIGS. 58 and 59.

Moreover, a play occurs between the optical transfer surfaces in each upper mold and each lower mold and the through-holes 1423 of each substrate with lenses 1411W. Thus, when the upper mold and the lower mold are disposed on and under each substrate with lenses 1411W in order to form the lens resin portions 1422a of each substrate with lenses 1411W, a shift occurs in the installed position of the substrate with lenses 1411W in relation to the upper mold and the lower mold. Due to the shift in the installed position, a new positional shift occurs in the through-holes 1423 of each substrate with lenses 1411W.

As described above, as illustrated in the graphs on the second stage of FIG. 57, a positional shift resulting from step B occurs in each through-hole 1423 and the upper surface 1422U and the lower surface 1422D of each lens resin portion 1422 of each substrate with lenses 1411W-a in addition to the positional shift resulting from step A.

Subsequently, in step C, the substrate with lenses 1411W-a and the substrate with lenses 1411W-b are direct-bonded by the above-described method. In this case, distortion and shrinkage occur in the substrates with lenses 1411W-a and 1411W-b. Due to this, a new positional shift occurs in each through-hole 1423 and the upper surface 1422U and the lower surface 1422D of each lens resin portion 1422 of the substrates with lenses 1411W-a and 1411W-b.

Figure 61:
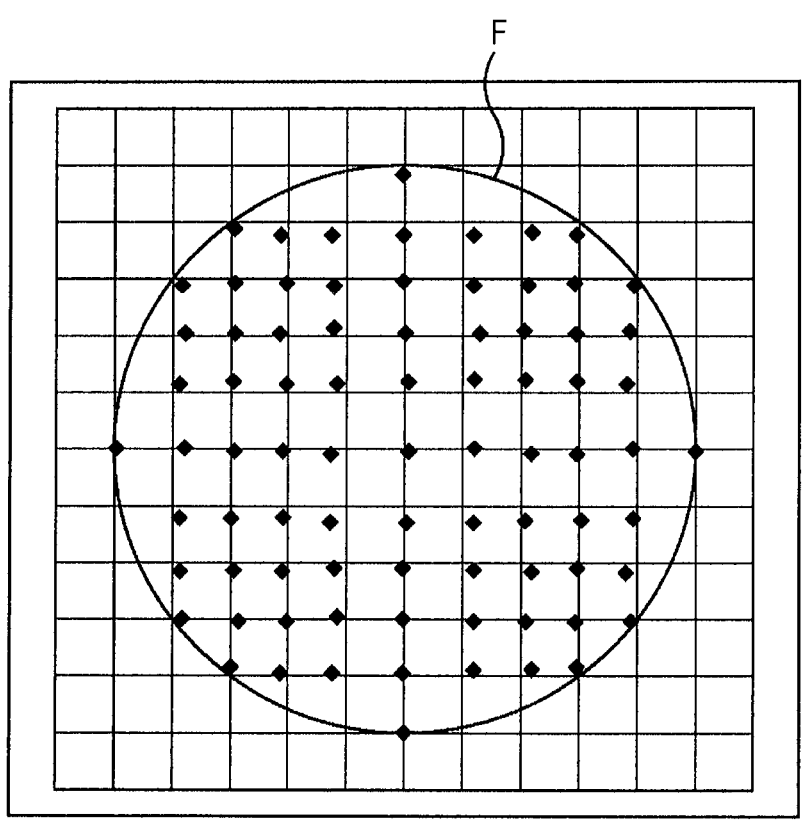
FIG. 61 is a diagram illustrating the cause of a positional shift of a lens.

FIG. 61 schematically illustrates the state of a positional shift of the upper surface 1422Ua of each lens resin portion 1422a of the substrate with lenses 1411W-a resulting from step C. The points in the drawing indicate the centers of the upper surfaces 1422Ua of the respective lens resin portions 1422a. When the substrates with lenses 1411W-a and 1411W-b are direct-bonded, the bonding progresses so that force is applied from the upper side to the center of the substrate with lenses 1411W-b and spreads to the periphery from the centers of the substrates with lenses 1411W-a and 1411W-b. Thus, the amount of shift of the upper surface 1422Ua of the lens resin portion 1422a near the center of the substrate with lenses 1411W-a is the largest.

Figure 62:
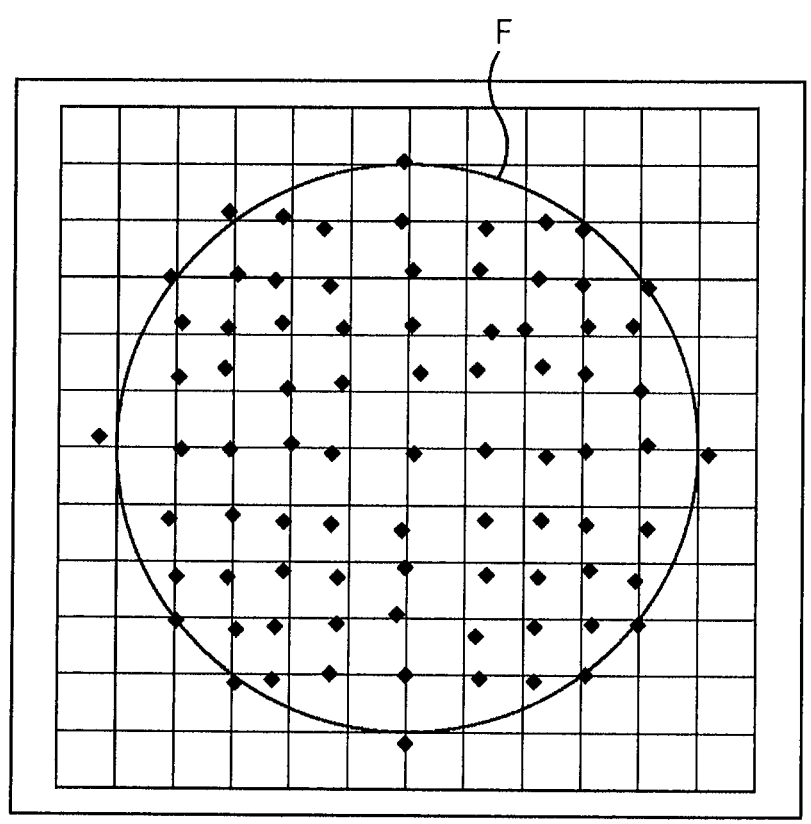
FIG. 62 is a diagram illustrating the cause of a positional shift of a lens.

FIG. 62 schematically illustrates the state of a positional shift of the upper surface 1422Ua of each lens resin portion 1422a of the substrate with lenses 1411W-a in a stage when step C ends. The points in the drawing indicate the centers of the upper surfaces 1422Ua of respective lens resin portions 1422a. The positional shift illustrated in FIG. 62 is the sum of positional shifts illustrated in FIGS. 58, 59, and 61.

As described above, as illustrated in the graphs on the third stage of FIG. 57, a positional shift resulting from step C occurs in each through-hole 1423 and the upper surface 1422U and the lower surface 1422D of each lens resin portion 1422 of the substrates with lenses 1411W-a and 1411W-b in addition to the positional shifts resulting from steps A and B. A positional shift resulting from step C does not occur in the substrate with lenses 1411W-c which is not direct-bonded.

Subsequently, in step D, a stacked lens structure in which the substrates with lenses 1411W-a and 1411W-b are stacked and the substrate with lenses 1411W-c are direct-bonded by the above-described method. In this case, distortion and shrinkage occur in each substrate with lenses 1411W. Due to this, a new positional shift occurs in each through-hole 1423 and the upper surface 1422U and the lower surface 1422D of each lens resin portion 1422 of each substrate with lenses 1411W.

Figure 63:
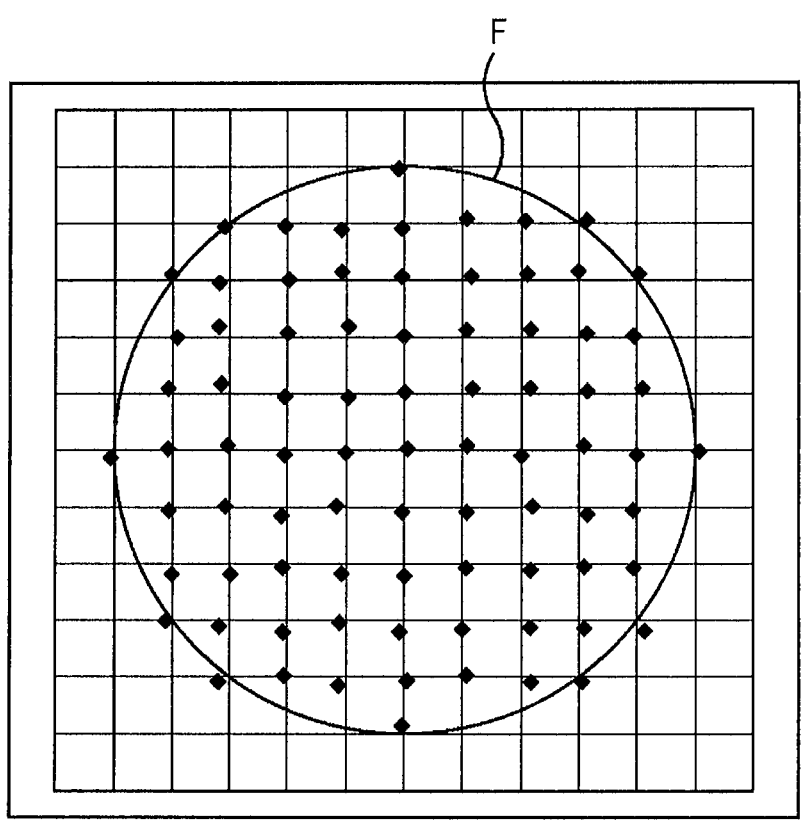
FIG. 63 is a diagram illustrating the cause of a positional shift of a lens.

FIG. 63 schematically illustrates the state of a positional shift of the upper surface 1422Ua of each lens resin portion 1422a of the substrate with lenses 1411W-a resulting from step D. The points in the drawing indicate the centers of the upper surfaces 1422Ua of respective lens resin portions 1422a.

Since the stacked lens structure of the substrates with lenses 1411W-a and 1411W-b is thicker than the single substrate with lenses 1411W, the amount of distortion and shrinkage of the substrates with lenses 1411W-a and 1411W-b in step D is smaller than that in step C. Thus, the positional shift of the upper surface 1422Ua of each lens resin portion 1422a of the substrate with lenses 1411W-a in step D illustrated in FIG. 63 is generally smaller than the positional shift in step C illustrated in FIG. 61.

The same occurs in the positional shift of each through-hole 1423a and the lower surface 1422Da of each lens resin portion 1422a of the substrate with lenses 1411W-a. The same also occurs in the positional shift of each through-hole 1423b and the upper surface 1422Ub and the lower surface 1422Db of each lens resin portion 1422b of the substrate with lenses 1411W-b. On the other hand, it is thought that the positional shift of each through-hole 1423c and the upper surface 1422Uc and the lower surface 1422Dc of each lens resin portion 1422c of the substrate with lenses 1411W-c is substantially equal to the positional shift in the substrates with lenses 1411W-a and 1411W-b in step C.

Figure 64:
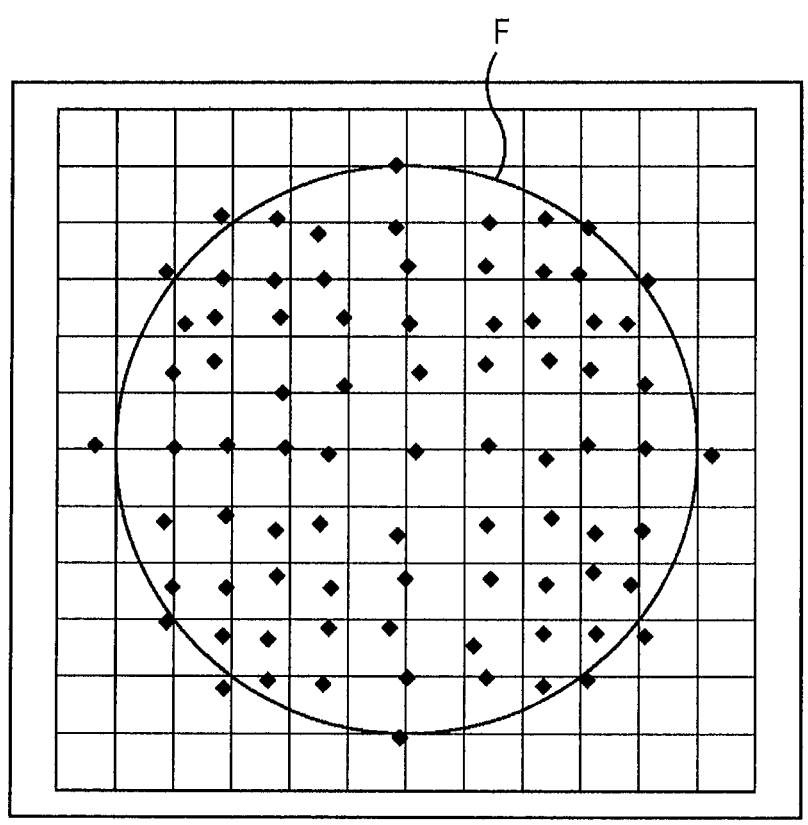
FIG. 64 is a diagram illustrating the cause of a positional shift of a lens.

FIG. 64 schematically illustrates the state of a positional shift of the upper surface 1422Ua of each lens resin portion 1422a of the substrate with lenses 1411W-a in a stage when step D ends. The points in the drawing indicate the centers of the upper surfaces 1422Ua of respective lens resin portions 1422a. The positional shift illustrated in FIG. 64 is the sum of the positional shifts illustrated in FIGS. 58, 59, 61, and 63.

As described above, as illustrated in the graphs on the fourth stage of FIG. 57, a positional shift resulting from step D occurs in each through-hole 1423 and the upper surface 1422U and the lower surface 1422D of each lens resin portion 1422 of the substrates with lenses 1411W-a and 1411w-b in addition to the positional shifts resulting from steps A to C. Moreover, a positional shift resulting from step D occurs in each through-hole 1423c and the upper surface 1422Uc and the lower surface 1422Dc of each lens resin portion 1422c of the substrate with lenses 1411W-c in addition to the positional shifts resulting from steps A and B.

As described above, the positional shifts resulting from steps A to D occur and are accumulated in each through-hole 1423 and the upper surface 1422U and the lower surface 1422D of each lens resin portion 1422 of each substrate with lenses 1411W. As a result, the center of the upper surface 1422U of each lens resin portion 1422 of each substrate with lenses 1411W, the center of the lower surface 1422D, and the center of each through-hole 1423 are not identical, and the optical axis of each lens resin portion 1422 is shifted from the target position. As a result, for example, the imaging performance of the stacked lens structure 1401 may decrease and the yield of the stacked lens structure 1401 may decrease.

In contrast, as will be described later, the formation positions of each through-hole 1423 and the upper surface 1422U and the lower surface 1422D of each lens resin portion 1422 of each substrate with lenses 1411W are set to positions by taking the above-described positional shifts into consideration.

For example, first, a plurality of stacked lens structures 1401W in which the substrates with lenses 1411W-a to 1411W-c in the substrate state are stacked is manufactured by the above-described steps A to D.

Subsequently, the amount of shift (error) between the target position and the center of the upper surface 1422U of each lens resin portion 1422 of each substrate with lenses 1411W of each stacked lens structure 1401W and the amount of shift (error) between the target position and the center of the lower surface 1422D are measured. Moreover, the amount of shift (error) between the target position and the center of each through-hole 1423 of each substrate with lenses 1411W of each stacked lens structure 1401W is measured. These amounts of shift are represented by two-dimensional vectors ($\Delta x$, $\Delta y$) on the plane of each substrate with lenses 1411W.

Subsequently, the average of the amounts of shift of the upper surface 1422Ua and the average of the amounts of shift of the lower surface 1422Da are calculated for the respective lens resin portions 1422a at the same position of the substrate with lenses 1411W-a. Moreover, the average of the amounts of shift of the through-hole 1423 is calculated for the respective through-holes 1423a at the same position of the substrate with lenses 1411W-a.

Subsequently, a correction amount of the formation position of the upper surface 1422Ua of a certain lens resin portion 1422a of the substrate with lenses 1411W-a is set to an inverse vector of the average of the amounts of shift of the upper surface 1422Ua. For example, when the average of the amounts of shift of the upper surface 1422Ua of the lens resin portion 1422a is represented by a vector ($\Delta x1$, $\Delta y1$), the correction amount is represented by a vector ($-\Delta x1$, $-\Delta y1$). The correction amounts of the formation positions of the upper surface 1422Ua of another lens resin portion 1422a of the substrate with lenses 1411W-a, the upper surface 1422Ub of each lens resin portion 1422b of the substrate with lenses 1411W-b, and the upper surface 1422Uc of each lens resin portion 1422c of the substrate with lenses 1411W-c are set by the same method. In this way, the correction amounts of the upper surfaces 1422U of the respective lens resin portions 1422 of the respective substrates with lenses 1411W are set individually.

Moreover, a correction amount of the formation position of the lower surface 1422Da of a certain lens resin portion 1422a of the substrate with lenses 1411W-a is set to an inverse vector of the average of the amounts of shift of the lower surface 1422Da. For example, when the average of the amounts of shift of the lower surface 1422Da of the lens resin portion 1422a is represented by a vector ($\Delta x2$, $\Delta y2$), the correction amount is represented by a vector ($-\Delta x2$, $-\Delta y2$). The correction amounts of the formation positions of the lower surface 1422Da of another lens resin portion 1422a of the substrate with lenses 1411W-a, the lower surface 1422Db of each lens resin portion 1422b of the substrate with lenses 1411W-b, and the lower surface 1422Dc of each lens resin portion 1422c of the substrate with lenses 1411W-c are set by the same method. In this way, the correction amounts of the lower surfaces 1422D of the respective lens resin portions 1422 of the respective substrates with lenses 1411W are set individually.

Further, a correction amount of the formation position of a certain through-hole 1423a of the substrate with lenses 1411W-a is set to an inverse vector of the average of the amounts of shift of the through-hole 1423a. For example, when the average of the amounts of shift of the through-hole 1423a is represented by a vector ($\Delta x3$, $\Delta y3$), the correction amount is represented by a vector ($-\Delta x3$, $-\Delta y3$). The correction amounts of the formation positions of another through-hole 1423a of the substrate with lenses 1411W-a, each through-hole 1423b of the substrate with lenses 1411W-b, and each through-hole 1423c of the substrate with lenses 1411W-c are set by the same method. In this way, the correction amounts of the individual through-holes 1423 of the respective substrates with lenses 1411W are set individually.

Figure 65:
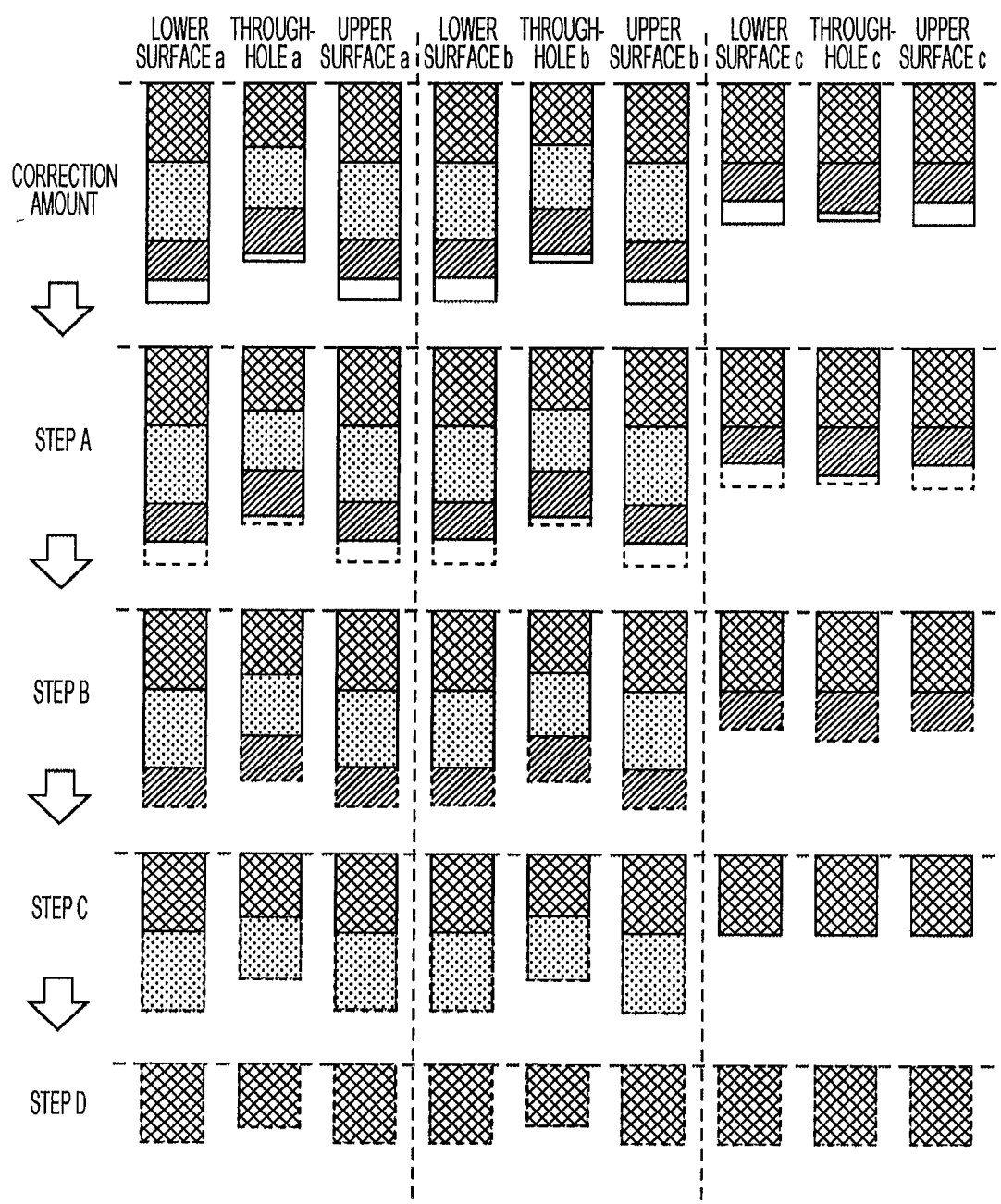
FIG. 65 is a diagram illustrating a first countermeasure against the positional shift of a lens.

FIG. 65 illustrates the correction amounts of the target positions, of the centers of each through-hole 1423 and the upper surface 1422U and the lower surface 1422D of each lens resin portion 1422 at the same position of each substrate with lenses 1411W and the amounts of shift from the target positions in steps A to D by bar graphs similarly to FIG. 57. Although the correction amounts and the amounts of shift are practically represented by two-dimensional vectors in x and y-directions on the plane of each substrate with lenses 1411W, the amounts of shift are represented by one-dimensional values in this drawing in order to simplify the description similarly to FIG. 57.

As illustrated in the graphs on the top stage of FIG. 65, the correction amounts of the upper surface 1422U and the lower surface 1422D of each lens resin portion 1422 are set as the initial values of the amounts of shift of the upper surface 1422U and the lower surface 1422D of each lens resin portion 1422. Moreover, the correction amount of each through-hole 1423 of each substrate with lenses 1411W is set as the initial value of the amount of shift of each through-hole 1423.

First, in step A, the position of the center of the optical transfer surface used for forming the upper surface 1422U of each lens resin portion 1422 in the upper mold for each substrate with lenses 1411W is set to a position shifted from the target position by the correction amount of the corresponding upper surface 1422U of each lens resin portion 1422.

Figure 66:
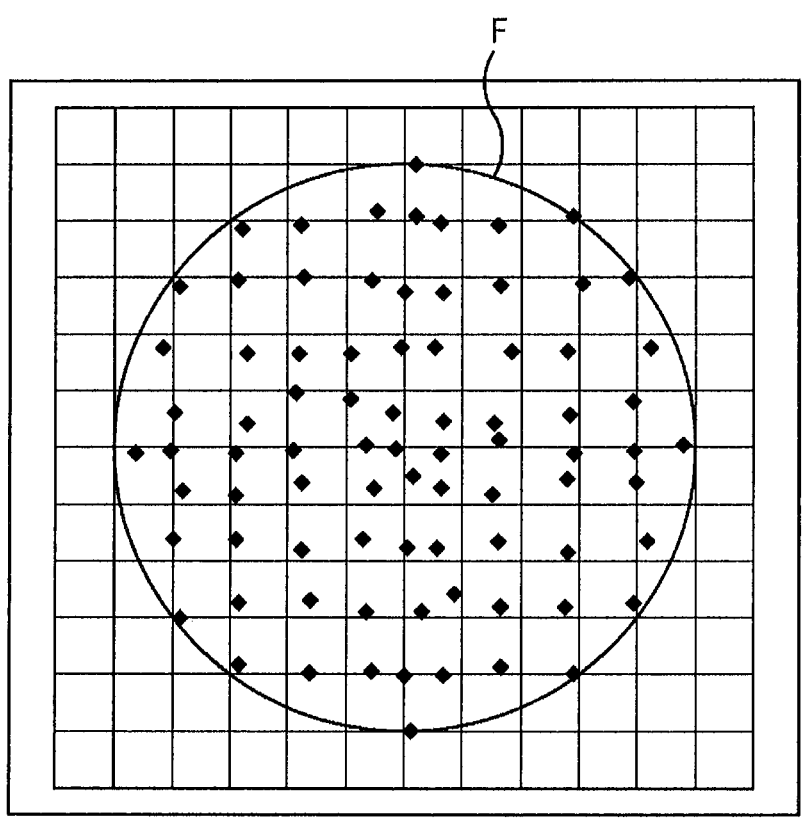
FIG. 66 is a diagram illustrating a first countermeasure against the positional shift of a lens.

FIG. 66 schematically illustrates an example of the setting values of the centers of the formation positions of the respective optical transfer surfaces of the upper mold for the substrate with lenses 1411W-a. The points in the drawing indicate the setting values of the central positions of the respective optical transfer surfaces. The centers of the optical transfer surfaces are set to positions shifted by the correction amount of the corresponding upper surface 1422U of each lens resin portion 1422 from the target positions which are the intersections of the grating in the drawing.

On the other hand, as described above, a positional shift of the optical transfer surface occurs when the optical transfer surfaces of the upper mold are manufactured. The positional shift of the optical transfer surface occurs in the direction of canceling the correction amount of the corresponding upper surface 1422U of each lens resin portion 1422.

Figure 67:
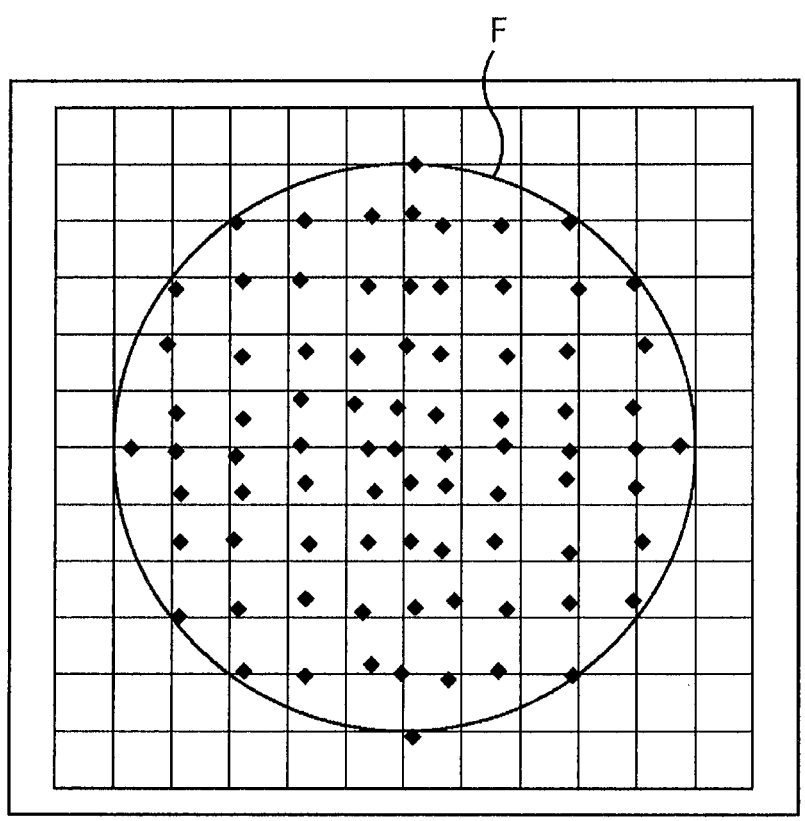
FIG. 67 is a diagram illustrating a first countermeasure against the positional shift of a lens.

FIG. 67 schematically illustrates the positions of the centers of the respective optical transfer surfaces of the upper mold for the substrate with lenses 1411W-a manufactured in step A. The points in the drawing indicate the positions of the centers of the respective optical transfer surfaces. The positions of the centers of the respective optical transfer surfaces illustrated in FIG. 67 are generally closer to the target positions which are the intersections of the grating than the setting values of the positions of the centers of the respective optical transfer surfaces illustrated in FIG. 66.

The same is true for the upper molds for the substrates with lenses 1411W-b and 1411W-c.

Moreover, in the lower mold for each substrate with lenses 1411W, similarly to the upper mold, the position of the center of the optical transfer surface used for forming the lower surface 1422D of each lens resin portion 1422 is set to a position shifted from the target position by the correction amount of the corresponding lower surface 1422D of each lens resin portion 1422. Moreover, when the optical transfer surfaces are manufactured in each lower mold, a positional shift of the optical transfer surface occurs in the direction of canceling the correction amount of the corresponding lower surface 1422D of each lens resin portion 1422.

Further, the position of the center of each through-hole 1423 in each substrate with lenses 1411W is set to a position shifted from the target position by the correction amount of each through-hole 1423. On the other hand, as described above, a positional shift occurs when the through-holes 1423 are manufactured in the respective substrates with lenses 1411W. In this case, the positional shift of each through-hole 1423 occurs in the direction of canceling the correction amount of each through-hole 1423.

The graphs on the second stage of FIG. 65 illustrate the amounts of shift of each through-hole 1423 and the upper surface 1422U and the lower surface 1422D of each lens resin portion 1422 of each substrate with lenses 1411W in a stage when step A ends. The portion surrounded by the dot line in each bar graph indicates the amount of shift canceled in step A. In this way, due to the amount of shift resulting from step A, the amounts of shift of each through-hole 1423 and the upper surface 1422U and the lower surface 1422D of each lens resin portion 1422 are smaller than the correction amounts (the initial values of the amounts of shift).

Subsequently, in step B, the lens resin portions 1422 of the respective substrates with lenses 1411W are formed.

In step B, as described above, by the imprinting errors, a new positional shift occurs in the upper surface 1422U and the lower surface 1422D of each lens resin portion 1422 of each substrate with lenses 1411W. In this case, the positional shift of the upper surface 1422U and the lower surface 1422D of each lens resin portion 1422 occurs in the direction of canceling the correction amount of the upper surface 1422U and the lower surface 1422D of each lens resin portion 1422.

Figure 68:
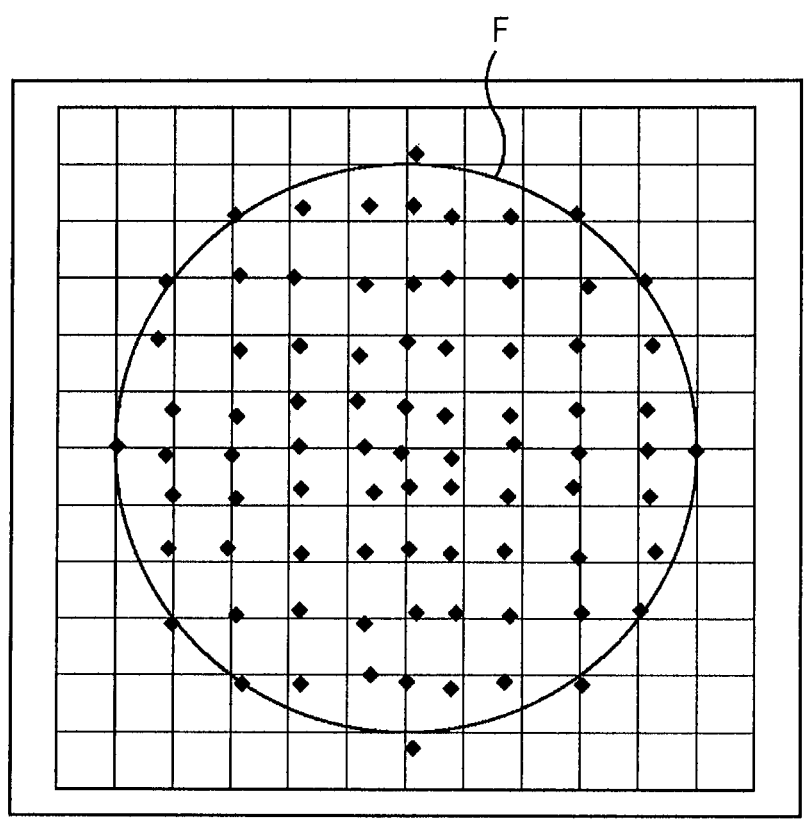
FIG. 68 is a diagram illustrating a first countermeasure against the positional shift of a lens.

FIG. 68 schematically illustrates the state of the positional shift of the upper surface 1422Ua of each lens resin portion 1422a of the substrate with lenses 1411W-a in a stage when step B ends similarly to FIG. 60. The positions of the centers of the upper surfaces 1422Ua of each lens resin portion 1422a in FIG. 68 are closer to the target positions which are the intersections of the grating than the positions of the centers of the optical transfer surfaces of the upper mold illustrated in FIG. 67.

Moreover, as described above, a new positional shift occurs in each through-hole 1423 of each substrate with lenses 1411W due to a shift in the installed position of each substrate with lenses 1411W in relation to the upper mold and the lower mold. The new positional shift of each through-hole 1423 occurs in the direction of canceling the correction amount of each through-hole 1423.

The graphs on the third stage of FIG. 65 illustrate the amounts of shift of each through-hole 1423 and the upper surface 1422U and the lower surface 1422D of each lens resin portion 1422 in a stage when step B ends. The portion surrounded by the dot line in each bar graph indicates the amount of shift canceled in step B. In this way, due to the amount of shift resulting from step B, the amounts of shift of each through-hole 1423 and the upper surface 1422U and the lower surface 1422D of each lens resin portion 1422 are smaller than that in the stage when step A ends.

Subsequently, in step C, the substrate with lenses 1411W-a and the substrate with lenses 1411W-b are direct-bonded.

In this case, as described above, due to distortion and shrinkage of the substrates with lenses 1411W-a and 1411W-b, a new positional shift occurs in each through-hole 1423 and the upper surface 1422U and the lower surface 1422D of each lens resin portion 1422 of the substrates with lenses 1411W-a and 1411W-b. The positional shift in step C occurs in the direction of canceling the correction amount of each through-hole 1423 and the upper surface 1422U and the lower surface 1422D of each lens resin portion 1422.

Figure 69:
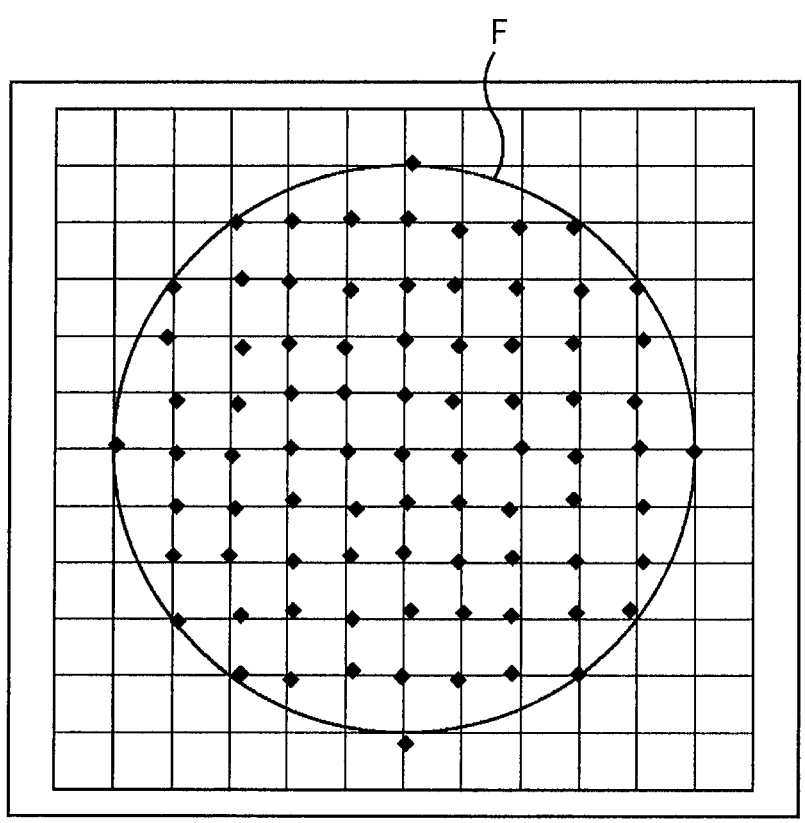
FIG. 69 is a diagram illustrating a first countermeasure against the positional shift of a lens.

FIG. 69 schematically illustrates the state of the positional shift of the upper surface 1422Ua of each lens resin portion 1422a of the substrate with lenses 1411W-a in a stage when step C ends similarly to FIG. 62. The positions of the centers of the upper surfaces 1422Ua of each lens resin portion 1422a are generally closer to the target positions which are the intersections of the grating as compared to the stage when step B ends as illustrated in FIG. 68.

The graphs on the fourth stage of FIG. 65 illustrate the amounts of shift of each through-hole 1423 and the upper surface 1422U and the lower surface 1422D of each lens resin portion 1422 in a stage when step C ends. The portion surrounded by the dot line in each bar graph indicates the amount of shift canceled in step C. In this way, due to the amount of shift resulting from step C, the amounts of shift of each through-hole 1423 and the upper surface 1422U and the lower surface 1422D of each lens resin portion 1422 of the substrates with lenses 1411W-a and 1411W-b are smaller than that in the stage when step B ends. In the substrates with lenses 1411W-c which is not direct-bonded, the amounts of shift of each through-hole 1423 and the upper surface 1422U and the lower surface 1422D of each lens resin portion 1422 do not change.

Subsequently, in step D, a stacked lens structure in which the substrates with lenses 1411W-a and 1411W-b are stacked and the substrate with lenses 1411W-c are direct-bonded.

In this case, as described above, due to the distortion of shrinkage of each substrate with lenses 1411W, a new positional shift occurs in each through-hole 1423 and the upper surface 1422U and the lower surface 1422D of each lens resin portion 1422 of each substrate with lenses 1411W. The positional shift in step D occurs in the direction of canceling the correction amounts of each through-hole 1423 and the upper surface 1422U and the lower surface 1422D of each lens resin portion 1422.

Figure 70:
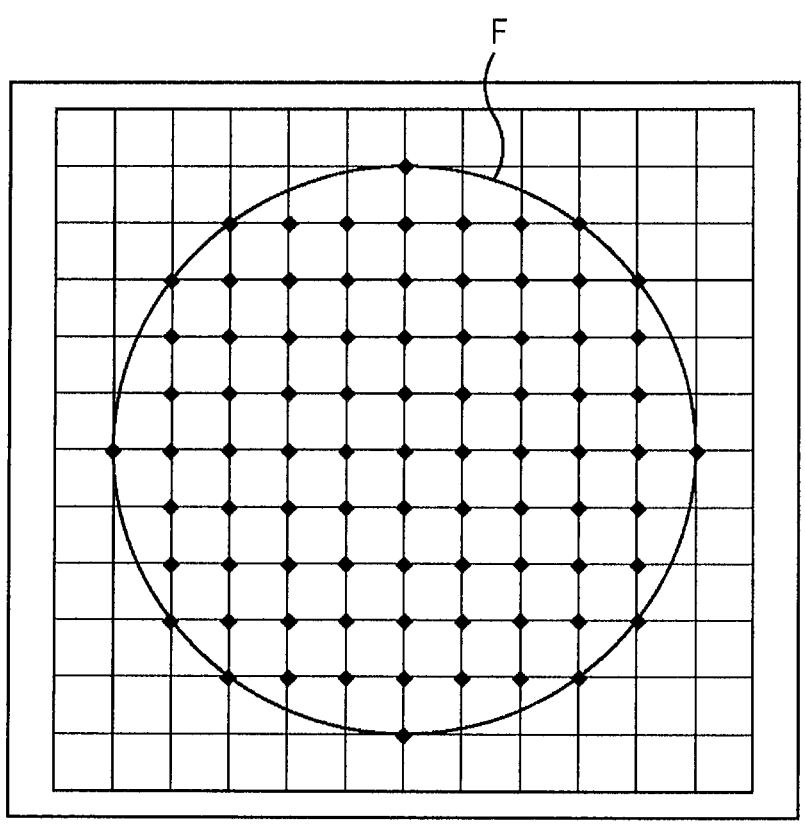
FIG. 70 is a diagram illustrating a first countermeasure against the positional shift of a lens.

FIG. 70 schematically illustrates the state of a positional shift of the upper surface 1422Ua of each lens resin portion 1422a of the substrate with lenses 1411W-a in a stage when step D ends in the same manner as FIG. 64. The positions of the centers of the upper surfaces 1422Ua of each lens resin portion 1422a are further closer to the target positions which are the intersections of the grating as compared to the stage when step C ends as illustrated in FIG. 69 and are approximately identical to the target positions.

The graphs on the fifth stage of FIG. 65 illustrate the amounts of shift of each through-hole 1423 and the upper surface 1422U and the lower surface 1422D of each lens resin portion 1422 in a stage when step D ends. The portion surrounded by the dot line in each bar graph indicates the amount of shift canceled in step D. In this way, due to the amount of shift resulting from step D, the amounts of shift of each through-hole 1423 and the upper surface 1422U and the lower surface 1422D of each lens resin portion 1422 are substantially 0. That is, the centers of each through-hole 1423 and the upper surface 1422U and the lower surface 1422D of each lens resin portion 1422 are approximately identical to the target positions.

In this way, it is possible to obviate the shifts from the target positions of the through-hole 1423 and the upper surface 1422U and the lower surface 1422D of the lens resin portion 1422 occurring in the steps of forming the through-holes 1423 and the lens resin portions 1422 in the substrates with lenses 1411W in the substrate state and stacking the substrates with lenses 1411W. As a result, for example, the imaging performance of the stacked lens structures 1401 is improved and the yield of the stacked lens structures 1401 is improved.

The subsequent manufacturing steps are the same as those of the above-described manufacturing steps, and the description thereof will not be provided.

In the above description, although an example of manufacturing a stacked lens structure having three layers has been illustrated, the above-described countermeasure can be applied to the case of manufacturing a stacked lens structure having two or four layers or more.

<Second Countermeasure against Positional Shift of Lens Resin Portion>

Next, a second countermeasure against the positional shift of the lens resin portion will be described with reference to FIGS. 71 to 78. In the second countermeasure, the number and the order of bonding the substrates with lenses in the substrate state are optimized.

First, the case of stacking four substrates with lenses 1501W-a to 1501W-d in the substrate state will be discussed with reference to FIGS. 71 to 74. A plurality of through-holes 1513a to 1513d is formed in support substrates 1511a to 1511d of the substrates with lenses 1501W-a to 1501W-d. Moreover, lens resin portions 1512a to 1512d are formed on the inner sides of the through-holes 1513a to 1513d.

Hereinafter, when it is not necessary to distinguish the individual substrates with lenses 1501W-a to 1501W-e (FIG. 78), the substrates with lenses will be referred to simply as substrates with lenses 1501W. Hereinafter, when it is not necessary to distinguish the individual support substrates 1511a to 1511e (FIG. 78), the support substrates will be referred to simply as support substrates 1511. Hereinafter, when it is not necessary to distinguish the individual lens resin portions 1512a to 1512e (FIG. 78), the lens resin portions will be referred to simply as lens resin portions 1512. Hereinafter, when it is not necessary to distinguish the individual through-holes 1513a to 1513e (FIG. 78), the through-holes will be referred to simply as through-holes 1513. Hereinafter, when it is not necessary to distinguish the individual stacked lens structures 1521W-a (FIG. 72) to 1521W-e (FIG. 78), the stacked lens structures will be referred to simply as stacked lens structures 1521W. Hereinafter, when it is not necessary to distinguish the individual temporarily stacked lens structures 1522W-a (FIG. 75) to 1522W-d (not illustrated), the temporarily stacked lens structures will be referred to simply as temporarily stacked lens structures 1522W.

First, for example, the case of sequentially stacking the substrates with lenses 1501W from a lower layer to an upper layer one by one as described above with reference to FIGS. 32A to 32F will be discussed.

Figure 71:
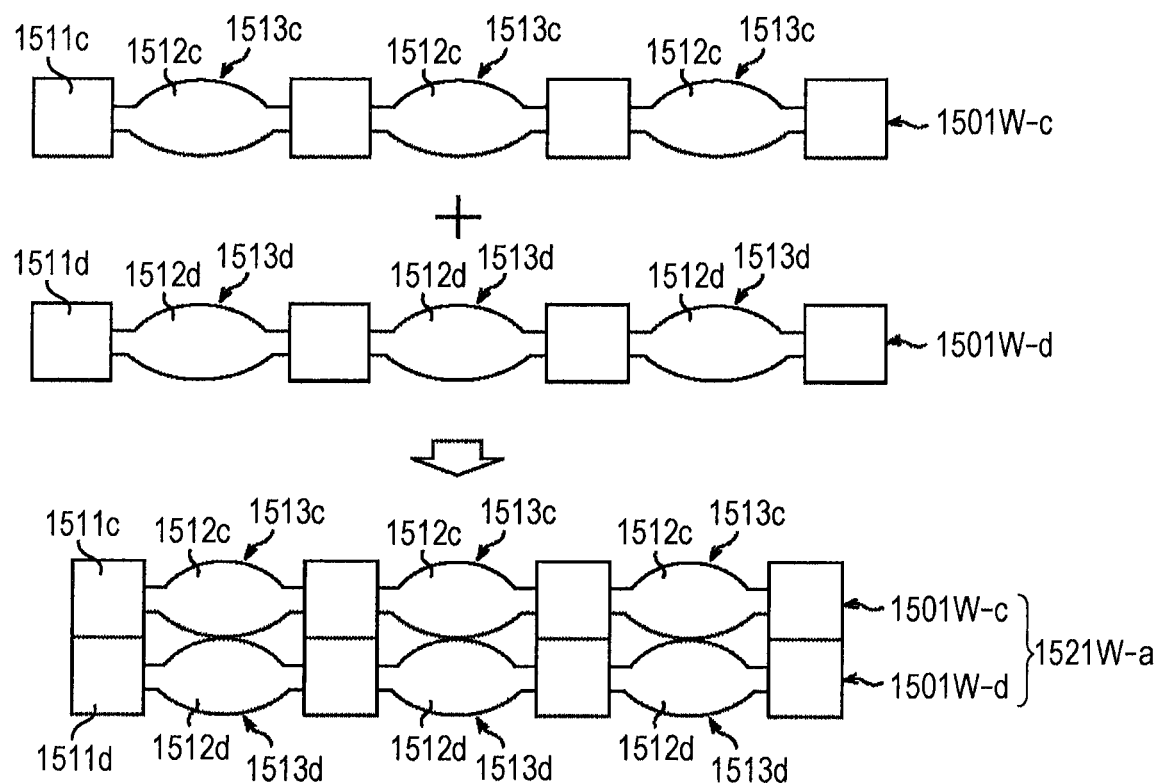
FIG. 71 is a diagram illustrating a second countermeasure against the positional shift of a lens.

As illustrated in FIG. 71, when the stacked lens structure 1521W-a which is a stacked substrate of the substrates with lenses 1501W-c and 1501W-d is manufactured by direct bonding, distortion and shrinkage occur in the substrates with lenses 1501W-c and 1501W-d as described above. As a result, a positional shift occurs in each lens resin portion 1512 of the substrates with lenses 1501W-c and 1501W-d.

Figure 72:
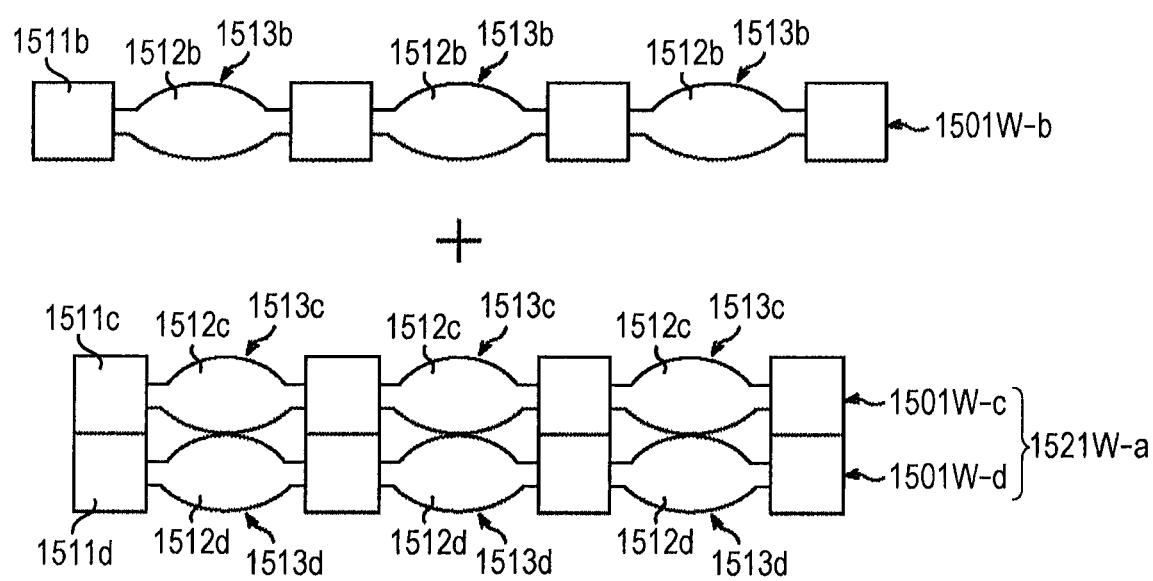
FIG. 72 is a diagram illustrating a second countermeasure against the positional shift of a lens.

Moreover, as illustrated in FIG. 72, when the stacked lens structure 1521W-a and the substrate with lenses 1501W-b are to be direct-bonded, a positional shift (relative shift) occurs between each lens resin portion 1512 of the stacked lens structure 1521W-a and each lens resin portion 1512b of the substrate with lenses 1501W-b. As a result, a shift in the optical axes of the lens resin portions 1512 of the respective layers increases.

Figure 73:
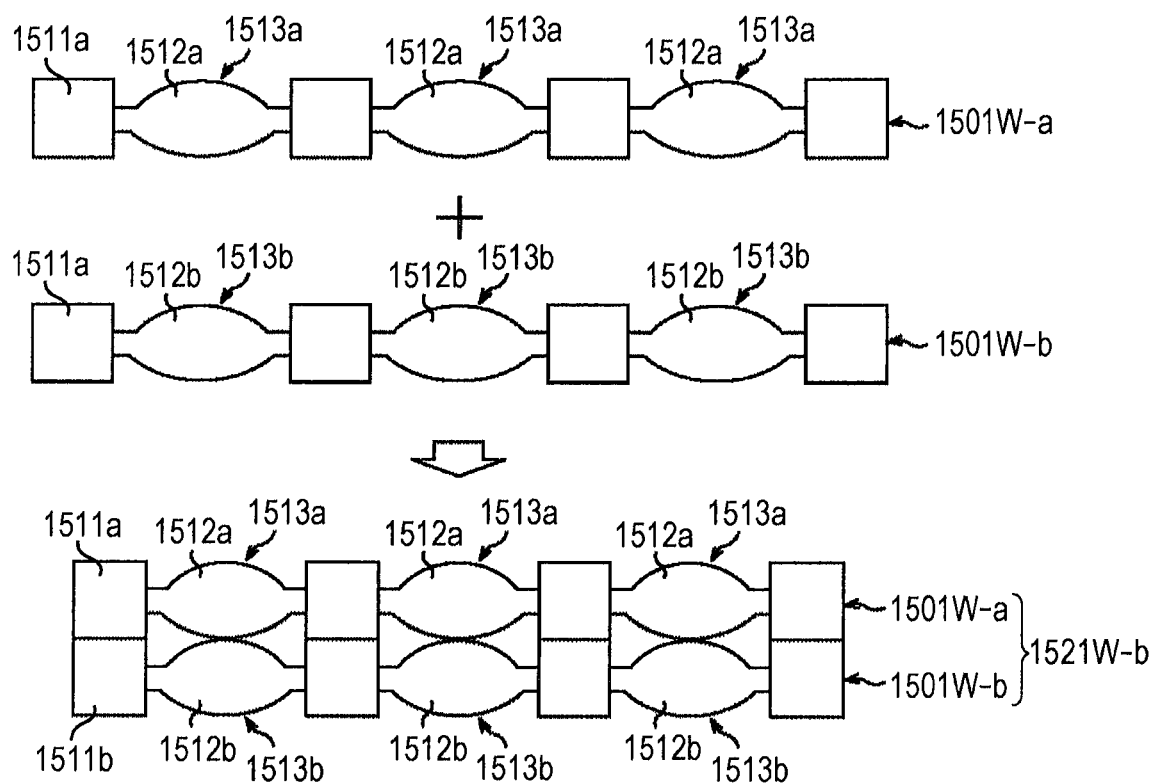
FIG. 73 is a diagram illustrating a second countermeasure against the positional shift of a lens.

Thus, as illustrated in FIG. 73, the substrates with lenses 1501W-a and 1501W-b are direct-bonded to manufacture the stacked lens structure 1521W-b separately from the stacked lens structure 1521W-a. In this case, substantially the same distortion and shrinkage as when manufacturing the stacked lens structure 1521W-a including the substrates with lenses 1501W-c and 1501W-d occurs in the substrates with lenses 1501W-a and 1501W-b. Thus, the positional shift of each lens resin portion 1512 of the stacked lens structure 1521W-a is approximately equal to the positional shift of each lens resin portion 1512 of the stacked lens structure 1521W-b.

Figure 74:
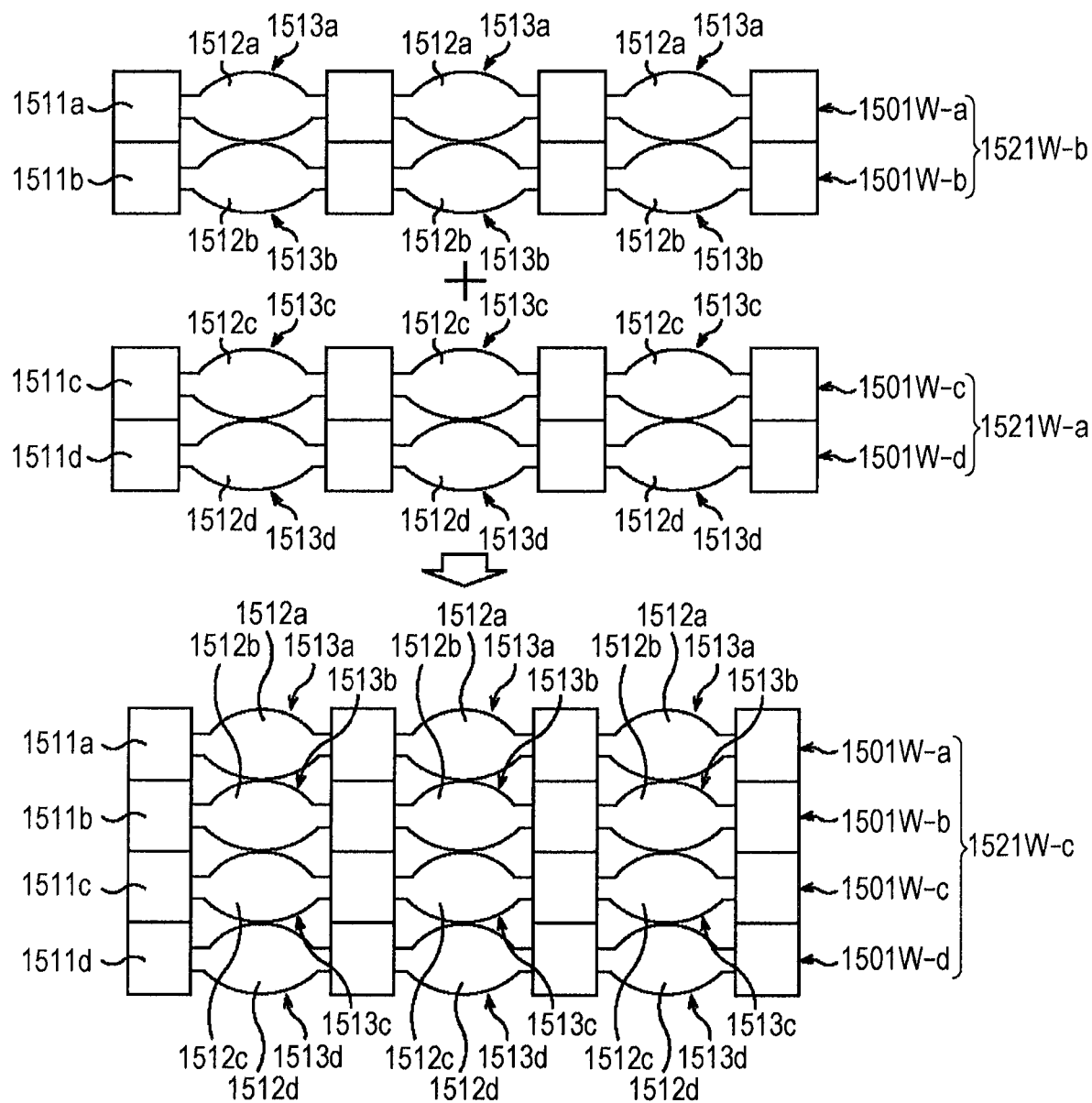
FIG. 74 is a diagram illustrating a second countermeasure against the positional shift of a lens.

Subsequently, as illustrated in FIG. 74, the stacked lens structures 1521W-a and 1521W-b manufactured by the same number of times (one time) of direct bonding are direct-bonded. In this way, the stacked lens structure 1521W-c including the substrates with lenses 1501W-a to 1501W-d is manufactured.

In this case, substantially equal distortion and shrinkage occur in the respective substrates with lenses 1501W. Thus, since the accumulated values of the distortion and shrinkage of the respective substrates with lenses 1501W are substantially equalized, the positional shifts of the lens resin portions 1512 of the respective substrates with lenses 1501W are substantially equalized. As a result, the optical axes of the lens resin portions 1512 of the respective substrates with lenses 1501W are approximately identical.

In this way, by combining the direct bonding of the substrates with lenses 1501W and the direct bonding of the stacked lens structures 1521W manufactured by the same number of times of direct bonding, the positions of the lens resin portions 1512 of the respective substrates with lenses 1501W after stacking can be made substantially identical.

Next, the case of stacking three substrates with lenses 1501W-a to 1501W-c will be discussed with reference to FIGS. 75 to 77.

First, as described above with reference to FIG. 73, the substrates with lenses 1501W-a and 1501W-b are direct-bonded to manufacture the stacked lens structure 1521W-b.

Figure 75:
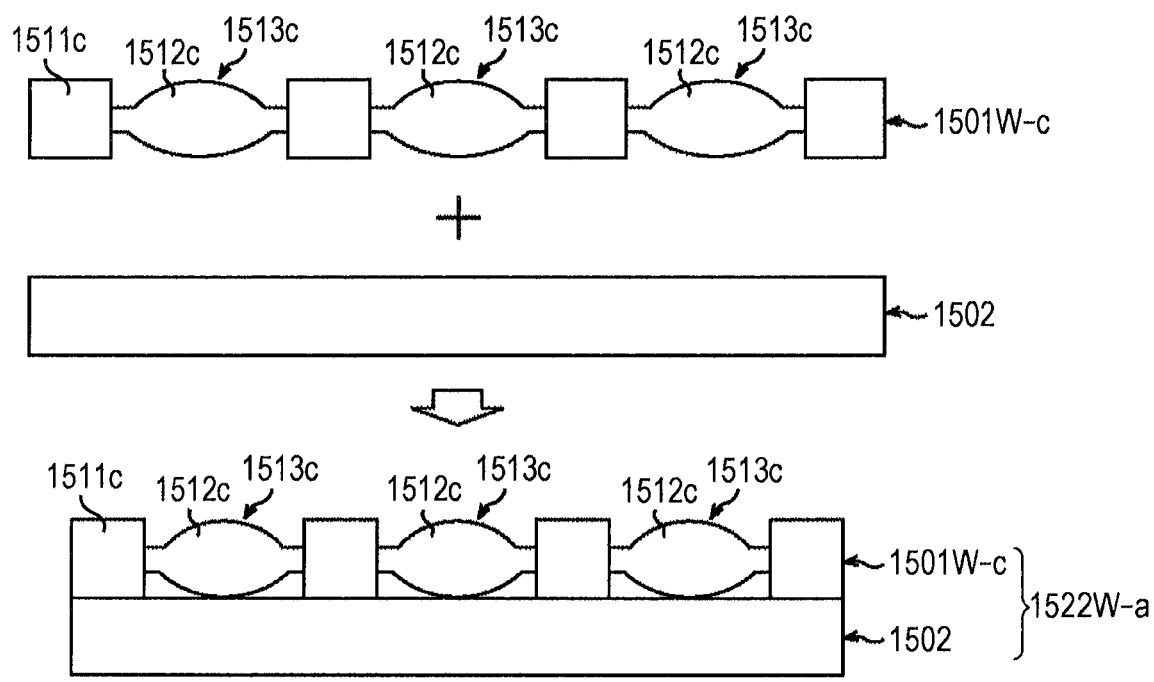
FIG. 75 is a diagram illustrating a second countermeasure against the positional shift of a lens.

On the other hand, as illustrated in FIG. 75, the substrate with lenses 1501W-c and a temporary substrate 1502 are direct-bonded to manufacture the temporarily stacked lens structure 1522W-a which is a stacked substrate of the substrate with lenses 1501W-c and the temporary substrate 1502. The temporary substrate 1502 is a substrate equivalent to the support substrate 1511, for example.

In this case, substantially the same distortion and shrinkage as when manufacturing the stacked lens structure 1521W-b including the substrates with lenses 1501W-a and 1501W-b occurs in the substrate with lenses 1501W-d and the temporary substrate 1502. Thus, the positional shift of each lens resin portion 1512 of the stacked lens structure 1521W-b is approximately equal to the positional shift of each lens resin portion 1512 of the temporarily stacked lens structure 1522W-a.

Figure 76:
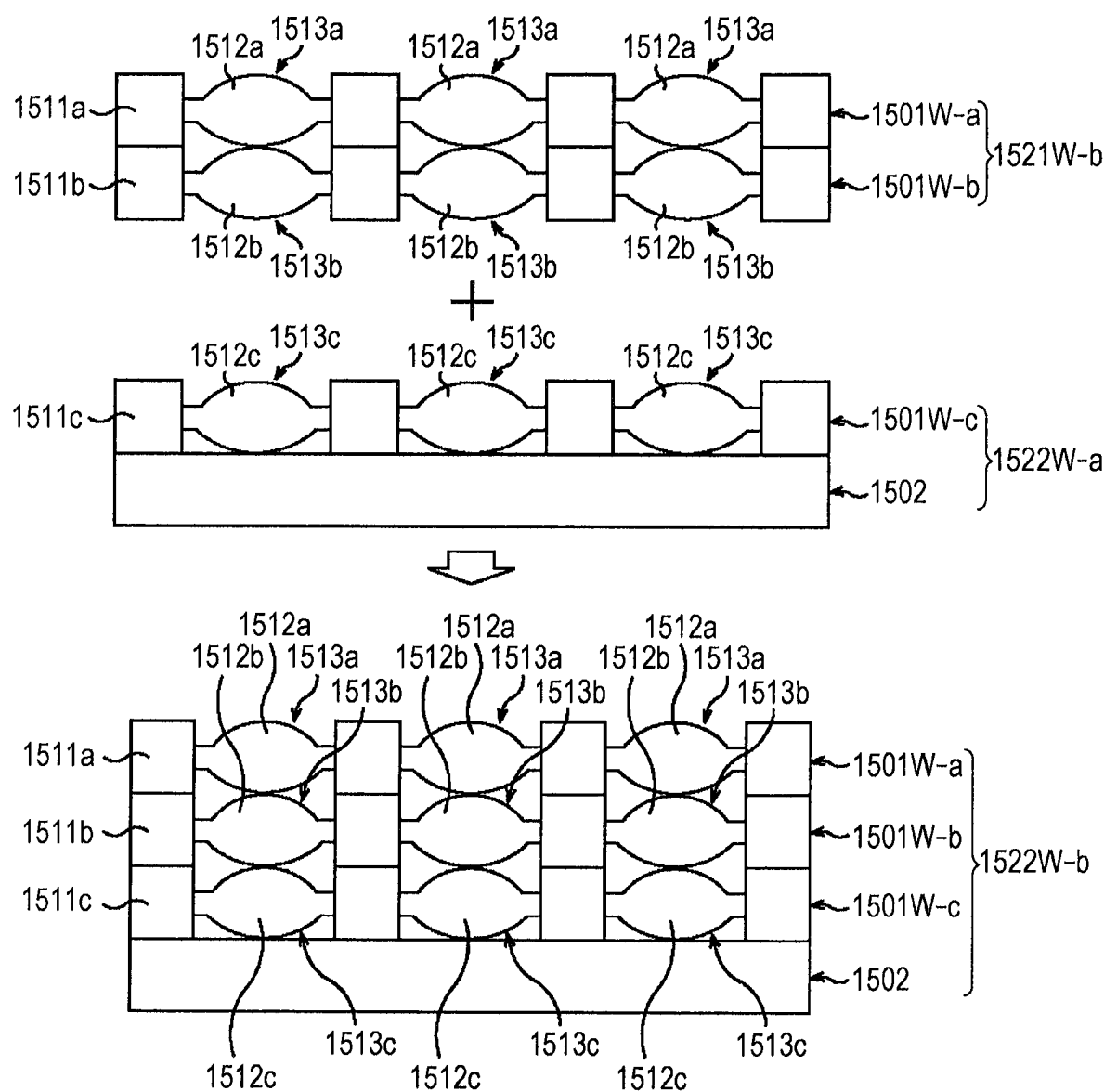
FIG. 76 is a diagram illustrating a second countermeasure against the positional shift of a lens.

Subsequently, as illustrated in FIG. 76, the stacked lens structure 1521W-b and the temporarily stacked lens structure 1522W-a manufactured by the same number of times (one time) of direct bonding are direct-bonded. In this way, the temporarily stacked lens structure 1522W-b including the substrates with lenses 1501W-a to 1501W-c and the temporary substrate 1502 is manufactured.

In this case, substantially equal distortion and shrinkage occur in the substrates with lenses 1501W and the temporary substrate 1502. Thus, since the accumulated values of the distortion and shrinkage of the respective substrates with lenses 1501W are substantially equalized, the positional shifts of the lens resin portions 1512 in the respective substrates with lenses 1501W are substantially equalized. As a result, the optical axes of the lens resin portions 1512 of the respective substrates with lenses 1501W are approximately identical.

Figure 77:
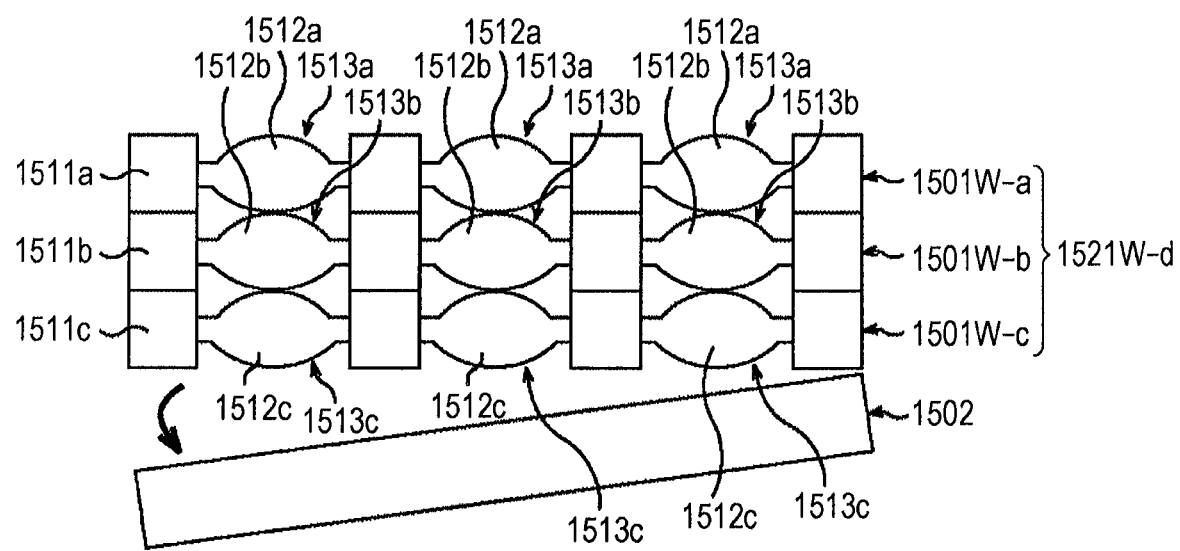
FIG. 77 is a diagram illustrating a second countermeasure against the positional shift of a lens.

After that, as illustrated in FIG. 77, the temporary substrate 1502 is separated (debonded) from the temporarily stacked lens structure 1522W-b and the stacked lens structure 1521W-d including the substrates with lenses 1501W-a to 1501W-c is obtained.

In this way, by combining the direct bonding of the substrates with lenses 1501W, the direct bonding of the substrate with lenses 1501W and the temporary substrate 1502, the direct bonding of the stacked lens structure 1521W and the temporarily stacked lens structure 1522W manufactured by the same number of times of direct bonding, and the separation of the temporary substrate 1502 from the temporarily stacked lens structure 1522W, the positions of the lens resin portions 1512 of the respective substrates with lenses 1501W after stacking can be made substantially identical.

Next, the case of stacking five substrates with lenses 1501W or more will be described with reference to FIG. 78.

First, the case of stacking five substrates with lenses 1501W-a to 1501W-e will be described.

First, the stacked lens structure 1521W-d including the substrates with lenses 1501W-a to 1501W-c is manufactured by the above-described method.

On the other hand, the substrates with lenses 1501W-d and 1501W-e are direct-bonded to manufacture the stacked lens structure 1521W-e (not illustrated).

Subsequently, the stacked lens structure 1521W-e and the temporary substrate 1502 are direct-bonded to manufacture the temporarily stacked lens structure 1522W-c (not illustrated). In this case, substantially the same distortion and shrinkage as when the stacked lens structure 1521W-b and the temporarily stacked lens structure 1522W-a are direct-bonded to manufacture the temporarily stacked lens structure 1522W-b occurs in the substrate with lenses 1501W-d, the substrate with lenses 1501W-e, and the temporary substrate 1502 as illustrated in FIG. 76. Thus, the positional shift of each lens resin portion 1512 of the stacked lens structure 1521W-d obtained by separating the temporary substrate 1502 from the temporarily stacked lens structure 1522W-b is approximately equal to the positional shift of each lens resin portion 1512 of the temporarily stacked lens structure 1522W-c.

Subsequently, the stacked lens structure 1521W-d and the temporarily stacked lens structure 1522W-c manufactured by the same number of times (two times) of direct bonding are direct-bonded. In this way, the temporarily stacked lens structure 1522W-d (not illustrated) including the substrates with lenses 1501a to 1501e and the temporary substrate 1502 is manufactured.

In this case, substantially equal distortion and shrinkage occur in the substrates with lenses 1501W and the temporary substrate 1502. Thus, since the accumulated values of the distortion and shrinkage of the respective substrates with lenses 1501W are substantially equalized, the positional shifts of the lens resin portions 1512 in the respective substrates with lenses 1501W are substantially equalized. As a result, the optical axes of the lens resin portions 1512 of the respective substrates with lenses 1501W are approximately identical.

Figure 78:
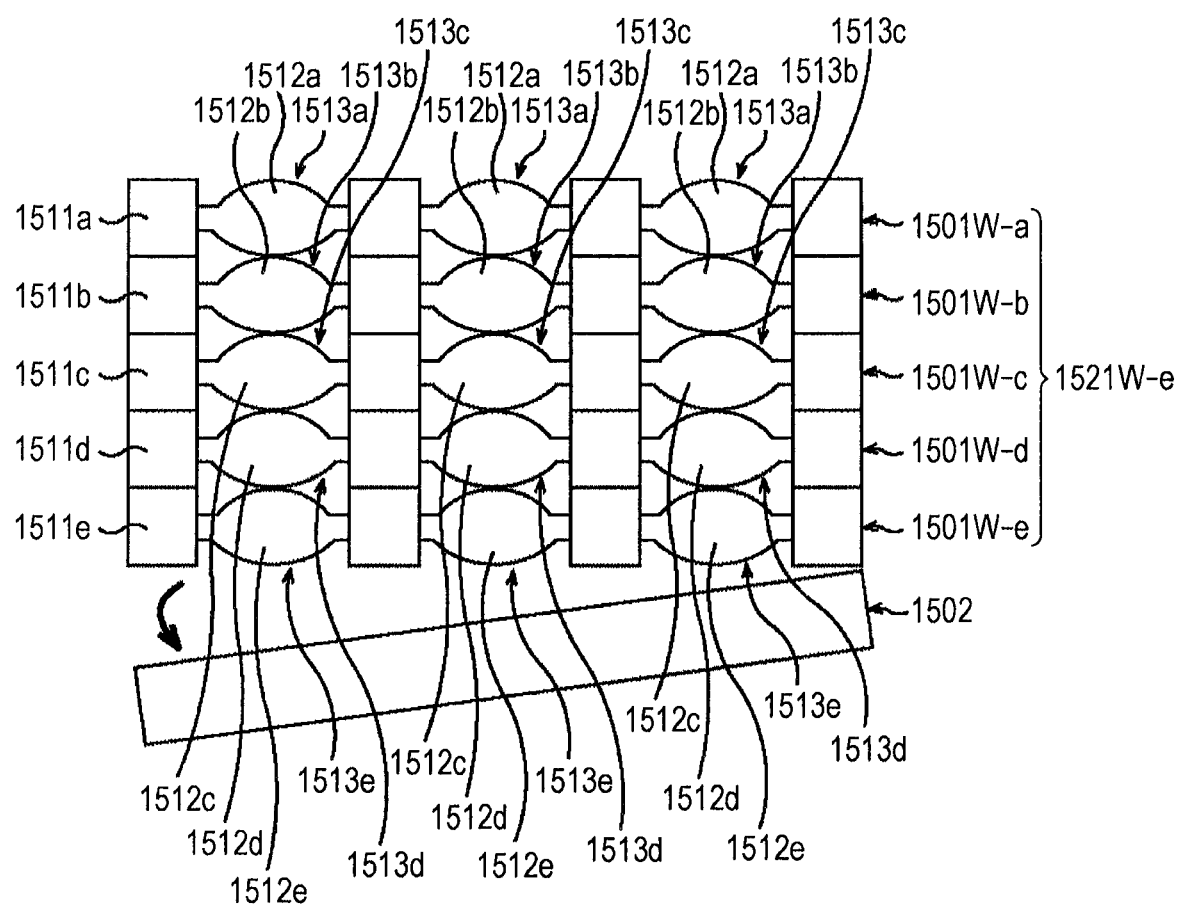
FIG. 78 is a diagram illustrating a second countermeasure against the positional shift of a lens.

After that, as illustrated in FIG. 78, the temporary substrate 1502 is separated (debonded) from the temporarily stacked lens structure 1522W-d and the stacked lens structure 1521W-e including the substrates with lenses 1501W-a to 1501W-e is obtained.

When six substrates with lenses 1501 are stacked, two sets of stacked lens structures including three substrates with lenses 1501 may be manufactured by the above-described method, and then, the two sets of stacked lens structures may be direct-bonded.

In the case of manufacturing seven stacked lens structures or more, by aligning the number of times of bonding of stacked lens structures (including temporarily stacked lens structures) to be direct-bonded using a temporary substrate as necessary, the positions of the lens resin portions 1512 between the substrates with lenses 1501 can be made substantially identical. That is, by combining the direct bonding of the substrates with lenses 1501W, the direct bonding of the substrate with lenses 1501W and the temporary substrate 1502, the direct bonding of the stacked lens structure 1521W and the temporary substrate 1502, the direct bonding of the stacked lens structures 1521W manufactured by the same number of times of bonding, the direct bonding of the stacked lens structure 1521W and the temporarily stacked lens structure 1522W manufactured by the same number of times of bonding, and the separation of the temporary substrate 1502 from the temporarily stacked lens structure 1522W to align the number of times of bonding of the stacked lens structures (including the temporarily stacked lens structures) to be direct-bonded, the positions of the lens resin portions 1512 between the substrates with lenses 1501W can be aligned.

Moreover, by equalizing the number of times of bonding of the respective substrates with lenses 1501W to reduce the number of times of bonding, the amount of distortion of the respective substrates with lenses 1501W can be reduced.

Further, it is possible to reduce the number of feedback operations to an imprint master.

<16.2 Method of Manufacturing Master Wafer>

Next, an example of a method of manufacturing a master wafer that forms the lower mold 181 and the upper mold 201 illustrated in FIGS. 23A to 23G will be described with reference to FIGS. 79 to 92.

An imprint technique is used for manufacturing a master wafer. For example, a master wafer is manufactured by forming an optical transfer surface having a predetermined shape on an entire surface of the master wafer according to a step-and-repeat method using a master pin which is a mold formed of metal, silicon, quartz, or glass.

Instead of the master pin, a replica manufactured using the master pin or a replica manufactured using the replica may be used. In the following description, although an example of manufacturing the master wafer using a master pin will be described mainly, the same technique can be applied to the case of manufacturing the master wafer using a replica.

However, high accuracy is demanded in the position of an optical transfer surface formed on a master wafer in order to align the optical axes of both surfaces of the lens resin portion (lens portion) and align the optical axes of the lens resin portions between substrates with lenses.

Figure 79:
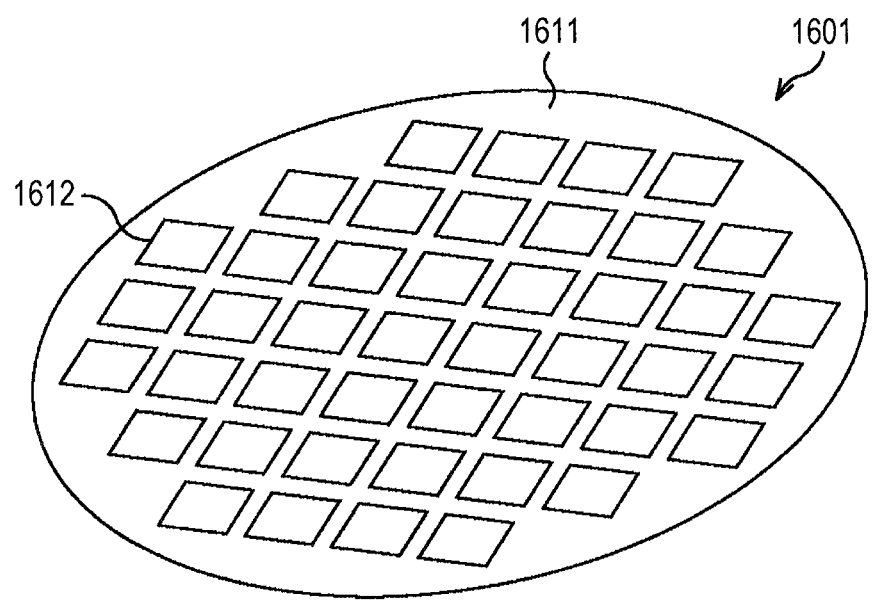
FIG. 79 is a diagram illustrating an example of a method of aligning a master pin.

For example, in order to secure the positional accuracy of the optical transfer surface, as illustrated in FIG. 79, a rectangular alignment mark 1612, for example, may be formed at the formation position of each optical transfer surface of a substrate 1611 used for manufacturing a master wafer 1601. The substrate 1611 is formed of metal, silicon, quartz, or glass, for example.

Figure 80:
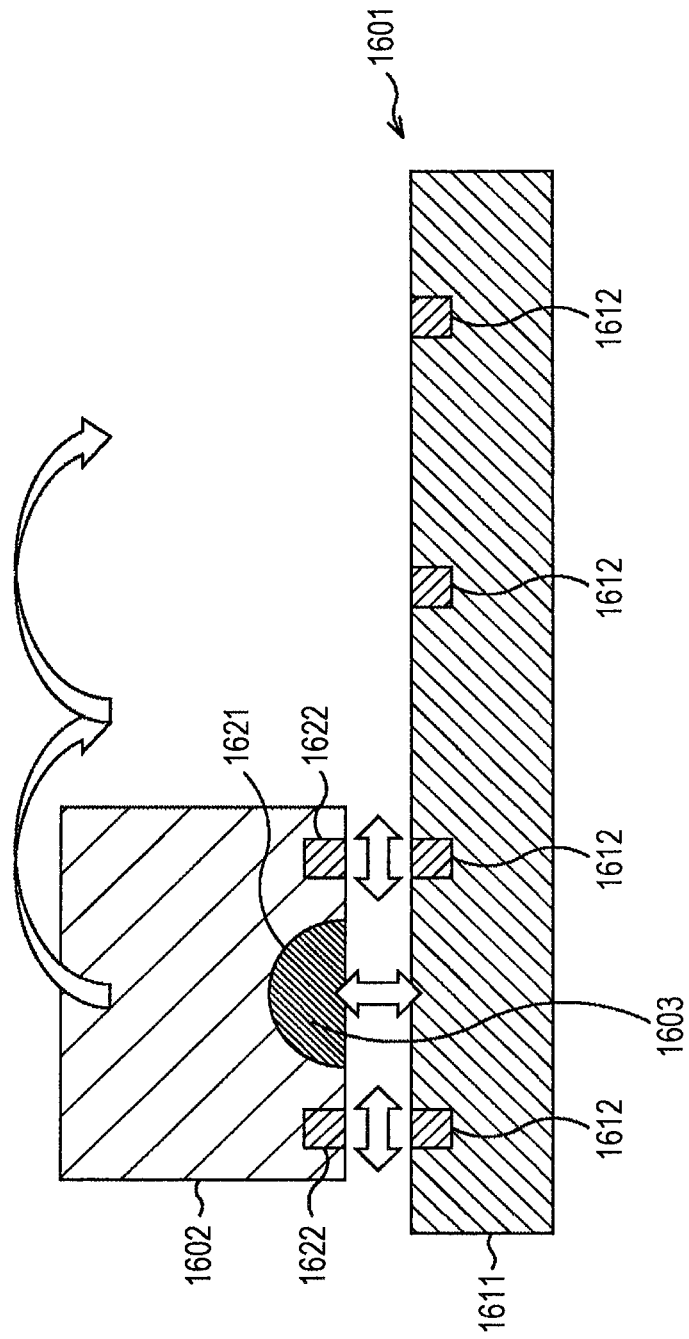
FIG. 80 is a diagram illustrating an example of a method of aligning a master pin.

For example, as illustrated in FIG. 80, an imprint apparatus coarsely adjusts the position of a master pin 1602 by aligning the position of a mark 1622 formed in the master pin 1602 and the position of the alignment mark 1612 on the substrate 1611 using an image processing technique such as pattern matching. After that, the imprint apparatus finely moves the master pin 1602 in a state of being in contact with the surface of the substrate 1611 to finely adjust the position of the master pin 1602.

Subsequently, the imprint apparatus molds a resin 1603 potted into a groove 1621 at the distal end of the master pin 1602 into the substrate 1611. Moreover, the imprint apparatus removes the resin 1603 from the master pin 1602 whereby an optical transfer surface formed of the resin 1603 is formed on the substrate 1611.

However, the positioning accuracy of the imprint apparatus may not satisfy the necessary accuracy because the imprint apparatus uses the image processing technique. In contrast, if the positioning accuracy of the imprint apparatus is increased, the necessary cost may increase dramatically.

Figure 81:
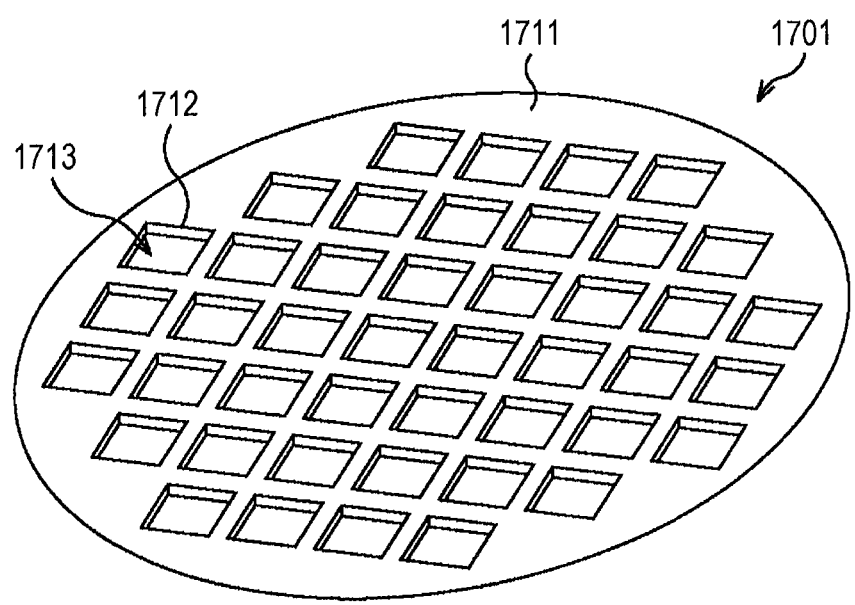
FIG. 81 is a diagram illustrating a method of aligning a master pin to which the present technique is applied.
Figure 82:
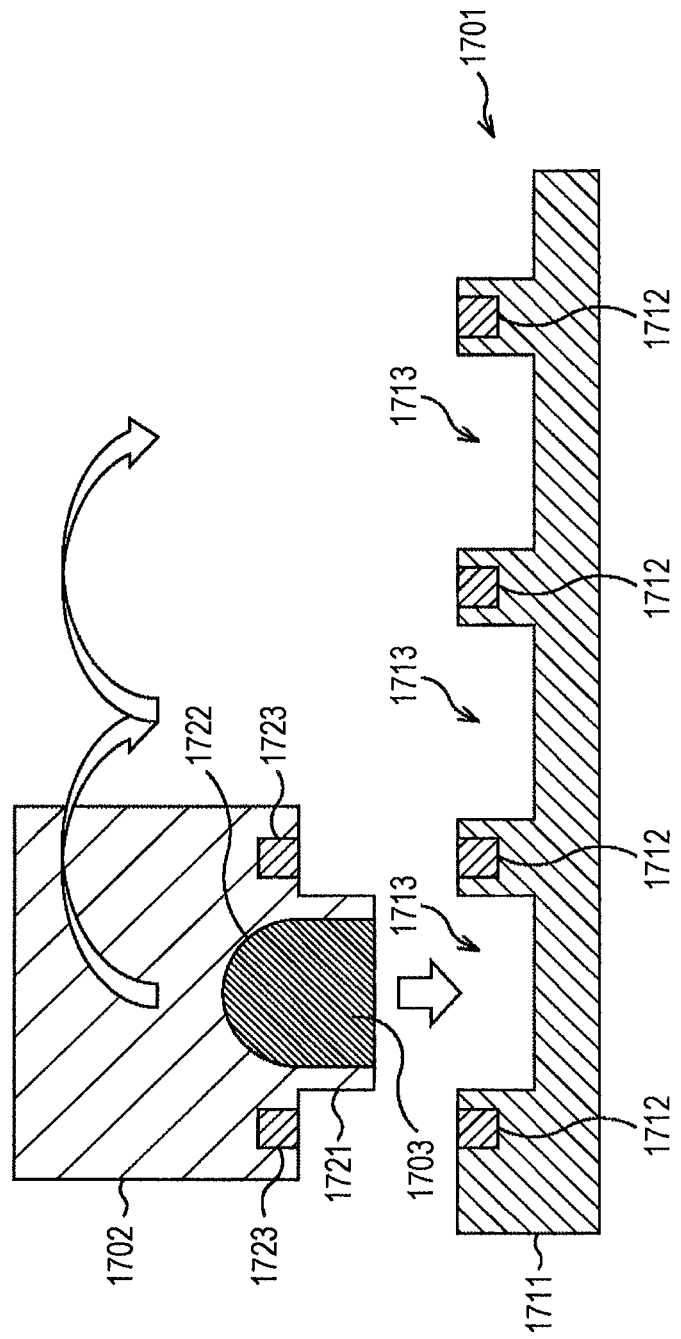
FIG. 82 is a diagram illustrating a method of aligning a master pin to which the present technique is applied.

Thus, as illustrated in FIGS. 81 and 82, a fitting portion is formed in the master wafer and the master pin to improve the positioning accuracy of the master pin.

For example, as illustrated in FIG. 81, a rectangular alignment mark 1712, for example, is formed on a substrate 1711 used for manufacturing a master wafer 1701 similarly to the substrate 1611 illustrated in FIG. 79. Moreover, an opening is formed in a rectangular positioning groove 1713 in formed on the inner side of each alignment mark 1712, for example. The substrate 1711 is formed of metal, silicon, quartz, or glass, for example.

On the other hand, a projection portion 1721 having such a shape that fits to the groove 1713 is formed at the distal end of the master pin 1702. A groove 1722 for potting a resin 1703 is formed at the distal end of the projection portion 1721. Further, a mark 1723 which surrounds the projection portion 1721 and has a shape identical to the alignment mark 1712 is formed on a surface of the master pin 1702 on which the projection portion 1721 is formed.

For example, an imprint apparatus coarsely adjusts the position of the master pin 1702 by aligning the position of the mark 1723 formed on the master pin 1702 and the position of the alignment mark 1712 on the substrate 1711 using an image processing technique such as pattern matching. After that, the imprint apparatus fits the projection portion 1721 of the master pin 1702 to the groove 1713 of the substrate 1711 whereby the master pin 1702 can be aligned with the substrate 1711 in a self-aligned manner.

Subsequently, the imprint apparatus molds the resin 1703 potted into the groove 1722 of the master pin 1702 into the master wafer 1701. Moreover, the imprint apparatus removes the resin 1703 from the master pin 1702 whereby an optical transfer surface formed of the resin 1703 is formed on the substrate 1711.

Here, the positioning accuracy of the master pin 1702 depends on the processing accuracy of the groove 1713 of the substrate 1711 rather than the alignment accuracy of the imprint apparatus. The groove 1713 of the substrate 1711 can be processed with high accuracy (for example, several nm to several tens of nm levels) using a high-accuracy lithography apparatus dedicated for pre-processing of semiconductors, for example. Thus, the positioning of the master pin 1702 can be performed with high accuracy regardless of the alignment accuracy of the imprint apparatus and the accuracy of the formation position of the optical transfer surface on the substrate 1711 is improved.

The fitting portion between the substrate 1711 and the master pin 1702 can be set to an arbitrary shape under such conditions that an optical transfer surface having a desired shape can be formed.

Figure 83:
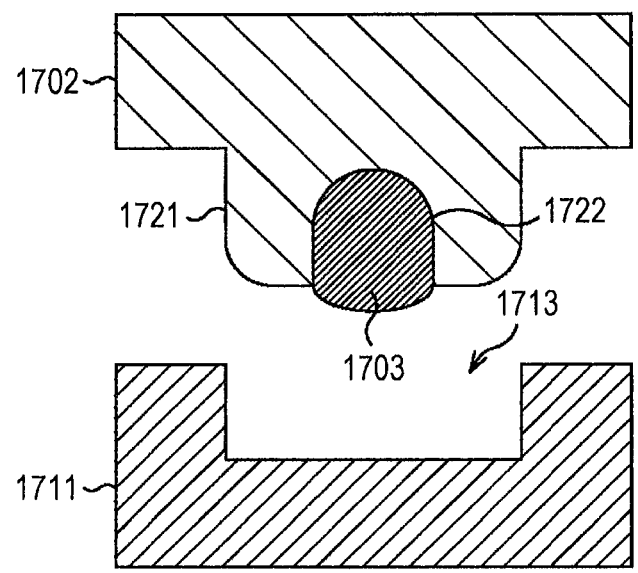
FIG. 83 is a diagram illustrating a first modification of a fitting portion between a master pin and a substrate.

For example, as illustrated in FIG. 83, the corners of the projection portion 1721 of the master pin 1702 may be rounded. In this way, the projection portion 1721 of the master pin 1702 is easily fitted to the groove 1713.

Figure 84:
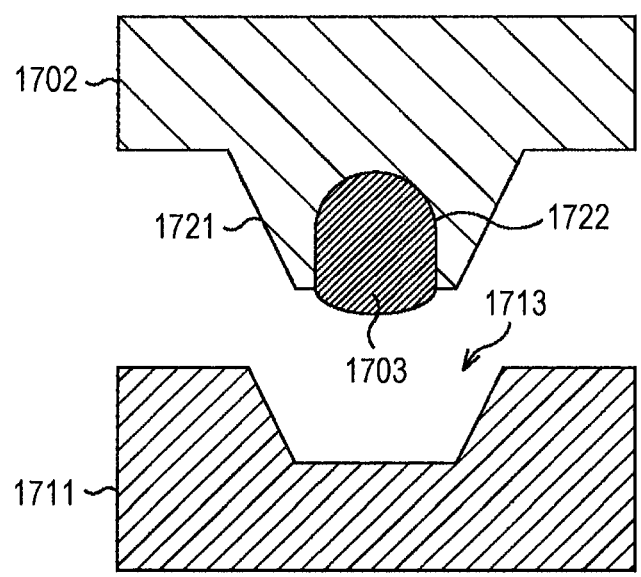
FIG. 84 is a diagram illustrating a second modification of a fitting portion between a master pin and a substrate.

Moreover, for example, as illustrated in FIG. 84, the projection portion 1721 of the master pin 1702 may be formed in such a tapered shape that the groove 1713 of the substrate 1711 is fitted to the projection portion 1721. In this way, the projection portion 1721 of the master pin 1702 is easily fitted to the groove 1713.

Figure 85:
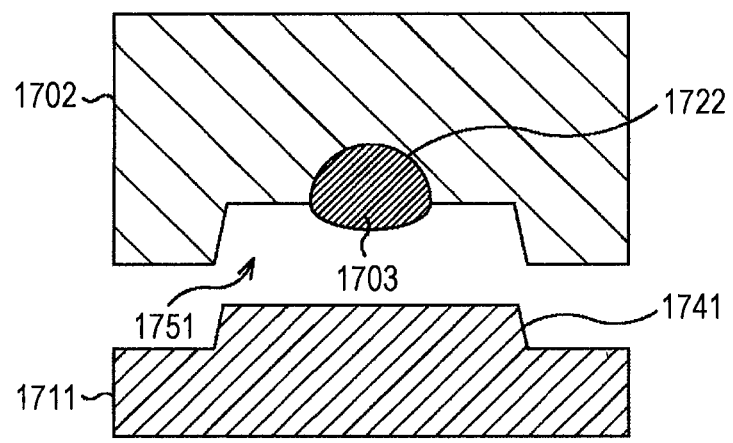
FIG. 85 is a diagram illustrating a third modification of a fitting portion between a master pin and a substrate.

Further, for example, as illustrated in FIG. 85, a tapered projection portion 1741 may be formed on the substrate 1711. Moreover, a groove 1751 that fits to the projection portion 1741 may be formed in the master pin 1702. In this case, a groove 1722 for potting the resin 1703 is formed on the inner side of the groove 1751 of the master pin 1702.

Figure 86:
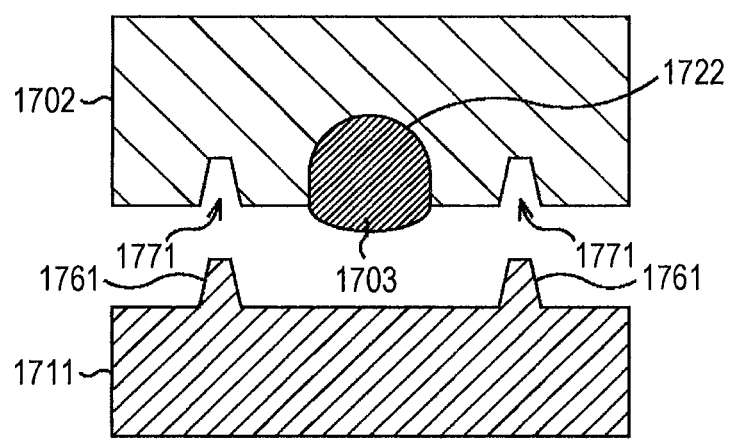
FIG. 86 is a diagram illustrating a fourth modification of a fitting portion between a master pin and a substrate.

Moreover, for example, as illustrated in FIG. 86, a fitting portion may be formed around a portion in which the resin 1703 is imprinted. Specifically, a projection portion 1761 is formed around a portion of the substrate 1711 in which the resin 1703 is imprinted. Moreover, a groove 1771 fitted to the projection portion 1761 is formed around the groove 1722 for potting the resin 1703 of the master pin 1702.

A groove may be formed in the substrate 1711 and a projection portion may be formed on the master pin 1702.

Moreover, the features of the fitting portions illustrated in FIGS. 83 to 86 may be combined in an allowable range. Further, the planar shape of the projection portion and the groove of the fitting portion can be set to a shape such as a circular shape other than the rectangular shape. Moreover, the alignment mark can be set to a shape such as a crossmark other than the rectangular shape.

In the above description, although an example of manufacturing a master wafer directly using a master pin has been illustrated, the above-described technique can be applied to the case of manufacturing a master wafer using a replica manufactured using a master pin as described above.

Figure 87A:
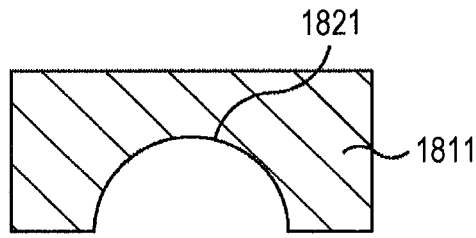
FIGS. 87A to 87D are diagrams illustrating a method of manufacturing a replica from a master pin.
Figure 87B:
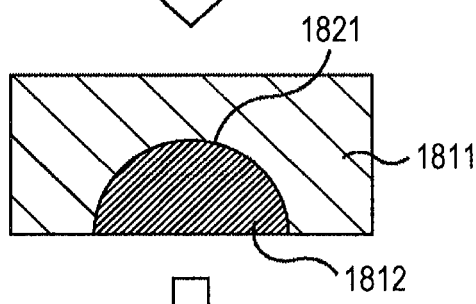

For example, first, as illustrated in FIGS. 87A and 87B, a resin 1812 is potted into a groove 1821 of a master pin 1811.

Figure 87C:
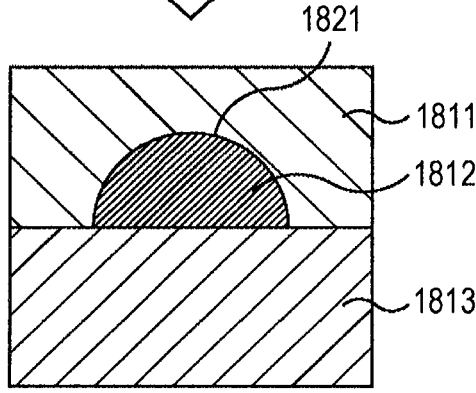

Subsequently, as illustrated in FIG. 87C, the resin 1812 potted into the groove 1821 of the master pin 1811 is molded into a substrate 1813.

Figure 87D:
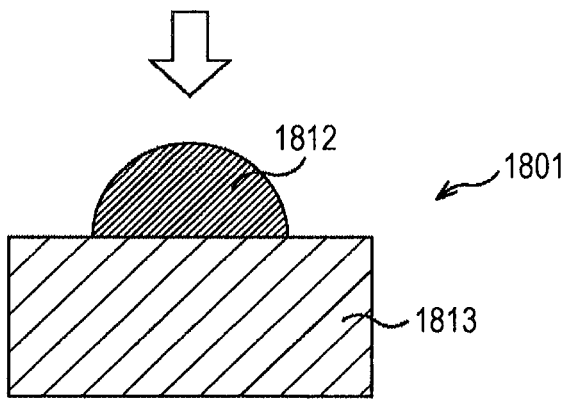

Subsequently, as illustrated in FIG. 87D, the resin 1812 is removed from the master pin 1811 whereby a replica 1801 including the resin 1812 and the substrate 1813 is obtained.

Figure 88:
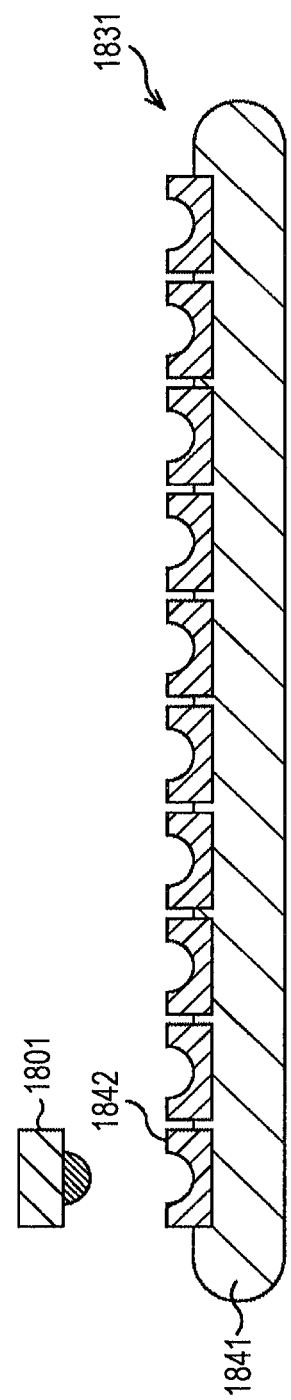
FIG. 88 is a diagram illustrating a method of manufacturing a master wafer from a replica.

Subsequently, as illustrated in FIG. 88, a concave mold resin 1842 is molded on the entire surface of a substrate 1841 according to a step-and-repeat method using the replica 1801 whereby a master wafer 1831 is manufactured. In this case, for example, when such a fitting portion as described with reference to FIGS. 81 to 85 is formed in the replica 1801 and the substrate 1841, for example, the positioning accuracy of the replica 1801 can be improved.

Figure 89:
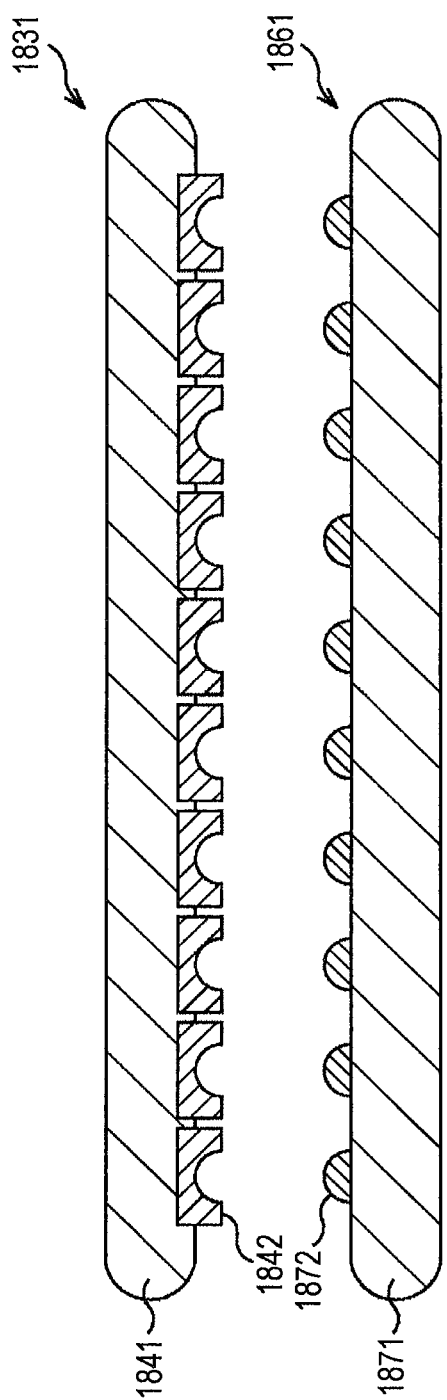
FIG. 89 is a diagram illustrating a method of manufacturing a replica from a master wafer.

Moreover, as illustrated in FIG. 89, when an optical transfer surface 1872 formed of a resin is formed on the substrate 1871 using the master wafer 1831, a replica 1861 of the master wafer 1831 is manufactured. The replica 1861 may be a final molded product (for example, a substrate with lenses in a substrate state) or a final molded product may be manufactured using the replica 1861.

Figure 90E:
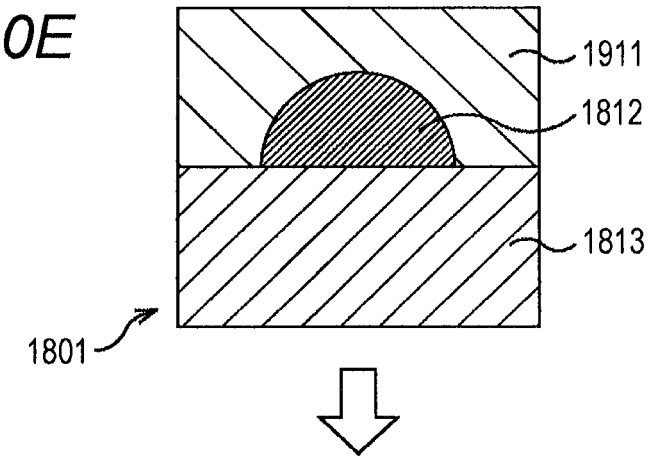
FIGS. 90E to 90G are diagrams illustrating a method of manufacturing a replica from a replica.
Figure 90F:
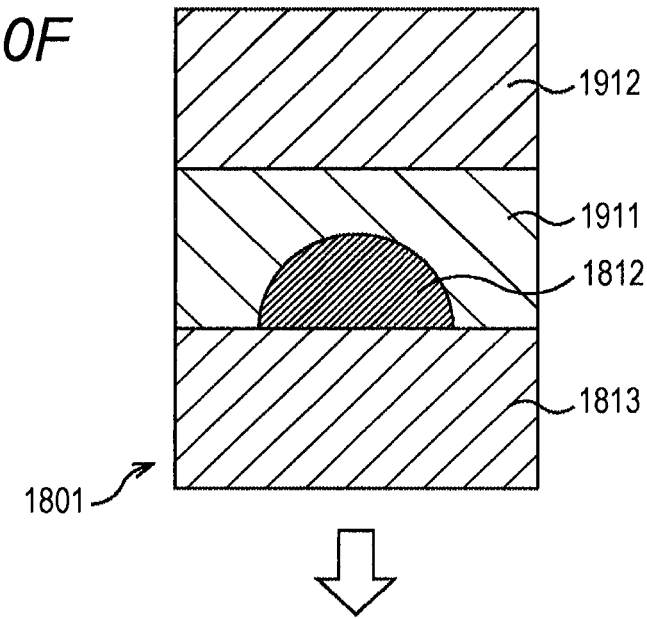
Figure 90G:
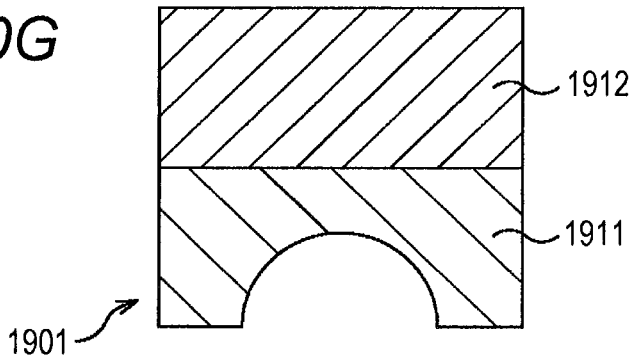

Moreover, for example, as illustrated in FIGS. 90E to 90G, a new replica 1901 can be manufactured using the replica 1801 illustrated in FIGS. 87A to 87D.

For example, first, as illustrated in FIG. 90E, a resin 1911 is potted into the replica 1801.

Subsequently, as illustrated in FIG. 90F, the resin 1911 is molded on the substrate 1912.

Subsequently, as illustrated in FIG. 90G, the resin 1911 is removed from the replica 1801 whereby a replica 1901 including the resin 1911 and the substrate 1912 is obtained.

Figure 91:
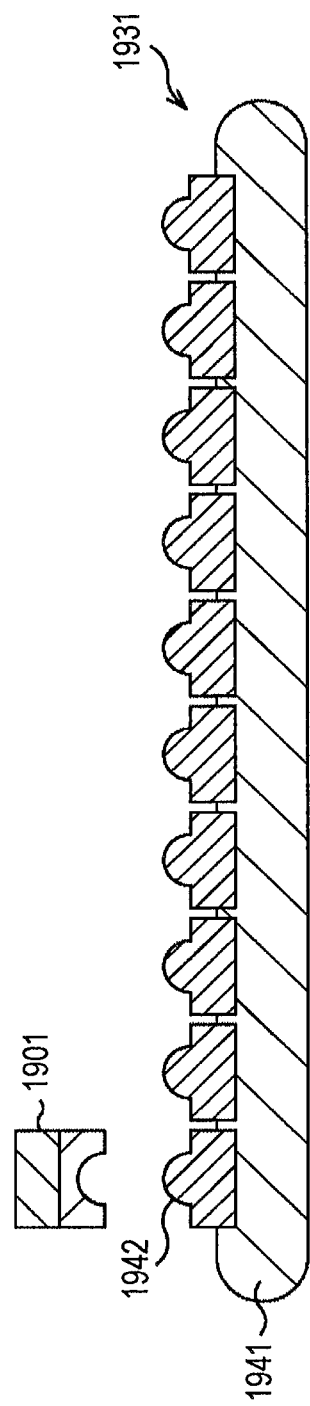
FIG. 91 is a diagram illustrating a method of manufacturing a master wafer from a replica.

Subsequently, as illustrated in FIG. 91, a convex mold resin 1942 is molded on the entire surface of the substrate 1941 according to a step-and-repeat method using the replica 1901 whereby a master wafer 1931 is manufactured. In this case, for example, when such a fitting portion as described with reference to FIGS. 81 to 85 is formed in the replica 1901 and the substrate 1941, the positioning accuracy of the replica 1901 can be improved.

Figure 92:
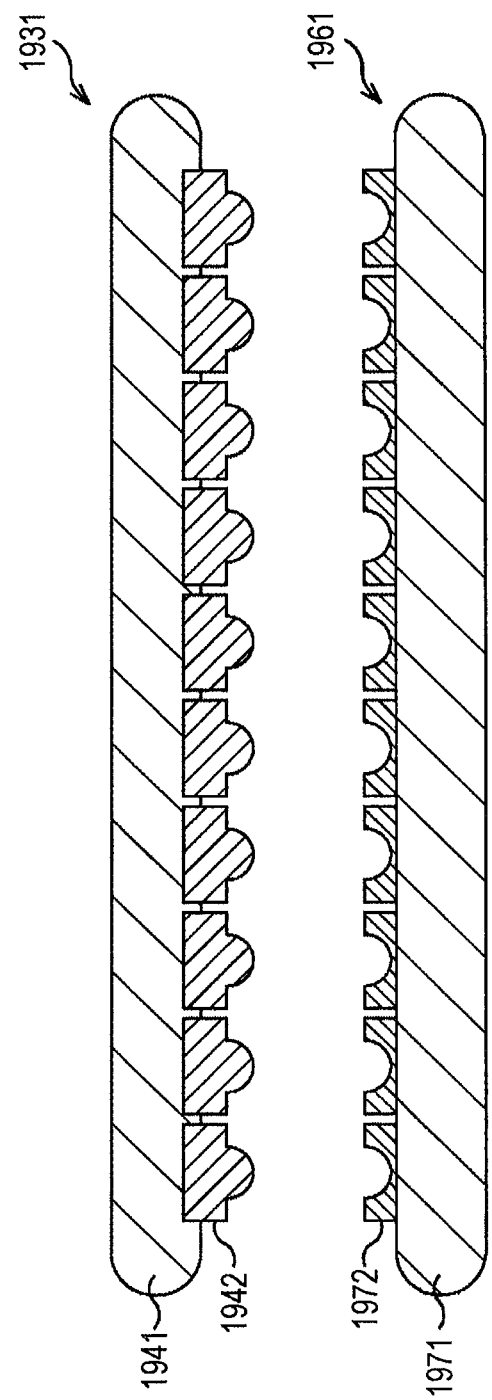
FIG. 92 is a diagram illustrating a method of manufacturing a replica from a master wafer.

Moreover, as illustrated in FIG. 92, when an optical transfer surface 1972 formed of a resin is formed on the substrate 1971 using the master wafer 1931, a replica 1961 of the master wafer 1931 is manufactured. The replica 1961 may be a final molded product (for example, a substrate with lenses in a substrate state) or a final molded product may be manufactured using the replica 1961.

In this manner, it is possible to manufacture a master wafer with high positional accuracy. As a result, it is possible to improve the positional accuracy of the lens resin portion in the substrate with lenses in a substrate state.

The above-described modifications can be also applied to the case of using and manufacturing an upper mold and a lower mold on which a transfer surface other than the optical transfer surface (for example, a transfer surface which uses a photo-curable resin).

17. Application Example to Electronic Apparatus

The camera module 1 can be used in such a form of being incorporated into an imaging apparatus such as a digital still camera or a video camera, a mobile terminal device having an imaging function, and an electronic apparatus which uses a solid-state imaging apparatus in an image capturing unit (photoelectric conversion unit) such as a copying machine which uses a solid-state imaging apparatus in an image reading unit.

Figure 93:
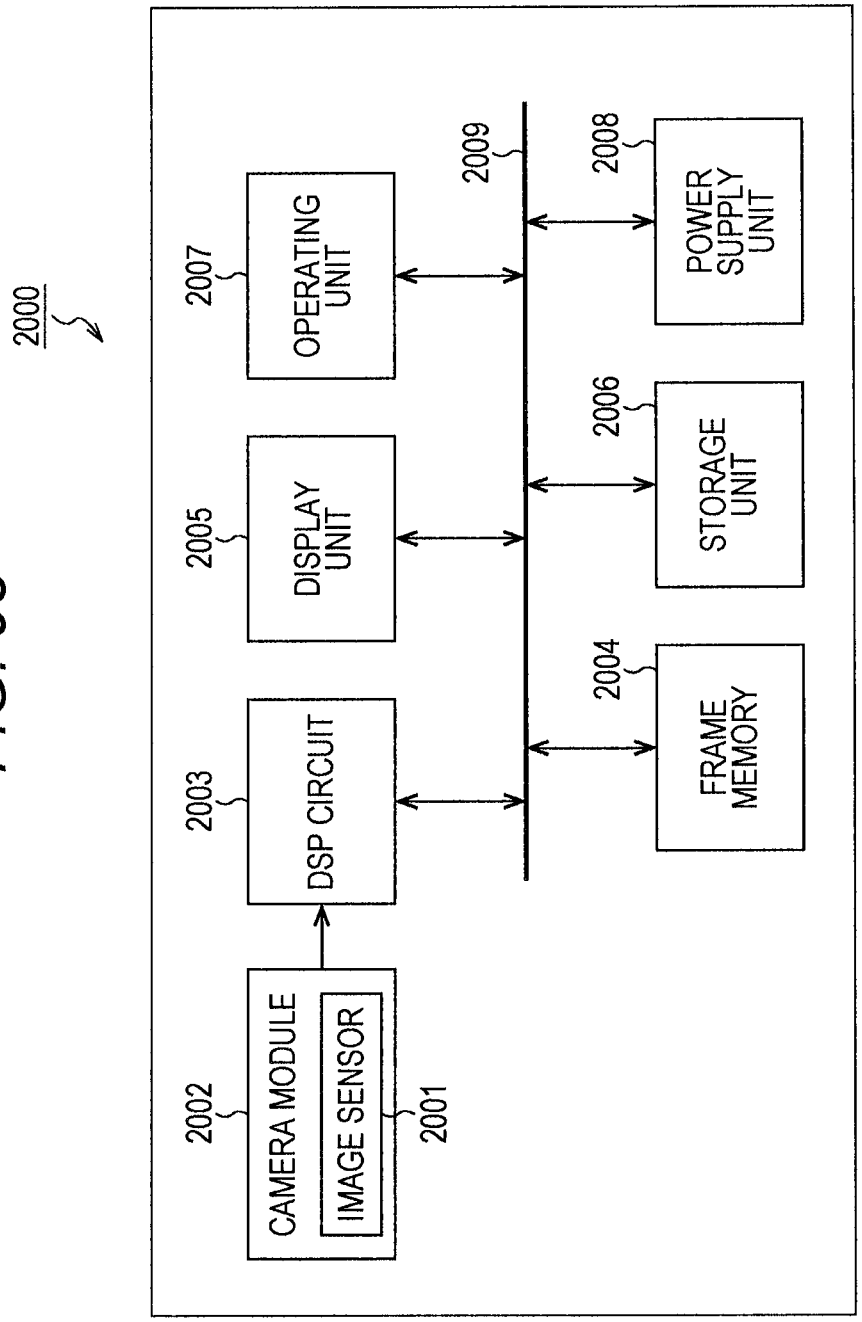
FIG. 93 is a block diagram illustrating a configuration example of an imaging apparatus as an electronic apparatus to which the present technique is applied.

FIG. 93 is a block diagram illustrating a configuration example of an imaging apparatus as an electronic apparatus to which the present technique is applied.

An imaging apparatus 2000 illustrated in FIG. 93 includes a camera module 2002 and a digital signal processor (DSP) circuit 2003 which is a camera signal processing circuit. Moreover, the imaging apparatus 2000 includes a frame memory 2004, a display unit 2005, a recording unit 2006, an operating unit 2007, and a power supply unit 2008. The DSP circuit 2003, the frame memory 2004, the display unit 2005, the recording unit 2006, the operating unit 2007, the power supply unit 2008 are connected to one another via a bus line 2009.

An image sensor 2001 in the camera module 2002 captures incident light (image light) from a subject, converts the amount of the incident light formed on an imaging surface to an electrical signal in respective pixels, and outputs the electrical signal as a pixel signal. The camera module 1 is used as the camera module 2002, and the image sensor 2001 corresponds to the light receiving element 12.

The display unit 2005 is a panel-type display device such as a liquid crystal panel or an organic electro-luminescence (EL) panel and displays a moving or still image imaged by the image sensor 2001. The recording unit 2006 records the moving or still image imaged by the image sensor 2001 on a recording medium such as a hard disk or a semiconductor memory.

The operating unit 2007 issues an operation instruction on various functions of the imaging apparatus 2000 according to the operation of a user. The power supply unit 2008 appropriately supplies various types of power serving as operation power to the DSP circuit 2003, the frame memory 2004, the display unit 2005, the recording unit 2006, and the operating unit 2007.

As described above, when the camera module 1 on which the stacked lens structures 11 which are positioned and bonded (stacked) with high accuracy is used as the camera module 2002, it is possible to improve the image quality and to reduce the size. Thus, in the imaging apparatus 2000 of a camera module for mobile devices such as a video camera, a digital still camera, and a mobile phone, it is possible to reduce the size of a semiconductor package and to improve the image quality of a photographed image.

The technology according to an embodiment of the present disclosure may be applied to various products. For example, the technology according to an embodiment of the present disclosure may be applied to an internal information acquisition system for a patient, which uses an endoscopic capsule.

Figure 94:
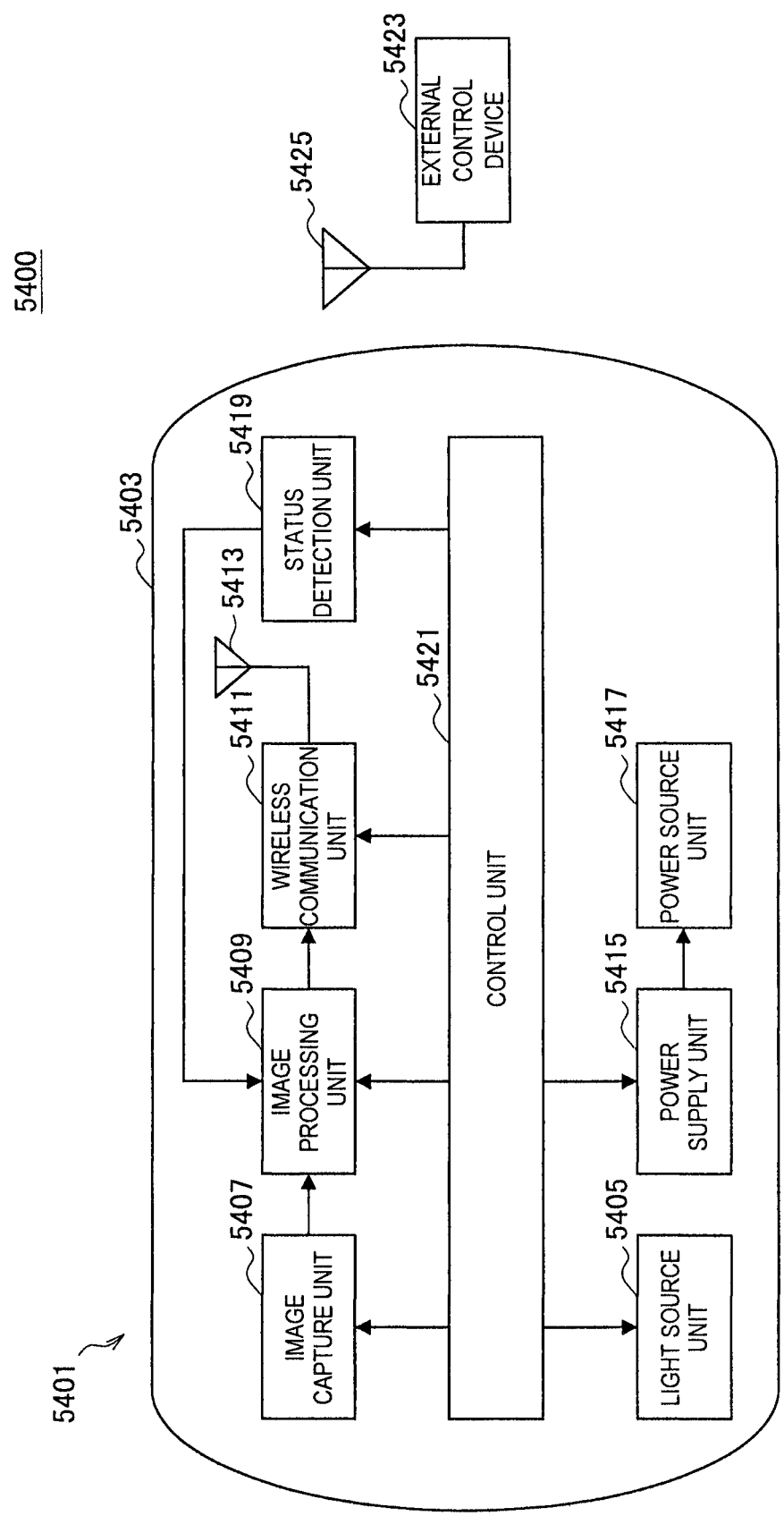
FIG. 94 is a block diagram illustrating an example of a schematic configuration of an internal information acquisition system.

FIG. 94 is a diagram illustrating an example of a schematic configuration of an internal information acquisition system 5400 to which the technology according to an embodiment of the present disclosure may be applied. Referring to FIG. 94, the internal information acquisition system 5400 includes an endoscopic capsule 5401, and an external control device 5423 that centrally controls the operation of the internal information acquisition system 5400. The endoscopic capsule 5401 is swallowed by a patient in an examination. The endoscopic capsule 5401 has an image capture function and a wireless communication function. The endoscopic capsule 5401 moves through the interior of organs such as the stomach and the intestines by peristaltic movement or the like until being excreted naturally from the patient, while also successively capturing images (hereinafter also called internal images) of the interior of the relevant organs at predetermined intervals, and successively wirelessly transmitting information about the internal images to the external control device 5423 outside the body. Based on the received information about the internal images, the external control device 5423 generates image data for displaying the internal images on a display device (not illustrated). In this way, with the internal information acquisition system 5400, images depicting the patient's internal conditions can be obtained continually from the time the endoscopic capsule 5401 is swallowed to the time the endoscopic capsule 5401 is excreted.

The configurations and functions of the endoscopic capsule 5401 and the external control device 5423 will be described in further detail. As illustrated in FIG. 94, the endoscopic capsule 5401 has the functions of a light source unit 5405, an image capture unit 5407, an image processing unit 5409, a wireless communication unit 5411, a power supply unit 5415, a power source unit 5417, a status detection unit 5419, and a control unit 5421 built in a capsule-shaped housing 5403.

The light source unit 5405 includes a light source such as a light-emitting diode (LED), for example, and irradiates the imaging field of the image capture unit 5407 with light.

The image capture unit 5407 includes an image sensor, and an optical system made up of multiple lenses provided in front of the image sensor. Reflected light (hereinafter called observation light) from the light used to irradiate a body tissue which is the object of observation is condensed by the optical system and incident on the image sensor. The image sensor receives and photoelectrically converts the observation light to thereby generate an electrical signal corresponding to the observation light, or in other words, an image signal corresponding to the observed image. The image signal generated by the image capture unit 5407 is provided to the image processing unit 5409. Note that various known image sensors such as a complementary metaloxide-semiconductor (CMOS) image sensor or a charge-coupled device (CCD) image sensor may be used as the image sensor of the image capture unit 5407.

The image processing unit 5409 includes a processor such as a central processing unit (CPU) or a graphics processing unit (GPU), and performs various types of signal processing on the image signal generated by the image capture unit 5407. This signal processing may be a minimal level of processing (such as image data compression, frame rate conversion, data rate conversion, and/or format conversion, for example) for transmitting the image signal to the external control device 5423. Configuring the image processing unit 5409 to perform only a minimal necessary level of processing makes it possible to realize the image processing unit 5409 in a more compact form with lower power consumption, which is preferable for the endoscopic capsule 5401. However, if there is extra space or available power inside the housing 5403, additional signal processing (such as a noise removal process or other image quality-improving processes, for example) may also be performed by the image processing unit 5409. The image processing unit 5409 provides the image signal subjected to the signal processing to the wireless communication unit 5411 as raw data. Note that if information about the status (such as movement or orientation) of the endoscopic capsule 5401 is acquired by the status detection unit 5419, the image processing unit 5409 may also provide the image signal to the wireless communication unit 5411 in association with the information. This makes it possible to associate the position inside the body where an image is captured, the direction in which the image is captured and the like with the captured image.

The wireless communication unit 5411 includes a communication device capable of transmitting and receiving various types of information to and from the external control device 5423. This communication device includes, for example, an antenna 5413 and a processing circuit that performs processing such as modulation processing for transmitting and receiving signals. The wireless communication unit 5411 performs predetermined processing such as modulation processing on the image signal that was subjected to the signal processing by the image processing unit 5409, and transmits the image signal to the external control device 5423 via the antenna 5413. In addition, the wireless communication unit 5411 receives, from the external control device 5423 via the antenna 5413, a control signal related to driving control of the endoscopic capsule 5401. The wireless communication unit 5411 provides the received control signal to the control unit 5421.

The power supply unit 5415 includes, for example, an antenna coil for receiving power, a power regeneration circuit for regenerating power from a current produced in the antenna coil, and a voltage step-up circuit. In the power supply unit 5415, the principle of what is called contactless or wireless charging is used to generate power. Specifically, an external magnetic field (electromagnetic wave) of a predetermined frequency provided to the antenna coil of the power supply unit 5415 produces an induced electromotive force in the antenna coil. This electromagnetic wave may be a carrier wave transmitted from the external control device 5423 via an antenna 5425, for example. Power is regenerated from the induced electromotive force by the power regeneration circuit, and the electric potential of the power is suitably adjusted in the voltage step-up circuit, thereby generating power for power storage. The power generated by the power supply unit 5415 is stored in the power source unit 5417.

The power source unit 5417 includes a secondary battery, and stores power generated by the power supply unit 5415. FIG. 94 omits arrows or the like indicating the recipients of power from the power source unit 5417 for brevity, but power stored in the power source unit 5417 is supplied to the light source unit 5405, the image capture unit 5407, the image processing unit 5409, the wireless communication unit 5411, the status detection unit 5419, and the control unit 5421, and may be used to drive these components.

The status detection unit 5419 includes a sensor such as an acceleration sensor and/or a gyro sensor for detecting the status of the endoscopic capsule 5401. The status detection unit 5419 can acquire information about the status of the endoscopic capsule 5401 from detection results from the sensor. The status detection unit 5419 provides the acquired information about the status of the endoscopic capsule 5401 to the image processing unit 5409. As discussed earlier, in the image processing unit 5409, the information about the status of the endoscopic capsule 5401 may be associated with the image signal.

The control unit 5421 includes a processor such as a CPU, and centrally controls the operation of the endoscopic capsule 5401 by operating in accordance with a predetermined program. The control unit 5421 appropriately controls the driving of the light source unit 5405, the image capture unit 5407, the image processing unit 5409, the wireless communication unit 5411, the power supply unit 5415, the power source unit 5417, and the status detection unit 5419 in accordance with a control signal transmitted from the external control device 5423, thereby realizing the function of each component as described above.

The external control device 5423 may be a processor such as a CPU or GPU, or a device such as a microcontroller or a control board on which a processor and a storage element such as memory are mounted. The external control device 5423 includes the antenna 5425, and is capable of transmitting and receiving various types of information to and from the endoscopic capsule 5401 via the antenna 5425. Specifically, the external control device 5423 controls the operation of the endoscopic capsule 5401 by transmitting a control signal to the control unit 5421 of the endoscopic capsule 5401. For example, a light irradiation condition under which the light source unit 5405 irradiates a target of observation with light may be changed by a control signal from the external control device 5423. In addition, an image capture condition (such as the frame rate and the exposure level in the image capture unit 5407, for example) may be changed by a control signal from the external control device 5423. In addition, the content of processing in the image processing unit 5409 and a condition (such as the transmission interval and the number of images to transmit, for example) under which the wireless communication unit 5411 transmits the image signal may be changed by a control signal from the external control device 5423.

In addition, the external control device 5423 performs various types of image processing on the image signal transmitted from the endoscopic capsule 5401, and generates image data for displaying a captured internal image on a display device. For the image processing, various known signal processing, such as a development process (demosaicing process), an image quality-improving process (such as a band enhancement process, a super-resolution process, a noise reduction (NR) process, and/or a shake correction process), and/or an enlargement process (electronic zoom process), may be performed. The external control device 5423 controls the driving of a display device (not illustrated), and causes the display device to display a captured internal image on the basis of the generated image data. Alternatively, the external control device 5423 may also cause a recording device (not illustrated) to record the generated image data, or cause a printing device (not illustrated) to make a printout of the generated image data.

The above describes an example of the internal information acquisition system 5400 to which the technology according to an embodiment of the present disclosure may be applied. Among the configurations described in the foregoing, the technology according to an embodiment of the present disclosure may be applied favorably to an endoscopic capsule. Specifically, this invention is effective for downsizing an imaging device and reducing the burden on patients applying technology according to an embodiment of the present.

18. Use Example of Image Sensor

Figure 95:
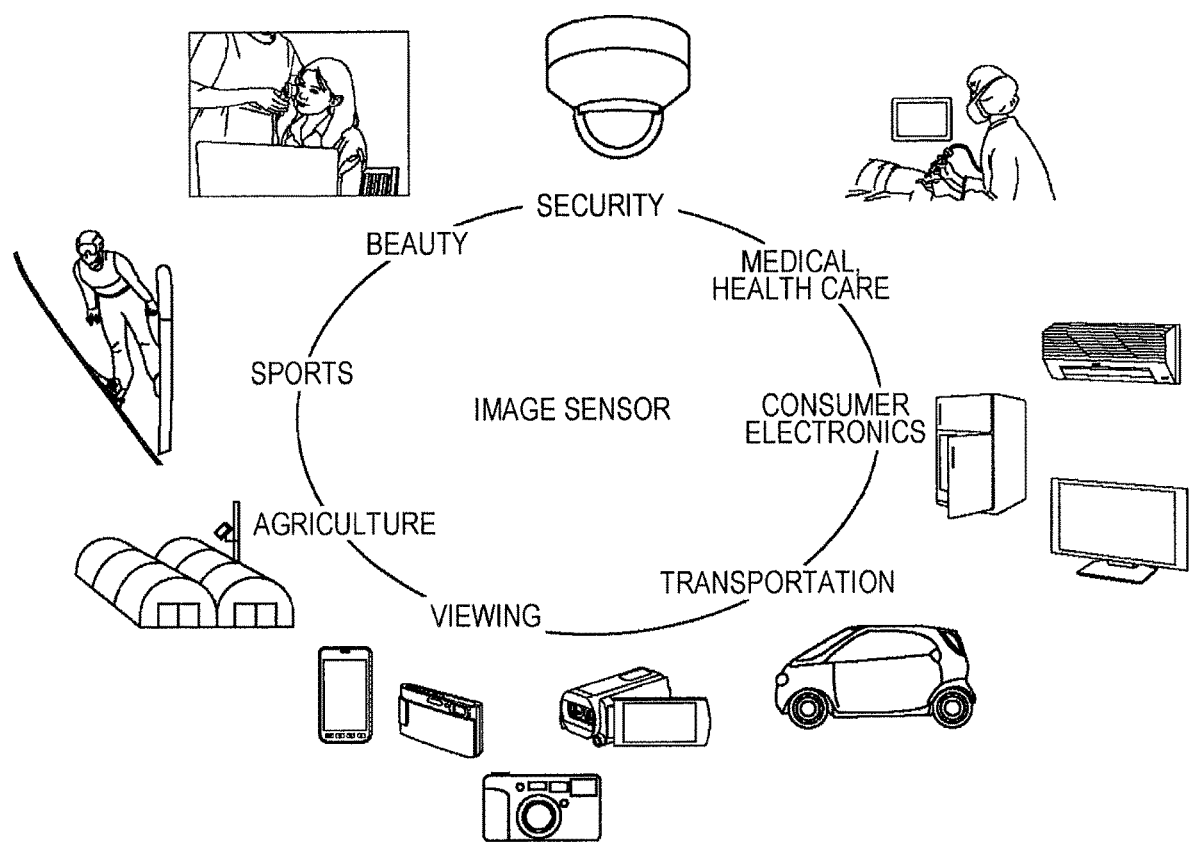
FIG. 95 is a diagram illustrating a use example of an image sensor.

FIG. 95 is a diagram illustrating a use example of using an image sensor configured as the camera module 1.

For example, the image sensor configured as the camera module 1 can be used in various cases of sensing light such as visible light, infrared light, ultraviolet light, and X-ray in the following manner.

Apparatuses for photographing images provided for viewing, such as digital cameras, mobile apparatuses with a camera feature.

Apparatuses provided for transportation, such as on-vehicle sensors for photographing the front, the rear, the surrounding, the interior, and the like of a vehicle to realize a safe driving function such as an automated stop function and to recognize the driver's condition, monitoring cameras for monitoring traveling vehicles and roads, and distance-measuring sensors for measuring the distance between vehicles.

Apparatuses provided for consumer electronics such as TVs, refrigerators, and air-conditioners to photograph the gesture of a user to operate apparatuses according to the gesture.

Apparatuses provided for medical and health-care purposes such as endoscopes and apparatuses for photographing blood vessels using infrared light.

Apparatuses provided for security purposes such as anti-crime surveillance cameras and cameras for personal authentication.

Apparatuses provided for cosmetic purposes such as skin meters for photographing the skin and microscopes for photographing the scalp.

Apparatus provided for sports purpose such as action cameras dedicated for sports and wearable cameras.

Apparatuses provided for agricultural purposes such as cameras for monitoring the conditions of farms and crops.

The embodiment of the present technique is not limited to the above-described embodiments but various changes can be made without departing from the spirit of the present technique.

For example, the present technique is not limited to application to a solid-state imaging apparatus that detects a distribution of incident light intensity of visible light to photograph the distribution as an image. However, the present technique can be applied to a solid-state imaging apparatus that photographs a distribution of incident intensity of infrared light, X-ray, or particles as an image and an overall solid-state imaging apparatus (physical quantity detection device) such as a finger print detection sensor that detects a distribution other physical quantities such as pressure or electrostatic capacitance to photograph the distribution as an image in a broader sense of meaning.

For example, an embodiment in which all or parts of the plurality of embodiments described above are combined may be employed.

The advantages described in the present specification are examples only and other advantages other than those described in the present specification may be provided.

The present technique can have the following configurations.

(1)

A method of manufacturing stacked lens structures, comprising:

a first step of forming a plurality of through-holes having a lens disposed on an inner side thereof at a position shifted from a predetermined first target position on a substrate according to a first shift which is a shift in the position of each of the through-holes occurring during manufacturing processes;

a second step of forming the lens on the inner side of each of the through-holes using a first mold in which a plurality of first transfer surfaces used for forming a first surface of each of the lenses is disposed at a position shifted from a predetermined second target position according to a second shift which is a shift in the position of the first surface of each of the lenses occurring during the manufacturing processes and a second mold in which a plurality of second transfer (1)

surfaces used for forming a second surface of each of the lenses is disposed at a position shifted from a predetermined third target position according to a third shift which is a shift in the position of the second surface of each of the lenses occurring during the manufacturing processes;

a third step of stacking the plurality of substrates having the lenses formed therein according to direct bonding; and a fourth step of dividing the plurality of stacked substrates.

(2)

The method of manufacturing stacked lens structures according to (1), wherein a first correction amount of shifting each of the through-holes from the first target position is set for the respective through-holes according to the first shift of each of the through-holes, a second correction amount of shifting each of the first transfer surfaces from the second target position is set for the respective first transfer surfaces according to the second shift of each of the lenses, and a third correction amount of shifting each of the second transfer surfaces from the third target position is set for the respective second transfer surfaces according to the third shift of each of the lenses.

(3)

The method of manufacturing stacked lens structures according to (2), wherein the first correction amount of each of the through-holes is set based on an inverse vector of a first vector indicating the first shift of each of the through-holes, the second correction amount of each of the first transfer surfaces is set based on an inverse vector of a second vector indicating the second shift of the first surface of the corresponding lens, and the third correction amount of each of the second transfer surfaces is set based on an inverse vector of a third vector indicating the third shift of the second surface of the corresponding lens.

(4)

The method of manufacturing stacked lens structures according to (3), wherein the first vector for each of the through-holes is set based on an average for the respective through-holes, of the shift in the position of each of the through-holes occurring in the first to third steps, the second vector for the first surface of each of the lenses is set based on an average for the respective lenses, of the shift in the position of the first surface of each of the lenses occurring in the second and third steps during manufacturing of the first mold, and the third vector for the second surface of each of the lenses is set based on an average for the respective lenses, of the shift in the position of the second surface of each of the lenses occurring in the second and third steps during manufacturing of the second mold.

(5)

The method of manufacturing stacked lens structures according to any one of (1) to (4), wherein the direct bonding is plasma bonding.

(6)

The method of manufacturing stacked lens structures according to any one of (1) to (5), wherein in the second step, the respective lenses are formed by imprinting using the first and second molds.

(7)

A stacked lens structure manufactured by the steps comprising:

a first step of forming a plurality of through-holes having a lens disposed on an inner side thereof at a position shifted from a predetermined first target position on a substrate according to a first shift which is a shift in the position of each of the through-holes occurring during manufacturing processes;

a second step of forming the lens on the inner side of each of the through-holes using a first mold in which a plurality of first transfer surfaces used for forming a first surface of each of the lenses is disposed at a position shifted from a predetermined second target position according to a second shift which is a shift in the position of the first surface of each of the lenses occurring during the manufacturing processes and a second mold in which a plurality of second transfer surfaces used for forming a second surface of each of the lenses is disposed at a position shifted from a predetermined third target position according to a third shift which is a shift in the position of the second surface of each of the lenses occurring during the manufacturing processes;

a third step of stacking the plurality of substrates having the lenses formed therein according to direct bonding; and a fourth step of dividing the plurality of stacked substrates.

(8)

An electronic apparatus comprising:

a stacked lens structure manufactured by the steps comprising:

a first step of forming a plurality of through-holes having a lens disposed on an inner side thereof at a position shifted from a predetermined first target position on a substrate according to a first shift which is a shift in the position of each of the through-holes occurring during manufacturing processes;

a second step of forming the lens on the inner side of each of the through-holes using a first mold in which a plurality of first transfer surfaces used for forming a first surface of each of the lenses is disposed at a position shifted from a predetermined second target position according to a second shift which is a shift in the position of the first surface of each of the lenses occurring during the manufacturing processes and a second mold in which a plurality of second transfer surfaces used for forming a second surface of each of the lenses is disposed at a position shifted from a predetermined third target position according to a third shift which is a shift in the position of the second surface of each of the lenses occurring during the manufacturing processes;

a third step of stacking the plurality of substrates having the lenses formed therein according to direct bonding; and a fourth step of dividing the plurality of stacked substrates.

(9)

A mold which is used for forming one surface of each of lenses of a substrate which is used for manufacturing a stacked lens structure, the stacked lens structure being manufactured by stacking a plurality of substrates in which a plurality of through-holes having a lens disposed on an inner side thereof is formed by direct bonding and dividing the plurality of substrates, wherein a plurality of transfer surfaces used for forming the one surface of each of the lenses is disposed at a position shifted from a predetermined target position according to a shift in the position of the one surface of each of the lenses occurring during manufacturing processes.

(10)

A method of manufacturing stacked lens structures, comprising:
- a first step of manufacturing a stacked substrate with lenses having a predetermined number of layers by combining direct bonding of substrates with lenses which are substrates in which a plurality of through-holes having a lens disposed on an inner side thereof is formed and direct bonding of stacked substrates with lenses manufactured by the same number of times of direct bonding, the stacked substrate with lenses being a stacked substrate of a plurality of substrates with lenses; and
- a second step of dividing the stacked substrate with lenses manufactured by the first step.

(11)

The method of manufacturing stacked lens structures according to (10), wherein
- in the first step, the stacked substrate with lenses having the predetermined number of layers is manufactured by further combining direct bonding of the substrate with lenses and a temporary substrate which is a substrate in which the through-holes and the lenses are not formed, direct bonding of the stacked substrate with lenses and the temporary substrate,
- direct bonding of the stacked substrate with lenses and a temporarily stacked substrate which is a stacked substrate including the substrate with lenses and the temporary substrate, the direct bonding being of the temporarily stacked substrate and the stacked substrate with lenses manufactured by the same number of times of direct bonding, and separation of the temporary substrate from the temporarily stacked substrate.

(12)

The method of manufacturing stacked lens structures according to (11), wherein
- in the first step, when first to third substrates with lenses are stacked, the first substrate with lenses and the second substrate with lenses are direct-bonded to manufacture the stacked substrate with lenses, the third substrate with lenses and the temporary substrate are direct-bonded to manufacture a first temporarily stacked substrate, the stacked substrate with lenses and the first temporarily stacked substrate are direct-bonded to manufacture a second temporarily stacked substrate, and the temporary substrate is separated from the second temporarily stacked substrate.

(13)

The method of manufacturing stacked lens structures according to (10), wherein
- in the first step, when first to fourth substrates with lenses are stacked, the first substrate with lenses and the second substrate with lenses are direct-bonded to manufacture a first stacked substrate with lenses, the third substrate with lenses and the fourth substrate with lenses are direct-bonded to manufacture a second stacked substrate with lenses, and the first stacked substrate with lenses and the second stacked substrate with lenses are direct-bonded.

(14)

The method of manufacturing stacked lens structures according to any one of (10) to (13), wherein
the direct bonding is plasma bonding.

(15)

A stacked lens structure manufactured by the steps comprising:
- a first step of manufacturing a stacked substrate with lenses having a predetermined number of layers by combining direct bonding of substrates with lenses which are substrates in which a plurality of through-holes having a lens disposed on an inner side thereof is formed and direct bonding of stacked substrates with lenses manufactured by the same number of times of direct bonding, the stacked substrate with lenses being a stacked substrate of a plurality of substrates with lenses; and
- a second step of dividing the stacked substrate with lenses manufactured by the first step.

(16)

An electronic apparatus comprising:
a stacked lens structure manufactured by the steps comprising:
- a first step of manufacturing a stacked substrate with lenses having a predetermined number of layers by combining direct bonding of substrates with lenses which are substrates in which a plurality of through-holes having a lens disposed on an inner side thereof is formed and direct bonding of stacked substrates with lenses manufactured by the same number of times of direct bonding, the stacked substrate with lenses being a stacked substrate of a plurality of substrates with lenses; and
- a second step of dividing the stacked substrate with lenses manufactured by the first step.

(17)

A method of manufacturing a mold, comprising:
- a first step of forming a second fitting portion that fits to a first fitting portion at a distal end of another mold at a plurality of predetermined positions of a first substrate; and
- a second step of fitting the first fitting portion of the other mold to the respective second fitting portions to realize alignment of the other mold and forming a transfer surface at the plurality of positions of the first substrate using the other mold.

(18)

The method of manufacturing the mold according to (17), wherein
one of the first fitting portion and the second fitting portion has a tapered projection portion and the other has a groove that fits to the projection portion.

(19)

The method of manufacturing the mold according to (17) or (18), wherein
in the first step, the second fitting portion is formed around a position at which the transfer surface of the first substrate is formed.

(20)

The method of manufacturing the mold according to any one of (17) to (19), wherein each of the transfer surfaces is used for forming one surface of each of lenses disposed on an inner side of a plurality of through-holes formed in a second substrate.

(21)

A substrate in which a second fitting portion that fits to a first fitting portion at a distal end of a mold used for forming a transfer surface is formed at a position at which a plurality of the transfer surfaces is formed.

(22)

A mold which is used for forming a transfer surface at a plurality of predetermined positions of a substrate and in which a second fitting portion that fits to a first fitting portion formed at the plurality of positions of the substrate is formed at a distal end.

(23)

A method of manufacturing a lens structure, the method comprising:
  forming a plurality of through-holes at a position shifted from a predetermined first target position according to a first shift amount corresponding to a shift in the position of each of the respective through-holes that occurs during a manufacturing process;
  forming a lens at an inner side of each of the through-holes of the plurality of through-holes using a first mold in which a plurality of first transfer surfaces used for forming a first surface of each of the lenses is disposed at a position shifted from a predetermined second target position according to a second shift amount corresponding to a shift in the position of the first surface of each of the respective lenses that occurs during the manufacturing processes and a second mold in which a plurality of second transfer surfaces used for forming a second surface of each of the lenses is disposed at a position shifted from a predetermined third target position according to a third shift amount corresponding to a shift in the position of the second surface of each of the respective lenses that occurs during the manufacturing processes;
  stacking and directly bonding the plurality of substrates having the lenses formed therein; and
  dividing the plurality of stacked substrates.

(24)

The method of manufacturing according to (23), wherein
  a first correction amount of shifting each of the through-holes from the first target position is set for the respective through-holes according to the first shift amount of each of the through-holes,
  a second correction amount of shifting each of the first transfer surfaces from the second target position is set for the respective first transfer surfaces according to the second shift amount of each of the lenses, and
  a third correction amount of shifting each of the second transfer surfaces from the third target position is set for the respective second transfer surfaces according to the third shift amount of each of the lenses.

(25)

The method of manufacturing according to (24), wherein
  the first correction amount of each of the through-holes is set based on an inverse vector of a first vector indicating the first shift amount of each of the respective through-holes,
  the second correction amount of each of the first transfer surfaces is set based on an inverse vector of a second vector indicating the second shift amount of the first surface of the corresponding lens, and
  the third correction amount of each of the second transfer surfaces is set based on an inverse vector of a third vector indicating the third shift amount of the second surface of the corresponding lens.

(26)

The method of manufacturing according to claim 25), wherein
  the first vector for each of the through-holes is set based on an average amount of shift in the position of each of the through-holes,
  the second vector for the first surface of each of the lenses is set based on an average amount of the shift in the position of the first surface of each of the lenses, and
  the third vector for the second surface of each of the lenses is set based on an average amount of the shift in the position of the second surface of each of the lenses.

(27)

The method of manufacturing according to any one of (23) to (26), wherein each of the plurality of substrates are directly bonded using plasma bonding.

(28)

The method of manufacturing according to any one of (23) to (27), wherein respective lenses are formed by imprinting using the first and second molds.

(29)

A lens structure manufactured by the steps comprising:
  forming a plurality of through-holes at a position shifted from a predetermined first target position according to a first shift amount corresponding to a shift in the position of each of the respective through-holes that occurs during a manufacturing processes;
  forming a lens at an inner side of each of the through-holes of the plurality of through-holes using a first mold in which a plurality of first transfer surfaces used for forming a first surface of each of the lenses is disposed at a position shifted from a predetermined second target position according to a second shift amount corresponding to a shift in the position of the first surface of each of the respective lenses that occurs during the manufacturing processes and a second mold in which a plurality of second transfer surfaces used for forming a second surface of each of the lenses is disposed at a position shifted from a predetermined third target position according to a third shift amount corresponding to a shift in the position of the second surface of each of the respective lenses that occurs during the manufacturing process;
  stacking and directly bonding the plurality of substrates having the lenses formed therein; and
  dividing the plurality of stacked substrates.

(30)

An electronic apparatus comprising:
a stacked lens structure manufactured by:
  forming a plurality of through-holes at a position shifted from a predetermined first target position according to a first shift amount corresponding to a shift in the position of each of the respective through-holes that occurs during a manufacturing process;
  forming a lens at an inner side of each of the through-holes of the plurality of through-holes using a first mold in which a plurality of first transfer surfaces used for forming a first surface of each of the lenses is disposed at a position shifted from a predetermined second target position according to a second shift amount corresponding to a shift in the position of the first surface of each of the respective lenses that occurs during the manufacturing processes and a second mold in which a plurality of second transfer surfaces used for forming a second surface of each of the lenses is disposed at a position shifted from a predetermined third target position according to a third shift amount corresponding to a shift in the position of the second surface of each of the respective lenses that occurs during the manufacturing processes;

stacking and directly bonding the plurality of substrates having the lenses formed therein; and dividing the plurality of stacked substrates.

(31)

A mold for forming one surface of a lens of a substrate including a plurality of through-holes, wherein the lens of the substrate is disposed at an inner side of the through-hole, wherein a plurality of transfer surfaces used for forming the surface of the lens is disposed at a position shifted from a predetermined target position according to an amount of shift in the position of the surface of the lens that occurs during a manufacturing process.

(32)

A method of manufacturing a lens structure, comprising:

directly bonding a first plurality of substrates to a second plurality of substrates thereby forming a stacked substrate, each substrate of the first plurality and second plurality of substrates including multiple through-holes having a lens disposed at an inner side thereof, wherein each substrate of the first plurality and second plurality of substrates is directly bonded to at least one other substrate of the respective first and second plurality of substrates that includes multiple through-holes having a lens disposed at an inner side therein; and dividing the stacked substrate into one or more lens structures.

(33)

The method of manufacturing according to (32), further comprising:

directly bonding a substrate that includes multiple through-holes having a lens disposed at an inner side therein to a substrate in which through-holes and lenses are not formed thereby forming a temporary stacked substrate;

directly bonding the stacked substrate and the temporary stacked substrate; and separating the temporary substrate from the temporarily stacked substrate.

(34)

The method of manufacturing stacked lens structures according to (33), wherein a first substrate with lenses and a second substrate with lenses of the first plurality of substrates are directly bonded, a third substrate with lenses of the second plurality of substrates and the temporary substrate are directly bonded thereby forming a first temporarily stacked substrate, the stacked substrate and the first temporarily stacked substrate are directly bonded thereby forming a second temporarily stacked substrate, and the temporary substrate is separated from the second temporarily stacked substrate.

(35)

The method of manufacturing stacked lens structures according to (32), wherein first and second substrates of the first plurality of substrates and third and fourth substrates of the plurality of substrates are stacked, the first substrate and the second substrate are directly bonded thereby forming a first stacked substrate with lenses, the third substrate and the fourth substrate are directly bonded thereby forming a second stacked substrate with lenses, and the first stacked substrate with lenses and the second stacked substrate with lenses are directly bonded.

(36)

The method of manufacturing stacked lens structures according to any one of (32) to (35), wherein the direct bonding is plasma bonding.

(37)

A lens structure manufactured by the steps comprising:

directly bonding a first plurality of substrates to a second plurality of substrates thereby forming a stacked substrate, each substrate of the first plurality and second plurality of substrates including multiple through-holes having a lens disposed at an inner side thereof, wherein each substrate of the first plurality and second plurality of substrates is directly bonded to at least one other substrate of the respective first and second plurality of substrates that includes multiple through-holes having a lens disposed at an inner side therein; and dividing the stacked substrate into one or more lens structures.

(38)

An electronic apparatus comprising:

a lens structure manufactured by:

directly bonding a first plurality of substrates to a second plurality of substrates thereby forming a stacked substrate, each substrate of the first plurality and second plurality of substrates including multiple through-holes having a lens disposed at an inner side thereof, wherein each substrate of the first plurality and second plurality of substrates is directly bonded to at least one other substrate of the respective first and second plurality of substrates that includes multiple through-holes having a lens disposed at an inner side therein; and dividing the stacked substrate into one or more lens structures.

(39)

A method of manufacturing a mold, comprising:

forming a first fitting portion at a plurality of predetermined positions of a first substrate, wherein the first fitting portion fits to a second fitting portion at a distal end of a mold; and aligning the second fitting portion of a second mold to the respective first fitting portion, and forming a transfer surface at the plurality of positions of the first substrate using the second mold.

(40)

The method of manufacturing according to (39), wherein one of the first fitting portion and the second fitting portion has a tapered projection portion and the other has a groove that fits to the projection portion.

(41)

The method of manufacturing according to any one of (39) to (40), wherein the first fitting portion is formed around a position at which the transfer surface of the first substrate is formed.

(42)

The method of manufacturing according to any one of (39) to (41), wherein each of the transfer surfaces is used for forming a surface of a lens disposed on at inner side of a plurality of through-holes formed in a second substrate.

(43)

A substrate including a first fitting portion that fits to a second fitting portion at a distal end of a mold used for forming a transfer surface.

(44)

A mold including:

a transfer surface disposed at a plurality of predetermined positions of a substrate, wherein a first fitting portion of the mold fits to a second fitting portion formed at the plurality of predetermined positions of the substrate.

REFERENCE SIGNS LIST

1 Camera module
11 Stacked lens structure
12 Light receiving element
13 Optical unit
21 Lens
41 (41a to 41e) Substrate with lenses
43 Sensor substrate
51 Diaphragm plate
52 Opening
81 Support substrate
82 Lens resin portion
83 Through-hole
121 Light blocking film
122 Upper surface layer
123 Lower surface layer
141 Etching mask
142 Protective film
1401 Stacked lens structure
1411a to 1411c Substrate with lenses
1421a to 1421e Support substrate
1422a to 1422c Lens resin portion
1422Ua to 1422Uc Upper surface
1422Da to 1422Dc Lower surface
1423a to 1423c Through-hole
1501W-a to 1501W-e Substrate with lenses
1502 Temporary substrate
1511a to 1511e Support substrate
1512a to 1512c Lens resin portion
1513a to 1513e Through-hole
1521W-a to 1521W-e Stacked lens structure
1522W-a to 1522W-d Temporarily stacked lens structure
1701 Master wafer
1702 Master pin
1703 Resin
1711 Substrate
1712 Alignment mark
1713 Groove
1721 Projection portion
1722 Mark
1741 Projection portion
1751 Groove
1761 Projection portion
1771 Groove
1801 Replica
1811 Master pin
1812 Resin
1813 Substrate
1831 Master wafer
1841 Substrate
1842 Resin
1861 Replica
1871 Substrate
1872 Resin
1901 Replica
1911 Resin
1912 Substrate
1931 Master wafer
1941 Substrate
1942 Resin
1961 Replica
1971 Substrate
1972 Resin
2000 Imaging apparatus
2001 Image sensor
2002 Camera module

What is claimed is:

1. A method of manufacturing a lens structure, the method comprising:
    forming a plurality of through-holes at positions shifted from a predetermined first target positions by first shift amounts corresponding to shifts in the positions of the respective through-holes that occur during manufacturing processes;
    forming a plurality of lenses, wherein forming the plurality of lenses includes forming a lens at an inner side of each of the through-holes using a first mold having a plurality of first transfer surfaces used for forming a first surface of each of the lenses, wherein the first transfer surfaces are disposed at positions shifted from predetermined second target positions by second shift amounts corresponding to shifts in the positions of the first surfaces of the respective lenses that occur during the manufacturing processes and using a second mold having a plurality of second transfer surfaces used for forming a second surface of each of the lenses, wherein the second transfer surfaces are disposed at positions shifted from predetermined third target positions by third shift amounts corresponding to shifts in positions of the second surfaces of the respective lenses that occur during the manufacturing processes;
    stacking and directly bonding the plurality of substrates having the lenses formed therein; and
    dividing the plurality of stacked substrates.

2. The method of manufacturing according to claim 1, wherein
    for each through-hole in the plurality of through-holes, a first correction amount of shifting the through-hole from the first target position is set according to the first shift amount of the through-hole,
    for each first transfer surface in the plurality of first transfer surfaces, a second correction amount of shifting the first transfer surface from the second target position is set according to the second shift amount of corresponding lens, and
    for each second transfer surface in the plurality of second transfer surfaces, a third correction amount of shifting the second transfer surface from the third target position is set according to the third shift amount of the corresponding lens.

3. The method of manufacturing according to claim 2, wherein
    the first correction amount of each of the through-holes is set based on an inverse vector of a first vector indicating the first shift amount of the respective through-holes,
    the second correction amount of each of the first transfer surfaces is set based on an inverse vector of a second vector indicating the second shift amount of the first surface of the corresponding lens, and
    the third correction amount of each of the second transfer surfaces is set based on an inverse vector of a third vector indicating the third shift amount of the second surface of the corresponding lens.

4. The method of manufacturing according to claim 3, wherein
    the first vector for each of the through-holes is set based on an average amount of shift in the position of each of the through-holes,
    the second vector for the first surface of each of the lenses is set based on an average amount of the shift in the position of the first surface of each of the lenses, and the third vector for the second surface of each of the lenses is set based on an average amount of the shift in the position of the second surface of each of the lenses.

5. The method of manufacturing according to claim 1, wherein each of the plurality of substrates are directly bonded using plasma bonding.

6. The method of manufacturing according to claim 1, wherein
respective lenses are formed by imprinting using the first and second molds.

7. A lens structure manufactured by the steps comprising:
forming a plurality of through-holes at positions shifted from predetermined first target positions according to a first shift amount corresponding to shifts in the positions of the respective through-holes that occur during manufacturing processes;
forming a plurality of lenses, wherein forming the plurality of lenses includes forming a lens at an inner side of each of the through-holes using a first mold having a plurality of first transfer surfaces used for forming a first surface of each of the lenses, wherein the first transfer surfaces are disposed at positions shifted from predetermined second target positions by second shift amounts corresponding to shifts in the positions of the first surface of each of the respective lenses that occur during the manufacturing processes and using a second mold having a plurality of second transfer surfaces used for forming a second surface of each of the lenses, wherein the second transfer surfaces are disposed at positions shifted from a predetermined third target positions by third shift amounts corresponding to shifts in the positions of the second surface of each of the respective lenses that occur during the manufacturing process;
stacking and directly bonding the plurality of substrates having the lenses formed therein; and
dividing the plurality of stacked substrates.

8. An electronic apparatus comprising:
a stacked lens structure manufactured by:
forming a plurality of through-holes at positions shifted from predetermined first target positions by first shift amounts corresponding to shifts in the positions of the respective through-holes that occur during manufacturing processes;
forming a plurality of lenses, wherein forming the plurality of lenses includes forming a lens at an inner side of each of the through-holes using a first mold having a plurality of first transfer surfaces used for forming a first surface of each of the lenses, wherein the first transfer surfaces are disposed at positions shifted from predetermined second target positions by second shift amounts corresponding to shifts in the positions of the first surfaces of the respective lenses that occur during the manufacturing processes and using a second mold having a plurality of second transfer surfaces used for forming a second surface of each of the lenses, wherein the second transfer surfaces are disposed at a positions shifted from predetermined third target positions by third shift amounts corresponding to shifts in positions of the second surfaces of each of the respective lenses that occur during the manufacturing processes;
stacking and directly bonding the plurality of substrates having the lenses formed therein; and
dividing the plurality of stacked substrates.

9. A method of manufacturing a lens structure, comprising:
directly bonding a first plurality of substrates to a second plurality of substrates thereby forming a stacked substrate, each substrate of the first plurality and second plurality of substrates including multiple through-holes having a lens disposed at an inner side thereof, wherein each substrate of the first plurality and second plurality of substrates is directly bonded to at least one other substrate of the respective first and second plurality of substrates that includes multiple through-holes having a lens disposed at an inner side therein;
directly bonding a substrate that includes multiple through-holes having a lens disposed at an inner side therein to a temporary substrate in which through-holes and lenses are not formed thereby forming a temporary stacked substrate;
directly bonding the stacked substrate and the temporary stacked substrate;
separating the temporary substrate from the temporary stacked substrate, wherein a first substrate with lenses and a second substrate with lenses of the first plurality of substrates are directly bonded, a third substrate with lenses of the second plurality of substrates and the temporary substrate are directly bonded thereby forming a first temporarily stacked substrate, the stacked substrate and the first temporarily stacked substrate are directly bonded thereby forming a second temporarily stacked substrate, and the temporary substrate is separated from the second temporarily stacked substrate; and
dividing the stacked substrate into one or more lens structures.

10. A method of manufacturing a lens structure, comprising:
directly bonding a first plurality of substrates to a second plurality of substrates thereby forming a stacked substrate, each substrate of the first plurality and second plurality of substrates including multiple through-holes having a lens disposed at an inner side thereof, wherein each substrate of the first plurality and second plurality of substrates is directly bonded to at least one other substrate of the respective first and second plurality of substrates that includes multiple through-holes having a lens disposed at an inner side therein; and
dividing the stacked substrate into one or more lens structures, wherein
first and second substrates of the first plurality of substrates and third and fourth substrates of the plurality of substrates are stacked, the first substrate and the second substrate are directly bonded thereby forming a first stacked substrate with lenses, the third substrate and the fourth substrate are directly bonded thereby forming a second stacked substrate with lenses, and the first stacked substrate with lenses and the second stacked substrate with lenses are directly bonded.

11. The method of manufacturing according to claim 9, wherein
the direct bonding is plasma bonding.

12. The method of manufacturing according to claim 10, wherein
the direct bonding is plasma bonding.

* * * * *